United States Patent
Chung

(10) Patent No.: US 10,229,746 B2
(45) Date of Patent: Mar. 12, 2019

(54) OTP MEMORY WITH HIGH DATA SECURITY

(71) Applicant: Attopsemi Technology Co., LTD, Hsinchu (TW)

(72) Inventor: Shine C. Chung, San Jose, CA (US)

(73) Assignee: Attopsemi Technology Co., LTD, Hsinchu (TW)

( * ) Notice: Subject to any disclaimer, the term of this patent is extended or adjusted under 35 U.S.C. 154(b) by 0 days.

(21) Appl. No.: 15/708,116

(22) Filed: Sep. 18, 2017

(65) Prior Publication Data

US 2018/0005703 A1 Jan. 4, 2018

Related U.S. Application Data

(63) Continuation-in-part of application No. 15/422,266, filed on Feb. 1, 2017, now Pat. No. 10,127,992, which
(Continued)

(51) Int. Cl.
*G11C 17/16* (2006.01)
*G11C 29/02* (2006.01)
(Continued)

(52) U.S. Cl.
CPC .............. *G11C 17/16* (2013.01); *G11C 7/222* (2013.01); *G11C 17/18* (2013.01); *G11C 29/027* (2013.01);
(Continued)

(58) Field of Classification Search
CPC .................................. G11C 17/16; G11C 7/222
(Continued)

(56) References Cited

U.S. PATENT DOCUMENTS

| 3,198,670 A | 8/1965 | Nissim |
| 3,715,242 A | 2/1973 | Daniel |

(Continued)

FOREIGN PATENT DOCUMENTS

| CN | 1469473 A | 1/2004 |
| CN | 1691204 A | 11/2005 |

(Continued)

OTHER PUBLICATIONS

U.S. Appl. No. 13/471,704, filed May 15, 2012.
(Continued)

*Primary Examiner* — Michael Tran

(57) ABSTRACT

A method of programming electrical fuses reliably is disclosed. If a programming current exceeds a critical current, disruptive mechanisms such as rupture, thermal runaway, decomposition, or melt, can be a dominant programming mechanism such that programming is not be very reliable. Advantageously, by controlled programming where programming current is maintained below the critical current, electromigration can be the sole programming mechanism and, as a result, programming can be deterministic and very reliable. In this method, fuses can be programmed in multiple shots with progressive resistance changes to determine a lower bound that all fuses can be programmed satisfactorily and an upper bound that at least one fuse can be determined failed. If programming within the lower and upper bounds, defects due to programming can be almost zero and, therefore, defects are essentially determined by pre-program defects.

21 Claims, 57 Drawing Sheets

Related U.S. Application Data is a continuation of application No. 14/485,696, filed on Sep. 13, 2014, now Pat. No. 9,711,237, which is a continuation-in-part of application No. 13/835,308, filed on Mar. 15, 2013, now Pat. No. 8,913,415, which is a continuation of application No. 13/471,704, filed on May 15, 2012, now Pat. No. 8,488,359, which is a continuation-in-part of application No. 13/026,752, filed on Feb. 14, 2011, now Pat. No. 8,514,606, and a continuation-in-part of application No. 13/026,656, filed on Feb. 14, 2011, now Pat. No. 8,644,049, said application No. 14/485,696 is a continuation-in-part of application No. 13/842,824, filed on Mar. 15, 2013, now Pat. No. 9,070,437, which is a continuation-in-part of application No. 13/471,704, said application No. 14/485,696 is a continuation-in-part of application No. 13/970,562, filed on Aug. 19, 2013, now Pat. No. 9,431,127, which is a continuation-in-part of application No. 13/471,704, application No. 15/708,116, which is a continuation-in-part of application No. 14/101,125, filed on Dec. 9, 2013, now Pat. No. 9,818,478, and a continuation-in-part of application No. 15/076,460, filed on Mar. 21, 2016, now Pat. No. 9,824,768.

(60) Provisional application No. 62/462,351, filed on Feb. 22, 2017, provisional application No. 61/609,353, filed on Mar. 11, 2012, provisional application No. 61/981,212, filed on Apr. 18, 2014, provisional application No. 61/880,916, filed on Sep. 21, 2013, provisional application No. 61/375,653, filed on Aug. 20, 2010, provisional application No. 61/375,660, filed on Aug. 20, 2010, provisional application No. 61/728,240, filed on Nov. 20, 2012, provisional application No. 61/668,031, filed on Jul. 5, 2012, provisional application No. 61/684,800, filed on Aug. 19, 2012, provisional application No. 61/734,945, filed on Dec. 7, 2012, provisional application No. 62/136,608, filed on Mar. 22, 2015.

(51) Int. Cl.
  *G11C 17/18* (2006.01)
  *G11C 7/22* (2006.01)
  *H01L 45/00* (2006.01)
  *H01L 27/22* (2006.01)
  *H01L 27/24* (2006.01)

(52) U.S. Cl.
  CPC ........ *H01L 27/224* (2013.01); *H01L 27/2409* (2013.01); *H01L 45/06* (2013.01); *H01L 45/1233* (2013.01); *H01L 45/144* (2013.01)

(58) Field of Classification Search
  USPC .................................................. 365/96, 194
  See application file for complete search history.

(56) References Cited

U.S. PATENT DOCUMENTS

| | | |
|---|---|---|
| 4,148,046 A | 4/1979 | Hendrickson et al. |
| 4,192,059 A | 3/1980 | Khan et al. |
| 4,642,674 A | 2/1987 | Schoofs |
| 5,192,989 A | 3/1993 | Matsushita et al. |
| 5,355,342 A | 10/1994 | Ueoka |
| 5,389,552 A | 2/1995 | Iranmanesh |
| 5,447,876 A | 9/1995 | Moyer et al. |
| 5,548,225 A | 8/1996 | Rountree |
| 5,600,588 A | 2/1997 | Kawashima |
| 5,610,871 A | 3/1997 | Hidaka |
| 5,635,742 A | 6/1997 | Hoshi et al. |
| 5,637,901 A | 6/1997 | Beigel et al. |
| 5,723,890 A | 3/1998 | Fujihira et al. |
| 5,757,046 A | 5/1998 | Fujihira et al. |
| 5,761,148 A | 6/1998 | Allan et al. |
| 5,962,903 A | 10/1999 | Sung et al. |
| 6,002,156 A | 12/1999 | Lin |
| 6,008,092 A | 12/1999 | Gould |
| 6,034,882 A | 3/2000 | Johnson et al. |
| 6,054,344 A | 4/2000 | Liang et al. |
| 6,108,247 A | 8/2000 | Suzu |
| 6,140,687 A | 10/2000 | Shimormura et al. |
| 6,215,681 B1 | 4/2001 | Schuurman |
| 6,222,244 B1 | 4/2001 | Arndt et al. |
| 6,243,864 B1 | 6/2001 | Odani et al. |
| 6,249,472 B1 | 6/2001 | Tamura et al. |
| 6,346,727 B1 | 2/2002 | Ohtomo |
| 6,388,292 B1 | 5/2002 | Lin |
| 6,400,540 B1 | 6/2002 | Chang |
| 6,405,160 B1 | 6/2002 | Djaja et al. |
| 6,461,934 B2 | 10/2002 | Nishida et al. |
| 6,483,734 B1 | 11/2002 | Sharma et al. |
| 6,597,629 B1 | 7/2003 | Raszka et al. |
| 6,611,043 B2 | 8/2003 | Takiguchi |
| 6,731,535 B1 | 5/2004 | Ooishi et al. |
| 6,770,953 B2 | 8/2004 | Boeck et al. |
| 6,798,684 B2 | 9/2004 | Low et al. |
| 6,803,804 B2 | 10/2004 | Madurawe |
| 6,813,705 B2 | 11/2004 | Duesterwald et al. |
| 6,897,543 B1 | 5/2005 | Huang et al. |
| 6,934,176 B2 | 8/2005 | Low et al. |
| 6,944,083 B2 | 9/2005 | Pedlow |
| 6,967,879 B2 | 11/2005 | Mizukoshi |
| 7,009,182 B2 | 3/2006 | Kannan et al. |
| 7,102,951 B2 | 9/2006 | Paillet et al. |
| 7,167,397 B2 | 1/2007 | Paillet et al. |
| 7,211,843 B2 | 5/2007 | Low et al. |
| 7,212,432 B2 | 5/2007 | Ferrant et al. |
| 7,224,598 B2 | 5/2007 | Perner |
| 7,263,027 B2 | 8/2007 | Kim et al. |
| 7,294,542 B2 | 11/2007 | Okushima |
| 7,369,452 B2 | 5/2008 | Kenkare et al. |
| 7,391,064 B1 | 6/2008 | Tripsas et al. |
| 7,405,590 B1 * | 7/2008 | Kaneko .................. G11C 17/16 326/30 |
| 7,411,844 B2 | 8/2008 | Nitzan et al. |
| 7,439,608 B2 | 10/2008 | Arendt |
| 7,450,414 B2 | 11/2008 | Scheuerlein |
| 7,461,371 B2 | 12/2008 | Luo et al. |
| 7,573,762 B2 | 8/2009 | Kenkare et al. |
| 7,579,232 B1 | 8/2009 | Ping |
| 7,589,367 B2 | 9/2009 | Oh et al. |
| 7,609,578 B2 | 10/2009 | Buer et al. |
| 7,660,181 B2 | 2/2010 | Kumar et al. |
| 7,696,017 B1 | 4/2010 | Tripsas et al. |
| 7,701,038 B2 | 4/2010 | Chen et al. |
| 7,759,766 B2 | 7/2010 | Booth |
| 7,764,532 B2 | 7/2010 | Kurjanowicz et al. |
| 7,772,591 B1 | 8/2010 | Shih et al. |
| 7,802,057 B2 | 9/2010 | Iyer et al. |
| 7,808,815 B2 | 10/2010 | Ro et al. |
| 7,830,697 B2 | 11/2010 | Herner |
| 7,833,823 B2 | 11/2010 | Klersy |
| 7,834,659 B1 * | 11/2010 | Im .......................... G11C 17/18 326/38 |
| 7,852,656 B2 | 12/2010 | Shin et al. |
| 7,859,920 B2 | 12/2010 | Jung |
| 7,889,204 B2 | 2/2011 | Hansen et al. |
| 7,910,999 B2 | 3/2011 | Lee et al. |
| 8,008,723 B2 | 8/2011 | Nagai |
| 8,050,129 B2 | 11/2011 | Liu et al. |
| 8,089,137 B2 | 1/2012 | Lung et al. |
| 8,115,280 B2 | 2/2012 | Chen et al. |
| 8,119,048 B2 | 2/2012 | Nishimura |
| 8,154,005 B2 | 4/2012 | Hsia |
| 8,168,538 B2 | 5/2012 | Chen et al. |
| 8,174,063 B2 | 5/2012 | Liu et al. |
| 8,174,922 B2 | 5/2012 | Naritake |

(56) References Cited

U.S. PATENT DOCUMENTS

| | | |
|---|---|---|
| 8,179,711 B2 | 5/2012 | Kim et al. |
| 8,183,665 B2 | 5/2012 | Bertin et al. |
| 8,217,490 B2 | 7/2012 | Bertin et al. |
| 8,233,316 B2 | 7/2012 | Liu et al. |
| 8,339,079 B2 | 12/2012 | Yamada |
| 8,369,166 B2 | 2/2013 | Kurjanowicz et al. |
| 8,373,254 B2 | 2/2013 | Chen et al. |
| 8,380,768 B2 | 2/2013 | Hoefler |
| 8,415,764 B2 | 4/2013 | Chung |
| 8,482,972 B2 | 7/2013 | Chung |
| 8,488,359 B2 | 7/2013 | Chung |
| 8,488,364 B2 | 7/2013 | Chung |
| 8,503,141 B2 | 8/2013 | Mallikarjunaswamy |
| 8,514,606 B2 | 8/2013 | Chung |
| 8,526,254 B2 | 9/2013 | Kurjanowicz et al. |
| 8,559,208 B2 | 10/2013 | Chung |
| 8,570,800 B2 | 10/2013 | Chung |
| 8,576,602 B2 | 11/2013 | Chung |
| 8,598,639 B2 | 12/2013 | Hsin |
| 8,643,085 B2 | 2/2014 | Pfirsch |
| 8,644,049 B2 | 2/2014 | Chung |
| 8,648,349 B2 | 2/2014 | Masuda et al. |
| 8,649,203 B2 | 2/2014 | Chung |
| 8,680,620 B2 | 3/2014 | Salcedo et al. |
| 8,699,259 B2 | 4/2014 | Zhang et al. |
| 8,760,904 B2 | 6/2014 | Chung |
| 8,804,398 B2 | 8/2014 | Chung |
| 8,817,563 B2 | 8/2014 | Chung |
| 8,830,720 B2 | 9/2014 | Chung |
| 8,848,423 B2 | 9/2014 | Chung |
| 8,854,859 B2 | 10/2014 | Chung |
| 8,861,249 B2 | 10/2014 | Chung |
| 8,913,415 B2 | 12/2014 | Chung |
| 8,913,449 B2 | 12/2014 | Chung |
| 8,923,070 B2 | 12/2014 | Xia |
| 8,923,085 B2 | 12/2014 | Chung |
| 8,929,122 B2 | 1/2015 | Chung |
| 8,988,965 B2 | 3/2015 | Chung |
| 9,019,742 B2 | 4/2015 | Chung |
| 9,019,791 B2 | 4/2015 | Chung |
| 9,025,357 B2 | 5/2015 | Chung |
| 9,070,437 B2 | 6/2015 | Chung |
| 9,178,100 B2 | 11/2015 | Webster |
| 9,236,141 B2 | 1/2016 | Chung |
| 9,281,038 B2 | 3/2016 | Chung |
| 9,305,973 B2 | 4/2016 | Chung |
| 9,324,447 B2 | 4/2016 | Chung |
| 9,324,849 B2 | 4/2016 | Chung |
| 9,343,176 B2 | 5/2016 | Chung |
| 9,460,807 B2 | 10/2016 | Chung |
| 9,478,306 B2 | 10/2016 | Chung |
| 9,548,109 B2 | 1/2017 | Chung |
| 9,767,915 B2 | 9/2017 | Chung |
| 9,818,478 B2 | 11/2017 | Chung |
| 9,981,970 B2 | 1/2018 | Chung |
| 2002/0018355 A1 | 2/2002 | Johnson et al. |
| 2002/0075744 A1 | 6/2002 | McCollum |
| 2002/0168821 A1 | 11/2002 | Williams et al. |
| 2002/0196659 A1 | 12/2002 | Hurst et al. |
| 2003/0104860 A1 | 6/2003 | Cannon et al. |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2004/0130924 A1 | 7/2004 | Ma et al. |
| 2005/0052915 A1 | 3/2005 | Herner |
| 2005/0060500 A1 | 3/2005 | Luo et al. |
| 2005/0062110 A1 | 3/2005 | Dietz et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2005/0242386 A1 | 11/2005 | Ang |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansal et al. |
| 2006/0215440 A1 | 9/2006 | Cho et al. |
| 2006/0244099 A1 | 11/2006 | Kurjanowicz |
| 2007/0004160 A1 | 1/2007 | Voldman |
| 2007/0008776 A1 | 1/2007 | Scheuerlein et al. |
| 2007/0030026 A1 | 2/2007 | Hsu et al. |
| 2007/0057323 A1 | 3/2007 | Furukawa et al. |
| 2007/0058422 A1 | 3/2007 | Philipp |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0183213 A1 | 8/2007 | Kusakabe |
| 2007/0218665 A1 | 9/2007 | Sutardja |
| 2007/0223266 A1 | 9/2007 | Chen |
| 2007/0279978 A1 | 12/2007 | Ho et al. |
| 2007/0284656 A1 | 12/2007 | Radigan |
| 2008/0025067 A1 | 1/2008 | Scheuerlein et al. |
| 2008/0025068 A1 | 1/2008 | Scheuerlein et al. |
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 | 5/2008 | Ohara |
| 2008/0144354 A1 | 6/2008 | Choi |
| 2008/0151612 A1 | 6/2008 | Pellizzer et al. |
| 2008/0170429 A1 | 7/2008 | Bertin et al. |
| 2008/0175060 A1 | 7/2008 | Liu et al. |
| 2008/0185568 A1 | 8/2008 | Kwon |
| 2008/0220560 A1 | 9/2008 | Klersy |
| 2008/0225567 A1 | 9/2008 | Burr et al. |
| 2008/0280401 A1 | 11/2008 | Burr et al. |
| 2008/0316852 A1 | 12/2008 | Matsufuji et al. |
| 2009/0039420 A1 | 2/2009 | Trivedi |
| 2009/0055617 A1 | 2/2009 | Bansal et al. |
| 2009/0115021 A1 | 5/2009 | Moriwaki |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0269932 A1 | 10/2009 | Chen |
| 2009/0309089 A1 | 12/2009 | Hsia et al. |
| 2010/0002501 A1 | 1/2010 | Leuschner |
| 2010/0027326 A1 | 2/2010 | Kim et al. |
| 2010/0034016 A1 | 2/2010 | Liu et al. |
| 2010/0061136 A1 | 3/2010 | Koyama et al. |
| 2010/0085798 A1 | 4/2010 | Lu et al. |
| 2010/0091546 A1 | 4/2010 | Liu et al. |
| 2010/0103721 A1 | 4/2010 | Guha |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0177547 A1 | 7/2010 | Shen |
| 2010/0201410 A1 | 8/2010 | Illegems |
| 2010/0232203 A1 | 9/2010 | Chung et al. |
| 2010/0238701 A1 | 9/2010 | Tsukamoto et al. |
| 2010/0246237 A1 | 9/2010 | Borot et al. |
| 2010/0250974 A1 | 9/2010 | Ristic |
| 2010/0277967 A1 | 11/2010 | Lee et al. |
| 2010/0301304 A1 | 12/2010 | Chen et al. |
| 2011/0022648 A1 | 1/2011 | Harris et al. |
| 2011/0051491 A1 | 3/2011 | Takizawa |
| 2011/0062557 A1 | 3/2011 | Bandyopadhyay et al. |
| 2011/0108926 A1 | 5/2011 | Bahl |
| 2011/0127627 A1 | 6/2011 | Hoofman |
| 2011/0128772 A1 | 6/2011 | Kim et al. |
| 2011/0145777 A1 | 6/2011 | Iyer et al. |
| 2011/0175199 A1 | 7/2011 | Lin et al. |
| 2011/0186990 A1 | 8/2011 | Mawatari |
| 2011/0222330 A1* | 9/2011 | Lee .................. G11C 13/0004 365/100 |
| 2011/0260289 A1 | 10/2011 | Oyamada |
| 2011/0267869 A1 | 11/2011 | Hoefler |
| 2011/0286261 A1 | 11/2011 | Sakuguchi |
| 2011/0297912 A1 | 12/2011 | Samachisa et al. |
| 2011/0310655 A1 | 12/2011 | Kreupl et al. |
| 2011/0312166 A1 | 12/2011 | Yedinak et al. |
| 2012/0032303 A1 | 2/2012 | Elkareh et al. |

(56) References Cited

U.S. PATENT DOCUMENTS

| | | |
|---|---|---|
| 2012/0039107 A1 | 2/2012 | Chung |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0120707 A1* | 5/2012 | Kim ............... G11C 17/12 365/104 |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0224413 A1 | 9/2012 | Zhang et al. |
| 2012/0256292 A1 | 10/2012 | Yu et al. |
| 2012/0257435 A1 | 10/2012 | Lin |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0161780 A1 | 6/2013 | Kizilyalli et al. |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0208526 A1 | 8/2013 | Chung |
| 2013/0215663 A1 | 8/2013 | Chung |
| 2013/0235644 A1 | 9/2013 | Chung |
| 2013/0268526 A1 | 10/2013 | John et al. |
| 2013/0286710 A1 | 10/2013 | Hall |
| 2013/0308366 A1 | 11/2013 | Chung |
| 2014/0010032 A1 | 1/2014 | Seshadri et al. |
| 2014/0016394 A1 | 1/2014 | Chung et al. |
| 2014/0071726 A1 | 3/2014 | Chung |
| 2014/0092674 A1 | 4/2014 | Chung |
| 2014/0124871 A1 | 5/2014 | Ko et al. |
| 2014/0124895 A1 | 5/2014 | Salzman et al. |
| 2014/0126266 A1 | 5/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0160830 A1 | 6/2014 | Chung |
| 2014/0211567 A1 | 7/2014 | Chung |
| 2014/0269135 A1 | 9/2014 | Chung |
| 2014/0340954 A1 | 11/2014 | Chung |
| 2015/0003142 A1 | 1/2015 | Chung |
| 2015/0003143 A1 | 1/2015 | Chung |
| 2015/0009743 A1 | 1/2015 | Chung |
| 2015/0014785 A1 | 1/2015 | Chung |
| 2015/0021543 A1 | 1/2015 | Chung |
| 2015/0029777 A1 | 1/2015 | Chung |
| 2015/0078060 A1 | 3/2015 | Chung |
| 2015/0130509 A1 | 5/2015 | He et al. |
| 2015/0137258 A1 | 5/2015 | Mittal |
| 2015/0194433 A1 | 7/2015 | Ponoth |
| 2015/0380103 A1 | 12/2015 | Braun et al. |
| 2016/0034351 A1 | 2/2016 | Michael |
| 2016/0071582 A1 | 3/2016 | Chung |
| 2016/0268002 A1 | 9/2016 | Chen |
| 2016/0276043 A1 | 9/2016 | Chung |
| 2017/0053708 A1 | 2/2017 | Wong |
| 2017/0110512 A1 | 4/2017 | Chung |
| 2018/0005703 A1 | 1/2018 | Nguyen |
| 2018/0075906 A1 | 3/2018 | Chung |

FOREIGN PATENT DOCUMENTS

| | | |
|---|---|---|
| CN | 101057330 A | 10/2007 |
| CN | 101083227 A | 12/2007 |
| CN | 101188140 A | 5/2008 |
| CN | 101271881 A | 9/2008 |
| CN | 101483062 A | 7/2009 |
| CN | 101728412 A | 6/2010 |
| CN | 10238593 A | 3/2012 |
| CN | 102385932 A | 3/2012 |
| CN | 10261027 A | 7/2012 |
| CN | 102610272 A | 7/2012 |
| EP | 1367596 A1 | 12/2003 |
| JP | 03-264814 | 11/1991 |
| TW | I309081 | 10/2007 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.
Aziz, A. et al., "Lateral Polysilicon n+p Diodes: Effect of the Grain boundaries and of the p-Implemented Doping Level on the I-V and C-V Characteristics, Springer Proceedings in Physics", vol. 54, 1991, pp. 318-322.
Aziz, A. et al., "Lateral Polysilicon PN Diodes: Current-Voltage Characteristics Simulation Between 200K and 400K a Numerical Approach," IEEE Trans. On Elec. Dev., vol. 41, No. 2, Feb. 1994, pp. 204-211.

(56) References Cited

OTHER PUBLICATIONS

Banerjee, Kaustav et al., "High Current Effects in Silicide Films for Sub-0.25um VLSI Technologies," IEEE 36th IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. On Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp, Jun. 2004, pp. 442-445.
Bedeschi, F. et al., "SET and RESET Pulse Characterization in BJT-Selected Phase-Change Memory," IEEE Int. Symp. On Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.
Cagli, C. et al., "Evidence for threshold switching in the set process of NiO-based RRAM and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.
Cheng, Yu-Hsing et al., "Failure Analysis and Optimization of Metal Fuses for Post Package Trimming," IEEE 45th IRPS, 2007, pp. 616-617.
Chiu, Pi-Feng et al., "A Low Store Energy, Low VDDmin, Non-volatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.
Chung, S. et al., "A 512×8 Electrical Fuse Memory with 15um2 Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS—Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.

Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.
Dion, Michael J., "Reservoir Modeling for Electromigration Improvement of Metal Systems with Refractory Barriers," IEEE 39th IRPS, 2001, pp. 327-333.
Doorn, T. S. et al., "Ultra-fast Programming of Silicided Polysilicon Fuses Based On New Insights in the Programming Physics," IEEE IEDM, 2005, pp. 667-670.
Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.
Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.
Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle MRAM Based on a Novel bit and Switching Method," IEEE Trans. on Mag. vol. 41, No. 1, Jan. 2005, pp. 132-136.
Fellner, Johannes, et al., "Lifetime Study for a Poly Fuse in a 0.35um Polycide CMOS Process," IEEE 43rd IRPS, 2005, pp. 446-449.
Gao, B. et al., "Oxide-Based RRAM: Uniformity Improvement Using A New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.
Gogl, D. et al., "A 16-Mb MRAM Featuring Bootstrapped Write Drivers," IEEE J. of Solid-State Circuits, vol. 40, No. 4, Apr. 2005, pp. 902-908.
Gopalan, C. et al., Demonstration of Conductive Bridging Random Access Memory (CBRAM) in Logic CMOS Process, IEEE Int. Memory Workshop, 2010, pp. 1-4.
Ha, Daewon and Kim, Kinam, "Recent Advances in High Density Phase Change Memory (PRAM)," IEEE VLSI Tech. Symp. Jun. 2007.
Hosoi, Y. et al., "High Speed Unipolar Switching Resistance RAM (RRAM) Technology," IEEE IEDM, Dec. 2006, pp. 1-4.
Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.
Huang, Chia-En et al., "A New CMOS Logic Anti-Fuse Cell with Programmable Contact," IEEE IEDM Tech. Dig. 2007, pp. 48-51.
Im, Jay et al., "Characterization of Silicided Polysilicon Fuse Implemented in 65nm CMOS Technology," 7th Annual Non-Volatile Memory Technology Symp, (NVMTS) 2006, pp. 55-57.
Jin, Li-Yan et al., "Low-Area 1-Kb Multi-Bit OTP IP Design," IEEE 8th Int. Conf. on ASIC (ASICON), 2009. pp. 629-632.
Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.
Kalnitsy, Alexander et al., "CoSi2 Integrated Fuses on Poly Silicon for Low Voltage 0.18um CMOS Applications," IEEE IEDM 1999, pp. 765-768.
Kang, Han-Byul et al., "Electromigration of NiSi Poly Gated Electrical Fuse and Its Resistance Behaviors Induced by High Temperature," IEEE IRPS, 2010, pp. 265-270.
Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.
Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.

(56) References Cited

OTHER PUBLICATIONS

Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.
Ker, Ming-Dou et al., "Ultra-High-Voltage Charge Pump Circuit in Low-Voltage Bulk CMOS Processes With Polysilicon Diodes," IEEE Trans. on Cir. And Sys.-II: Exp. Brief., vol. 54, No. 1, Jan. 2007, pp. 47-51.
Kim, Deok-Kee et al., "An Investigation of Electrical Current Induced Phase Transitions in the NiPtSi/Polysilicon System," J. App. Phy. 103, 073708 (2008).
Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.
Kim, Jinbong et al., "3-Transistor Antifuse OTP ROM Array Using Standard CMOS Process," IEEE VLSI Cir. Symposium, Jun. 2003, pp. 239-242.
Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol. 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.
Lai, S., "Current Status of the Phase Change Memory and Its Future," IEEE IEDM Dig. of Tech. Paper, Dec. 2003, pp. 255-258.
Lee, H. Y. et al., "Low Power and High Speed Bipolar Switching with A Thin Reactive Ti Buffer Layer in Robust HfO2 Based RRAM," IEEE IEDM, 2008, pp. 1-4.
Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.
Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.
Lee, M.-J. et al., "Stack Friendly all-Oxide 3D RRAM Using GaInZnO Peripheral TFT Realized Over Glass Substrates," IEDM, Dec. 2008. pp. 1-4.
Lee, Man Chiu et al., "OTP Memory for Low Cost Passive RFID Tags," IEEE Conf. on Electron Devices and Solid-State Circuits (EDSSC), 2007, pp. 633-636.
Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.
Lim, Kyunam et al., "Bit Line Coupling Scheme and Electrical Fuse Circuit for Reliable Operation of High Density DRAM," IEEE VLSI Cir. Symp. Jun. 2001, pp. 33-34.
Maffitt, T. et al., "Design Considerations for MRAM," IBM J. Res. & Dev., vol. 50, No. 1, Jan. 2006, pp. 25-39.
Meng, X.Z. et al., "Reliability Concept for Electrical Fuses," IEE Proc.-Sci Meas. Technol., vol. 144, No. 2, Mar. 1997, pp. 87-92.

Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.
Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.
Morimoto, T. et al., "A NiSi Salicide Technology for Advanced Logic Devices," IEEE IEDM, Dec. 1991, pp. 653-656.
Neale, Ron, "PCM Progress Report No. 6 Afterthoughts," http://www.eetimes.com/General/PrintView/4236240, Feb. 13, 2012, 5 pages.
Nebashi, R. et al., "A 90nm 12ns 32Mb 2T1MTJ MRAM," IEEE ISSCC Dig. of Tech. Paper, Sess. 27.4, Feb. 2009, 3 pages.
Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.
Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.
Oh, G. H. et al., "Parallel Multi-Confined (PMC) Cell Technology for High Density MLC PRAM," IEEE VLSI Tech. Symp., Jun. 2009, pp. 220-221.
Oh, J. H. et al., "Full Integration of Highly Manufacturable 512Mb PRAM Based on 90nm Technology," IEEE IEDM Dig. of Tech. Paper, Dec. 2006, pp. 1-4.
Osada, K. et al., "Phase Change RAM Operated with 1.5V CMOS as Low Cost Embedded Memory," IEEE CICC, Nov. 2005, pp. 431-434.
Park, Don et al., "Study on Reliability of Metal Fuse for Sub-100nm Technology," IEEE Int. Symp. On Semiconductor Manufacturing (ISSM), 2005, pp. 420-421.
Park, Jongwoo et al., "Phase Transformation of Programmed NiSi Electrical Fuse: Diffusion, Agglomeration, and Thermal Stability," 18th IEEE Int. Symp. On Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.
Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.
Rizzolo, R. F. et al., "IBM System z9 eFUSE applications and methodology," IBM J. Res. & Dev. vol. 51 No. ½ Jan./Mar. 2007, pp. 65-75.
Robson, Norm et al., "Electrically Programmable Fuse (eFuse) from Memory Redundancy to Autonomic Chips," IEEE CICC., 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.
Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.

(56) References Cited

OTHER PUBLICATIONS

Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of A Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/ 94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. Of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 dated Sep. 18, 2012.
Office Action for U.S. Appl. No. 13/471,704 dated Jul. 31, 2012.
Notice of Allowance for U.S. Appl. No. 13/471,704 dated Oct. 18, 2012.
Notice of Allowance for U.S. Appl. No. 13/026,678 dated Sep. 19, 2012.
Office Action for U.S. Appl. No. 13/026,783 dated Sep. 27, 2012.
Office Action for U.S. Appl. No. 13/026,717 dated Oct. 25, 2012.
Office Action for U.S. Appl. No. 13/026,650 dated Nov. 9, 2012.
Office Action for U.S. Appl. No. 13/026,692 dated Nov. 9, 2012.
Office Action for U.S. Appl. No. 13/026,752 dated Nov. 9, 2012.
Office Action for U.S. Appl. No. 13/026,656 dated Nov. 13, 2012.
Office Action for U.S. Appl. No. 13/026,704 dated Nov. 23, 2012.
Office Action for U.S. Appl. No. 13/397,673, dated Dec. 18, 2012.
Office Action for U.S. Appl. No. 13/026,840, dated Dec. 31, 2012.
Office Action for U.S. Appl. No. 13/026,852, dated Jan. 14, 2013.
Restriction Requirement for U.S. Appl. No. 13/026,835, dated Dec. 12, 2012.
Notice of Allowance for U.S. Appl. No. 13/026,717, dated Feb. 12, 2013.
Office Action for U.S. Appl. No. 13/471,704, dated Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, dated Feb. 20, 2013.
Notice of Allowance for U.S. Appl. No. 13/026,783, dated Mar. 4, 2013.
Notice of Allowance for U.S. Appl. No. 13/026,692, dated Mar. 15, 2013.
Notice of Allowance for U.S. Appl. No. 13/026,835, dated Mar. 20, 2013.
Notice of Allowance for U.S. Appl. No. 13/026,664, dated Apr. 22, 2013.
Notice of Allowance for U.S. Appl. No. 13/026,656, dated Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, dated Apr. 18, 2013.
Notice of Allowance for U.S. Appl. No. 13/026,704, dated Apr. 30, 2013.
Notice of Allowance for U.S. Appl. No. 13/026,852, dated May 10, 2013.
Notice of Allowance for U.S. Appl. No. 13/026,717, dated May 15, 2013.
Notice of Allowance for U.S. Appl. No. 13/471,704, dated May 22, 2013.
Notice of Allowance for U.S. Appl. No. 13/026,678, dated May 28, 2013.
Notice of Allowance for U.S. Appl. No. 13/026,650, dated May 30, 2013.
Restriction Requirement for U.S. Appl. No. 13/314,444, dated Jun. 7, 2013.

(56) References Cited

OTHER PUBLICATIONS

Restriction Requirement for U.S. Appl. No. 13/214,198, dated Jun. 13, 2013.
Notice of Allowance for U.S. Appl. No. 13/026,840, dated Jun. 13, 2013.
Restriction Requirement for U.S. Appl. No. 13/026,771, dated Jun. 13, 2013.
Notice of Allowance for U.S. Appl. No. 13/026,752, dated Jul. 1, 2013.
Restriction Requirement for U.S. Appl. No. 13/678,543, dated Jul. 8, 2013.
Office Action for U.S. Appl. No. 13/026,725, dated Jul. 19, 2013.
Notice of Allowance for U.S. Appl. No. 13/026,664, dated Jul. 22, 2013.
Notice of Allowance for U.S. Appl. No. 13/026,692, dated Jul. 23, 2013.
Notice of Allowance for U.S. Appl. No. 13/397,673, dated Jul. 30, 2013.
Notice of Allowance for U.S. Appl. No. 13/026,704, dated Aug. 2, 2013.
Notice of Allowance for U.S. Appl. No. 13/026,783, dated Aug. 5, 2013.
Office Action for U.S. Appl. No. 13/214,198, dated Aug. 6, 2013.
Office action for Chinese Patent Application No. 201110279954.7, dated Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, dated Sep. 9, 2013.
Office Action for U.S. Appl. No. 13/314,444, dated Sep. 9, 2013.
Office Action for U.S. Appl. No. 13/026,771, dated Sep. 9, 2013.
Notice of Allowance for U.S. Appl. No. 13/026,852, dated Sep. 18, 2013.
Office Action (Ex Parte) for U.S. Appl. No. 13/678,543, dated Sep. 20, 2013.
Office Action for U.S. Appl. No. 13/835,308, dated Sep. 27, 2013.
Notice of Allowance for U.S. Appl. No. 13/026,717, dated Oct. 1, 2013.
Office Action for U.S. Appl. No. 13/954,831, dated Oct. 1, 2013.
Notice of Allowance for U.S. Appl. No. 13/026,656, dated Oct. 4, 2013.
Office Action for U.S. Appl. No. 13/214,183, dated Oct. 25, 2013.
Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, dated Nov. 15, 2013.
Notice of Allowance for U.S. Appl. No. 13/026,835, dated Nov. 22, 2013.
Notice of Allowance for U.S. Appl. No. 13/026,725, dated Dec. 10, 2013.
Office Action for U.S. Appl. No. 13/026,783, dated Dec. 23, 2013.
Notice of Allowance for U.S. Appl. No. 13/026,771, dated Jan. 15, 2014.
Office Action for Chinese Patent Application No. 201110244362.1, dated Sep. 29, 2013.
Office Action for Chinese Patent Application No. 201110235464.7, dated Oct. 8, 2013.
Office Action for Chinese Patent Application No. 201110244400.3, dated Nov. 5, 2013.
Office Action for Chinese Patent Application No. 201110244342.4, dated Oct. 31, 2013.
Restriction Requirement for U.S. Appl. No. 13/678,541, dated Feb. 28, 2014.
Notice of Allowance for U.S. Appl. No. 13/026,840, dated Mar. 6, 2014.
Notice of Allowance for U.S. Appl. No. 13/026,840, dated Mar. 10, 2014.
Notice of Allowance of U.S. Appl. No. 13/678,543, dated Dec. 13, 2013.
Notice of Allowance for U.S. Appl. No. 13/835,308, dated Mar. 14, 2014.
Notice of Allowance for U.S. Appl. No. 13/026,835, dated Mar. 14, 2014.
Notice of Allowance for U.S. Appl. No. 13/026,725, dated Mar. 31, 2014.
Notice of Allowance for U.S. Appl. No. 13/026,852, dated Mar. 20, 2014.
Notice of Allowance for U.S. Appl. No. 13/026,771, dated Mar. 18, 2014.
Final Office Action for U.S. Appl. No. 13/214,183, dated Apr. 17, 2014.
"Embedded Systems/Mixed C and Assembly Programming", Wikibooks, Aug. 6, 2009, pp. 1-7.
Notice of Allowance for U.S. Appl. No. 13/761,097, dated Jul. 15, 2014.
Office Action for U.S. Appl. No. 13/571,797, dated Apr. 24, 2014.
Notice of Allowance for U.S. Appl. No. 13/590,044, dated Apr. 29, 2014.
Notice of Allowance for U.S. Appl. No. 13/954,831, dated May 27, 2014.
Notice of Allowance of U.S. Appl. No. 13/833,044, dated May 29, 2014.
Notice of Allowance for U.S. Appl. No. 13/761,048, dated Jun. 10, 2014.
Office Action for Taiwanese Patent Application No. 100129642, dated May 19, 2014 (with translation).
Office Action for U.S. Appl. No. 13/072,783, dated Nov. 7, 2013.
Notice of Allowance for U.S. Appl. No. 13/026,840, dated Jun. 24, 2014.
Notice of Allowance for U.S. Appl. No. 13/214,198, dated Jun. 23, 2014.
Notice of Allowance for U.S. Appl. No. 13/590,044, dated Jun. 23, 2014.
Ker et al., "MOS-bounded diodes for on-chip ESD protection in a 0.15-μm shallow-trench-isolation salicided CMOS Process" International Symposium on VLSI Technology, Systems and Applications, 2003, 5 pgs.
Notice of Allowance for U.S. Appl. No. 13/840,965, dated Jun. 25, 2014.
Office Action for U.S. Appl. No. 13/970,562, dated Jun. 27, 2014.
Office Action for U.S. Appl. No. 13/835,308, dated Jun. 27, 2014.
Notice of Allowance for U.S. Appl. No. 13/288,843, dated Jul. 8, 2014.
Restriction Requirement for U.S. Appl. No. 13/678,539, dated Jul. 1, 2014.
Notice of Allowance for U.S. Appl. No. 14/231,413, dated Jul. 18, 2014.
Notice of Allowance for U.S. Appl. No. 13/590,044, dated Jul. 23, 2014.
Restriction Requirement for U.S. Appl. No. 13/833,067, dated Jul. 11, 2014.
Notice of Allowance for U.S. Appl. No. 13/954,831, dated Aug. 4, 2014.
Restriction Requirement for U.S. Appl. No. 13/678,544, dated Aug. 1, 2014.
Notice of Allowance for U.S. Appl. No. 13/761,097, dated Jul. 25, 2014.
Ex parte Quayle for U.S. Appl. No. 13/761,057, mailed Aug. 8, 2014.
Final Office Action for U.S. Appl. No. 13/314,444, dated May 14, 2014.

(56) References Cited

OTHER PUBLICATIONS

Corrected Notice of Allowability for U.S. Appl. No. 13/288,843, dated Aug. 19, 2014.
Office Action for U.S. Appl. No. 13/590,049, dated Aug. 29, 2014.
Ex Parte Quayle for U.S. Appl. No. 13/590,047, mailed Aug. 29, 2014.
Ex Parte Quayle for U.S. Appl. No. 13/590,050, mailed Sep. 3, 2014.
Office Action for U.S. Appl. No. 13/678,544, dated Sep. 12, 2014.
Office Action for U.S. Appl. No. 13/678,539, dated Sep. 10, 2014.
Notice of Allowance for U.S. Appl. No. 13/288,843, dated Sep. 18, 2014.
Notice of Allowance for U.S. Appl. No. 13/761,057, dated Sep. 26, 2014.
Notice of Allowance for U.S. Appl. No. 13/833,044, dated Sep. 24, 2014.
Notice of Allowance for U.S. Appl. No. 13/314,444, dated Sep. 24, 2014.
Office Action for U.S. Appl. No. 13/761,045, dated Sep. 30, 2014.
Notice of Allowance for U.S. Appl. No. 13/835,308, dated Oct. 10, 2014.
Notice of Allowance for U.S. Appl. No. 13/571,797, dated Oct. 14, 2014.
Office Action for U.S. Appl. No. 13/833,067, dated Oct. 20, 2014.
Notice ofAllowance for U.S. Appl. No. 14/085,228, dated Oct. 23, 2014.
Office Action for U.S. Appl. No. 13/842,824, dated Oct. 29, 2014.
Herner et al., "Vertical p-i-n Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, dated Nov. 25, 2014.
Notice of Allowance for U.S. Appl. No. 13/590,047, dated Nov. 24, 2014.
Office Action for U.S. Appl. No. 13/590,044, dated Dec. 9, 2014.
Notice of Allowance for U.S. Appl. No. 13/590,050, dated Dec. 18, 2014.
Office Action for U.S. Appl. No. 14/042,392, dated Dec. 31, 2014.
Office Action for U.S. Appl. No. 14/071,957, dated Dec. 29, 2014.
International Search Report and Written Opinion for International Patent Application No. PCT/US/2014/056676, dated Dec. 19, 2014.
Office Action for U.S. Appl. No. 14/493,083, dated Jan. 8, 2015.
Office Action for Chinese Patent Application No. 2011102443903, dated Dec. 16, 2014 (with translation).
Notice of Allowance for U.S. Appl. No. 13/970,562, dated Jan. 23, 2015.
Notice of Allowance for U.S. Appl. No. 14/493,069, dated Feb. 17, 2015.
Notice of Allowance for U.S. Appl. No. 14/085,228, dated Feb. 18, 2015.
Notice of Allowance for U.S. Appl. No. 13/761,045, dated Feb. 18, 2015.
Notice of Allowance for U.S. Appl. No. 14/231,404, dated Jan. 22, 2015.
Notice of Allowance for U.S. Appl. No. 14/021,990, dated Dec. 9, 2014.
Final Office Action for U.S. Appl. No. 13/678,544, dated Feb. 15, 2015.
Office Action for U.S. Appl. No. 14/101,125, dated Mar. 6, 2015.
Hassan, "Argument for anti-fuse non-volatile memory in 28nm high-k metal gate", Feb. 15, 2011, www1.eeetimes.com publication.
Office Action for U.S. Appl. No. 13/026,783, dated Mar. 5, 2015.
Final Office Action for U.S. Appl. No. 13/678,539, dated Apr. 1, 2015.
Office Action for U.S. Appl. No. 14/636,155, dated Apr. 10, 2015.
Notice of Allowance for U.S. Appl. No. 14/021,990, dated Apr. 14, 2015.
Notice of Allowance for U.S. Appl. No. 13/842,824, dated Apr. 14, 2015.
Notice of Allowance for U.S. Appl. No. 14/071,957, dated Apr. 14, 2014.
Notice of Allowance for U.S. Appl. No. 14/231,404, dated Apr. 17, 2015.
Notice of Allowance for U.S. Appl. No. 13/590,444, dated May 12, 2015.
Notice of Allowance for U.S. Appl. No. 13/072,783, dated May 13, 2015.
Notice of Allowance for U.S. Appl. No. 13/833,067, dated Jun. 5, 2015.
Office Action for U.S. Appl. No. 13/314,444, dated Dec. 10, 2014.
Final Office Action for U.S. Appl. No. 13/026,783, dated Jul. 30, 2015.
Notice of Allowance for U.S. Appl. No. 14/553,874, dated Aug. 10, 2015.
Office Action for U.S. Appl. No. 14/500,743, dated Aug. 17, 2015.
Notice of Allowance for U.S. Appl. No. 14/042,392, dated Aug. 21, 2015.
Office Action for U.S. Appl. No. 14/485,696, dated Aug. 20, 2015.
Notice of Allowance for U.S. Appl. No. 14/493,083, dated Aug. 27, 2015.
Office Action for U.S. Appl. No. 13/678,539, dated Sep. 16, 2015.
Office Action for U.S. Appl. No. 14/507,691, dated Oct. 30, 2015.
Final Office Action for U.S. Appl. No. 14/101,125, dated Nov. 17, 2015.
Notice of Allowance for U.S. Appl. No. 13/072,783, dated Oct. 27, 2015.
Office Action for U.S. Appl. No. 14/792,479, dated Aug. 28, 2015.
Notice of Allowance for U.S. Appl. No. 14/500,743, dated Dec. 2, 2015.
Notice of Allowance for U.S. Appl. No. 14/636,155, dated Dec. 4, 2015.
Notice of Allowance for U.S. Appl. No. 14/071,957, dated Dec. 4, 2015.
Notice of Allowance for U.S. Appl. No. 13/678,544, dated Feb. 12, 2016.
Office Action for U.S. Appl. No. 14/749,392, dated Feb. 25, 2016.
Office Action for U.S. Appl. No. 14/940,012, dated Feb. 26, 2016.
Notice of Allowance for U.S. Appl. No. 14/485,698, dated Mar. 1, 2016.
Notice of Allowance for U.S. Appl. No. 14/507,691, dated Mar. 15, 2016.
Final Office Action for U.S. Appl. No. 13/314,444, dated Dec. 8, 2011.
Final Office Action for U.S. Appl. No. 13/678,539, dated Apr. 8, 2016.
Notice of Allowance for U.S. Appl. No. 14/545,775, dated Apr. 12, 2016.
Final Office Action for U.S. Appl. No. 14/101,125, dated Apr. 21, 2016.
Notice of Allowance for U.S. Appl. No. 14/500,743, dated Apr. 26, 2016.
Notice of Allowance for U.S. Appl. No. 14/749,392, dated Jun. 27, 2016.
Notice of Allowance for U.S. Appl. No. 14/940,012, dated Jul. 15, 2016.
Office Action for U.S. Appl. No. 14/985,095, dated Jul. 21, 2016.
Notice of Allowance for U.S. Appl. No. 13/314,444, dated Aug. 5, 2016.
Notice of Allowance for U.S. Appl. No. 14/485,696, dated Sep. 21, 2016.
Notice of Allowance for U.S. Appl. No. 15/076,460, dated Dec. 5, 2016.
Final Office Action for U.S. Appl. No. 14/101,125, dated Dec. 14, 2016.
Office Action for U.S. Appl. No. 15/297,922, dated Dec. 23, 2016.
Office Action for U.S. Appl. No. 15/270,287, dated Dec. 23, 2016.
Final Office Action for U.S. Appl. No. 13/678,539, dated Feb. 8, 2017.
Notice of Allowance for U.S. Appl. No. 15/076,460, dated Mar. 15, 2017.
Office Action for U.S. Appl. No. 15/422,266, dated Mar. 17, 2017.
Office Action for U.S. Appl. No. 15/365,584, dated Apr. 21, 2017.

(56) References Cited

OTHER PUBLICATIONS

Notice of Allowance for U.S. Appl. No. 14/485,696, dated May 25, 2017.
Notice of Allowance for U.S. Appl. No. 14/101,125, dated Jul. 10, 2017.
Notice of Allowance for U.S. Appl. No. 15/076,460, dated Jul. 20, 2017.
Final Office Action for U.S. Appl. No. 14/485,698, dated Jul. 24, 2017.
Renewed Final Office Action for U.S. Appl. No. 14/485,698, dated Aug. 2, 2017.
Office Action for Taiwanese Patent Application No. 102145000, dated Jul. 7, 2017. (with translations).
Office Action for Chinese Patent Application No. 102610272 A, dated Jul. 10, 2017. (with translations).
Final Office Action for U.S. Appl. No. 15/422,266, dated Sep. 12, 2017.
Notice of Allowance for U.S. Appl. No. 15/365,584, dated Sep. 13, 2017.
Notice of Allowance for U.S. Appl. No. 14/485,698, dated Oct. 16, 2017.
Final Office Action for U.S. Appl. No. 15/422,266, dated Jan. 22, 2018.
Notice of Allowance for U.S. Appl. No. 14/485,698, dated Feb. 15, 2018.
Extended Search Report for EP Application No. 14901820, dated Jun. 23, 2017.
Office Action for U.S. Appl. No. 15/884,362, dated May 4, 2018.
Extended European Search Report for EP Application No. 18151106.4, dated Apr. 6, 2018.
Tonti, "Reliability, design qualification, and prognostic opportunity of in due E-Fuse" Prognostics and Heath Management IEEE Conference Jun. 20, 2011, pp. 1-7.
Officce Action for U.S. Appl. No. 15/805,109, dated May 29, 2018.
Office Action for U.S. Appl. No. 14/485,698, dated Jun. 21, 2018.

\* cited by examiner

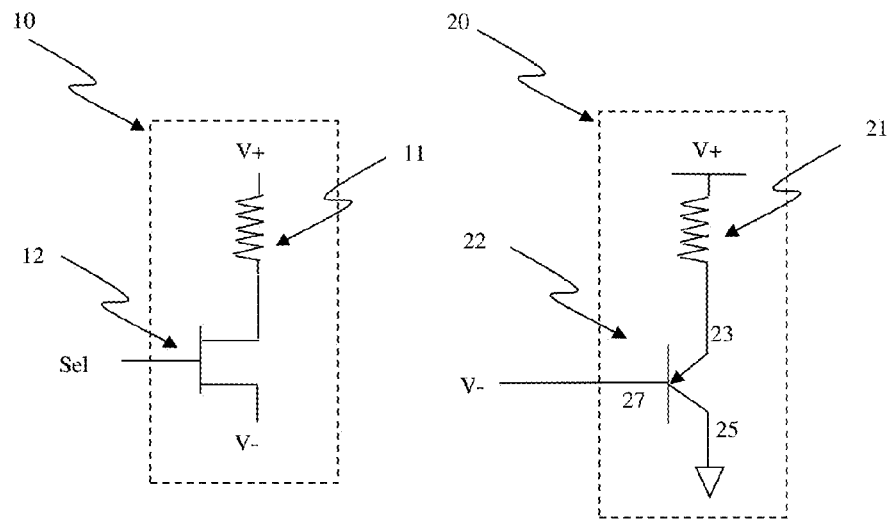
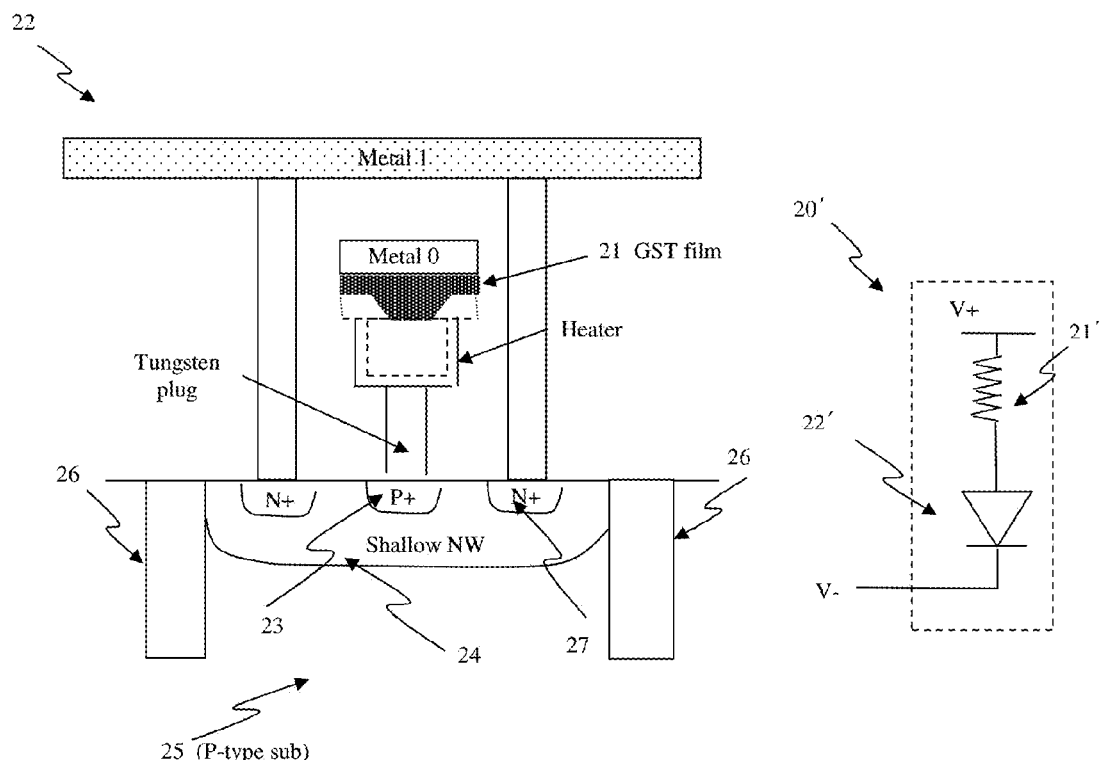
FIG. 1 (prior art)    FIG. 2(a) (prior art)
FIG. 2(b) (prior art)    FIG. 2(c) (prior art)

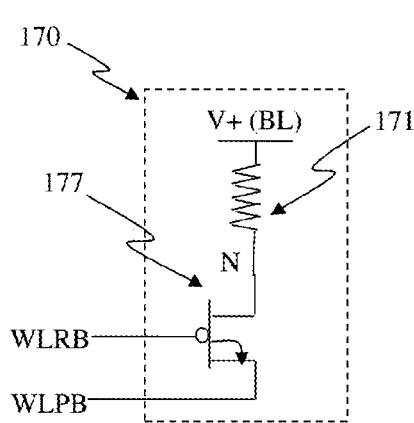
FIG. 6(c4)
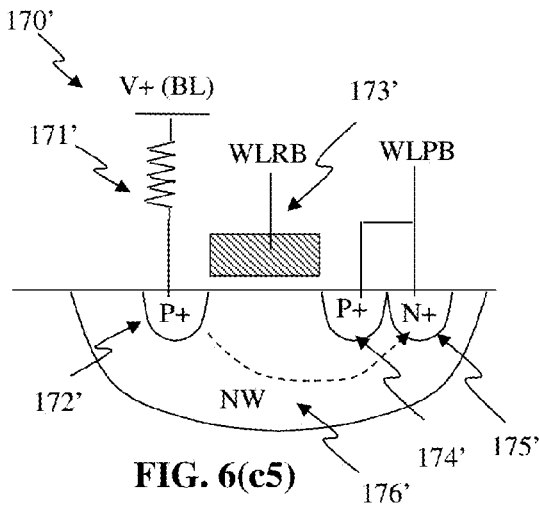
FIG. 6(c5)
|  | Program by diode | | | Read by diode | |
|---|---|---|---|---|---|
|  | Select | Deselect |  | Select | Deselect |
| WLRB | VDDP/0 | VDDP |  | VDD/0 | VDD |
| WLPB | 0 | VDDP |  | 0 | VDD |
FIG. 6(c6)
|  | Program by MOS | | | Read by MOS | |
|---|---|---|---|---|---|
|  | Select | Deselect |  | Select | Deselect |
| WLRB | 0 | VDDP |  | 0 | VDD |
| WLPB | VDDP | VDDP |  | VDD | VDD |
FIG. 6(c7)
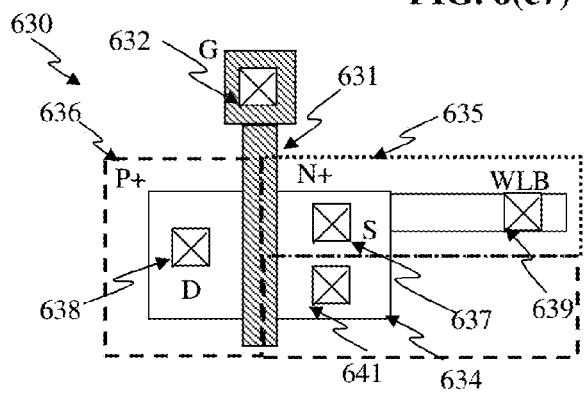
FIG. 6(c8)
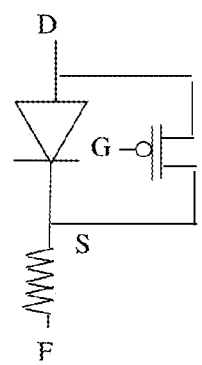
FIG. 6(c8a)

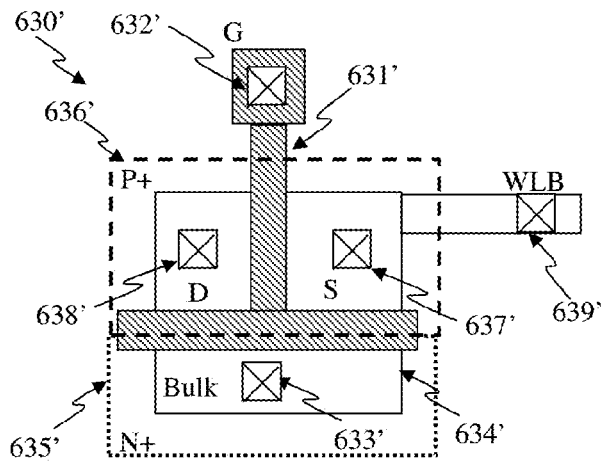
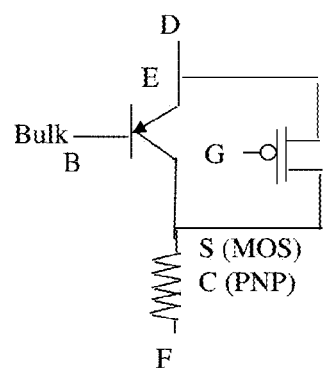
FIG. 6(c9)  FIG. 6(c9a)
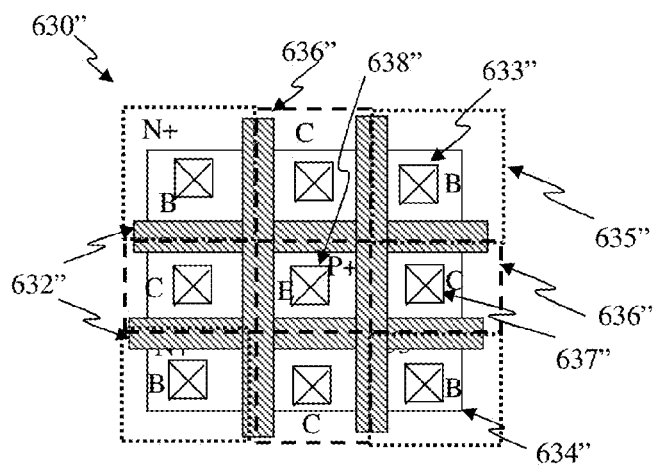
FIG. 6(c9b)
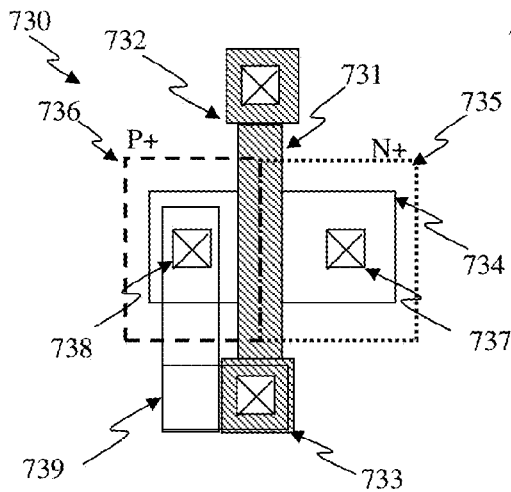
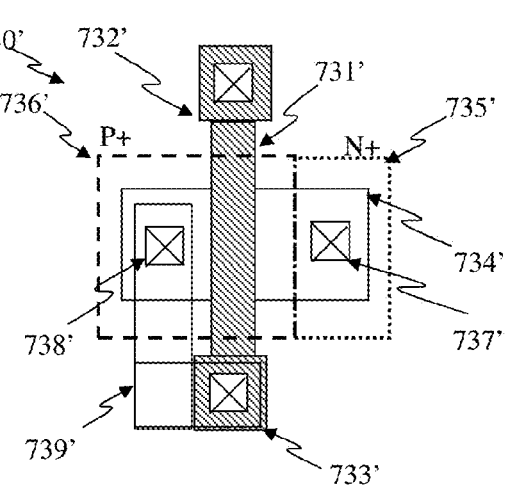
FIG. 6(d1)  FIG. 6(d2)

| Mode | 1st active region | 2nd active region | Comment |
|---|---|---|---|
| MOS | P+ implant | P+ implant | Both P+ implant |
| MOS/diode | N+ and P+ implant | P+ implant | P+ overlaps into 1st active |
| Dummy-gate diode | N+ implant | P+ implant | N+ for 1st, P+ for 2nd active |
| Schottky diode | N+ implant | No P+, No N+ | No N+/P+ implant for 2nd |
FIG. 7(i9)
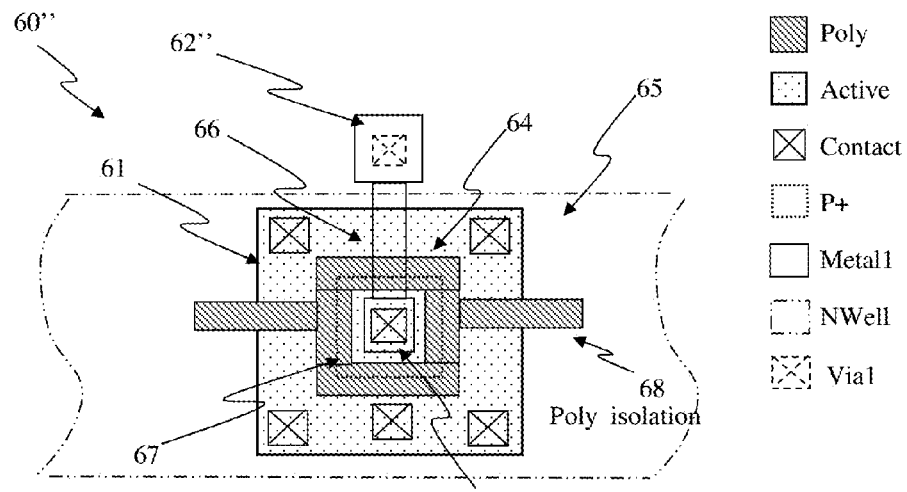
FIG. 8(a)
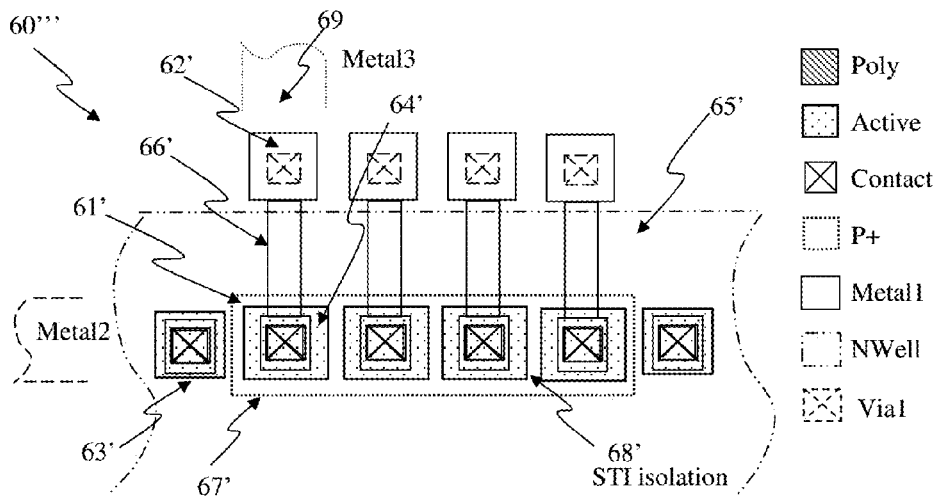
FIG. 8(b)

Cross section of fuse

▨ Polysilicon

☐ silicide

| Condition1 | BL0=H | BL1=L |  | Condition 2 | BL0=Z | BL1=L |
|---|---|---|---|---|---|---|
| WL0N=H/Z | X | 1 |  | WL0N=H/L/Z | X | 1 |
| WL0P=H |  |  |  | WL0P=H |  |  |
| WL1N=H/Z | X | X |  | WL1N=H/L/Z | X | X |
| WL1P=L/Z |  |  |  | WL1P=L/Z |  |  |

| Condition1 | BL0=L | BL1=H | | Condition 2 | BL0=Z | BL1=H |
|---|---|---|---|---|---|---|
| WL0N=L | X | 0 | | WL0N=L | X | 0 |
| WL0P=L/Z | | | | WL0P=H/L/Z | | |
| WL1N=H/Z | X | X | | WL1N=H/Z | X | X |
| WL1P=L/Z | | | | WL1P=H/L/Z | | |

FIG. 18(a)        FIG. 18(b)

OTP MEMORY WITH HIGH DATA SECURITY

CROSS-REFERENCE TO RELATED APPLICATIONS

This application claims priority benefit of U.S. Provisional Patent Application No. 62/462,351, filed on Feb. 22, 2017 and entitled "One-Time Programmable Memory," which is hereby incorporated herein by reference.

This application is also a continuation-in-part of U.S. patent application Ser. No. 15/422,266, filed on Feb. 1, 2017 and entitled "Method and Structure for Reliable Electrical Fuse Programming," which is hereby incorporated herein by reference, which is a continuation of U.S. patent application Ser. No. 14/485,696, filed on Sep. 13, 2014 and entitled "Method and Structure for Reliable Electrical Fuse Programming," which is a continuation-in-part of U.S. patent application Ser. No. 13/835,308, filed on Mar. 15, 2013 and entitled "Circuit and System of Using Junction Diode as Program Selector for One-Time Programmable Devices," which is a continuation of U.S. patent application Ser. No. 13/471,704, filed on May 15, 2012 and entitled "Circuit and System of Using Junction Diode as Program Selector for One-Time Programmable Devices," which is hereby incorporated herein by reference, and which claims priority benefit of U.S. Provisional Patent Application No. 61/609,353, filed on Mar. 11, 2012 and entitled "Circuit and System of Using Junction Diode as Program Selector for One-Time Programmable Devices," which is hereby incorporated herein by reference.

The prior application of U.S. patent application Ser. No. 14/485,696 claims priority benefit of U.S. Provisional Patent Application No. 61/981,212, filed on Apr. 18, 2014 and entitled "Circuit and System of Using Junction Diode or Channel of MOS as Program Selector for Programmable Resistive Devices," which is hereby incorporated herein by reference.

The prior application of U.S. patent application Ser. No. 14/485,696 claims priority benefit of U.S. Provisional Patent Application No. 61/880,916, filed on Sep. 21, 2013 and entitled "Circuit and System of Using Junction Diode as Program Selector for Electrical Fuses with Extended Area for One-Time Programmable Devices," which is hereby incorporated herein by reference.

The prior application U.S. patent application Ser. No. 13/471,704 is a continuation-in-part of U.S. patent application Ser. No. 13/026,752, filed on Feb. 14, 2011 and entitled "Circuit and System of Using Junction Diode as Program Selector for One-Time Programmable Devices," which is hereby incorporated herein by reference, and which claims priority benefit of (i) U.S. Provisional Patent Application No. 61/375,653, filed on Aug. 20, 2010 and entitled "Circuit and System of Using Junction Diode As Program Selector for Resistive Devices in CMOS Logic Processes," which is hereby incorporated herein by reference; and (ii) U.S. Provisional Patent Application No. 61/375,660, filed on Aug. 20, 2010 and entitled "Circuit and System of Using Polysilicon Diode As Program Selector for Resistive Devices in CMOS Logic Processes," which is hereby incorporated herein by reference.

The prior application U.S. patent application Ser. No. 13/471,704 is a continuation-in-part of U.S. patent application Ser. No. 13/026,656, filed on Feb. 14, 2011 and entitled "Circuit and System of Using Polysilicon Diode As Program Selector for One-Time Programmable Devices," which claims priority benefit of (i) U.S. Provisional Patent Application No. 61/375,653, filed on Aug. 20, 2010 and entitled "Circuit and System of Using Junction Diode As Program Selector for Resistive Devices in CMOS Logic Processes," which is hereby incorporated herein by reference; and (ii) U.S. Provisional Patent Application No. 61/375,660, filed on Aug. 20, 2010 and entitled "Circuit and System of Using Polysilicon Diode As Program Selector for Resistive Devices in CMOS Logic Processes," which is hereby incorporated herein by reference.

The prior application of U.S. patent application Ser. No. 14/485,696 is a continuation-in-part of U.S. patent application Ser. No. 13/842,824, filed on Mar. 15, 2013 and entitled "Circuit and System of Using Junction Diode as Program Selector for One-Time Programmable Devices with Heat Sink," which is hereby incorporated herein by reference, which in turn is a continuation-in-part of U.S. patent application Ser. No. 13/471,704, filed on May 15, 2012 and entitled "Circuit and System of Using Junction Diode as Program Selector for One-Time Programmable Devices," which is hereby incorporated herein by reference, and which claims priority benefit of U.S. Provisional Patent Application No. 61/609,353, filed on Mar. 11, 2012 and entitled "Circuit and System of Using Junction Diode as Program Selector for One-Time Programmable Devices," which is hereby incorporated herein by reference.

The prior application U.S. patent application Ser. No. 13/842,824 claims priority benefit of: (i) U.S. Provisional Patent Application No. 61/728,240, filed on Nov. 20, 2012 and entitled "Circuit and System of Using Junction Diode as Program Selector for One-Time Programmable Devices with Heat Sink," which is hereby incorporated herein by reference; (ii) U.S. Provisional Patent Application No. 61/668,031, filed on Jul. 5, 2012 and entitled "Circuit and System of Using Junction Diode as Program Selector and MOS as Read Selector for One-Time Programmable Devices," which is hereby incorporated herein by reference; and (iii) U.S. Provisional Patent Application No. 61/684,800, filed on Aug. 19, 2012 and entitled "Circuit and System of Using Junction Diode as Program Selector for Metal Fuses for One-Time Programmable Devices," which is hereby incorporated herein by reference.

The prior application of U.S. patent application Ser. No. 14/485,696 is a continuation-in-part of U.S. patent application Ser. No. 13/970,562, filed on Aug. 19, 2013 and entitled "Circuit and System of Using Junction Diode as Program Selector for Metal Fuses for One-Time Programmable Devices," which is hereby incorporated herein by reference, which in turn is a continuation-in-part of U.S. patent application Ser. No. 13/471,704, filed on May 15, 2012 and entitled "Circuit and System of Using Junction Diode as Program Selector for One-Time Programmable Devices," which is hereby incorporated herein by reference, and which claims priority benefit of U.S. Provisional Patent Application No. 61/609,353, filed on Mar. 11, 2012 and entitled "Circuit and System of Using Junction Diode as Program Selector for One-Time Programmable Devices," which is hereby incorporated herein by reference.

This prior application U.S. patent application Ser. No. 13/970,562 claims priority benefit of: (i) U.S. Provisional Patent Application No. 61/684,800, filed on Aug. 19, 2012 and entitled "Circuit and System of Using Junction Diode as Program Selector for Metal Fuses for One-Time Programmable Devices," which is hereby incorporated herein by reference; and (ii) U.S. Provisional Patent Application No. 61/728,240, filed on Nov. 20, 2012 and entitled "Circuit and System of Using Junction Diode as Program Selector for One-Time Programmable Devices with Heat Sink," which is hereby incorporated herein by reference.

This application is also a continuation-in-part of U.S. patent application Ser. No. 14/101,125, filed on Dec. 9, 2013 and entitled "Programmable Resistive Device and Method using Diode as Selector," which is hereby incorporated herein by reference, which claims priority benefit of (i) U.S. Provisional Patent Application No. 61/734,945, filed on Dec. 7, 2012 and entitled "Circuit and System of 3D Programmable Resistive Device and Memory using Diode as Selector," which is hereby incorporated herein by reference; and (ii) U.S. Provisional Patent Application No. 61/880,916, filed on Sep. 21, 2013 and entitled "Circuit and System of Using Junction Diode as Program Selector for Electrical Fuses with Extended Area for One-time Programmable Devices," which is hereby incorporated herein by reference.

This application is also a continuation-in-part of U.S. patent application Ser. No. 15/076,460, filed on Mar. 21, 2016 and entitled "Integrated OTP Memory for Providing MTP Memory," which is hereby incorporated herein by reference, which claims priority benefit of U.S. Provisional Patent Application No. 62/136,608, filed on Mar. 22, 2015, and title "System and Method of an Integrated OTP for MTP Memory," which is hereby incorporated herein by reference.

BACKGROUND OF THE INVENTION

A programmable resistive device is generally referred to a device's resistance states that may change after means of programming. Resistance states can also be determined by resistance values. For example, a resistive device can be a One-Time Programmable (OTP) device, such as an electrical fuse, and the programming means can apply a high voltage to induce a high current to flow through the OTP element. When a high current flows through an OTP element by turning on a program selector, the OTP element can be programmed, or burned into a high or low resistance state (depending on either fuse or anti-fuse). The programmable resistive device can also be referred to those devices that can be programmed into another state reversible and repetitively, such as PCM, RRAM, or CBRAM, etc. The programmable resistive device can also be referred to those devices that can be programmed into another state by conductive current in opposite directions, such as bipolar RRAM, or MRAM, etc.

An electrical fuse is a common OTP which is a programmable resistive device that can be constructed from a segment of interconnect, such as polysilicon, silicided polysilicon, silicide, metal, metal alloy, or some combination thereof. The metal can be aluminum, copper, or other transition metals. One of the most commonly used electrical fuses is a CMOS gate, fabricated in silicided polysilicon, used as interconnect. The electrical fuse can also be one or more contacts or vias instead of a segment of interconnect. A high current may blow the contact(s) or via(s) into a very high resistance state. The electrical fuse can be an anti-fuse, where a high voltage makes the resistance lower, instead of higher. The anti-fuse can consist of one or more contacts or vias with an insulator in between. The anti-fuse can also be a CMOS gate coupled to a CMOS body with a thin gate oxide as insulator.

The programmable resistive device can be a reversible resistive device that can be programmed into a digital logic value "0" or "1" repetitively and reversibly. The programmable resistive device can be fabricated from phase change material, such as Germanium (Ge), Antimony (Sb), and Tellurium (Te) with composition $Ge_2Sb_2Te_5$ (GST-225) or GeSbTe-like materials including compositions of Indium (In), Tin (Sn), or Selenium (Se). Another phase change material can include a chalcogenide material such as AgInSbTe. The phase change material can be programmed into a high resistance amorphous state or a low resistance crystalline state by applying a short and high voltage pulse or a long and low voltage pulse, respectively.

Another type of reversible resistive device is a class of memory called Resistive RAM (RRAM), which is a normally insulating dielectric, but can be made conducting through filament, defects, metal migration, etc. The dielectric can be binary transition metal oxides such as NiO or TiO2, perovskite materials such as Sr(Zr)TiO3 or PCMO, organic charge transfer complexes such as CuTCNQ, or organic donor-acceptor systems such as Al AlDCN. As an example, RRAM can have cells fabricated from metal oxides between electrodes, such as Pt/NiO/Pt, TiN/TiOx/HfO2/TiN, TiN/ZnO/Pt, or W/TiN/SiO2/Si, etc. The resistance states can be changed reversibly and determined by polarity, magnitude, duration, voltage/current-limit, or the combinations thereof to generate or annihilate conductive filaments. Another programmable resistive device similar to RRAM is a Conductive Bridge RAM (CBRAM) that is based on electro-chemical deposition and removal of metal ions in a thin solid-state electrolyte film. The electrodes can be an oxidizable anode and an inert cathode and the electrolyte can be Ag- or Cu-doped chalcogenide glass such as GeSe, Cu2S, or GeS, etc. The resistance states can be changed reversibly and determined by polarity, magnitude, duration, voltage/current-limit, or combinations thereof to generate or annihilate conductive bridges. The programmable resistive device can also be an MRAM (Magnetic RAM) with cells fabricated from magnetic multi-layer stacks that construct a Magnetic Tunnel Junction (MTJ). In a Spin Transfer Torque MRAM (STT-MRAM) the direction of currents applied to an MTJ determines parallel or anti-parallel states, and hence low or high resistance states.

A conventional programmable resistive memory cell 10 is shown in FIG. 1. The cell 10 consists of a resistive element 11 and an NMOS program selector 12. The resistive element 11 is coupled to the drain of the NMOS 12 at one end, and to a high voltage V+ at the other end. The gate of the NMOS 12 is coupled to a select signal (Sel), and the source is coupled to a low voltage V−. When a high voltage is applied to V+ and a low voltage to V−, the resistive cell 10 can be programmed by raising the select signal (Sel) to turn on the NMOS 12. One of the most common resistive elements is a silicided polysilicon, the same material and fabricated at the same time as a MOS gate. The size of the NMOS 12, as program selector, needs to be large enough to deliver the required program current for a few microseconds. The program current for a silicided polysilicon is normally between a few milliamps for a fuse with width of 40 nm to about 20 mA for a fuse with width about 0.6 um. As a result, the cell size of an electrical fuse using silicided polysilicon tends to be very large. The resistive cell 10 can be organized as a two-dimensional array with all Sel's and V−'s in a row coupled as wordlines (WLs) and a ground line, respectively, and all V+'s in a column coupled as bitlines (BLs).

Another conventional programmable resistive device 20 for Phase Change Memory (PCM) is shown in FIG. 2(a). The PCM cell 20 has a phase change film 21 and a bipolar transistor 22 as program selector with P+ emitter 23, N base 27, and P sub collector 25. The phase change film 21 is coupled to the emitter 23 of the bipolar transistor 22 at one end, and to a high voltage V+ at the other end. The N type base 27 of bipolar transistor 22 is coupled to a low voltage V−.

The collector 25 is coupled to ground. By applying a proper voltage between V+ and V− for a proper duration of time, the phase change film 21 can be programmed into high or low resistance states, depending on voltage and duration. Conventionally, to program a phase-change memory to a high resistance state (or reset state) requires about 3V for 50 ns and consumes about 300 uA of current, or to program a phase-change memory to a low resistance state (or set state) requires about 2V for 300 ns and consumes about 100 uA of current.

FIG. 2(b) shows a cross section of a conventional bipolar transistor 22. The bipolar transistor 22 includes a P+ active region 23, a shallow N well 24, an N+ active region 27, a P type substrate 25, and a Shallow Trench Isolation (STI) 26 for device isolation. The P+ active region 23 and N+ active region 27 couple to the N well 24 are the P and N terminals of the emitter-base diode of the bipolar transistor 22, while the P type substrate 25 is the collector of the bipolar transistor 22. This cell configuration requires an N well 24 be shallower than the STI 26 to properly isolate cells from each other and needs 3-4 more masking steps over the standard CMOS logic processes which makes it more costly to fabricate.

Another programmable resistive device 20' for Phase Change Memory (PCM) is shown in FIG. 2(c). The PCM cell 20' has a phase change film 21' and a diode 22'. The phase change film 21' is coupled between an anode of the diode 22' and a high voltage V+. A cathode of the diode 22' is coupled to a low voltage V−. By applying a proper voltage between V+ and V− for a proper duration of time, the phase change film 21' can be programmed into high or low resistance states, depending on voltage and duration. The programmable resistive cell 20' can be organized as a two dimensional array with all V−'s in a row coupled as wordline bars (WLBs), and all V+'s in a column coupled as bitlines (BLs). As an example of use of a diode as program selector for each PCM cell as shown in FIG. 2(c), see Kwang-Jin Lee et al., "A 90 nm 1.8V 512 Mb Diode-Switch PRAM with 266 MB/s Read Throughput," International Solid-State Circuit Conference, 2007, pp. 472-273. Though this technology can reduce the PCM cell size to only $6.8F^2$ (F stands for feature size), the diode requires very complicated process steps, such as Selective Epitaxial Growth (SEG), to fabricate, which would be very costly for embedded PCM applications.

FIGS. 3(a) and 3(b) show several embodiments of an electrical fuse element 80 and 84, respectively, fabricated from an interconnect. The interconnect serves as a particular type of resistive element. The resistive element has three parts: anode, cathode, and body. The anode and cathode provide contacts for the resistive element to be connected to other parts of circuits so that a current can flow from the anode to cathode through the body. The body width determines the current density and hence the electro-migration threshold for a program current. FIG. 3(a) shows a conventional electrical fuse element 80 with an anode 81, a cathode 82, and a body 83. This embodiment has a large symmetrical anode and cathode. FIG. 3(b) shows another conventional electrical fuse element 84 with an anode 85, a cathode 86, and a body 87. This embodiment has an asymmetrical shape with a large anode and a small cathode to enhance the electro-migration effect based on polarity and reservoir effects. The polarity effect means that the electro-migration always starts from the cathode. The reservoir effect means that a smaller cathode makes electro-migration easier because the smaller area has lesser ions to replenish voids when the electro-migration occurs. The fuse elements 80, 84 in FIGS. 3(a) and 3(b) are relatively large structures which makes them unsuitable for some applications.

FIGS. 4(a) and 4(b) show programming a conventional MRAM cell 210 into parallel (or state 0) and anti-parallel (or state 1) by current directions. The MRAM cell 210 consists of a Magnetic Tunnel Junction (MTJ) 211 and an NMOS program selector 218. The MTJ 211 has multiple layers of ferromagnetic or anti-ferromagnetic stacks with metal oxide, such as $Al_2O_3$ or MgO, as an insulator in between. The MTJ 211 includes a free layer stack 212 on top and a fixed layer stack 213 underneath. By applying a proper current to the MTJ 211 with the program selector CMOS 218 turned on, the free layer stack 212 can be aligned into parallel or anti-parallel to the fixed layer stack 213 depending on the current flowing into or out of the fixed layer stack 213, respectively. Thus, the magnetic states can be programmed and the resultant states can be determined by resistance values, lower resistance for parallel and higher resistance for anti-parallel states. The resistances in state 0 or 1 are about 5KΩ or 10 KΩ, respectively, and the program currents are about +/−100-200 μA. One example of programming an MRAM cell is described in T. Kawahara, "2 Mb Spin-Transfer Torque RAM with Bit-by-Bit Bidirectional Current Write and Parallelizing-Direction Current Read," International Solid-State Circuit Conference, 2007, pp. 480-481.

SUMMARY

Embodiments of programmable resistive device cells using junction diodes as program selectors are disclosed. The programmable resistive devices can be fabricated using standard CMOS logic processes to reduce cell size and cost.

In one embodiment, a programmable resistive device and memory can use P+/N well diodes as program selectors, where the P and N terminals of the diode are P+ and N+ active regions residing in an N well. The same P+ and N+ active regions are used to create sources or drains of PMOS and NMOS devices, respectively. Advantageously, the same N well can be used to house PMOS in standard CMOS logic processes. By using P+/N well diodes in standard CMOS processes, a small cell size can be achieved, without incurring any special processing or masks. The junction diode can be constructed in N well or P well in bulk CMOS or can be constructed on isolated active regions in Silicon-On-Insulator (SOI) CMOS, FinFET bulk, FinFET SOI, or similar technologies. Thus, costs can be reduced substantially for variously applications, such as embedded applications.

In one embodiment, junction diodes can be fabricated with standard CMOS logic processes and can be used as program selectors for One-Time Programmable (OTP) devices. The OTP devices can include electrical fuses are programmable elements. Examples of electrical fuses include interconnect fuse, contact/via fuse, contact/via anti-fuse, gate-oxide breakdown anti-fuse, etc. The programmable resistive element can be built with heat sink or heat generator to dissipate heat or to generate heat to assist with programming of the programmable resistive element. If the programmable resistive element is an electrical fuse, the fuse element can be built with an extended area to assist with programming of the programmable resistive element. If a metal fuse is used as an electrical fuse, at least one contact and/or a plurality of vias can be built (possibly with use of one or more jumpers) in the program path to generate more Joule heat to assist with programming. The jumpers are conductive and can be formed of metal, metal gate, local interconnect, polymetal, etc. The OTP device can have at least one OTP element coupled to at least one diode in a memory cell. The diode can be constructed by P+ and N+ active regions in a CMOS N well, or on an isolated active region as the P and N terminals of the diode. The OTP element can be polysilicon, silicided polysilicon, silicide, polymetal, metal, metal alloy, local interconnect, thermally isolated active region, CMOS gate, or combination thereof.

The invention can be implemented in numerous ways, including as a method, system, device, or apparatus (including graphical user interface and computer readable medium). Several embodiments of the invention are discussed below.

As a One-Time Programmable (OTP) memory, one embodiment can, for example, include at least a plurality of OTP cells. At least one of the OTP cells can include at least: an OTP element including at least an electrical fuse coupled to a first supply voltage line; and a program selector coupled to the OTP element and to a second supply voltage line. At least a portion of the electrical fuse can have at least one extended area that has reduced or substantially no current flowing therethrough. The OTP element can be configured to be programmable by applying voltages to the first and second supply voltage lines and by turning on the program selector to thereby change the OTP element into a different logic state.

As an electronics system, one embodiment can, for example, include at least: a processor, and an One-Time Programmable (OTP) memory operatively connected to the processor. The OTP memory includes a plurality of OTP cells, and at least one of the OTP cells includes at least: an OTP element including at least one electrical fuse operatively coupled to a first supply voltage line, and a program selector coupled to the OTP element and to a second supply voltage line. At least a portion of the electrical fuse can have at least one extended area that has reduced current or substantially no current flowing therethrough. The OTP element can be configured to be programmable by applying voltages to the first and second supply voltage lines by turning on the program selector and thereby change the OTP element into a different logic state.

As a method for operating an OTP memory, one embodiment can, for example, include at least: providing a plurality of OTP cells, at least one of the OTP cells includes at least (i) an OTP element including at least one electrical fuse coupled to a first supply voltage line, (ii) a program selector coupled to the OTP element and to a second supply voltage line, and (iii) at least one portion of the electrical fuse having an extended area that has reduced current or substantially no current flow therethrough; and one-time programming a logic state into the at least one of the OTP cells by applying voltage to the first and the second voltage lines and by turning on the program selector.

As a One-Time Programmable (OTP) memory, one embodiment can, for example, include at least a plurality of OTP cells. At least one of the OTP cells can include at least: an OTP element including at least a programmable resistive element coupled to a first supply voltage line, and a program selector coupled to the programmable resistive element and to a second supply voltage line. At least a portion of the programmable resistive element can have at least one extended area that has reduced or substantially no current flowing therethrough. The programmable resistive element can be configured to be programmable by applying voltages to the first and second supply voltage lines and by turning on the program selector to thereby change the programmable resistive element into a different logic state.

BRIEF DESCRIPTION OF THE DRAWINGS

The present invention will be readily understood by the following detailed descriptions in conjunction with the accompanying drawings, wherein like reference numerals designate like structural elements, and in which:

FIG. 1 shows a conventional programmable resistive memory cell.

FIG. 2(a) shows another conventional programmable resistive device for Phase Change Memory (PCM) using bipolar transistor as program selector.

FIG. 2(b) shows a cross section of a conventional Phase Change Memory (PCM) using bipolar transistor as program selector.

FIG. 2(c) shows another conventional Phase Change Memory (PCM) cell using diode as program selector.

FIG. 5(a1a) shows a scanning electronic microscope (SEM) photo of electrical fuses with some programmed below a critical current according to one embodiment.

FIG. 5(a1b) shows a typical cell current distribution of programming electrical fuses.

FIG. 5(a1c) shows a cell current distribution by programming cells lightly to enhance data security according to one embodiment.

FIG. 5(a1d) shows a cell current distribution by programming "unprogrammed" cells lightly to enhance data security according to another embodiment.

FIG. 5(a1e) shows an address map where about enhancing data security can be applied to only a few lines of code and still be very effective.

FIG. 5(a1f) shows a block diagram of scramble the program pad VDDP current to prevent cell current from be detected according to one embodiment.

FIG. 5(a2a) shows a portion of a block diagram of using a voltage regulator to limit an OTP internal program voltage supply according to one embodiment.

FIG. 5(a2b) shows a portion of a block diagram of using a current regulator to limit an OTP programming current according to another embodiment.

FIG. 5(a2c) shows a portion of a block diagram of an OTP macro to illustrate low-voltage concurrent program and read.

FIG. 6(a2) shows a top view of junction diodes as program selector with Silicide Block Layer (SBL) isolation in SOI or similar technologies according to one embodiment FIG. 6(*a*3) shows a top view of a programmable resistive cell having a resistive element and a diode as program selector in one piece of an isolated active region with dummy gate isolation in the two terminals of the diode, according to one embodiment.

FIG. 6(*a*4) shows a top view of a programmable resistive cell having a resistive element with a diode as program selector in one piece of an isolated active region with SBL isolation in the two terminals of the diode, according to another embodiment FIG. 6(*a*5) shows a top view of a Schottky diode with STI isolation as a program selector according to one embodiment.

FIG. 6(*a*6) shows a top view of a Schottky diode with CMOS gate isolation as a program selector according to one embodiment.

FIG. 6(*a*7) shows a top view of a Schottky diode with Silicide Block Layer (SBL) isolation as a program selector according to one embodiment.

FIG. 6(*b*) shows a 3D view of junction diodes as program selector with dummy CMOS gate isolation in FINFET technologies according to one embodiment.

FIG. 6(*b*0*a*) shows a 3D view of fin structured used as an electrical fuse element in FinFET technologies according to one embodiment.

FIG. 6(*b*0*b*) shows a 3D view of an active-region fuse in advanced CMOS process according to another embodiment.

FIG. 6(*b*1*a*) shows a device cross section of building a channel diode in a gate-last process after polysilicon gate formation according to one embodiment.

FIG. 6(*b*1*b*) shows a device cross section of building a channel diode in a gate-last process after LDD implant according to one embodiment.

FIG. 6(*b*1*c*) shows a device cross section of building a channel diode in a gate-last process after spacer formation and source/drain implants according to one embodiment.

FIG. 6(*b*1*d*) shows a device cross section of building a channel diode in a gate-last process after polysilicon gate removed according to one embodiment.

FIG. 6(*b*1*e*) shows a device cross section of building a channel diode in a gate-last process after building replacement metal gate according to one embodiment.

FIG. 6(*c*01) shows a block diagram of a programmable resistive cell with a read selector in parallel to a selector for low voltage read, according to one embodiment.

FIG. 6(*c*02) shows a block diagram of a programmable resistive cell with a read selector in parallel to a MOS selector for low voltage read, according to another embodiment.

FIG. 6(*c*03) shows a block diagram of a programmable resistive cell with a read selector in parallel to a diode selector for low voltage read, according to yet another embodiment.

FIG. 6(*c*1) shows a schematic of a programmable resistive cell with a PMOS for low power applications according to one embodiment.

FIG. 6(*c*2) shows a schematic of a programmable resistive cell with a PMOS for low power applications according to another embodiment.

FIG. 6(*c*3) shows a schematic of a programmable resistive cell with an NMOS for low power applications according to another embodiment.

FIG. 6(*c*4) shows a schematic of a programmable resistive cell with a PMOS configured as diode or MOS during program or read according to one embodiment.

FIG. 6(*c*5) shows a cross section of a programmable resistive cell with a PMOS configured as diode or MOS during program or read, corresponding to the programmable resistive cell in FIG. 6(*c*4), according to one embodiment.

FIG. 6(*c*6) shows operation conditions of a programmable resistive cell with a PMOS configured as a diode for program and read selector, corresponding to the programmable resistive cell in FIG. 6(*c*4), according to one embodiment.

FIG. 6(*c*7) shows operation conditions of a programmable resistive cell with a PMOS configured as a MOS for program and read selector, corresponding to the programmable resistive cell in FIG. 6(*c*4), according to one embodiment.

FIG. 6(*c*8) shows a top view of a programmable resistive cell with a merged dummy-gate diode and a PMOS selector in an SOI technology according to one embodiment.

FIG. 6(*c*8*a*) shows a schematic of a programmable resistive cell with a merged dummy-gate diode and a PMOS selector in an SOI technology, corresponding to FIG. 6(*c*8), according to one embodiment.

FIG. 6(*c*9) shows a top view of a programmable resistive cell with a merged PNP bipolar and a PMOS selector in an SOI technology according to one embodiment.

FIG. 6(*c*9*a*) shows a schematic of a programmable resistive cell with a merged PNP bipolar and a PMOS selector in an SOI technology, corresponding to FIG. 6(*c*9), according to one embodiment.

FIG. 6(*c*9*b*) shows a top view of a planar bipolar device built in a CMOS process, corresponding to the PNP bipolar in FIG. 6(*c*9*a*), according to one embodiment.

FIG. 6(*d*1) shows a programmable resistive cell using a dummy gate of a program selector as a PRD element in a thermally insulated substrate, according to one embodiment.

FIG. 6(*d*2) shows a programmable resistive cell using a MOS gate of a program selector as a PRD element in a thermally insulated substrate, according to another embodiment.

FIG. 7(*a*1) shows an electrical fuse element with a small body and slightly tapered structures according to another embodiment.

FIG. 7(*a*2) shows an electrical fuse element using a thermally conductive but electrically insulated area near the anode as a heat sink according to another embodiment.

FIG. 7(*a*3) shows an electrical fuse element using a thinner oxide underneath the body and near the anode as a heat sink according to another embodiment.

FIG. 7(*a*3*a*) shows an electrical fuse element using thin oxide areas underneath the anode as heat sinks according to yet another embodiment.

FIG. 7(*a*3*b*) shows an electrical fuse element using a thin oxide area near to the anode as a heat sink according to yet another embodiment.

FIG. 7(*a*3*c*) shows an electrical fuse element using an extended anode as a heat sink according to yet another embodiment.

FIG. 7(*a*3*d*) shows an electrical fuse element using a high resistance area as a heat generator according to one embodiment.

FIG. 7(*a*3*e*) shows an electrical fuse element with an extended area in the cathode according to one embodiment.

FIG. 7(*a*3*f*) shows an electrical fuse element with an extended area in the cathode and a borderless contact in the anode according to one embodiment.

FIG. 7(*a*3*g*) shows an electrical fuse element with an extended area in the cathode and a shared contact in the anode according to one embodiment.

FIG. 7(*a*4) shows an electrical fuse element with at least one notch according to another embodiment.

FIG. 7(*a*5) shows an electrical fuse element with part NMOS metal gate and part PMOS metal gate according to another embodiment.

FIG. 7(*a*6) shows an electrical fuse element with a segment of polysilicon between two metal gates according to another embodiment.

FIG. 7(*a*7) shows a diode constructed from a polysilicon between two metal gates according to another embodiment.

FIG. 7(*a*8) shows a 3D perspective view of a metal fuse element constructed from a contact and a metal segment, according to one embodiment.

FIG. 7(*a*9) shows a 3D perspective view of a metal fuse element constructed from a contact, two vias, and segment(s) of metal 2 and metal 1, according to another embodiment.

FIG. 7(*a*10) shows a 3D perspective view of a metal fuse element constructed from three contacts, segment(s) of metal gate and metal 1 with an extension at one end, according to another embodiment.

FIG. 7(*a*11) shows a 3D perspective view of a metal fuse element constructed from three contacts, segments of metal gate and metal 1 with a hook shape at one end, according to another embodiment.

FIG. 7(*a*12) shows a 3D perspective view of a metal1 fuse element constructed from one contact and four vias (two via1 and two via2 ) according to another embodiment.

FIG. 7(*a*13) shows a 3D perspective view of a metal-gate fuse element in a FinFET technology according to yet another embodiment.

FIG. 7(*b*) shows a top view of an electrical fuse coupled to a junction diode with STI isolation in four sides, according to one embodiment.

FIG. 7(*c*) shows a top view of an electrical fuse coupled to a junction diode with dummy CMOS isolation in two sides, according to one embodiment.

FIG. 7(*d*) shows a top view of an electrical fuse coupled to a junction diode with dummy CMOS isolation in four sides, according to one embodiment.

FIG. 7(*e*) shows a top view of an electrical fuse coupled to a junction diode with Silicide Block Layer isolation in four sides, according to one embodiment.

FIG. 7(*f*) shows a top view of an abutted contact coupled between a resistive element, P terminal of a junction diode, and metal in a single contact, according to one embodiment.

FIG. 7(*g*) shows a top view of an electrical fuse coupled to a junction diode with dummy CMOS gate isolation between P+/N+ of a diode and adjacent cells, according to one embodiment.

FIG. 7(*h*) shows a top view of a programmable resistive cell coupled to a junction diode with dummy CMOS gate isolation between P+/N+ active regions, according to one embodiment.

FIG. 7(*i*1) shows a top view of a programmable resistive cell with a PMOS for low voltage operations according to one embodiment.

FIG. 7(*i*2) shows a top view of a programmable resistive cell with a PMOS for low voltage operations according to another embodiment.

FIG. 7(*i*3) shows a top view of a programmable resistive cell with a PMOS for low voltage operations according to yet another embodiment.

FIG. 7(*i*4) shows a top view of a programmable resistive cell with a PMOS for low voltage operations according to yet another embodiment.

FIG. 7(*i*5) shows a top view of a programmable resistive cell with a PMOS for low voltage operations according to yet another embodiment.

FIG. 7(*i*6) shows a top view of a programmable resistive cell with a PMOS and a shared contact for low voltage operations according to yet another embodiment.

FIG. 7(*i*7) shows a top view of 1×4 programmable resistive cells in a FinFET technology according to one embodiment.

FIG. 7(*i*8) shows a top view of 2×2 programmable resistive cells in a FinFET technology according to another embodiment.

FIG. 7(*i*8*a*) shows a top view of a 2×1 programmable resistive cells in a FinFET technology using a fin as a programmable resistive element according to one embodiment.

FIG. 7(*i*8*b*) shows a top view of a 2×1 programmable resistive cells in a FinFET technology using a fin as a programmable resistive element according to another embodiment.

FIG. 7(*i*9) shows a table for different operation modes of a selector according to one embodiment.

FIG. 8(*b*) shows a top view of a metal fuse coupled to a junction diode with 4 cells sharing one N well contact in each side according to one embodiment.

FIG. 8(*c*) shows a top view of a via1 fuse coupled to a junction diode with 4 cells sharing one N well contact in each side according to one embodiment.

FIG. 8(*d*) shows a top view of a two-dimensional array of via1 fuses using P+/N well diodes according to one embodiment.

FIG. 8(*e*1) shows a 3D perspective view of a contact/via fuse cell according to one embodiment.

FIG. 8(*e*2) shows various cross sections of a contact/via fuse element corresponding to the contact/fuse cell in FIG. 8(*e*1), according to one embodiment.

FIG. 9(*b*) shows a top view of a PCM cell using a P+/N well junction diode as program selector in accordance with one embodiment.

FIG. 11(*b*) shows another top view of an MRAM cell with an MTJ as a resistive element and with P+/N well diodes as program selectors in a shallow well CMOS process in accordance with another embodiment.

FIG. 12(*b*) shows alternative conditions to program the upper-right cell into 1 in a 2×2 MRAM array in accordance with one embodiment.

FIG. 13(*a*) shows one embodiment of a three-terminal 2×2 MRAM cell array using junction diodes as program selectors and the condition to program the upper-right cell into 0 in accordance with one embodiment.

FIG. 18(a) shows a schematic of a wordline driver circuit according to one embodiment.

FIG. 18(b) shows a schematic of a bitline circuit according to one embodiment.

FIG. 19(b) shows one embodiment of a schematic of an amplifier according to one embodiment.

FIG. 19(c) shows a timing diagram of the pre-amplifier and the amplifier in FIGS. 19(a) and 19(b), respectively.

FIG. 20(a) shows another embodiment of a pre-amplifier, similar to the pre-amplifier in FIG. 18(a).

FIG. 20(b) shows level shifters according to one embodiment.

FIG. 20(c) shows another embodiment of an amplifier with current-mirror loads.

FIG. 20(d) shows another embodiment of a pre-amplifier with two levels of PMOS pullup stacked so that all core devices can be used.

FIG. 20(e) shows another embodiment of a pre-amplifier with an activation device for enabling.

FIG. 21(a) depicts a method of programming a programmable resistive memory in a flow chart according to one embodiment.

FIG. 21(b) depicts a method of reading a programmable resistive memory in a flow chart according to one embodiment.

FIG. 21(c) depicts a method of reading a programmable resistive memory with MOS read selector in a flow chart according to one embodiment.

FIG. 21(d) depicts a programming method of randomizing OTP resistance in a flow chart according to one embodiment.

FIG. 21(e) depicts a programming method of reaching a desirable OTP resistance in a flow chart according to one embodiment.

Figure 22:
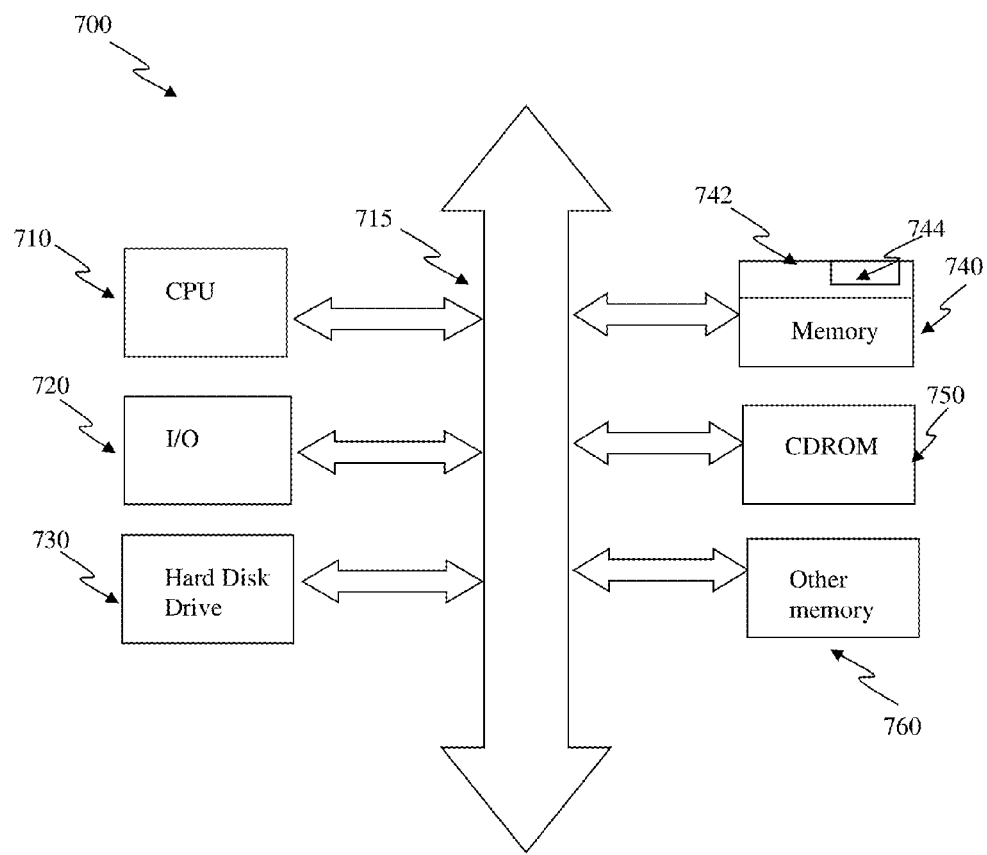

FIG. 22 shows a processor system according to one embodiment.

DETAILED DESCRIPTION OF EMBODIMENTS OF THE INVENTION

Embodiments disclosed herein use a P+/N well junction diode as program selector for a programmable resistive device. The diode can comprise P+ and N+ active regions on an N well. Since the P+ and N+ active regions and N well are readily available in standard CMOS logic processes, these devices can be formed in an efficient and cost effective manner. For standard Silicon-On-Insulator (SOI), FinFET, or similar technologies, isolated active regions can be used to construct diodes as program selectors or as programmable resistive elements. The programmable resistive device can also be included within an electronic system.

In one or more embodiments, junction diodes can be fabricated with standard CMOS logic processes and can be used as program selectors for One-Time Programmable (OTP) devices. The OTP devices can include electrical fuses are programmable elements. Examples of electrical fuses include interconnect fuse, contact/via fuse, contact/via anti-fuse, gate-oxide breakdown anti-fuse, etc. At least one heat sink, heat generator, or extended area can be built in a programmable resistive device (PRD) to assist programming. A heat sink can include at least one conductor built in or near to a PRD element to dissipate heat fast. A heat generator can include at least one high resistance material in the current path to generate more heat. An interconnect, a conductive jumper, a single or a plurality of contact or via can be used as a heat generator. An extended area is an area in the PRD element where there is reduced or no current flow through. If a metal fuse is used as an electrical fuse, at least one contact and/or a plurality of vias can be built (possibly with use of one or more jumpers) in the program path to generate more Joule heat to assist with programming. The jumpers are conductive and can be formed of metal, metal gate, local interconnect, polymetal, etc. The OTP device can have at least one OTP element coupled to at least one diode in a memory cell. The diode can be constructed by P+ and N+ active regions in a CMOS N well, or on an isolated active region as the P and N terminals of the diode. The OTP element can be polysilicon, silicided polysilicon, silicide, polymetal, metal, metal alloy, local interconnect, thermally isolated active region, CMOS gate, or combination thereof.

Embodiments of the invention are discussed below with reference to the figures. However, those skilled in the art will readily appreciate that the detailed description given herein with respect to these figures is for explanatory purposes as the invention extends beyond these limited embodiments.

Figures 3A, 3B:
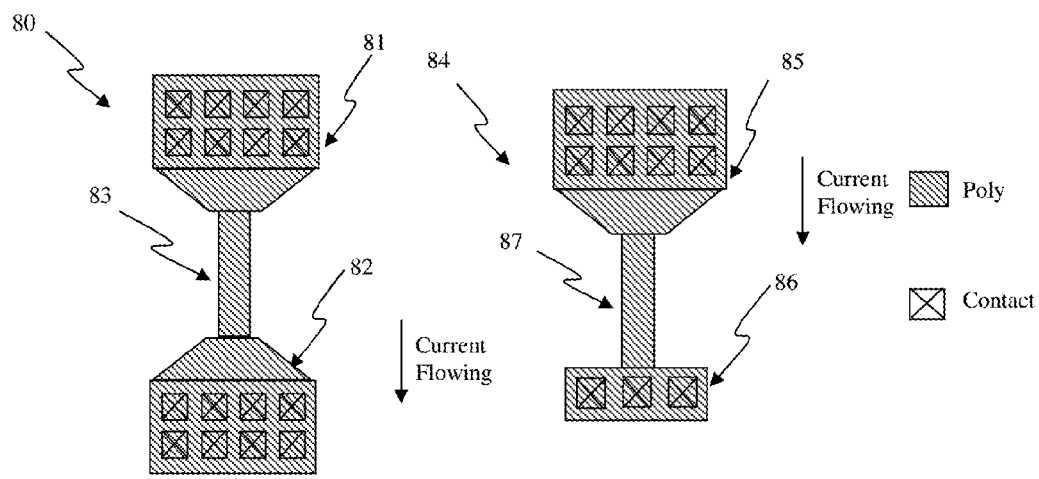
FIGS. 3(a) and 3(b) show several embodiments of an electrical fuse element, respectively, fabricated from an interconnect.
Figures 4A, 4B:
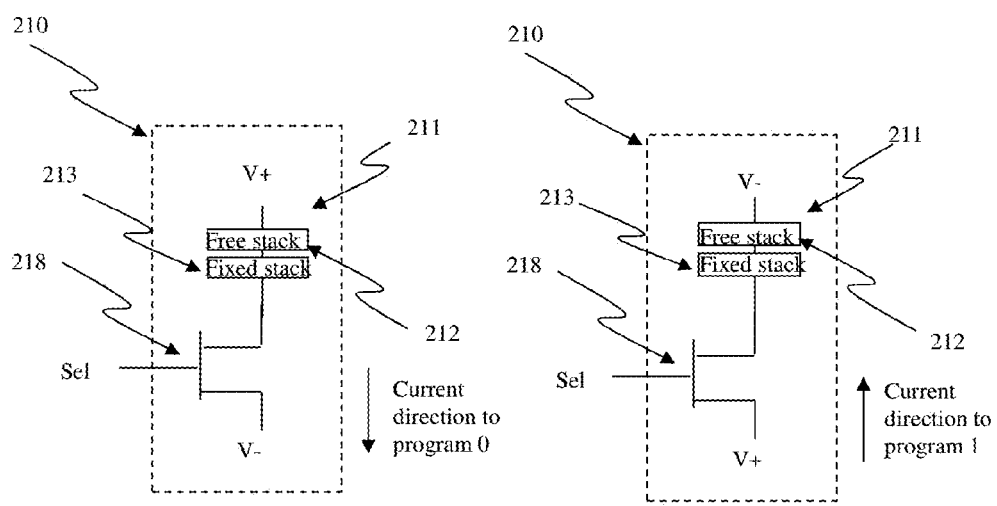
FIGS. 4(a) and 4(b) show programming a conventional MRAM cell into parallel (or state 0) and anti-parallel (or state 1) by current directions.
Figure 5A:
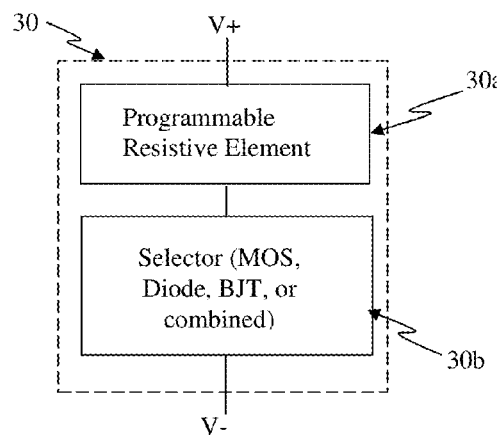
FIG. 5(a) shows a block diagram of a memory cell using a junction diode according to one embodiment.

FIG. 5(a) shows a block diagram of a memory cell 30 using at least a selector according to one embodiment. In particular, the memory cell 30 includes a resistive element 30a and a selector 30b. The resistive element 30a can be coupled between one terminal of the selector 30b and a high voltage V+. Another terminal of the selector 30b can be coupled to a low voltage V−. The selector 30b may have a third terminal in other embodiments to turn on the selector. In one implementation, the memory cell 30 can be a fuse cell with the resistive element 30a operating as an electrical fuse. The selector 30b can serve as a program or read selector. The selector can be constructed a MOS, diode, bipolar, or combined from a P+/N well in standard CMOS processes using a P type substrate or on an isolated active region in an SOI or FinFET technologies. If the selector is a diode, the P+ and N+ active regions served as the anode and cathode of the diode can be the sources or drains of CMOS devices. The N well is a CMOS well to house PMOS devices. Alternatively, the junction diode can be constructed from N+/P well in triple-well or CMOS processes using an N type substrate. The coupling of the resistive element 30a and the selector 30b between the supply voltages V+ and V− can be interchanged. By applying a proper voltage between V+ and V− for a proper duration of time, the resistive element 30a can be programmed into high or low resistance states, depending on voltage and duration, thereby programming the memory cell 30 to store a data value (e.g., bit of data). The P+ and N+ active regions of the diode can be isolated by using a dummy CMOS gate, Shallow Trench Isolation (STI) or Local Oxidation (LOCOS), or Silicide Block Layer (SBL).

Figure 5:
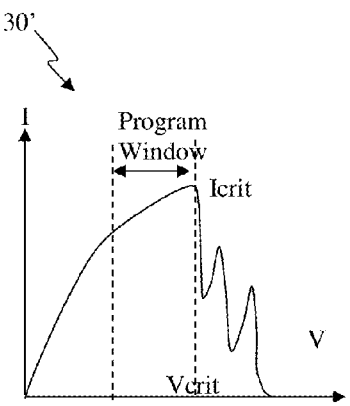
FIG. 5(a1) shows I-V characteristics of programming an electrical fuse reliably according to one embodiment.
Figure 5:
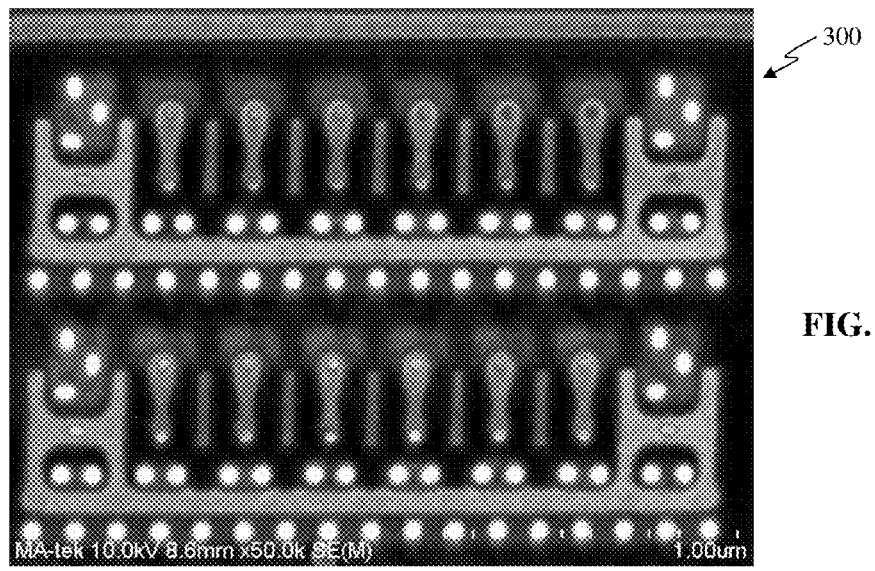
Figure 5:
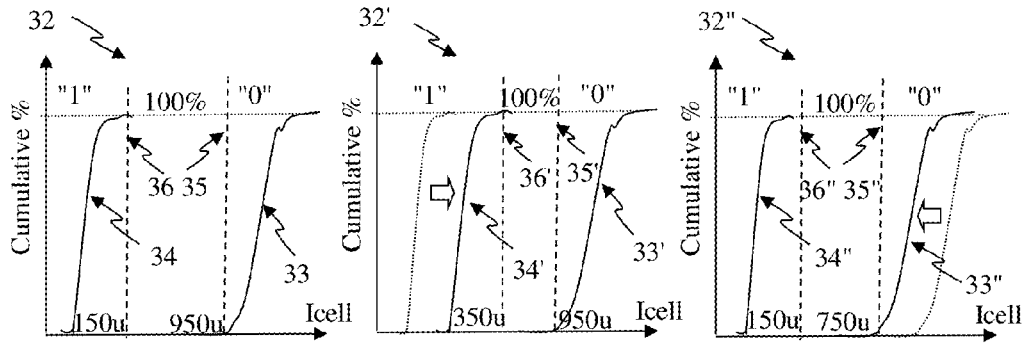
Figure 5:
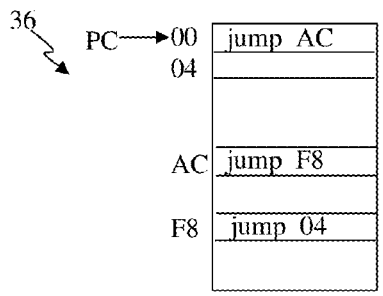
Figure 5:
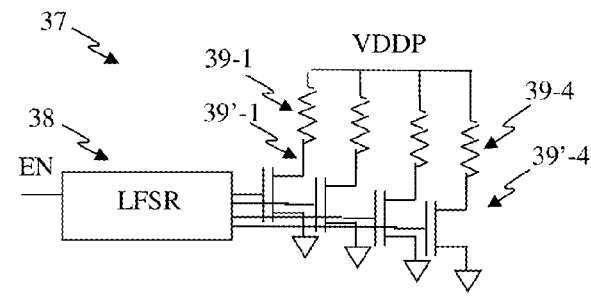
Figure 5:
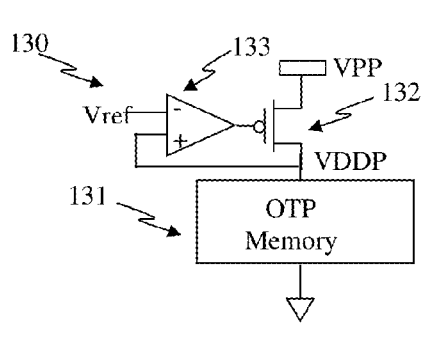
Figure 5:
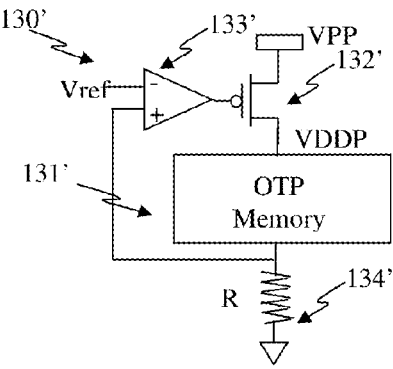
Figure 5:
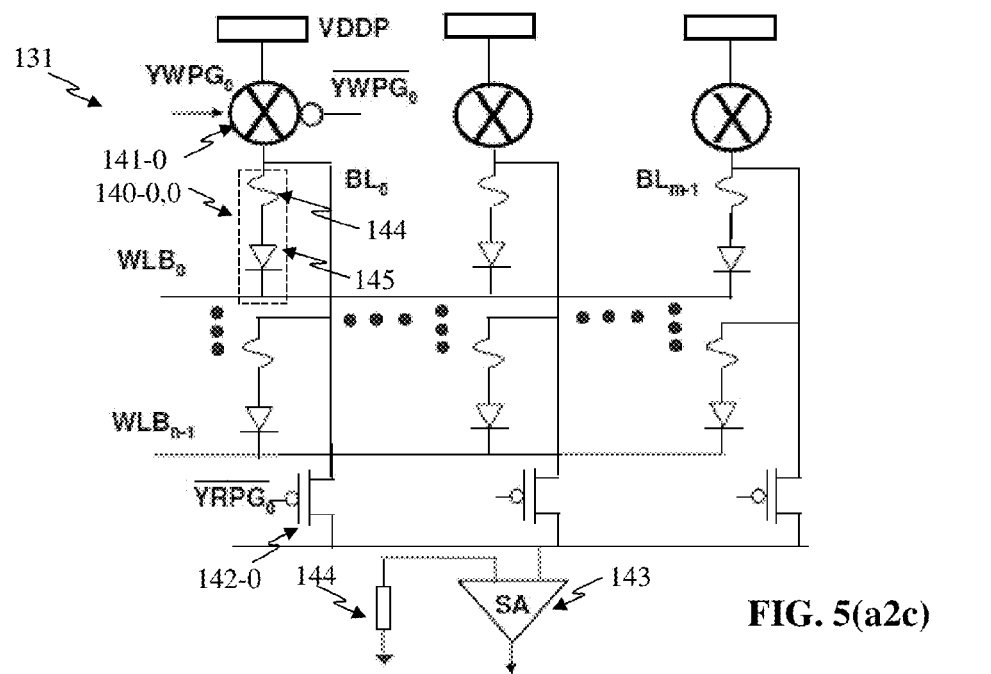

FIG. 5(a1) shows an I-V characteristic of programming a programmable resistive element, such as electrical fuse, according to one embodiment. The I-V characteristic shows a voltage applied to the electrical fuse in the X-axis and the responding current is shown in the Y-axis. When the current is very low, the slope of the curve is the inversion of the initial resistance. As the current is increased, the resistance is increased due to Joule heat so that the curve bends toward the X-axis if the temperature coefficient is positive. At a critical point, Icrit, the resistance of the electrical fuse changes drastically (or can even become negative) due to rupture, decomposition, melt, or thermal run away. The conventional way of programming an electrical fuse is by applying a current higher than Icrit such that the programming behavior is chaotic like an explosion and the resultant resistance is highly unpredictable. On the other hand, if a programming current is below Icrit, the programming mechanism is solely based on electromigration such that the programming behavior is very controllable, deterministic, and can be modeled precisely by the laws of physics. An electrical fuse can be programmed by applying multiple voltage or current pulses with progressive resistance changes until a satisfactory high resistance can be reached and sensed. The post-program yield can be 100% practically so that the total yield can be determined by pre-program yield which depends on the pre-program fabrication defects. As a result, programming an electrical fuse can be very reliable. The I-V characteristics in FIG. 5(a1) can also be applicable for an OTP cell that includes OTP element and a selector. Further, the program status, whether an electrical fuse is programmed or not, is not clearly visible by optical microscope or scanning electronic microscope (SEM).

A method of programming a fuse reliably can include the following steps: (a) starting with a low program voltage initially to program a portion of an OTP memory and incrementing the program voltage until all OTP cells can be programmed and verified, marked this voltage as a low bound of the program voltage, (b) continuously incrementing the program voltage to program a portion of OTP memory cells until at least one OTP cell, whether programmed or not, is verified failure, marked this voltage as a high bound of the program voltage. Incremental programming can happen on the same or another unprogrammed OTP cells in different embodiments. Furthermore, the program time can be adjusted to characterize the program window by repeating the above steps (a) and (b) accordingly until a low bound, high bound, or program window (voltage range between high and low bound) meets a target value. The window of programming an electrical fuse reliably is marked in FIG. 5(a1). After characterizing the program window, the other OTP cells can be programmed with a voltage between the low and high bounds in at least one pulses.

A method of measuring the cell current can include the following steps: (a) applying a voltage to a program pad VDDP in the program mode, low enough that can not program the OTP cells, (b) preventing the VDDP from supplying current to the OTP macro other than the OTP memory array, (c) turning on the selector of the OTP cell to be measured, (d) measuring the current flowing through the VDDP pad as the cell current of the selected OTP cell. This method is applicable to those OTP cells that have been programmed or not. This method can also be used as a criteria to determine whether an OTP cell is verified as being in an un-programmed state or a programmed state by using a maximum cell current for programmed and a minimum cell current for un-programmed, respectively, to determine the low and high bounds of a program voltage during characterization. This method can verify the resistance of an OTP cell, other than using a sense amplifier to convert the cell resistance into logic data.

The program voltage and time can be further optimized in different embodiments to accommodate that some bits are easier to program and some are harder to program. A program pulse can be ramping from low to high in voltage over time. A lower voltage in shorten pulse can be applied to those bits to start with and then a higher voltage and/or longer pulse can be supplemented to those bits that haven't been programmed yet. Thus the total program time can be saved accordingly. For example, the program voltage of an OTP is 3.5 to 4.2V and program time is 10 us for an electrical fuse in 0.18 um. Programming an OTP memory can include three steps: (a) applying a 3.7V pulse with 1 us duration to program all bits, (b) verifying the data in nominal or lower supply voltage or with higher reference resistor, and (c) applying a 3.9V pulse with 10 us duration to those bits that haven't passed verification yet. In another embodiment, the same or higher voltage can be applied to all bits in the second or subsequent programming passes. In yet another embodiment, the program time of the second or the subsequent programming pulses can be different from the first or earlier pulses.

Programming below a critical current can make fuse state almost undetectable. FIG. 5(a1a) show a scanning electronic microscope (SEM) scanning electronic microscope (SEM) photo 300, as an example, of some electrical fuses programmed below a critical current as depicted in the above description. Some fuses were programmed and some were not. Whether the fuses were programmed or not is hard to detect even under a high magnification SEM. However, data security of an electrical fuse can be further enhanced according to various embodiments also described herein.

FIG. 5(a1b) shows a plot 32 of cumulative percentage of cell current distributions for those unprogrammed fuses and fuses programmed below a critical current. The cell currents can be obtained by measuring the current flowing through a program pad VDDP in low VDDP voltages. Curves 33 and 34 are cumulated percentages of unprogrammed (data 0) and programmed (data 1) cell currents, respectively. Lines 36 and 35 are the limits of data 1 and 0. The minimum cell current for "0" is about 950 uA, or R0=100 ohm. The maximum cell current for "1" is about 150 uA, or R1=2K ohm (i.e. 10-20 times of R0).

FIG. 5(a1c) shows one embodiment of enhanced data security 32'. Curves/lines 33', 34', 35', are 36' data 0, data 1, minimum data 0, and maximum data 1 of cell current distributions, respectively. The curve 34' for data 1 has been moved to the right with a maximum current of 350 uA, or 1K ohm (i.e. 5-10 times of R0) by programming the fuse with lower voltage and/or shorter time. As a result, the fuse program states can be harder to observe in SEM because of even less perceptible fuse damage. Nano-probes would be hard to detect any minor resistance changes from 100 to 1K ohms because of resolution or noise.

FIG. 5(a1d) shows another embodiment of enhanced data security 32". Curves/lines 33", 34", 35", and 36" are data 0, data 1, minimum data 0, and maximum data 1 of cell current distributions, respectively. The data 0, the supposed unprogrammed state, can be programmed to around 300 ohm (i.e. 2-3 times of R0). This can be shown as data "0" 33" in FIG. 5(a1d) moved to the left. In this embodiment, any fuse would be programmed at least once, whether lightly or heavily programmed, to generate data 0 and 1, respectively. The program states would be even harder to observe since all fuses would be programmed at least once with subtle degrees of damage to fuses. This embodiment is possible through programming fuses below a catastrophe condition. In yet another embodiment, any data "0" can be randomly programmed to 300 ohm to further scramble the fuse resistance. Similarly, data "1" can be randomly programmed with different program voltages or time to further scramble the fuse resistance. Programming a fuse to a lower resistance can be achieved by using a lower program voltage and/or shorter program time. Conversely, programming a fuse to a high resistance can be achieved by using a higher program voltage and/or longer program time. By using each embodiment alone or in any combinations, the fuse program states would be almost impossible to detect externally by optical, mechanical, or electrical means, while still providing an internal sense amplifier with sufficient margins to accurately and reliably sense data 0 and 1. In yet another embodiment, the fuse resistance can be programmed to any desirable level by initial lightly programming the fuse, verifying the fuse resistance, and then applying a few more pulses to further program the fuse, if needed or as desired. In one embodiment, the verifying method can be achieved by measuring the current flowing through the VDDP pad with applied voltages low enough for not disturbing the program state or by using a sensing circuit to convert the fuse resistance into logic states.

The enhanced data security schemes discussed above can be applied to only a portion of code (program code) and still be very effective. FIG. 5(a1e) shows an address map 36 according to one embodiment. Normally, a program starts running when a Program Counter (PC) is initialized to address 00, as an example. Then the program starts in sequential order until encounter branches. However, the code in address 00 can be placed with a "jump to address AC." In the address AC, the code can be placed with a "jump to address F8." Then in the address F8, the code can be placed with a "jump to address 04." Applying enhanced data security to the codes in addresses 00, AC, and F8 can be sufficient to provide enough protection for the whole code.

Measuring the current flowing through the program pad VDDP at low voltage can be used to determine the fuse resistance. However, to provide additionally security to data stored in the OTP memory, fuse resistance or corresponding current/voltage can be scrambled or randomized. FIG. 5(a1f) shows a block diagram 37 of scrambling the VDDP current according to one embodiment. FIG. 5(a1f) shows a Linear Feedback Shift Register (LFSR) 38, as a pseudo random numbers. The outputs of LFSR 38 are coupled to the gates of the four NMOS, 39'-1 through 39'-4, whose sources are coupled to ground and drains each coupled to VDDP through a resistor 39-1 through 39-4. When the LFSR 38 is enabled after the OTP memory finishes programming and testing, there would be some random currents flowing through the VDDP to ground to scramble the cell currents so that the real cell current will be difficult to detect.

The program method as shown in FIG. 5(a1) has a maximum program voltage or current that can be determined by thermal runaway, rupture, material decompose, or melting. A minimum program voltage or current can be determined by electromigration threshold. To increase the maximum limit and to decrease the minimum limit to thereby increase the program window for better manufacture or reliability, the program voltage or current to an OTP memory can be limited by an external supply voltage. In one embodiment, the program current can be set to a current limit by a tester during programming an OTP memory. In another embodiment, the internal program voltage can be regulated to a suitable program voltage from an external supply voltage. In yet another embodiment, the current flowing through an OTP memory can be regulated for not exceeding a current limit from an external supply voltage. To decrease the minimum limit, the OTP element can include electromigration friendly structures, such as heat sink, heat generator, or extended area to accelerate electromigration for programming.

FIG. 5(a2a) shows a portion of a block diagram of using a voltage regulator to set proper program voltage for an OTP memory, according to one embodiment. The new OTP memory 130 has an OTP memory 131, a PMOS header 132, and an operational amplifier (OP) 133. The header 132 can be coupled to an external program pad VPP and an internal supply VDDP of the OTP memory 131. The gate of header 132 can be coupled to an output of the OP 133. The OP 133 has one input from a reference voltage Vref and another input from the VDDP. The VDDP will be regulated to Vref by using an OP 133 to clamp VDDP to Vref. The Vref can be generated from a band-gap reference with proper scaling up or down in one embodiment.

FIG. 5(a2b) shows a portion of a block diagram of using a current regulator to limit current for programming an OTP memory, according to another embodiment. The new OTP memory 130' has an OTP memory 131', a PMOS header 132', an operational amplifier (OP) 133', and a resistor 134' with resistance R. The header 132' can be coupled to an external program pad VPP and an internal supply VDDP of the OTP memory 131'. The gate of header 132' can be coupled to an output of the OP 133'. The OP 133' has one input from a reference voltage Vref and another input from one end of the resistor 134'. The resistor 134' has the other end coupled to ground. The current flowing through the OTP memory 131' will be regulated to Vref/R by the OP 133' in this circuit configuration. The Vref can be generated from a band-gap reference with proper scaling up or down in one embodiment. The resistance R is normally about 10-15 ohm for not to interfere programming. The current regulator can be tailed to different cell currents and therefore is a more desirable embodiment.

An OTP cell can be programmed at least once to make sure the cell can be programmed. However, if an OTP cell is programmed, the OTP cell can not be used any more. This is always a dilemma for OTP memory. For a fuse-based OTP programming below a critical current according to FIG. 5(a1), the program mechanism is purely determined by heat generation and heat dissipation so that a fuse with sufficiently low initial resistance can be determined programmable. If an initial fuse resistance can be tested lower than 400 ohm, for example, this fuse is doomed to be programmable by using the program method as discussed in FIG. 5(a1). This can be achieved by a sensing circuit with 400 ohm of reference resistance. In another embodiment, measuring the current flowing through the program pad VDDP after applying a low voltage (e.g. 1.2V) to VDDP can be used as criteria to determine being programmable.

FIG. 5(a2c) shows a portion of a block diagram of an OTP memory 131 as the OTP memory 131 in FIG. 5(a2a) to demonstrate a novel scheme to fake program a fuse. The OTP memory 131 has a fuse cell 140-0,0 organized as an n row and m column array. Each fuse cell has a fuse element 144 coupled to a diode 145 as a program selector. The cathodes of the diode 145 for those cells in the same row are coupled to a wordline bar (WLBi), where i=0, 1, 2, . . . , n−1. The other end of the fuse 144 for those cells in the same column are coupled to a bit line (BLj), where j=0, 1, 2, . . . , m−1. Each bit line can be coupled to a program pad VDDP through a write pass gate (YWPG) 141-0 through 141-(m−1) for programming. Each bitline can also be coupled to a sense amplifier 143 through a read pass gate (YRPG) 142-0 through 142-(m−1) for read. The sense amplifier has a reference branch 144. To program a fuse, a fuse cell (i, j) can be selected by pulling WLBi low and turning on the YWPGj so that a high current can flow from VDDP through YWPGi, fuse, diode, and WLBi to ground and program the fuse at cell (i,j) accordingly. To read a fuse resistance, a fuse cell (i,j) can be selected by pulling WLBi low and turning on the YRPGj so that a pull-up in the sense amplifier 143 can have a conduction path through YRPGj, fuse, diode, and WLBi, to ground. By comparing the current flowing through the cell and reference path, a data 0 or 1 can be determined accordingly.

The OTP memory as shown in FIG. 5(a2c) can be faked to a programmed state by using low-voltage programming, such as 1.2V, and reading the same cell at the same time. Since the program voltage is very low so that the fake programming does not change the fuse resistance much but to raise the voltage level of a selected bitline. The high bitline voltage can result in reading "1" in the sense amplifier 143 output, instead of reading "0" in unprogrammed cells. By doing this way, a pseudo-match pattern can be generated to test bitline/wordline open or short accordingly. Moreover, the corresponding circuits for programming, such as YWPG, and program control circuits can be tested accordingly. Thus, full testability of a fuse-based OTP can be achieved. In the concurrent read and low-voltage programming scheme, the net OTP cell current due to fake programming can be deducted from the current flowing through the program pad VDDP and subtracting a sensing current flowing through the OTP element. Thus the cell resistance can be calculated accordingly with the low program voltage, net cell current, and selector characteristics.

Figures 5B, 5C:
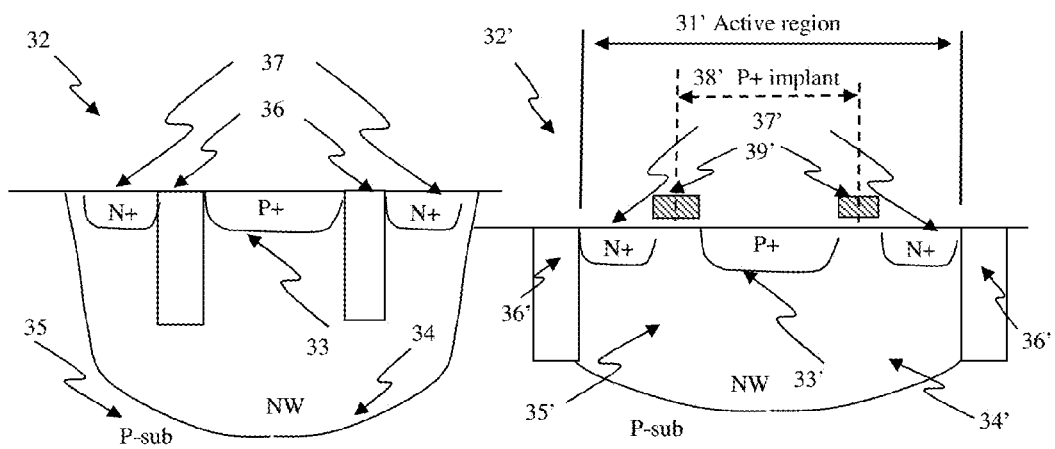
FIG. 5(b) shows a cross section of junction diodes as program selector with STI isolation according to one embodiment.
FIG. 5(c) shows a cross section of junction diodes as program selector with dummy CMOS gate isolation according to one embodiment.

Electrical fuse cell can be used as an example to illustrate the key concepts according to one embodiment. FIG. 5(b) shows a cross section of a diode 32 using a P+/N well diode as program selector with Shallow Trench Isolation (STI) isolation in a programmable resistive device. P+ active region 33 and N+ active region 37, constituting the P and N terminals of the diode 32 respectively, are sources or drains of PMOS and NMOS in standard CMOS logic processes. The N+ active region 37 is coupled to an N well 34, which houses PMOS in standard CMOS logic processes. P substrate 35 is a P type silicon substrate. STI 36 isolates active regions for different devices. A resistive element (not shown in FIG. 5(b)), such as electrical fuse, can be coupled to the P+ region 33 at one end and to a high voltage supply V+ at the other end. To program this programmable resistive device, a high voltage is applied to V+, and a low voltage or ground is applied to the N+ region 37. As a result, a high current flows through the fuse element and the diode 32 to program the resistive device accordingly.

FIG. 5(c) shows a cross section of another embodiment of a junction diode 32' as program selector with dummy CMOS gate isolation. Shallow Trench Isolation (STI) 36' provides isolation among active regions. An active region 31' is defined between STI 36', where the N+ and P+ active regions 37' and 33' are further defined by a combination of a dummy CMOS gate 39', P+ implant layer 38', and N+ implant (the complement of the P+ implant 38'), respectively, to constitute the N and P terminals of the diode 32'. The dummy CMOS gate 39' is a CMOS gate fabricated in standard CMOS process. The width of dummy gate 39' can be close to the minimum figure width of a CMOS gate and can also be less than twice the minimum figure width. The dummy MOS gate can also be created with a thicker gate oxide. The diode 32' is fabricated as a PMOS-like device with 37', 39', 33', and 34' as source, gate, drain, and N well, except that the source 37' is covered by an N+ implant, rather than a P+ implant 38'. The dummy MOS gate 39', preferably biased at a fixed voltage or coupled to the N+ active region 37', only serves for isolation between P+ active region 33' and N+ active region 37' during fabrication. The N+ active 37' is coupled to an N well 34', which houses PMOS in standard CMOS logic processes. P substrate 35' is a P type silicon substrate. A resistive element (not shown in FIG. 5(c)), such as electrical fuse, can be coupled to the P+ region 33' at one end and to a high voltage supply V+ at the other end. To program this programmable resistive device, a high voltage is applied to V+, and a low voltage or ground is applied to the N+ active region 37'. As a result, a high current flows through the fuse element and the diode 32' to program the resistive device accordingly. This embodiment is desirable for isolation for small size and low resistance.

Figures 5D, 6A:
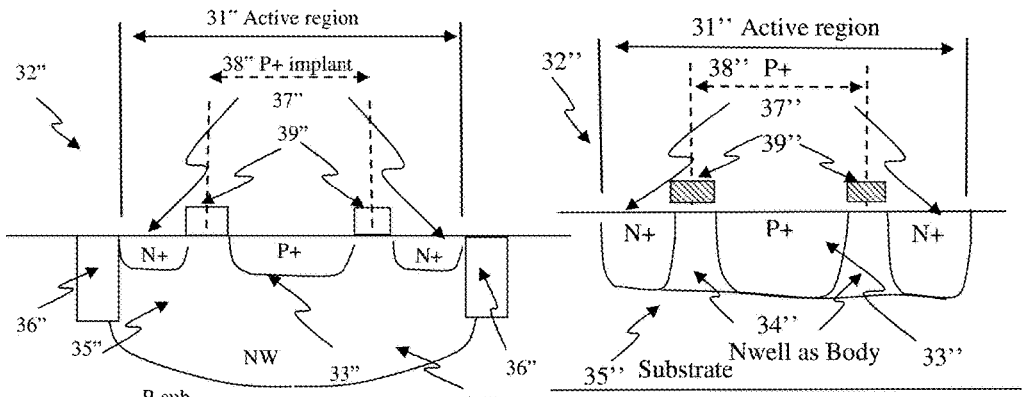
FIG. 5(d) shows a cross section of junction diodes as program selector with SBL isolation according to one embodiment.
FIG. 6(a) shows a cross section of junction diodes as program selector with dummy CMOS gate isolation in SOI technologies according to one embodiment.

FIG. 5(d) shows a cross section of another embodiment of a junction diode 32" as program selector with Silicide Block Layer (SBL) isolation. FIG. 5(d) is similar to 5(c), except that the dummy CMOS gate 39''' in FIG. 5(c) is replaced by SBL 39''' in FIG. 5(d) to block a silicide grown on the top of active region 31". Without a dummy MOS gate or a SBL, the N+ and P+ active regions would be undesirably electrically shorted by a silicide on the surface of the active region 31".

FIG. 6(a) shows a cross section of another embodiment of a junction diode 32''' as a program selector in Silicon-On-Insulator (SOI), FinFET, or similar technologies. In SOI technologies, the substrate 35'' is an insulator such as $SiO_2$ or similar material with a thin layer of silicon grown on top. All NMOS and PMOS are in active regions isolated by $SiO_2$ or similar material to each other and to the substrate 35". An active region 31" is divided into N+ active regions 37", P+ active region 33", and bodies 34" by a combination of a dummy CMOS gate 39", P+ implant 38", and N+ implant (the complement of P+ implant 38"). Consequently, the N+ active regions 37" and P+ active region 33" constitute the N and P terminals of the junction diode 32". The N+ active regions 37" and P+ active region 33" can be the same as sources or drains of NMOS and PMOS devices, respectively, in standard CMOS processes. Similarly, the dummy CMOS gate 39" can be the same CMOS gate fabricated in standard CMOS processes. The dummy MOS gate 39", which can be biased at a fixed voltage or coupled to the N+ region 37", only serves for isolation between P+ active region 33" and N+ active region 37" during fabrication. The width of the dummy MOS gate 39" can vary but can, in one embodiment, be close to the minimum gate width of a CMOS gate and can also be less than twice the minimum width. The dummy MOS gate can also be created with a thicker gate oxide to sustain higher voltage. The N+ active regions 37" can be coupled to a low voltage supply V−. A resistive element (not shown in FIG. 6(a)), such as an electrical fuse, can be coupled to the P+ active region 33" at one end and to a high voltage supply V+ at the other end. To program the electrical fuse cell, a high and a low voltages are applied to V+ and V−, respectively, to conduct a high current flowing through the resistive element and the junction diode 32" to program the resistive device accordingly. Other embodiments of isolations in CMOS bulk technologies, such as dummy MOS gate, or SBL in one to four (1-4) or any sides or between cells, can be readily applied to CMOS SOI technologies accordingly.

Figure 6:
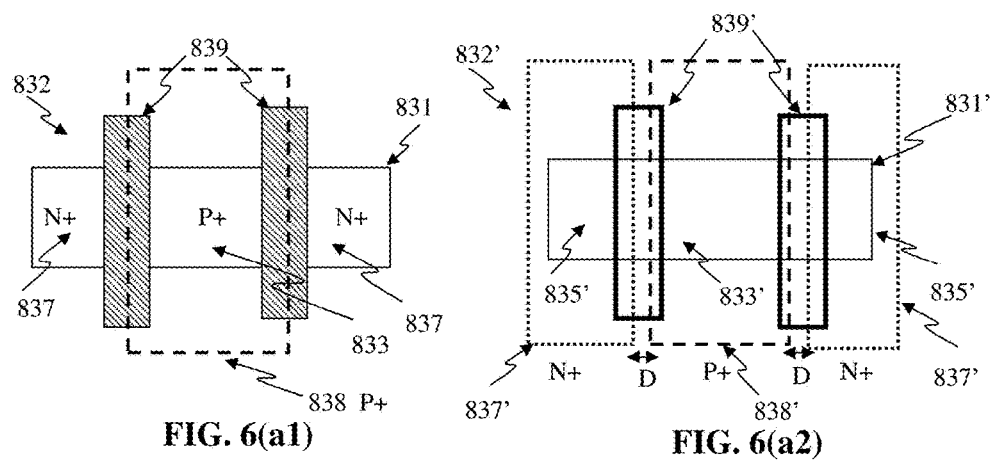
FIG. 6(a1) shows a top view of junction diodes as program selector with dummy CMOS gate isolation in SOI or similar technologies according to one embodiment.
Figure 6:
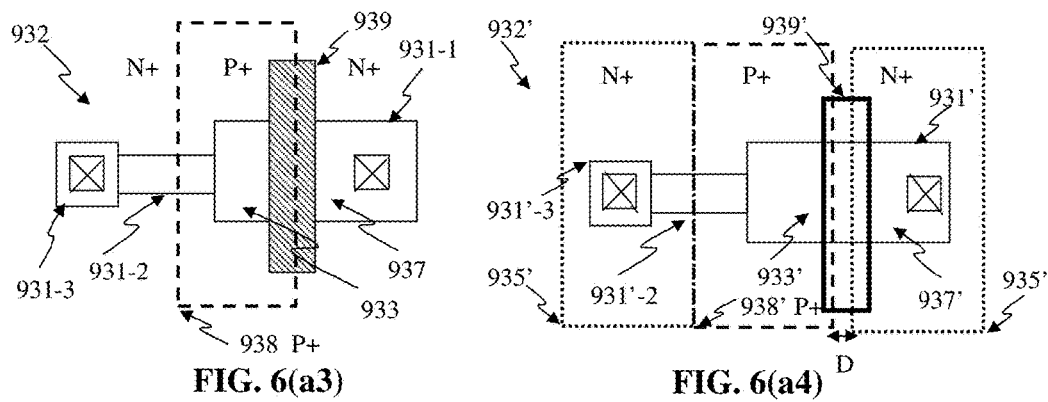
Figure 6:
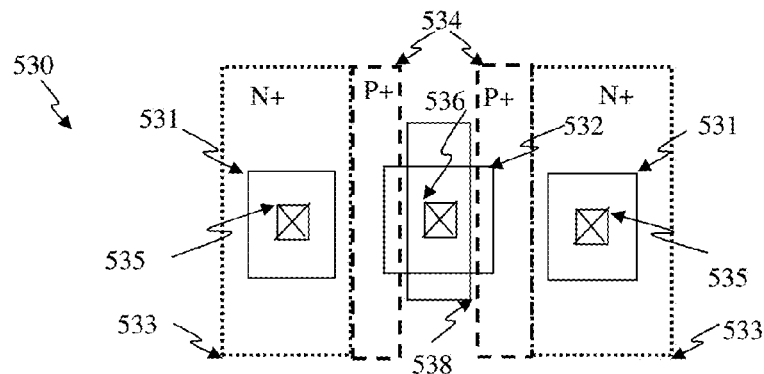
Figure 6:
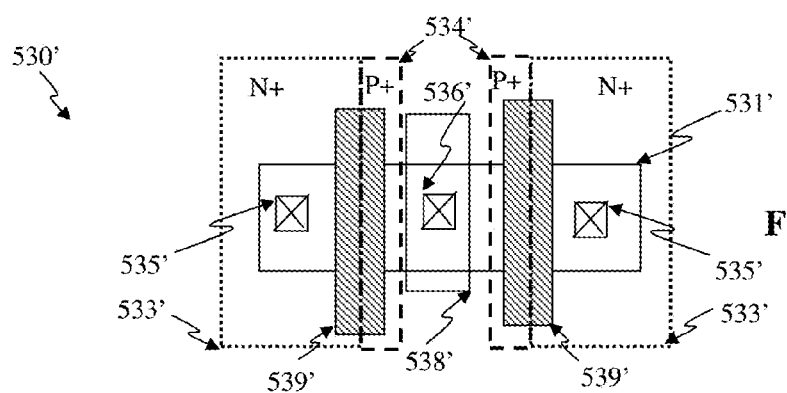
Figure 6:
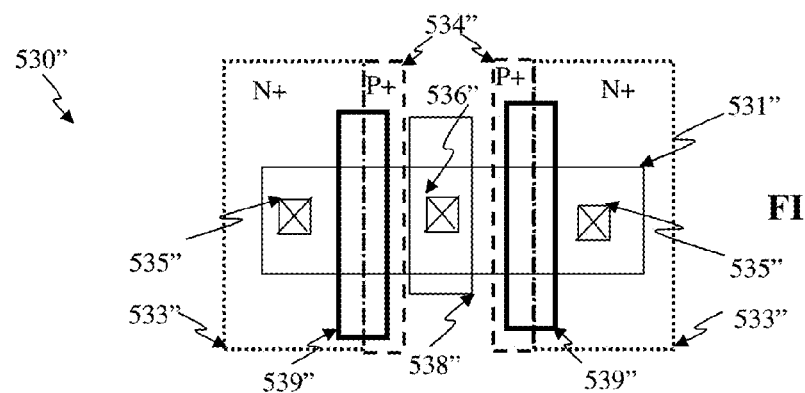

FIG. 6(a1) shows a top view of one embodiment of a junction diode 832, corresponding to the cross section as shown in FIG. 6(a), constructed from an isolated active region as a program selector in Silicon-On-Insulator (SOI), FinFET, or similar technologies. One active region 831 is divided into N+ active regions 837, P+ active region 833, and bodies underneath dummy gate 839 by a combination of a dummy CMOS gate 839, P+ implant 838, and N+ implant (the complement of P+ implant 838). Consequently, the N+ active regions 837 and P+ active region 833 constitute the N and P terminals of the junction diode 832. The N+ active region 837 and P+ active region 833 can be the same as sources or drains of NMOS and PMOS devices, respectively, in standard CMOS processes. Similarly, the dummy CMOS gate 839 can be the same CMOS gate fabricated in standard CMOS processes. The dummy MOS gate 839, which can be biased at a fixed voltage or coupled to N+ region 837, only serves for isolation between P+ active region 833 and N+ active region 837 during fabrication. The N+ active region 837 can be coupled to a low voltage supply V−. A resistive element (not shown in FIG. 6(a1)), such as an electrical fuse, can be coupled to the P+ active region 833 at one end and to a high voltage supply V+ at the other end. To program the resistive element, high and a low voltages are applied to V+ and V−, respectively, to conduct a high current flowing through the resistive element and the junction diode 832 to program the resistive element accordingly. Other embodiments of isolations in CMOS bulk technologies, such as dummy MOS gate, or SBL in one to four (1-4) or any sides or between cells, can be readily applied to CMOS SOI technologies accordingly.

FIG. 6(a2) shows a top view of one embodiment of a diode 832' constructed from an isolated active region as a program selector in an SOI, FinFET, or similar technologies. This embodiment is similar to that in FIG. 6(a1), except that SBL is used instead of a dummy gate for isolation. An active region 831' is on an isolated substrate that is covered by P+ 838' and N+ 835' implant layers. The P+ 838' and N+ 835' are separated with a space D and a Silicide Block Layer (SBL) 839'. covers the space and overlap into both P+ 838' and N+ 835' regions. The P+ 838' and N+ 835' regions serve as the P and N terminals of a diode, respectively. The space regions can be doped with slightly P, N, or unintentionally doped. The space D and/or the doping level in the space regions can be used to adjust the breakdown or leakage of the diode 832'. The diode constructed in an isolated active region can be one side, instead of two sides as is shown in FIG. 6(a2) or in another embodiment.

FIG. 6(a3) shows a top view of one embodiment of a fuse cell 932 constructed from a fuse element 931-2, a diode 931-1 as program selector in one piece of an isolated active region, and a contact area 931-3. These elements/regions (931-1, 931-2, and 931-3) are all isolated active regions built on the same structure to serve as a diode, fuse element, and contact area of a fuse cell 932. The isolated active region 931-1 is divided by a CMOS dummy gate 939 into regions 933 and 937 that are further covered by P+ implant 938 and N+ implant (the complement of the P+ implant 938) to serve as P and N terminals of the diode 931-1. The P+ 933 is coupled to a fuse element 931-2, which is further coupled to the contact area 931-3. The contact area 931-3 and the contact area for cathode of the diode 931-1 can be coupled to V+ and V− supply voltage lines, respectively, through a single or plural of contacts. When high and low voltages are applied to V+ and V−, respectively, a high current can flow through the fuse element 931-2 to program the fuse into a high resistance state. In one implementation, the fuse element 931-2 can be all N or all P. In another implementation, the fuse element 931-2 can be half P and half N so that the fuse element can behave like a reverse-biased diode during read, when the silicide on top is depleted after program. If there is no silicide available, the fuse element 931-2, which is an OTP element, can be constructed as N/P or P/N diodes for breakdown in the forward or reverse biased condition. In this embodiment, the OTP element can be coupled directly to a diode as program selector without any contacts in between. Thus, the cell area can be small and its cost can be relatively low.

FIG. 6(a4) shows a top view of one embodiment of a fuse cell 932' constructed from a fuse element 931'-2, a diode 931' as program selector in one piece of an isolated active region, and a contact area 931'-3. These elements/regions (931'-1, 931'-2, and 931'-3) are all isolated active regions built on the same structure to serve as a diode, fuse element, and contact area of a fuse cell 932'. The isolated active region 931'-1 is divided by a Silicide Block Layer (SBL) in 939' to regions 933' and 937' that are further covered by P+ implant 938' and N+ implant 935' to serve as P and N terminals of the diode 931'. The P+ 933' and N+ 937' regions are separated with a space D, and an SBL 939' covers the space and overlaps into both regions. The space D and/or the doping level in the space region can be used to adjust the breakdown voltage or leakage current of the diode 931'. The P+ 933' is coupled to a fuse element 931'-2, which is further coupled to the contact area 931'-3. The contact area 931'-3 and the contact area for the cathode of the diode 931'-1 can be coupled to V+ and V− supply voltage lines, respectively, through a single or plural of contacts. When high and low voltages are applied to V+ and V−, respectively, a high current can flow through the fuse element 931'-2 to program the fuse into a high resistance state. In one implementation, the fuse element 931'-2 can be all N or all P. In another implementation, the fuse element 931'-2 can be half P and half N so that the fuse element can behave like a reverse-biased diode during read, when the silicide on top is depleted after program. If there is no silicide available, the fuse element 931'-2, which is an OTP element, can be constructed as N/P or P/N diodes for breakdown in the forward or reverse biased condition. In this embodiment, the OTP element can be coupled directly to a diode as program selector without any contacts in between. Thus, the cell area can be small and the costs can be low.

The diode as a program selector can be made of Schottky diode in standard CMOS processes as shown in FIGS. 6(a5)-6(a7). The Schottky diode is a metal to semiconductor diode, instead of a junction diode that is fabricated from the same semiconductor material but with N+ and P+ dopants in two terminals. The top view of a Schottky diode as a program selector can be very similar to that of a junction diode, except the anode of the diode is a metal to a lightly doped N or P type dopant, which is different from a heavily P+ doped in a junction diode. The anode of the Schottky diode can be made of any kinds of metals, such as aluminum or copper, metal alloys, or silicides in other embodiments. The Schottky diode can be a metal to N+ active on N well or P+ active on P well. The Schottky diode can be fabricated in bulk or SOI CMOS, planar or FinFET CMOS in other embodiments. There are many variations but equivalent embodiments of fabricating Schottky diodes that are still within the scope of this invention for those skilled in the art.

FIG. 6(a5) shows a top view of a Schottky diode 530 according to one embodiment. The Schottky diode 530 can be formed inside an N well (not shown) has active regions 531 as the cathode and an active region 532 as the anode. The active regions 531 are covered by N+ implant 533 with a contact 535 coupled to an external connection. The active region 532 is not covered by N+ or P+ implant so that the doping concentration of the active region 532 is substantially the same as the doping concentration of the N well, A silicide layer can be formed on top of the active region 532 to form a Schottky barrier with the silicon, which is further coupled to a metal 538 through an anode contact 536. A P+ implant 534 can overlap into the active region 532 to reduce leakage. In other embodiment, the P+ implant 534 can be omitted.

FIG. 6(a6) shows a top view of a Schottky diode 530' according to one embodiment. The Schottky diode 530' can be formed inside an N well (not shown) has an active region 531 to house the anode and cathode of the diode. The active region 531' is divided by dummy gates 539' into a central anode and two outside cathode areas. The cathode areas are covered by an N+ implant 533' with a contact 535' coupled to external connection. The central anode is not covered by N+ or P+ implant so that the doping concentration of the active region 532 is substantially the same as the doping concentration of the N well. A silicide layer can be formed on top of the central anode region to form a Schottky barrier with the silicon, which is further coupled to a metal 538' through an anode contact 536'. A P+ implant 534' can overlap into the central active region to reduce leakage. The boundary of N+ 533' and P+ 534' can fall on the cathode areas in other embodiment. The dummy gate 539' and/or P+ implant 534' can surround the contact 536' area in all sides to further reduce leakage current in one embodiment. The P+ implant 534' can be omitted in another embodiment.

FIG. 6(a7) shows a top view of a Schottky diode 530" according to one embodiment. The Schottky diode 530" can be formed inside an N well (not shown) has an active region 531" to house the anode and cathode of the diode. The active region 531" is divided by Silicide Block Layers (SBL) 539" into a central anode and two outside cathode areas. The cathode areas are covered by an N+ implant 533" with a contact 535" coupled to external connection. The central anode 532" is not covered by N+ or P+ implant so that the doping concentration of the active region 532 is substantially the same as the doping concentration of the N well. A silicide layer can be formed on top of the central anode region to form a Schottky barrier with the silicon, which is further coupled to a metal 538" through an anode contact 536". A P+ implant region 534" can overlap into the anode region to reduce leakage. In other embodiment, the P+ implant 534" can be omitted.

Figure 6B:
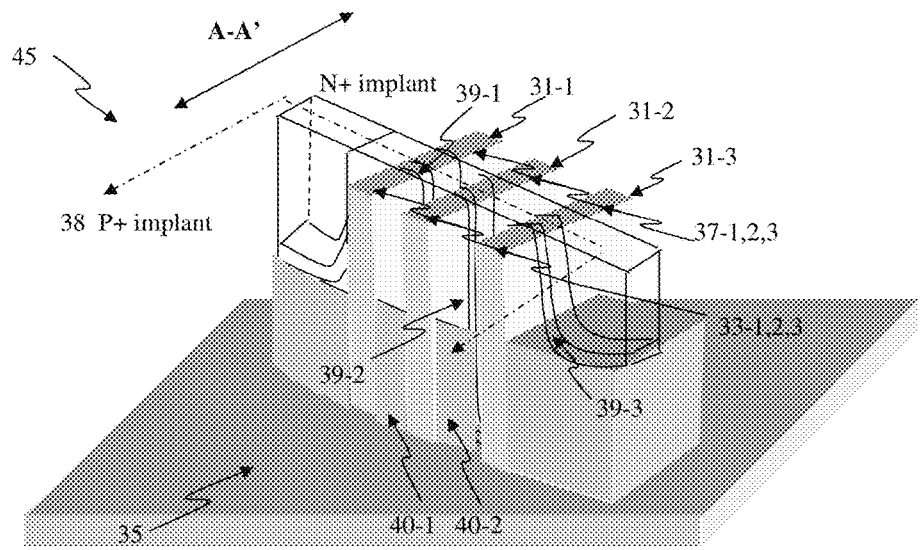
Figure 6:
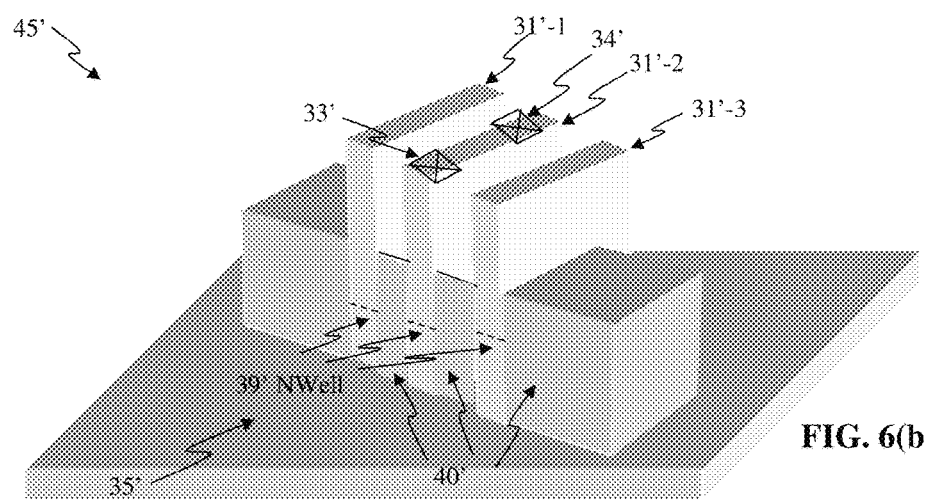
Figure 6:
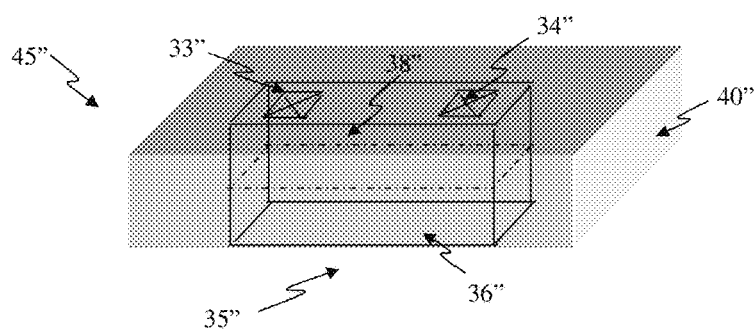
Figure 6:
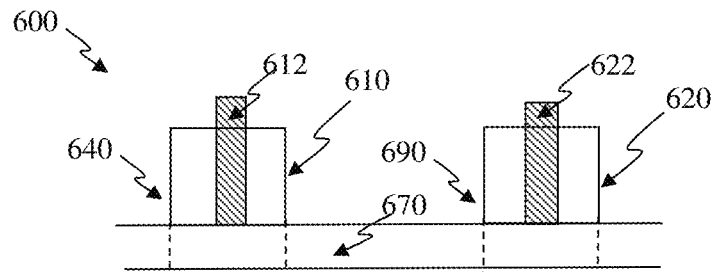
Figure 6:
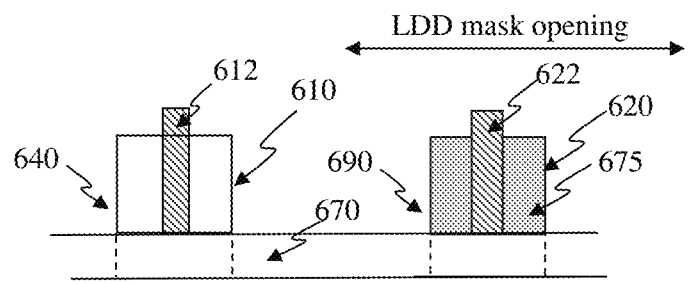
Figure 6:
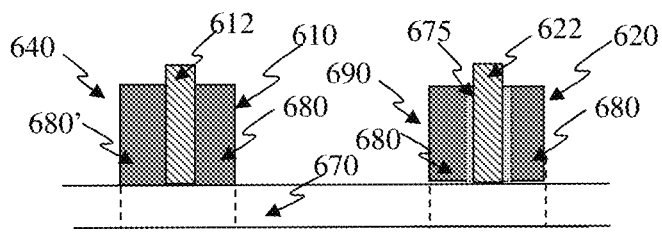
Figure 6:
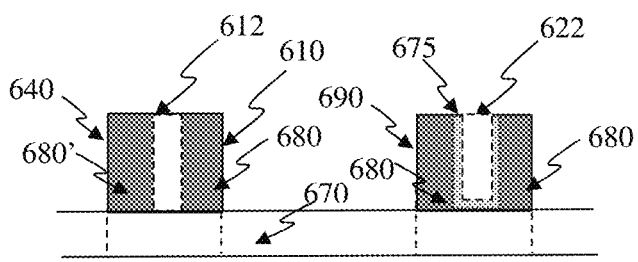
Figure 6:
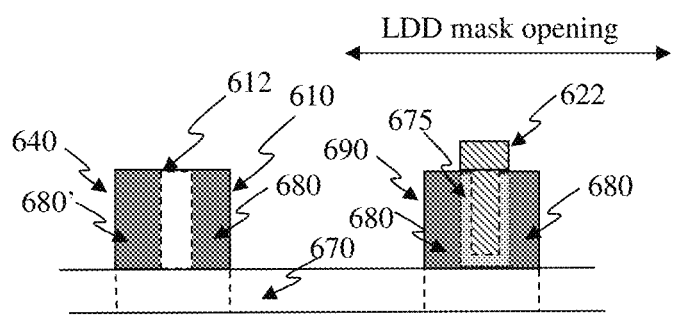
Figure 6:
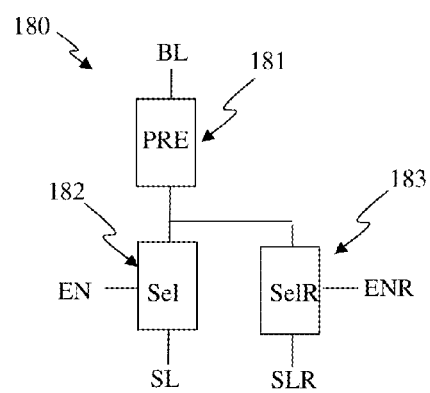
Figure 6:
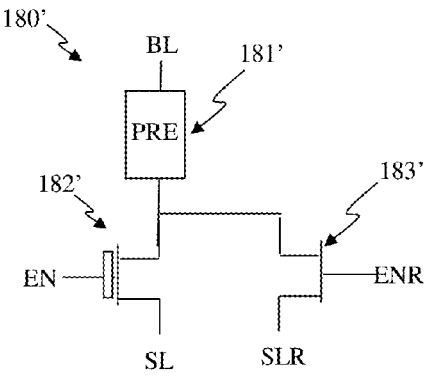
Figure 6:
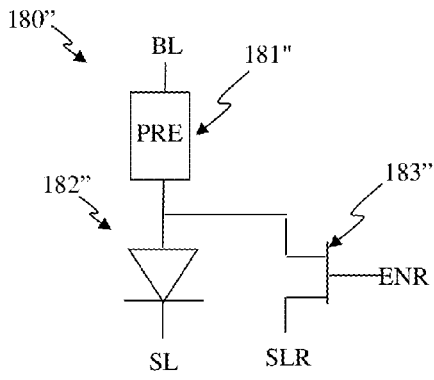
Figure 6:
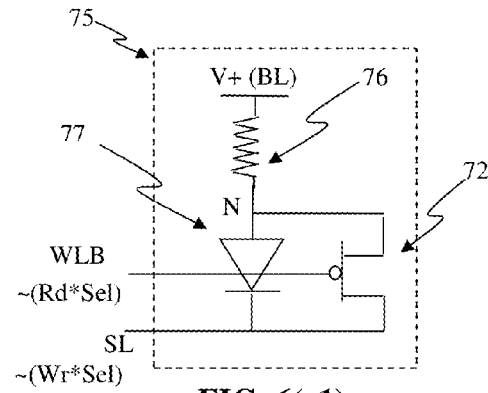
Figure 6:
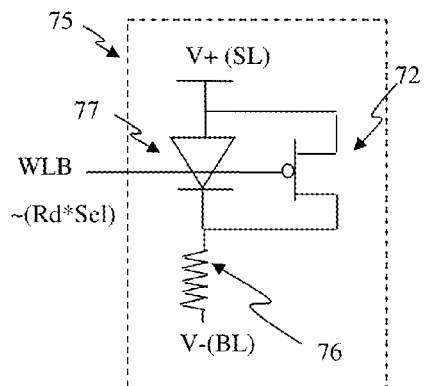
Figure 6:
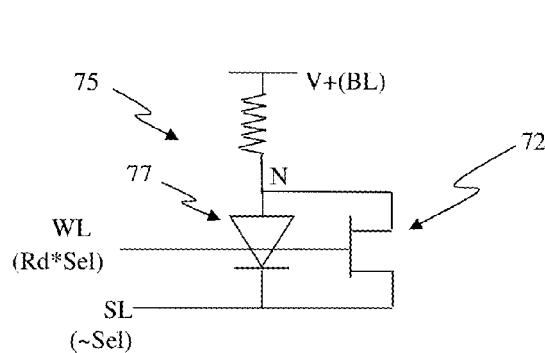

FIG. 6(b) shows a cross section of another embodiment of a diode 45 as a program selector in FinFET technologies. FinFET refers to a fin-based, multigate transistor. FinFET technologies are similar to the conventional CMOS except that thin and tall silicon islands can be raised above the silicon substrate to serve as the bulks of CMOS devices. The bulks are divided into source, drain, and channel regions by polysilicon or non-aluminum metal gates like in the conventional CMOS. The primary difference is that the MOS devices are raised above the substrate so that channel widths are the height of the islands, though the direction of current flow is still in parallel to the surface. In an example of FinFET technology shown in FIG. 6(b), the silicon substrate 35 is an epitaxial layer built on top of an insulator like SOI or other high resistivity silicon substrate. The silicon substrate 35 can then be etched into several tall rectangular islands 31-1, 31-2, and 31-3. With proper gate oxide grown, the islands 31-1, 31-2, and 31-3 can be patterned with MOS gates 39-1, 39-2, and 39-3, respectively, to cover both sides of raised islands 31-1, 31-2, and 31-3 and to define source and drain regions. The source and drain regions formed at the islands 31-1, 31-2, and 31-3 are then filled with silicon/SiGe called extended source/drain regions, such as 40-1 and 40-2, so that the combined source or drain areas can be large enough to allow contacts. The extended source/drain can be fabricated from polysilicon, polycrystalline Si/SiGe, lateral epitaxial growth silicon/SiGe, or Selective Epixatial Growth (SEG) of Silicon/SiGe, etc. The extended source/drain regions 40-1 and 40-2, or other types of isolated active regions, can be grown or deposited to the sidewall or the end of the fins. The fill 40-1 and 40-2 areas in FIG. 6(b) are for illustrative purpose to reveal the cross section and can, for example, be filled up to the surface of the islands 31-1, 31-2, and 31-3. In this embodiment, active regions 33-1,2,3 and 37-1,2,3 are covered by a P+ implant 38 and N+ implant (the complement of P+ implant 38), respectively, rather than all covered by P+ implant 38 as PMOS in the conventional FinFET, to constitute the P and N terminals of the junction diode 45. The N+ active regions 37-1,2,3 can be coupled to a low voltage supply V-. A resistive element (not shown in FIG. 6(b)), such as an electrical fuse, can be coupled to the P+ active region 33-1,2,3 at one end and to a high voltage supply V+ at the other end. To program the electrical fuse, high and low voltages are applied between V+ and V-, respectively, to conduct a high current flowing through the resistive element and the junction diode 45 to program the resistive device accordingly. Other embodiments of isolations in CMOS bulk technologies, such as STI, dummy MOS gate or SBL, can be readily applied to FinFET technologies accordingly.

FIG. 6(b0a) shows a 3D perspective view of an active-region fuse 45' constructed from fin structures 31'-1, 31'-2, and 31'-3 according to one embodiment. Fins 31'-1, 31'-2, and 31'-3 t have P+ implant in an Nwell 39' and on an Nwell silicon or SOI substrate 35'. The dash lines are boundaries between the P+ implant regions and the Nwell 39'. The fuse constructed from fin 31'-2 is a P+ active-region fuse built on Nwell 39'. The middle fin 31'-2 has two contacts 33' and 34' to act as two terminals of the fuse element. Because of tall and slim silicon island in a FinFET technology, the heat generated on the surface of the fin due to silicide can not dissipate very well so that a fin itself can be used as an electrical fuse effectively in one embodiment.

In an advanced CMOS process when the horizontal dimensions (parallel to silicon surface) are scaled more aggressively than the vertical dimension (perpendicular to silicon surface), an active-region fuse can be constructed from planar CMOS too. Similarly, an active-region fuse can be constructed from a DRAM process when the interlayer dielectrics are very thick. FIG. 6(b0b) shows a 3D perspective view of an active-region fuse 45" in a planar CMOS. The shaded area 40" is an oxide isolation, i.e. STI. The active region is the hallow area (shown by wire frames) surrounded by STI 40" The active region has P+ implant 38" over Nwell 36" on top of a substrate 35" that can be Nwell in bulk or oxide isolation in SOI. The active region has two contacts 33" and 34'" to serve as two terminals of an electrical fuse. Because of deep STI isolation, the heat generated on the surface of the P+ active region due to silicide can not be dissipated very well so that the P+ active region can be used as an electrical fuse effectively in one embodiment.

A dummy-gate diode (as known as "gated diode") in a FinFET technology as shown in FIG. 6(b) is one embodiment to build good-performance diodes. The gate in a gated diode can be removed to form a new kind of diode, called channel diode, in a gate-last metal-gate process without any additional masks or process steps. The channel diode can be constructed with the source and drain of a MOS as anode and cathode of a diode, respectively, while the gate is removed.

Metal gate in a high-K metal-gate process can not sustain high temperature source/drain annealing process. Therefore, there is a gate-last or Replacement Metal Gate (RMG) process to over come the thermal budget issues. The gate-last metal-gate process follows the conventional polysilicon-gate process from gate formation/definition, LDD implants, and source/drain implants. After the source/drain implants, wafers are under high temperature to anneal the damage from high energy and high dose source/drain implants. Then, the polysilicon gates are removed and replaced with high-K dielectrics (e.g. HfO2), work function metals (e.g. TiN, TaN, etc.) and gate filler (e.g. AlCo, AlNi alloy). A high-performance diode can be created with the polysilicon gate removed and without any metal-gate built. With proper logic operation in the mask generation, no additional masks are needed.

FIG. 6(b1a)-6(b1e) shows device cross sections of building channel diode and MOS in a portion of process steps, according to one embodiment. FIG. 6(b1a) shows device cross sections 600, along the line A-A' as shown in FIG. 6(b), after polysilicon definition. Channel diode 640 has a fin structure 610, a polysilicon gate 612, and a field oxide 670. MOS 690 has a fin structure 620, a polysilicon gate 622, and a field oxide 670. FIG. 6(b1b) shows device cross sections after LDD implant 675 on the MOS device. The LDD mask has opening only over the MOS device 690, but not channel diode 640. Logic operations can be used to block LDD mask on channel diode 640, otherwise LDD mask tends to be generated automatically. FIG. 6(b1c) shows device cross sections after spacer formation and source/drain implant. MOS 690 has the same source/drain implant 680 on source/drain, while the channel diode 640 has different source/drain implant 680 and 680' on the two source/drain to create anode and cathode of the diode. The channels in the MOS 690 and channel diode 640 can have lighter or near intrinsic implants. A small region near the polysilicon gate in the MOS 690 still has LDD implant, as protected by oxide spacers from source/drain implants. FIG. 6(b1d) shows device cross sections after the polysilicon gates are moved for MOS 690 and channel diode 640. FIG. 6(b1e) shows device cross sections after a replacement metal gate is built on MOS 690 but not on channel diode 640, by using the LDD mask for differentiation. By customizing the LDD implant mask, a channel diode can be built in a gate-last CMOS process without any additional masks or process steps. The channel diode can be readily applied to replacement metal-gate technologies for FinFET, planar, bulk, or SOI CMOS in other embodiments. The breakdown voltage of the channel diode can be adjusted by changing the polysilicon width for different applications, such as ESD, analog, or memory chips, etc.

FIGS. 6(a), 6(a1)-6(a4), 6(b) and 6(b1a-b1e) shows various schemes of constructing diodes as program selector and/or OTP element in a fully or partially isolated active region. A diode as program selector can be constructed from an isolated active region such as in SOI or FINFET technologies. The isolated active region can be used to construct a diode with two ends implanted with P+ and N+, the same implants as the source/drain implants of CMOS devices, to serve as two terminals of a diode. A dummy CMOS gate or silicide block layer (SBL) can be used for isolation and to prevent shorting of the two terminals. In the SBL isolation, the SBL layer can overlap into the N+ and P+ implant regions and the N+ and P+ implant regions can be separated with a space. The width and/or the doping level in the space region can be used to adjust the diode's breakdown voltage or leakage current accordingly. A fuse as OTP element can also be constructed from an isolated active region. Since the OTP element is thermally isolated, the heat generated during programming cannot be dissipated easily so that the temperature can be raised higher to accelerate programming. The OTP element can have all N+ or all P+ implant. If there is a silicide on top of the active region, the OTP element can have part N+ and part P+ implants so that the OTP element can behave like a reverse biased diode during read, such as when the silicide is depleted after OTP programming in one embodiment. If there is no silicide on top, the OTP element can have part N+ and part P+ implants as a diode to be breakdown during OTP programming in another embodiment. In either case, the OTP element or diode can be constructed on the same structure of an isolated active region to save area. In an SOI or FinFET SOI technology, an active region can be fully isolated from the substrate and from other active regions by SiO2 or similar material. Similarly, in a FINFET bulk technology, active regions in the fin structures built on the same silicon substrate are isolated from each other above the surface that can be coupled together by using extended source/drain regions.

If a programmable resistance device cell uses a diode as selector for read, the read path may contain a diode's threshold voltage (~0.7V) so that read voltage cannot be lower. One embodiment to resolve this issue is to use a MOS as a read selector. FIGS. 6(c01)-6(c7) depict several embodiments of using MOS as read selector for low voltage operation.

FIG. 6(c01) shows a programmable resistive device (PRD) 180 having a programmable resistive element (PRE) 181 coupled to an element selector 182 and a read selector 183 at one end and coupled to a bitline (BL) in the other end. The element selector 182 has an enable terminal (EN) and couples to a source line (SL). The read selector 183 can have a read enable terminal (ENR) and can couple to a read source line (SLR). The read selector 182 can be built with low-Vt core logic devices instead of I/O devices typically used in selector 183. During read, the read selector 182 can be turned on by applying low supply voltages to BL, SLR, and ENR so that a current can flow from BL to SLR depending on the resistance state of PRE 181. This current can be compared with a reference current to determine the resistance state of the PRE 181 into a logic state of 0 or 1.

FIG. 6(c02) shows a block diagram of a programmable resistive device (PRD) 180' having a programmable resistive element (PRE) 181' coupled to an element selector 182' and a read selector 183' at one end and coupled to a bitline (BL) in the other end. The element selector 182' can be a MOS built by I/O thick oxide device that has an enable terminal (EN) and couples to a source line (SL). The read selector 183' can have a read enable terminal (ENR) and can couple to a read source line (SLR). The read selector 183' can be built with low-Vt core logic devices instead of I/O devices in selector 182'. During read, the read selector 183' can be turned on by applying low supply voltages to BL, SLR, and ENR so that a current can flow from BL to SLR depending on the resistance state of PRE 181'. This current can be compared with a reference current to determine the resistance state of the PRE 181' into a logic state of 0 or 1.

FIG. 6(c03) shows a block diagram of a programmable resistive device (PRD) 180" having a programmable resistive element (PRE) 181" coupled to an element selector 182" and a read selector 183" at one end and coupled to a bitline (BL) in the other end. The element selector 182" can be a dummy-gate diode built by I/O thick oxide device with Vt (~0.8V) that couples to a source line (SL). The read selector 183" can have a read enable terminal (ENR) and can couple to a read source line (SLR). The read selector 183" can be built with low-Vt (~0.4V) core logic devices instead of I/O devices as typically used in element selector 182". During read, the read selector 183" can be turned on by applying low supply voltages (~1.0V) to BL, SLR, and ENR so that a current can flow from BL to SLR depending on the resistance state of PRE 181". This current can be compared with a reference current to determine the resistance state of the PRE 181" into a logic state of 0 or 1. The thick-oxide I/O device 182" can be programmed with a higher voltage of 2-3V. But, without the low-Vt core logic device 183", the PRD cell may not be read with ~1.0V supply voltage. In some applications, low voltage read is more important than programming, especially for OTP.

FIGS. 6(c01)-6(c03) illustrate programmable resistive devices having read selectors 183, 183', and 183", respectively, built by core logic devices so that the read selectors can be turned on in low supply voltages. The programmable resistive element, such as 181 in FIG. 6(c01), can be a One-Time Programmable (OTP), Multiple-Time Programmable (MTP), embedded flash, or emerging memories, such as PCM, RRAM, or MRAM, etc. In particular, an oxide breakdown anti-fuse can be one example of OTP as PRE 181 in FIG. 6(c01). The breakdown voltage of an anti-fuse can be 4-5V even in 40 nm or 28 nm CMOS. To select an anti-fuse as a PRE 181 for program, the element selector 182 is normally built in thick oxide I/O device to sustain high programming voltage of 4-5V. The I/O device has a higher threshold voltage, ~0.7V, such that a low supply voltage of 0.7V or below may not turn on the element selector 182 for read. Therefore, a read selector 183 built by core logic device (e.g. Vt-0.4V) can serve the purpose. To prevent stressing the core logic device in the read selector 183, ENR or SLR can be let floating during programming in one embodiment. The read selector 183 can be configured as MOS-connected diode mode (ENR connected to drain of 183) or linear mode (ENR connected to a supply voltage) for read in another embodiment. The element selector 182 and/or read selector 183 can be built in NMOS or PMOS in different embodiments. The element selector 182 can be a combination of core logic MOS, I/O MOS and/or diode in another embodiment. The element selector 182 and/or 183 can be built with Schottky diode for low voltage program or read in yet another embodiment.

FIG. 6(c1) shows a programmable resistive device cell 75 for low voltage and low power applications. If an I/O voltage supply of a chip can be down to 1.2V, the diode's high turn-on voltage 0.7V as read/program selector can restrict the read margin. Therefore, a MOS can be used as read selector in the cell for low voltage read according to another embodiment. The programmable resistive cell 75 has a programmable resistive element 76, a diode 77 as program selector, and a MOS 72 as read selector. The anode of the diode 77 (node N) is coupled to the drain of the MOS 72. The cathode of the diode 77 is coupled to the source of the MOS 72 as Select line (SL). The gate of the MOS 72 can be coupled to wordline bar (WLB) for read. The programmable resistive element 76 is coupled between a node N and a high voltage V+, which can serve as a Bitline (BL). By applying a proper voltage between V+ and SL for a proper duration of time, the programmable resistive element 76 can be programmed into high or low resistance states, depending on magnitude and/or duration of voltage/current. The diode 77 can be a junction diode constructed from a P+ active region and an N+ active region on the same N well as the P and N terminals of a diode, respectively. In another embodiment, the diode 77 can be a diode constructed from a polysilicon structure with two ends implanted by P+ and N+, respectively. The P or N terminal of either junction diode or polysilicon diode can be implanted by the same source or drain implant in CMOS devices. Either the junction diode or polysilicon diode can be built in standard CMOS processes without any additional masks or process steps. The MOS 72 is for reading the programmable resistive device. Turning on a MOS can have a lower voltage drop between the source and the drain than a diode's turn-on voltage for low voltage operations. To turn on the diode 77 for programming, the cathode of the diode can be set to low for the selected row during write, i.e. ~(Wr*Sel) in one embodiment. To turn on the MOS 72, the gate of the MOS can be set to low for the selected row during read, i.e. ~(Rd*Sel) in one embodiment. If the program voltage is VDDP=2.5V, the selected and unselected SLs for program can be 0 and 2.5V, respectively. The SLs can be all set to 1.0V for read. The selected and unselected WLBs for read are 0 and 1.0V, respectively. The programmable resistive memory cell 75 can be organized as a two-dimensional array with all V+'s in the same columns coupled together as bitlines (BLs) and all MOS gates and sources in the same rows coupled together as wordline bars (WLBs) and Source Lines (SLs), respectively.

FIG. 6(c2) shows a schematic of another programmable resistive cell according to another embodiment. FIG. 6(c2) is similar to FIG. 6(c1) except that the placement of the resistive element and diode/MOS are interchanged. V+'s of the cells in the same row can be coupled to a source line (SL) that can be set to VDDP for program and VDD for read. V−'s of the cells in the same column can be coupled as a bitline (BL) and further coupled to a sense amplifier for read and set to ground for program. The gates of the MOS in the same row can be coupled to a wordline bar (WLB) that can be set to low when selected during read, i.e. ~(Rd*Sel), in one embodiment.

FIG. 6(c3) shows a schematic of another programmable resistive cell according to another embodiment. FIG. 6(c3) is similar to FIG. 6(c1) except that the PMOS is replaced by an NMOS. V+'s of the cells in the same column can be coupled as a bitline (BL) that can be coupled to VDDP for program and coupled to a sense amplifier for read. The cathodes of the diode and the sources of the MOS in the same row can be coupled as a source line (SL). The SL can be set to ground when selected for read or program. The gates of the MOS in the same row can be coupled as a wordline (WL) that can be set high when selected for read, i.e. Rd*Sel, in one embodiment.

FIG. 6(c4) shows a schematic of using at least one PMOS configured as diode or MOS for program or read selector according to one embodiment. The programmable resistance device cell 170 has a programmable resistive element 171 coupled to a PMOS 177. The PMOS 177 has a gate coupled to a read wordline bar (WLRB) and a drain coupled to a program wordline bar (WLPB), a source coupled to the programmable resistive element 171, and a bulk coupled to the drain. The PMOS 177 can have the source junction conducted to behave like a diode for the selected cells during programming. The PMOS 177 can also have the source junction or the channel conducted to behave like a diode or MOS selector, respectively, during read.

FIG. 6(c5) shows a cross section of the cell in FIG. 6(c4) to further illustrate the program and read path using at least one PMOS as a selector configured as diode or MOS for program or read selector according to one embodiment. The programmable resistive device cell 170' has a programmable resistive element 171' coupled to a PMOS that consists of a source 172', gate 173', drain 174', N well 176', and N well tap 175'. The PMOS has a special conduction mode that is hard to find in the ordinary CMOS digital or analog designs by pulling the drain 174' to a very low voltage (e.g., ground) to turn on the junction diode in the source 172' for programming as shown in a dash line. Since the diode has an I-V characteristic of exponential law than square law in MOS, this conduction mode can deliver high current to result in smaller cell size and low program voltage. The PMOS can be turned on during read to achieve low voltage read.

The operation conditions of the cells in FIGS. 6(c4) and 6(c5) are further described in FIGS. 6(c6) and 6(c7) to illustrate the novelty of the particular cells. FIG. 6(c6) shows operation conditions of programming and reading by diode. During programming, the selected cell can have WLPB coupled to a very low voltage (i.e. ground) to turn on the source junction diode, while the WLRB can be either coupled to VDDP, the program voltage, or ground. The WLPB and WLRB of the unselected cells can be both coupled to VDDP. During reading, the selected cell can have the WLRB coupled to VDD core voltage or ground and the WLPB coupled to ground to turn on the source junction diode of PMOS 171 in FIG. 6(c4). The WLPB and WLRB of the unselected cells are coupled to VDD. FIG. 6(c7) shows the operation conditions of programming and reading by MOS. The operation conditions in this figure are similar to those in FIG. 6(c6) except that the WLRB and WLPB of the selected cells are coupled to 0 and VDD/VDDP, respectively, during read/program. Thus, the PMOS is turned on during programming or reading. The PMOS can be drawn in a layout like a conventional PMOS, but the operation voltages applied to the PMOS terminals are quite different from conventional operations. In other embodiments, combinations of diode and/or MOS for programming or read can be achieved, such as programming by diode and reading by MOS in one embodiment or programming by diode and MOS in different current directions for different data in another embodiment, for example.

In a Silicon-On-Isolator (SOI) technology, the selectors configured as merged devices can be further elaborated as diode/MOS or bipolar/MOS. FIG. 6(c8) shows a top view of a programmable resistive device (PRD) cell 630 built in an SOI technology. The PRD cell 630 has a gate 631 over an active region 634 and divides the active region 634 into left and right portions. The left active region is covered by a P+ implant 636 and the right active region is covered by an N+ implant 635 on top and a P+ implant 636 in the bottom. The left, top right, and bottom right portions of the active region 634 can be coupled to contacts 638, 637, and 641, respectively. The gate 631 can be coupled to a contact 632. The contacts 638, 632, and 637 constitute the anode, dummy gate, and cathode terminals of a dummy-gate diode. The contacts 638, 632, and 641 constitute the drain, gate, and source terminal of a PMOS device. The contacts 637 and 641 can be coupled together by metal or by silicide on top of the active region 634 as a single node. In essence, one dummy-gate diode and a PMOS are merged as a single selector in the PRD cell 630. The active region 634 can have an extension in the right portion as a fuse, according to one embodiment. The fuse can have a contact 639 as a terminal of the fuse. The coupling of the merged devices and the fuse can be interchangeable in another embodiment. The MOS can be an NMOS in yet another embodiment. FIG. 6(c8a) shows a schematic of a PRD cell, corresponding to the PRD cell 630 in FIG. 6(c8).

FIG. 6(c9) shows a top view of a programmable resistive device (PRD) cell 630' built in an SOI technology. The PRD cell 630' has a gate 631' over an active region 634' and divides the active region 634' into left, right, and bottom portions. The left and right active region is covered by a P+ implant 636' and the bottom active region is covered by an N+ implant 635'. The left, right, and bottom portions of the active region 634' can be coupled to contacts 638', 637', and 633', respectively. The gate 631' can be coupled to a contact 632'. The contacts 638', 633', and 637' constitute the emitter, base, and collector terminals of a PNP bipolar device. The contacts 638', 632', and 637' and 633' also constitute the drain, gate, source, and bulk terminal of a PMOS device. In essence, one PNP bipolar and a PMOS are merged as a single selector in the PRD cell 630'. The active region 634' can have an extension in the right portion as a fuse, according to one embodiment. The fuse can have a contact 639' as a terminal of the fuse. The coupling of the merged devices and the fuse can be interchangeable in another embodiment. The MOS can be an NMOS in yet another embodiment. FIG. 6(c9a) shows a schematic of a PRD cell, corresponding to the PRD cell 630' in FIG. 6(c9).

FIG. 6(c9b) shows a top view of a merged bipolar/PMOS, corresponding to the PNP and PMOS in FIG. 6(c9a), according to one embodiment. The merged PNP bipolar and PMOS 630" has 2 rows and 2 columns of gates 632" dividing an active region 634" into 9 regions. A P+ implant 636" covers the central and 4 sides regions, while an N+ implant 635" covers the 4 corner regions. Contact 638", 633", and 636" in the central, corner, and side regions serve as terminals of an emitter, base, and collector of the bipolar 630", respectively. With this configuration, the gain of the bipolar 630" can be very high, ~100, so that programming efficiency can be greatly improved over the bipolar in FIG. 6(c9). There are also 4 PMOS devices built between emitter 638" and collector 636" that can be turned on during programming or reading by coupling the gate 632" to a low supply voltage.

There are many different combinations of operation modes for the merged devices in FIGS. 6(c8)-6(c9b). The selector can be configured as MOS, such as NMOS or PMOS, or bipolar, such as PNP or NPN, or diode. The diode can have N or P type region between anode and cathode. The order of the merged device and PRD can be interchangeable. The selector can be configured as a diode or bipolar to supply large current for programming, or reading in one embodiment. The selector can also be configured as a MOS to reduce supply voltage requirement for reading, or programming in another embodiment. There are many variations and yet equivalent embodiments and they all fall within the scope of this invention for those skilled in the art.

FIG. 6(d1) shows a top view of a programmable resistive device (PRD) cell 730 built on a thermally insulated substrate, such as SOI or polysilicon. In a thermally insulated substrate the heat conductivity is poor such that the programmable resistive element (PRE) can be shared with the gate of a program selector and still keeps high program efficiency. The cell 730 has a PRE with body 731, anode 732, and cathode 733. The body 731 of the PRE is also the gate of a dummy-gate diode including an active region 734, a cathode with an N+ implant 735 and a cathode contact 737, and an anode with a P+ implant 736 and an anode contact 738. The cathode 733 of the PRE is coupled to the anode of the dummy-gate diode by a metal 739.

FIG. 6(d2) shows a top view of a programmable resistive device (PRD) cell 730' built on a thermally insulated substrate, such as SOI or polysilicon. In a thermally insulated substrate the heat conductivity is poor such that the programmable resistive element (PRE) can be shared with the gate of a program selector and still keeps high program efficiency. The cell 730' has a PRE with body 731', anode 732', and cathode 733'. The body 731' of the PRE is also the gate of a MOS including an active region 734', a drain with a drain contact 737' covered by an N+ implant 735' and a source with a contact 738' covered by a P+ implant 736'. The cathode 733' of the PRE is coupled to the source contact 738' of the MOS by a metal 739'. The PRD cell 730' can be programmed or read by turning on the source junction diode of the MOS, similar to the operations from FIG. 6(c4)-6(c7).

The PRD cells 730 and 730' shown in FIGS. 6(d1) and 6(d2) are for illustrative purposes. The thermally insulated substrate can be a Silicon-On-Insulator (SOI) or a polysilicon substrate. The active area can be silicon, Ge, SiGe, III-V, or II-VI semiconductor material. The PRE can be an electrical fuse (including anti-fuse), PCM thin film, RRAM film, etc. The PRE can be built with heat sink as shown in FIGS. 7(a2), 7(a3a)-7(a3c), heat source as shown in FIG. 7(a3) or 7(a3d), or extended area as shown in FIG. 7(a3e)-7(a3g). The program selector can be a diode or a MOS. The MOS selector can be programmed or read by turning on a MOS channel or a source junction. There are many combinations and equivalent embodiments of this concept and they all fall within the scope of this invention for those skilled in the art.

Figure 7A:
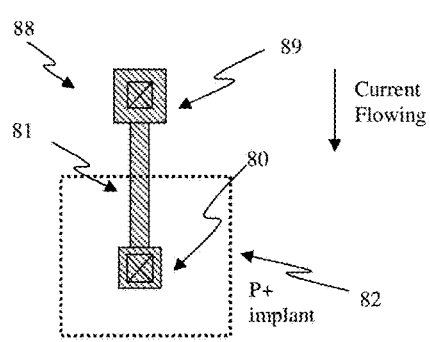
FIG. 7(*a*) shows an electrical fuse element according to one embodiment.
Figure 7:
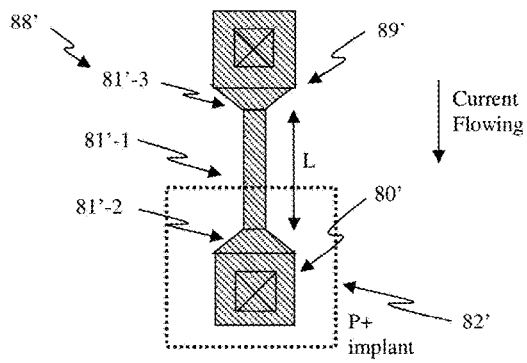
Figure 7:
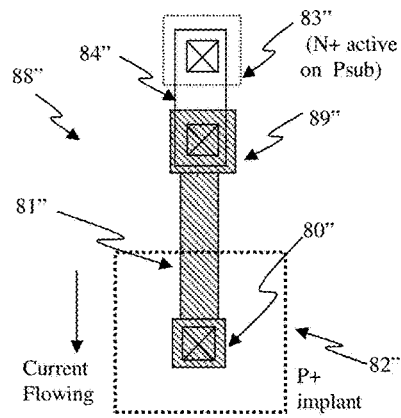
Figure 7:
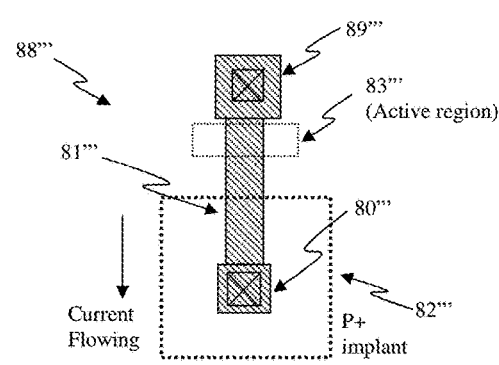
Figure 7:
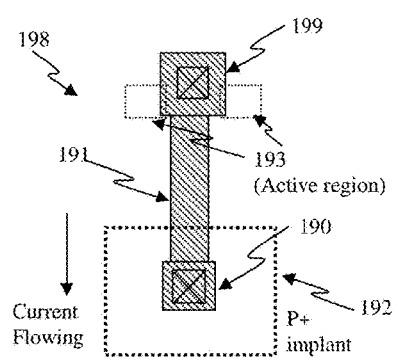
Figure 7:
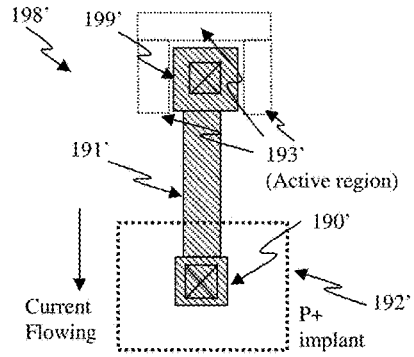
Figure 7:
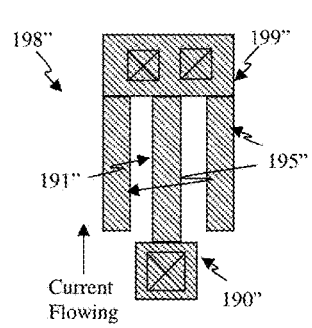
Figure 7:
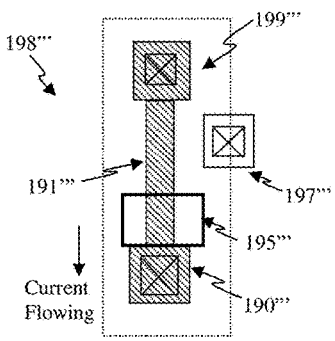
Figure 7:
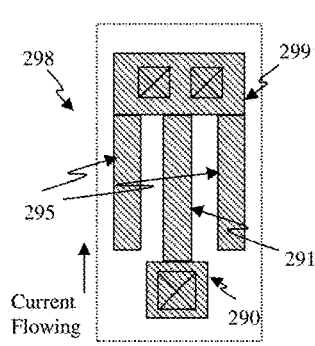
Figure 7:
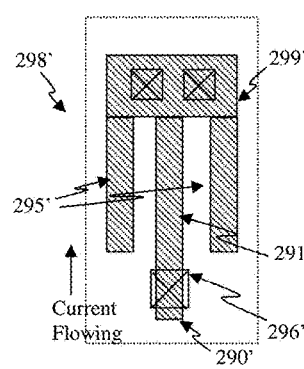
Figure 7:
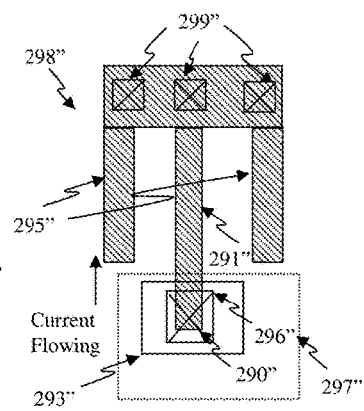
Figure 7:
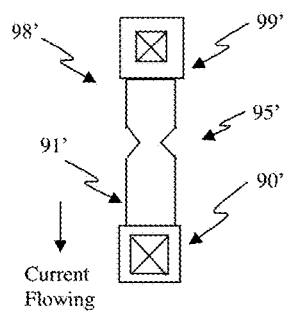
Figure 7:
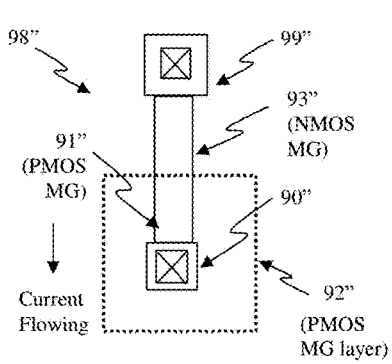
Figure 7:
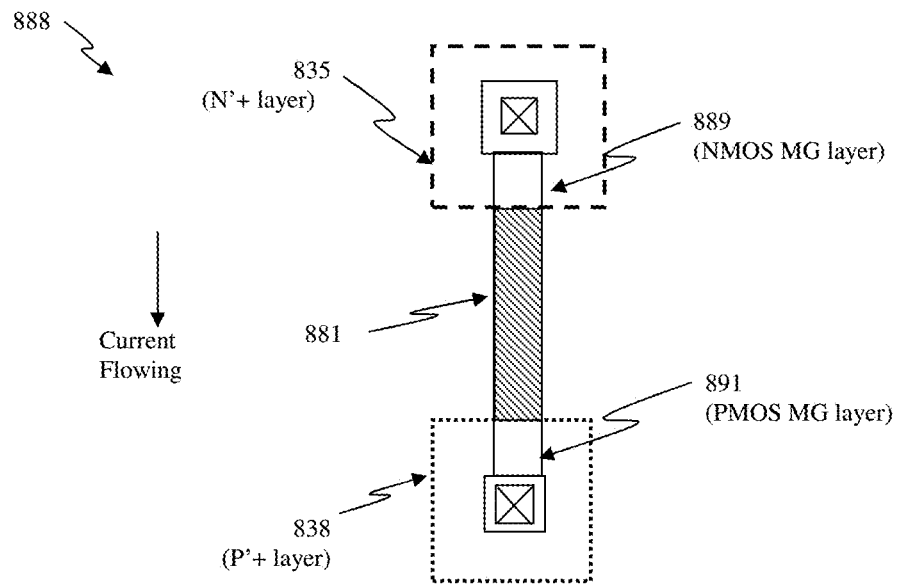
Figure 7:
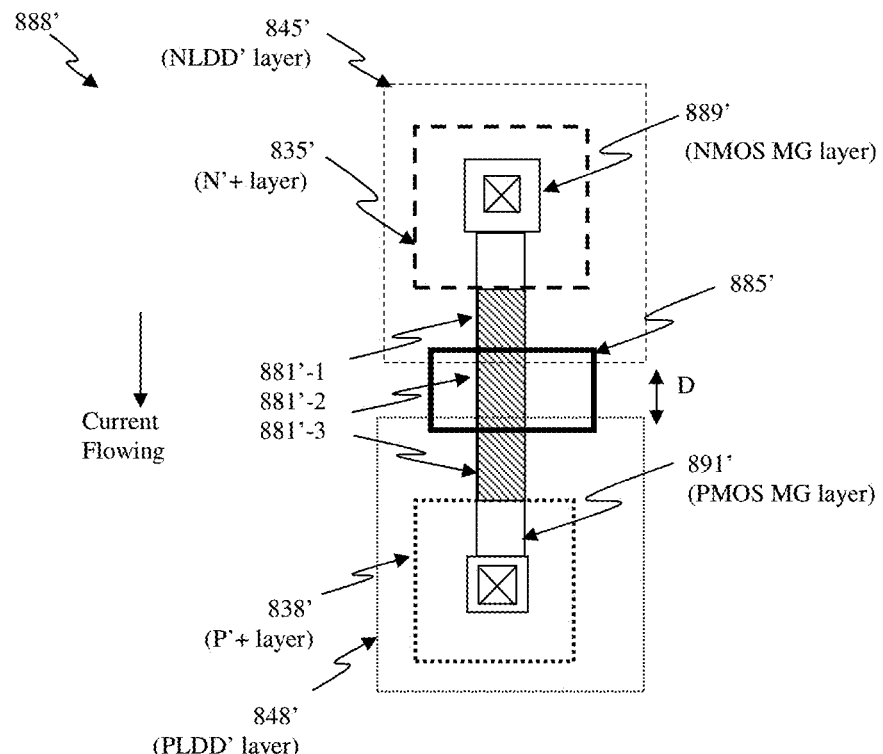
Figure 7:
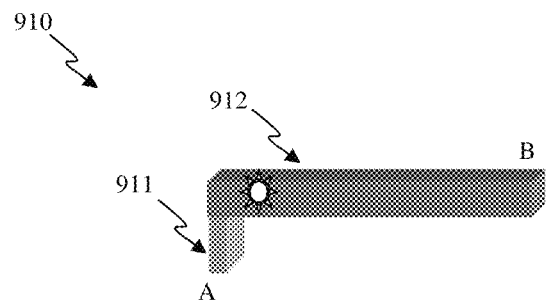
Figure 7:
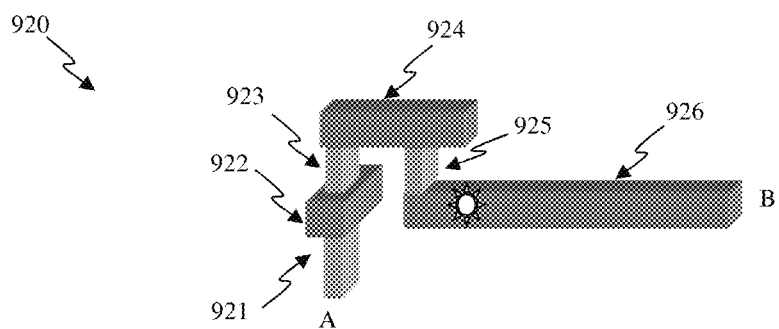
Figure 7:
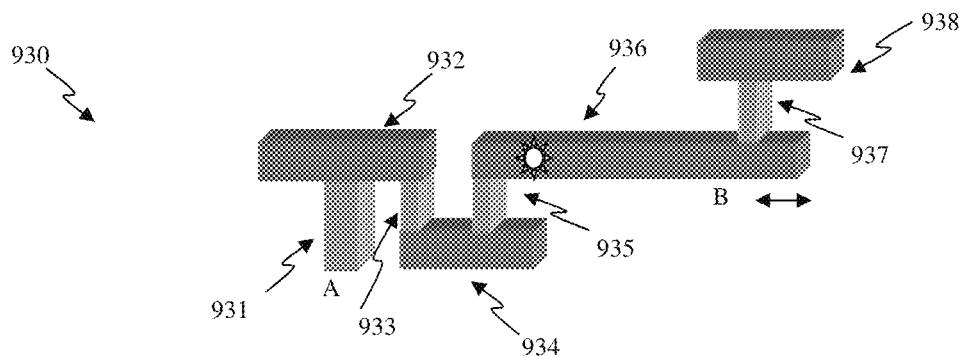
Figure 7:
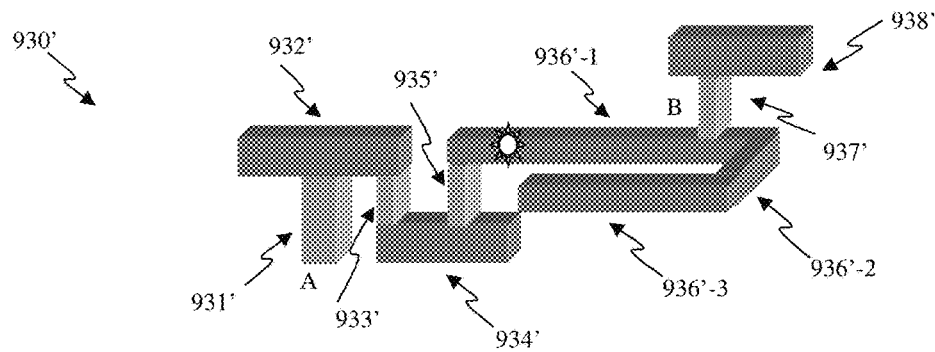
Figure 7:
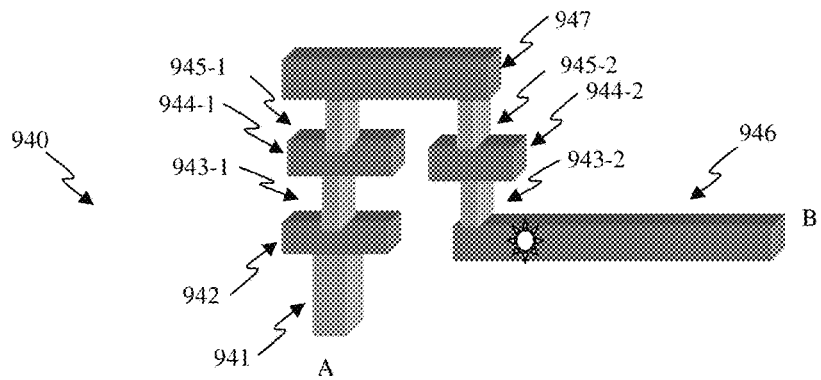
Figure 7:
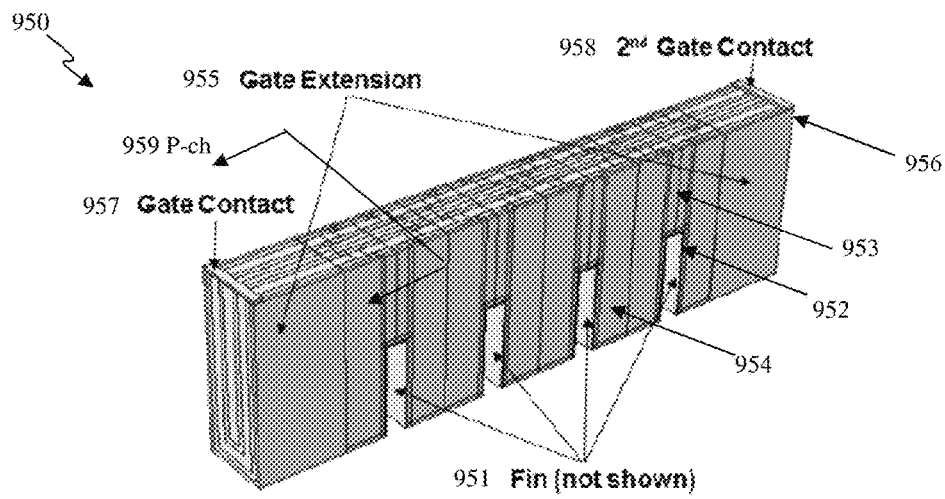

FIG. 7(a) shows a top view of an electrical fuse element 88 according to one embodiment. The electrical fuse element 88 can, for example, be used as the resistive element 31a illustrated in FIG. 5(a). The electrical fuse element 88 includes an anode 89, a cathode 80, and a body 81. In this embodiment, the electrical fuse element 88 is a bar shape with a small anode 89 and cathode 80 to reduce area. In another embodiment, the width of the body 81 can be about the same as the width of cathode or anode. The width of the body 81 can be very close to the minimum feature width of the interconnect. The anode 89 and cathode 80 may protrude from the body 81 to make contacts. The contact number can be one (1) for both the anode 89 and the cathode 80 so that the area can be very small. However, the anode 89 or cathode 80 can have any shapes or different area ratio in one embodiment. In other embodiments, the area ratio of the anode 89 to cathode 80 or cathode 80 to anode 89 can be between 2 to 4. In other words, the electrical fuse can be asymmetrical between cathode and anode, and/or between the left and right parts of the fuse in FIG. 7(a). In one embodiment, the fuse body 81 can have about 0.5-8 squares, namely, the length to width ratio is about 0.5-to-8, to make efficient use of (e.g., optimize) cell area and program current. In one embodiment, the fuse body 81 can have about 2-6 squares, namely, the length to width ratio is about 2-to-6, to efficiently utilize cell area and program current. In yet another embodiment, the narrow fuse body 81 can be bent (such as 45, 90, or any degrees) to make the length longer between the width of anode and cathode areas to utilize cell area more efficiently. The fuse element 88 has a P+ implant 82 covering part of the body 81 and the cathode 80, while an N+ implant over the rest of area. This embodiment makes the fuse element 88 behave like a reverse biased diode to increase resistance after being programmed, such as when silicide on top is depleted by electro-migration, ion diffusion, silicide decomposition, and other effects. The fuse element 88 can also have a portion of NMOS gate and another portion of PMOS gate in a metal-gate process placed in any order of the current flowing directions. NMOS and PMOS gates can have different material composition to create stress so that fuse programming can be easier. It is desirable to make the program voltage compatible with the I/O voltages, such as 3.3V, 2.5V, or 1.8V, for ease of use without the needs of building charge pumps. The program voltage pin can also be shared with at least one of the standard I/O supply voltage pins. In one embodiment, to make the cell small while reducing the contact resistance in the overall conduction path, the number of contacts in the OTP element or diode can be no more than two (<=2), in a single cell. Similarly, in another embodiment, the contact size of the OTP element or diode can be larger than at least one contact outside of the memory array. The contact enclosure can be smaller than at least one contact enclosure outside of the memory array in yet another embodiment.

FIG. 7(a1) shows a top view of an electrical fuse structure 88' with a small body 81'-1 and at least one slightly tapered structures 81'-2 and/or 81'-3 according to another embodiment. The electrical fuse element 88' can, for example, be used as the resistive element 31a illustrated in FIG. 5(a). The electrical fuse element 88' includes an anode 89', a cathode 80', body 81'-1, and tapered structures 81'-2 and 81'-3. The body 81'-1 can include a small rectangular structure coupled to at least one tapered structures 81'-2 and/or 81'-3, which are further coupled to cathode 80' and anode 89', respectively. The length (L) and width (W) ratio of the body 81'-1 is typically between 0.5 and 8. In this embodiment, the electrical fuse element 88' is substantially a bar shape with a small anode 89' and cathode 80' to reduce area. The anode 89' and cathode 80' may protrude from the body 81-1' to make contacts. The contact number can be one (1) for both the anode 89' and the cathode 80' so that the area can be very small. The contact can be larger than at least one contact outside of the memory array in another embodiment. The contact enclosure can be smaller than at least one contact enclosure outside of the memory array in yet another embodiment. P+ implant layer 82' covers part of the body and N+ implant layer (the complement of P+) covers the other part so that the body 81'-1 and taped structure 81'-2 can behave like a reverse biased diode to enhance resistance ratio during read, such as when silicide on top is depleted after program.

FIG. 7(a2) shows a top view of an electrical fuse element 88" according to another embodiment. The electrical fuse element 88" is similar to the one shown in FIG. 7(a) except using a thermally conductive but electrically insulated heat sink coupled to the anode. The electrical fuse element 88" can, for example, be used as the resistive element 31a illustrated in FIG. 5(a). The electrical fuse element 88" can include an anode 89", a cathode 80", a body 81", and an N+ active region 83". The N+ active region 83" on a P type substrate is coupled to the anode 89" through a metal 84". In this embodiment, the N+ active region 83" is electrically insulated from the conduction path (i.e. N+/P sub diode is reverse biased) but thermally conductive to the P substrate that can serve as a heat sink. In other embodiment, the heat sink can be coupled to the anode 89" directly without using any metal or interconnect, and can be close to or underneath the anode. The heat sink can also be coupled to the body, cathode, or anode in part or all of a fuse element in other embodiments. This embodiment of heat sink can create a steep temperature gradient to accelerate programming.

FIG. 7(a3) shows a top view of an electrical fuse element 88''' according to another embodiment. The electrical fuse element 88''' is similar to the one shown in FIG. 7(a) except a thinner oxide region 83''' which serves as a heat sink underneath the body 81" and near the anode 89'''. The electrical fuse element 88''' can, for example, be used as the resistive element 31a illustrated in FIG. 5(a). The electrical fuse element 88''' includes an anode 89''', a cathode 80''', a body 81''', and an active region 83''' near the anode 89'''. The active region 83''' underneath the fuse element 81''' makes the oxide thinner in the area than the other (i.e., thin gate oxide instead of thick STI oxide). The thinner oxide above the active region 83''' can dissipate heat faster to create a temperature gradient to accelerate programming. In other embodiments, the thin oxide area 83''' can be placed underneath the cathode, body, or anode in part or all of a fuse element as a heat sink.

FIG. 7(a3a) shows a top view of an electrical fuse element 198 according to another embodiment. The electrical fuse element 198 is similar to the one shown in FIG. 7(a) except thinner oxide regions 193 are placed in two sides of the anode 199 as another form of heat sink. The electrical fuse element 198 can, for example, be used as the resistive element 31a illustrated in FIG. 5(a). The electrical fuse element 198 includes an anode 199, a cathode 190, a body 191, and an active region 193 near the anode 199. The active region 193 underneath the anode 199 makes the oxide thinner in the area than the other (i.e., thin gate oxide instead of thick STI oxide). The thinner oxide above the active region 193 can dissipate heat faster to create a temperature gradient to accelerate programming. In other embodiment, the thin oxide area can be placed underneath the cathode, body, or anode in part or in all of a fuse element as a heat sink in one side, two sides, or any sides.

FIG. 7(a3b) shows a top view of an electrical fuse element 198' according to another embodiment. The electrical fuse element 198' is similar to the one shown in FIG. 7(a) except thinner oxide regions 193' are placed close to the anode 199' as another form of heat sink. The electrical fuse element 198' can, for example, be used as the resistive element 31a illustrated in FIG. 5(a). The electrical fuse element 198' includes an anode 199', a cathode 190', a body 191', and an active region 193' near the anode 199'. The active region 193' close to the anode 199' of the fuse element 198' makes the oxide thinner in the area than the other (i.e., thin gate oxide instead of thick STI oxide) and can dissipate heat faster to create a temperature gradient to accelerate programming. In other embodiment, the thin oxide area can be placed near to the cathode, body, or anode of a fuse element in one, two, three, four, or any sides to dissipate heat faster. In other embodiment, there can be at least one substrate contact coupled to an active region, such as 193', to prevent latch-up. The contact pillar and/or the metal above the substrate contact can also serve as another form of heat sink.

FIG. 7(a3c) shows a top view of an electrical fuse element 198" according to yet another embodiment. The electrical fuse element 198" is similar to the one shown in FIG. 7(a) except having a heat sink 195" in the cathode. The electrical fuse element 198" can, for example, be used as the resistive element 31a illustrated in FIG. 5(a). The electrical fuse element 198" includes a cathode 199", an anode 190", a body 191", and a heat sink 195". In one embodiment, the heat sink area can be only one side, instead of two sides to fit into small cell space, and/or the length can be longer or shorter. In another embodiment, the heat sink area can be a portion of anode or body in one side or two sides. In yet another embodiment, the length to width ratio of a heat sink area can be larger than 0.6 or larger than minimum requirement by design rules.

FIG. 7(a3d) shows a top view of an electrical fuse element 198''' according to yet another embodiment. The electrical fuse element 198''' is similar to the one shown in FIG. 7(a) except a heater 195''' is created near the cathode. The electrical fuse element 198''' can, for example, be used as the resistive element 31a illustrated in FIG. 5(a). The electrical fuse element 198''' includes an anode 199''', a cathode 190''', a body 191''', and high resistance area 195''' which can serve as a heater. The high resistance area 195''' can generate more heat to assist programming the fuse element. In one embodiment, the heater can be an unsilicided polysilicon or unsilicided active region with a higher resistance than the silicided polysilicon or silicided active region, respectively. In another embodiment, the heater can be a single or a plurality of contact and/or via in serial to contribute more resistance and generate more heat along the programming path. In yet another embodiment, the heater can be a portion of high resistance interconnect to provide more heat to assist programming. The heater 195'''' can be place to the cathode, anode, or body, in part or all of a fuse element. Active region 197" has a substrate contact to reduce latch-up hazards. The contact pillar in the active region 197" can also act as a heat sink.

FIG. 7(a3e) shows a top view of an electrical fuse element 298 according to yet another embodiment. The electrical fuse element 298 is similar to the one shown in FIG. 7(a) but further includes an extended region 295 in a cathode portion. The electrical fuse element 298 can, for example, be used as the resistive element 31a illustrated in FIG. 5(a). The electrical fuse element 298 includes a cathode 299, an anode 290, a body 291, and an extended cathode region 295. In other embodiments, the extended cathode area can be on only one side of the body 291, for small cell size, and/or the length of the extended cathode structures can be longer or shorter. More generally, however, the extended cathode region 295 is referred to as an extended area. That is, the extended cathode region 295 is one example of an extended area. In another embodiment, the extended area can be a portion of anode or body in one side or two sides. In yet another embodiment, the length to width ratio of an extended area can be larger than 0.6. The extended area means any additional area longer than required by design rules and coupled to an anode, cathode, or body that has reduced or no current flowing therethrough to assist with programming.

FIG. 7(a3f) shows a top view of an electrical fuse element 298' with an extended area in a cathode portion according to another embodiment. The electrical fuse 298' has a cathode 299', an anode 290' and a body 291'. The cathode 299' has an extended cathode area 295' near to and on one or two sides of the body 291' to assist (e.g., accelerate) programming. The extended area 295' are pieces of fuse element that extend beyond nearest cathode and anode contacts and are longer than required by design rules. The anode contact 290' in the electrical fuse element 298' is also borderless, namely, the contact is wider than the underneath fuse element. In another embodiment, the cathode contact can be borderless and/or the anode portion can have extended area.

FIG. 7(*a*3*g*) shows a top view of an electrical fuse element 298" according to another embodiment. The electrical fuse 298" has a cathode contact 299", an anode 290" and a body 291". The cathode 299" has extended areas 295", and contacts 299" near to and on two sides of the body 291" to accelerate programming. The extended areas 295" are segments of fuse element that extend beyond the cathode or anode contact with reduced or substantially no current flowing through and/or are longer than required by design rules. The extended area 295" can have the length to width ratio in the current flowing path of larger than required by design rules, or larger than 0.6, for example. The anode 290" has a shared contact 296" to interconnect the fuse element 291" with an active region 297" in a single contact 296" with a piece of metal 293" on top. The extended area can be near to one side of the body 291" and/or attached to cathode or anode in other embodiment. In another embodiment, the extended area can be straight or bent more than once to save area. In yet another embodiment, the anode can have an extended area and/or the cathode can have a shared contact.

A heat sink can be used to create a temperature gradient to accelerate programming. The heat sink as shown in FIGS. 7(*a*2), 7(*a*3*a*)-7(*a*3*c*) are for illustrative purposes. A heat sink can be a thin oxide area placed near, underneath, or above the anode, body, or cathode of a fuse element in one, two, three, four, or any sides to dissipate heat faster. A heat sink can be an extended area of the anode, body, or cathode of a fuse element to increase heat dissipation area. A heat sink can also be a single or a plurality of conductors coupled to (i.e., in contact or in proximity) the anode, body, or cathode of a fuse element to dissipate heat faster. A heat sink can also be a large area of anode or cathode with one or more contact/via to increase heat dissipation area. A heat sink can also be an active region and/or with at least one contact pillar built above an active region near the cathode, body, or anode of the fuse element to dissipate heat faster. In an OTP cell that has a shared contact, i.e., using a metal to interconnect MOS gate and active region in a single contact, can be considered as another embodiment of a heat sink for MOS gate to dissipate heat into the active region faster.

Extended areas as shown in FIGS. 7(*a*3*e*)-7(*a*3*g*) are portions of fuse element beyond a contact or via that is longer than required by design rules and has reduced or no substantial current flowing therethrough such that programming can be accelerated. An extended area (which can bend 45 or 90 degrees and can include one or more separate components) can be placed to one, two, or any side of the anode, cathode, or body of a fuse element. An extended area can also act as a heat sink to dissipate more heat. Heat sink and extended area are based on two different physical properties to accelerate programming, though the embodiments in structure can be very similar. An extended area can act as a heat sink, but not the other way around. It should also be understood that the various embodiments can be used separate or in any combinations.

With a heat sink, the thermal conduction (i.e. heat loss) of a fuse element can be increased from 20% to 200% in some embodiments. Similarly, a heat generator can be used to create more heat to assist programming the fuse element. A heater, such as 83''' in FIG. 7(*a*3) or 195''' in FIG. 7(*a*3*d*), can usually be a high resistance area placed on or near the cathode, body, or anode in part or all of a fuse element to generate more heat. A heater can be embodied as a single or a plurality of unsilicided polysilicon, unsilicided active region, a single or a plurality of contact, via, or combined, or a single or a plurality of segment of high resistance interconnect in the programming path. The resistance of the heat generator can be from 8Ω to 200Ω, or more desirably from 20Ω to 100Ω, in some embodiments.

The fuse element with heat sink, heat generator, or extended area can be made of polysilicon, silicided polysilicon, silicide, polymetal, metal, metal alloy, metal gate, local interconnect, metal-0, thermally isolated active region, or CMOS gate, etc. There are many variations or combinations of variations and yet equivalent embodiments of heat sinks to dissipate heat, heat generators to provide more heat, and/or extended area to assist programming and that they are all within the scope of this invention.

FIG. 7(*a*4) shows a top view of an electrical fuse element 98' according to another embodiment. The electrical fuse element 98' is similar to the one shown in FIG. 7(*a*) except the fuse element has at least one notch in the body to assist programming. More generally, a target portion of the body 91' can be made formed with less area (e.g., thinner), such as a notch. The electrical fuse element 98' can, for example, be used as the resistive element 31*a* illustrated in FIG. 5(*a*). The electrical fuse element 98' can include an anode 99', a cathode 90', and a body 91'. The body 91' has at least a notch 95' so that the fuse element can be easily broken during programming FIG. 7(*a*5) shows a top view of an electrical fuse element 98" according to another embodiment. The electrical fuse element 98" is similar to the one shown in FIG. 7(*a*) except the fuse element is part NMOS and part PMOS metal gates. The electrical fuse element 98" can, for example, be used as the resistive element 31*a* illustrated in FIG. 5(*a*). The electrical fuse element 98" can include an anode 99", a cathode 90", and bodies 91" and 93" fabricated from PMOS and NMOS metal gates, respectively. By using different types of metals in the same fuse element, the thermal expansion can create a large stress to rupture the fuse when the temperature is raised during programming.

FIG. 7(*a*6) shows a top view of an OTP element 888 according to another embodiment. The OTP element 888 is similar to the one shown in FIG. 7(*a*) except the OTP element is built with a polysilicon between metal gates. The OTP element 888 can, for example, be used as the resistive element 31*a* illustrated in FIG. 5(*a*). The OTP element 888 can include an NMOS metal gate as anode 889, a PMOS metal gate as cathode 891, and a polysilicon as body 881. In a gate-last or Replacement Metal Gate (RMG) process, polysilicon can be provided and used as place holders for CMOS gates. After high temperature cycles of silicidation and source/drain annealing, the polysilicon gates are etched and replaced by metal gates. Different types of metals can be used for NMOS and PMOS metal gates to suite NMOS/PMOS threshold voltage requirements. Since use of polysilicon as gates or interconnects are available before being replaced by metal gates, a portion of polysilicon can be preserved by modifying the layout database with layout logic operations. For example, the N+ and P+ implant layers with N well can be used to define NMOS and PMOS in the conventional CMOS. The N+ and P+ layers can be modified with logic operations as N'+ layer 835 and P'+ layer 838 so that a segment of polysilicon 881 can be preserved. The polysilicon as an OTP body 881 can be implanted by NLDD, PLDD, N+ source/drain, P+ source/drain, or threshold voltage adjust implants with minimum masks increment. The polysilicon 881 can be all N, all P, or part N and part P. The OTP element can be breakdown by high voltage or high current. In one embodiment, the polysilicon body can be between the same NMOS or PMOS metal gates. In another embodiment, the polysilicon body is coupled to neither NMOS nor PMOS metal gate.

FIG. 7(*a*7) shows a top view of a diode 888' according to another embodiment. The diode 888' is similar to the OTP element 888 shown in FIG. 7(*a*6) except the OTP body is further divided into N type and P type regions to act as a diode. The diode 888' can, for example, be used as the resistive element 31*a* or program selector 31*b* illustrated in FIG. 5(*a*). The diode 888' includes an NMOS metal gate as anode 889', a PMOS metal gate as cathode 891', and a polysilicon 881 as body. The body 881' is further divided into three regions 881'-1, 881'-3, and 881'-2, covered by modified NLDD' layer 845', modified PLDD' layer 848', and none, respectively. The layers 845' and 848' can be generated from NLDD and PLDD layers with logic operations so that the areas 881'-1 and 881'-3 can receive NLDD and PLDD implants, respectively. The NLDD' 845' and PLDD' 848' can be separated with a space D. The doping concentration in the space region can be slightly N or P, or unintentionally doped. The width of the space and/or the doping level in the space region can be used to adjust the diode's breakdown or leakage current. A silicide block layer (SBL) 885' can cover the space and overlap into both regions. The SBL 885' can be used to block silicide formation to prevent the bodies 881'-1 and 881'-3 from being shorts in one embodiment. The bodies 881'-1 and 881'-3 are coupled to anode 889' and 891', respectively, which serve as the N and P terminals of a diode. The diode can be used as an OTP element by junction breakdown under forward or reverse bias, or can be used as program selector. The NLDD or PLDD layer in the above discussions are for illustrative purposes. Any layers such as N+, P+, NLDD, PLDD, high-Resistance, or Vt-adjust implants can be used to construct a diode with minimum masks increment.

FIG. 7(*a*8) shows a 3D view of a metal fuse element 910 having two ends A and B, constructed from a contact 911 and a segment of metal1 912 according to one embodiment. The metal fuse element 910 has one end A coupled to a contact 911, which is coupled to a segment of metal1 912. The other end of the metal1 912 is the end B of the metal fuse element 910. When a high current flows through the metal fuse element 910, the high contact resistance (i.e. 60 ohm in 28 nm CMOS, for example) can generate additional Joule heat, to supplement the metal Joule heat, to assist with programming the metal1 912. The spot with the maximum temperature is marked with a sign of sun.

FIG. 7(*a*9) shows a 3D view of another metal fuse element 920 having two ends A and B, constructed from a contact 921, two vias 923 and 925, and segment(s) of metal1 and metal2. The metal fuse element 920 has one end A coupled to a contact 921, which is further coupled to a metal2 jumper 924 through a metal1 922 and a via 923. The metal2 jumper 924 is coupled to a segment of metal1 926 through another via 925. The other end of the metal1 926 is the end B of the metal fuse element 920. The metal2 jumper 924 can be referred to as a jumper because it electrically connects the via 923 with the via 925. The contact 921 and vias 923 and 925 can be used to generate additional heat to assist programming the metal1 926. For example, in an advanced CMOS technologies such as 28 nm, a contact resistance can be 60 ohm and a via resistance can be 10 ohm. By building up contacts and vias in series, the resistance in the programming path can be increased substantially to generate more Joule heat for programming the metal1 926, to supplement the Joule heat generated in metal1 926 alone. The hot spot is marked with a sign of sun in metal 1 926. The location of the hot spot depends on the length ratio of metal2 jumper 924 and metal1 926.

FIG. 7(*a*10) shows a 3D view of yet another metal fuse element 930 having two ends A and B, constructed from three contacts, one metal gate, and two segments of metal1. The metal fuse element 930 has one end A coupled to a contact 931, which is further coupled to a metal-gate jumper 934 through a metal1 jumper 932 and another contact 933. The metal-gate jumper 934 is coupled to another metal1 936 through another contact 935. The other end of the metal1 936 is the end B of the metal fuse element 930. The metal1 jumper 932 can be referred to as a jumper because it electrically connects the contact 931 with the contact 933. Also, the metal-gate jumper 934 can be referred to as a jumper because it electrically connects the contact 933 with the contact 935. There are three contacts 931, 933 and 935 being combined in this embodiment to generate more heat, i.e. 180 ohm if each contact has 60 ohm, for programming the metal1 936, to supplement the Joule heat generated by metal1 936 alone. The metal-gate jumper 934 can also help to generate Joule heat too. The end B can further be coupled to a via1 937 to metal2 938 for further interconnect. The metal1 936 near end B has an extension longer than required in design rules to accelerate programming. The hot spot is marked with a sign of sun on metal1 936. The location of the hot spot depends on the length ratios of metal1 jumper 932, metal-gate jumper 934 and metal1 936. This embodiment is more suitable when the metal-gate jumper 934 is harder to program than the metal1 936.

FIG. 7(*a*11) shows a 3D view of yet another metal fuse element 930' having two ends A and B, constructed from three contacts, one metal gate, and two segments of metal1. The metal fuse element 930' has one end A coupled to a contact 931', which is further coupled to a metal-gate jumper 934' through a metal1 jumper 932' and another contact 933'. The metal-gate jumper 934' is coupled to another metal1 936'-1 through another contact 935'. The other end of the metal1 936'-1 is the end B of the metal fuse element 930'. There are three contacts to generate more heat, i.e. 180 ohm if each contact has 60 ohm, for programming the metal1 936'-1 to supplement the Joule heat generated by metal1 936'-1 alone. The metal-gate jumper 934' can also help to generate Joule heat too. The end B can be coupled to a via1 937' which couples to metal2 938' for further interconnect. The metal1 936-1 near end B can also be extended beyond required by design rules to improve programming. The extended area can be quite long that can be configured (e.g., bent) as or into a configuration (e.g., hook or serpentine shape) to save area. For example, as illustrated in FIG. 7(*a*11), the metal1 936'-1 can be extended to include a hook shape of metal1 936'-2 and 936'-3 to accelerate programming. The hot spot is marked with a sign of sun on metal1 936'. The location of the hot spot depends on the length ratios of the metal1 jumper 932', the metal-gate jumper 934' and the metal1 936'. This embodiment is more suitable when the metal-gate jumper 934' is harder to program than the metal1 936'.

FIG. 7(*a*12) shows a 3D view of another metal1 fuse element 940, having two ends A and B, constructed from contact, via1, via2 and segments of metal1 and metal2, according to another embodiment. The metal1 fuse 940 has one end A coupled to a contact 941, metal1 942, via1 943-1, metal2 944-1, via2 944-1 to metal3 jumper 947. The metal3 jumper 947 can be coupled to the metal1 946 through via2 945-2, and couple to metal2 944-2, via1 943-2. The contact and vias in the conduction path can help to generate more Joule heat to accelerate programming. The hot spot is marked with a sign of sun. The location of the hot spot on metal1 946 depends on the length ratio of metal3 jumper 947 and metal1 946. Similar to that shown in FIG. 7(a11), the metal 946 can be extended to improve programming. For example, an extension provided to the metal1 946 can be longer than required by design rules and/or a hook or serpentine shape of metal1 near the end B can help to accelerate programming. This embodiment can generate more heat by using more contact or vias.

FIG. 7(a13) shows a 3D perspective view of a metal gate as a fuse element 950 in a FinFET technology, according to one embodiment. The metal-gate fuse 956 straddles over 4 fins 951 (not shown) in a perspective view. Over the fins, there are high-K dielectrics with work function metal 952 and gate filler 953 on top of fins 951. There are also gate filler 954 of the same material to interconnect between fins 951 and gate extension 955 to provide a first gate contact 957 (not shown) and second gate contact 958 (not shown) to constitute the metal-gate fuse 956. The metal-gate fuse 956 can be built with a portion of PMOS and another portion of NMOS gate material in any current directions. NMOS and PMOS can have different gate material compositions to create stress so that fuse programming can be easier. The boundaries between NMOS and PMOS can be somewhere in the middle of the fins 951 or near to the fins 951 to create heat and stress spots to assist fuse programming. The thinner portion of the gate 953 on top of fins 951 can have higher resistance to act as a heat generator to assist programming. On the other hand, the thin gate dielectrics below the gate 953 can dissipate heat to the fins 951 and can act as a heat sink. There are many combinations of using heat generator and heat sink as described in embodiments to accelerate programming. The metal-gate fuse 956 can straddle one or any number of fins in other embodiment. The gate 953 on top of the fins 951 can be in an extension area, beyond the cathode or anode contacts, instead of in the fuse body, in another embodiment. There are many variations and yet equivalent embodiments of this embodiment.

The embodiments in FIGS. 7(a8)-7(a13) are representative and suitable for those interconnect fuses that have low resistivity, i.e. metal or some kinds of local interconnect that has sheet resistance of 0.1-0.5 ohm/sq, for example. Counting on Joule heat generated by the interconnect fuses alone may not be sufficient to raise the temperature for programming. Instead, by building up a plurality of contacts, vias, or combinations of contacts and/or vias in series, more heat can be generated to raise the temperature to assist with programming. These embodiments can be applied to any kinds of metals, such as metal gate, local interconnect, metal1, metal2, etc. These embodiments can also be applied to any kind or any number of contacts, via1 (between metal1 and metal2), or via2 (between metal2 and metal3), etc. It is more desirable to keep the metal to be programmed long (i.e. length/width >20) and the jumpers (such as the other metals, metal gate, or local interconnect) being used short (i.e. length/width <10) so that high temperature can occur in the metal portion to be programmed. The long metal line can be serpentine to fit into small area. By using jumpers, contacts/vias can be further combined to further increase the resistance of the fuse element and raise its temperature to thereby seed-up programming of the fuse element.

There can be many variations of equivalent embodiments in using contacts, vias, or combination to assist programming metal fuses. For example, the metal to be programmed can be metal gate, local interconnect, metal1, metal2, metal3, or metal4, etc. The via can be any types of via, such as via2 between metal2 and metal3. The number of vias or contacts can be one or more, or none. The directions of current flow can be downstream or upstream, i.e. current flows from metal2 to metal1 or from metal1 to metal-2, respectively. It is more desirable for the end A to be coupled to a diode as program selector with no more than two contacts, and for the end B to be coupled to wider metals with more vias. The program selector can be a MOS device too. Those skilled in the art understand that there are many equivalent embodiments of the metal fuses using heat generated from a single or a plurality of contacts or vias to assist with programming and that are all still within other embodiments.

The OTP elements shown in FIGS. 7(a) and 7(a1)-7(a12) are only to illustrate certain embodiments. As denoted, the OTP elements can be built from any interconnects, including but not limited to polysilicon, silicided polysilicon, silicide, local interconnect, polymetal, metal, metal alloy, metal gate, thermally isolative active region, CMOS gate, or combinations thereof. Polymetal is a sandwich structure of metal-nitride-polysilicon, (i.e. W/WNx/Si) that can be used to reduce the resistance of polysilicon. The OTP elements can be N type, P type, or part N and part P type. Each of the OTP elements can have an anode, a cathode, and at least one body. The anode or cathode contacts can be no more than 2 for polysilicon/polymetal/local interconnect, and can be no more than 4 for metal fuse, preferably. The contact size can be larger than at least one contact outside of the OTP memory array. The contact enclosure can be smaller than at least one contact enclosure outside of the OTP memory array to lower the electromigration threshold. In another embodiment, the enclosure can be negative, namely, the contact is wider than the underneath figure, the so-called borderless contact. The length to width ratio in the body can be between 0.5-8, or more particular 2-6 in some embodiments, for polysilicon/local interconnect/polymetal/metal gate, or in the case of metal even larger than 10 for metal, for example. There are many variations or combinations of embodiments in part or all that can be considered equivalent embodiments.

Polysilicon used to define CMOS gates or as interconnect in a high-K/metal-gate CMOS process can also be used as OTP elements. The fuse element can be P type, N type, or part N and part P type if applicable. Particularly, the after/before resistance ratio can be enhanced for those fuse elements that have P+ and N+ implants to create a diode after being programmed, such as polysilicon, polymetal, thermally isolated active region, or gate of a high-K/metal-gate CMOS. For example, if a metal-gate CMOS has a sandwich structure of polysilicon between metal alloy layers, the metal alloy layers may be blocked by masks generated from layout database to create a diode in the fuse elements. In SOI or SOI-like processes, a fuse element can also be constructed from a thermally isolated active region such that the fuse element can be implanted with N+, P+, or part N+ and part P+ in each end of the active region. If a fuse element is partly implanted with N+ and P+, the fuse element can behave like a reverse-biased diode, such as when silicide on top is depleted after being programmed. In one embodiment, if there is no silicide on top of active regions, an OTP element can also be constructed from an isolated active region with part N+ and part P+ to act as a diode for breakdown in forward or reverse biased conditions. Using isolated active region to construct an OTP element, the OTP element can be merged with part of the program-selector diode in one single active island to save area.

In some processing technologies that can offer Local Interconnect, local interconnect can be used as part or all of an OTP element. Local interconnect, also called as metal0 (M0), is a by-product of a salicide process that has the capability to interconnect polysilicon or MOS gate with an active region directly. In advanced MOS technologies beyond 28 nm, the scaling along the silicon surface dimensions is much faster than scaling in the height. As a consequence, the aspect ratio of CMOS gate height to the channel length is very large such that making contacts between metal1 and source/drain or CMOS gate very expensive in terms of device area and cost. Local interconnect can be used as an intermediate interconnect between source/drain to CMOS gate, between CMOS gate to metal1, or between source/drain to metal1 in one or two levels The local interconnects, CMOS gate, or combination can be used as an OTP element in one embodiment. The OTP element and one terminal of the program-selector diode can be connected directly through local interconnect without needing any contacts to save area in another embodiment.

Those skilled in the art understand that the above discussions are for illustrative purposes and that there are many variations and equivalents in constructing electrical fuses (including anti-fuses) or program selectors in CMOS processes.

FIGS. 7(b), 7(c), 7(d), 7(e), 7(f), 7(g), 7(h) and 7(i1)-7(i6) show top views of P+/N well diodes constructed with different embodiments of isolation and fuse elements. Without isolation, P+ and N+ active regions would be shorted together by silicide grown on top. The isolation can be provided by STI, dummy CMOS gate, SBL, or some combination thereof from one to four (1-4) or any sides or between cells. The P+ and N+ active regions that act as P and N terminals of the diodes are sources or drains of CMOS devices. Both the P+ and N+ active regions reside in an N well, which can be the same N well to house PMOS in standard CMOS processes. The N+ active region of the diodes in multiple cells can be shared, though for simplicity FIGS. 7(b)-7(h) and 7(i1)-7(i6) show only one N+ active region for one P+ active region.

Figure 7B:
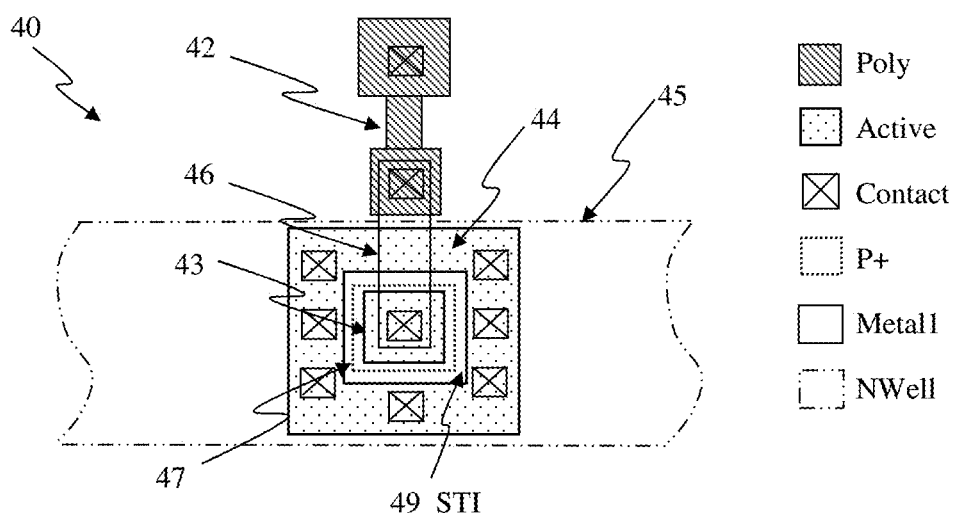

FIG. 7(b) shows a top view of one embodiment of an electrical fuse cell 40 including a P+/N well diode having active regions 43 and 44 with STI 49 isolation in four sides. A fuse element 42 is coupled to the active region 43 through a metal 46. The active regions 43 and 44 are covered by a P+ implant 47 and N+ implant (the complement of P+ implant 47), respectively, to constitute the P and N terminals of the diode 40. The active regions 43 and 44 of the diode 40 reside in an N well 45, the same N well can be used to house PMOS in standard CMOS processes. In this embodiment, the P+ active region 43 and N+ active region 44 are surrounded by an STI 49 in four (4) sides. Since the STI 49 is much deeper than either the N+ or P+ active region, the resistance of the diode 40 between the P+ active region 43 and N+ active region 44 is high.

Figure 7C:
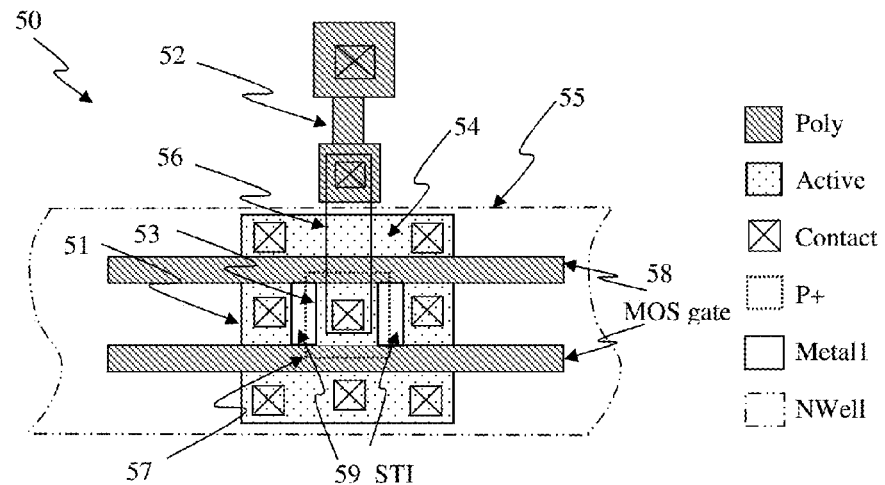

FIG. 7(c) shows a top view of another embodiment of an electrical fuse cell 50 including a P+/N well diode having active regions 53 and 54 with an STI 59 isolation in two sides and a dummy MOS gate 58 in another two sides. An active region 51 with two STI slots 59 in the right and left is divided into a peripheral 54 and a central 53 regions by two MOS gates 58 on top and bottom. The dummy MOS gate 58 is preferably biased to a fixed voltage. The central active region 53 is covered by a P+ implant 57, while the peripheral active region 54 is covered by an N+ implant layer (the complement of the P+ implant), which constitute the P and N terminals of the diode 50. The active region 51 resides in an N well 55, the same N well can be used to house PMOS in standard CMOS processes. A fuse element 52 is coupled to the P+ active region 53. In this embodiment, the P+ active region 53 and N+ active region 54 are surrounded by STI 59 in left and right sides and the dummy MOS gate 58 on top and bottom. The isolation provided by the dummy MOS gate 58 can have lower resistance than the STI isolation, because the space between the P+ active region 53 and N+ active region 54 may be narrower and there is no oxide to block the current path underneath the silicon surface.

Figure 7D:
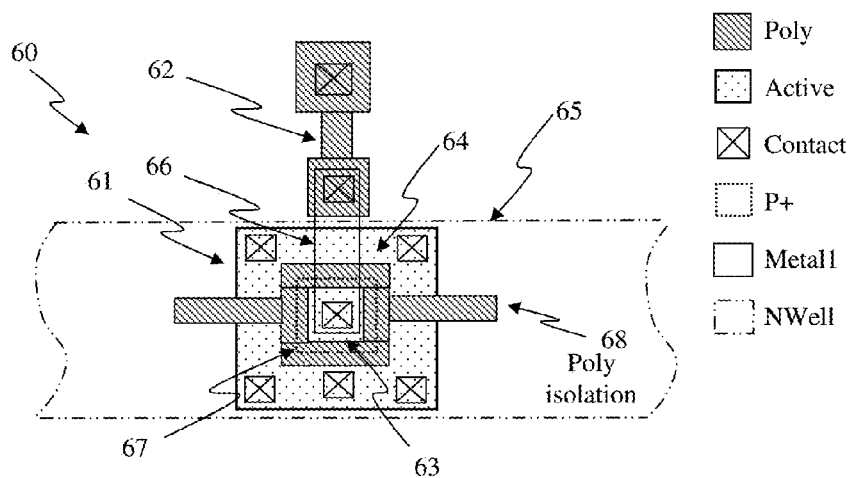

FIG. 7(d) shows a top view of yet another embodiment of an electrical fuse cell 60 including a P+/N well diode with dummy MOS gate 68 providing isolation in four sides. An active region 61 is divided into a center active region 63 and a peripheral active region 64 by a ring-shape MOS gate 68. The center active region 63 is covered by a P+ implant 67 and the peripheral active region 64 is covered by an N+ implant (the complement of the P+ implant 67), respectively, to constitute the P and N terminals of the diode 60. The active region 61 resides in an N well, the same N well can be used to house PMOS in standard CMOS processes. A fuse element 62 is coupled to the P+ active region 63 through a metal 66. The dummy MOS gate 68, which can be biased at a fixed voltage, provides isolation between P+ active region 63 and N+ active region 64 regions on four sides. This embodiment offers low resistance between P and N terminals of the diode 60.

Figure 7E:
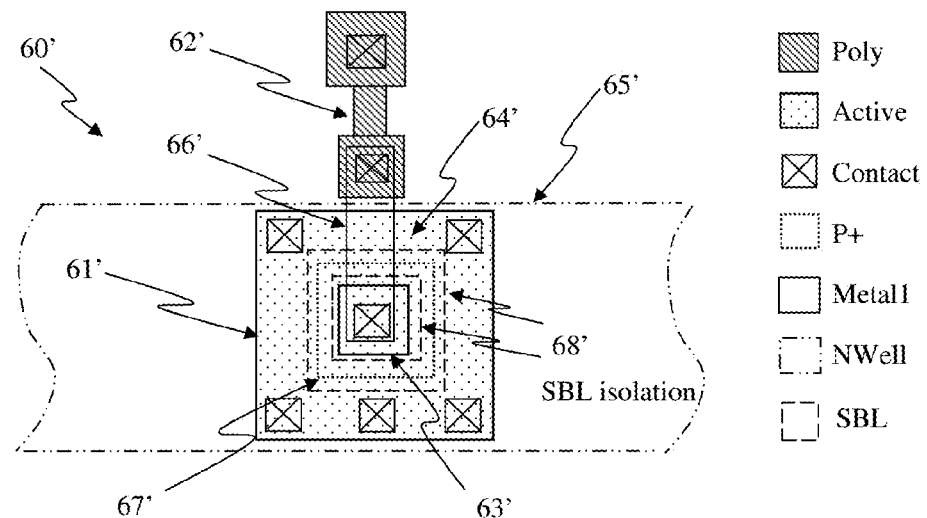

FIG. 7(e) shows a top view of yet another embodiment of an electrical fuse cell 60' including a P+/N well diode having active regions 63' and 64' with Silicide Block Layer (SBL) 68' providing isolation in four sides. An active region 61' is divided into a center active region 63' and a peripheral active region 64' by an SBL ring 68'. The center active region 63' and the peripheral active region 64' are covered by a P+ implant 67' and an N+ implant (the complement of P+ implant 67'), respectively, to constitute the P and N terminals of the diode 60'. The boundaries between the P+ implant 67' and N+ implants are about in the middle of the SBL ring 68'. The active region 61' resides in an N well 65'. A fuse element 62' is coupled to the P+ active region 63' through a metal 66'. The SBL ring 68' blocks silicide formation on the top of the active regions between P+ active region 63' and N+ active region 64'. In this embodiment, the P+ active region 63' and N+ active region 64' are isolated in four sides by P/N junctions. This embodiment has low resistance between the P and N terminals of the diode 60', though the SBL may be wider than a MOS gate. In another embodiment, there is a space between the P+ implant 67' and the N+ implant that is covered by the SBL ring 68'.

Figure 7F:
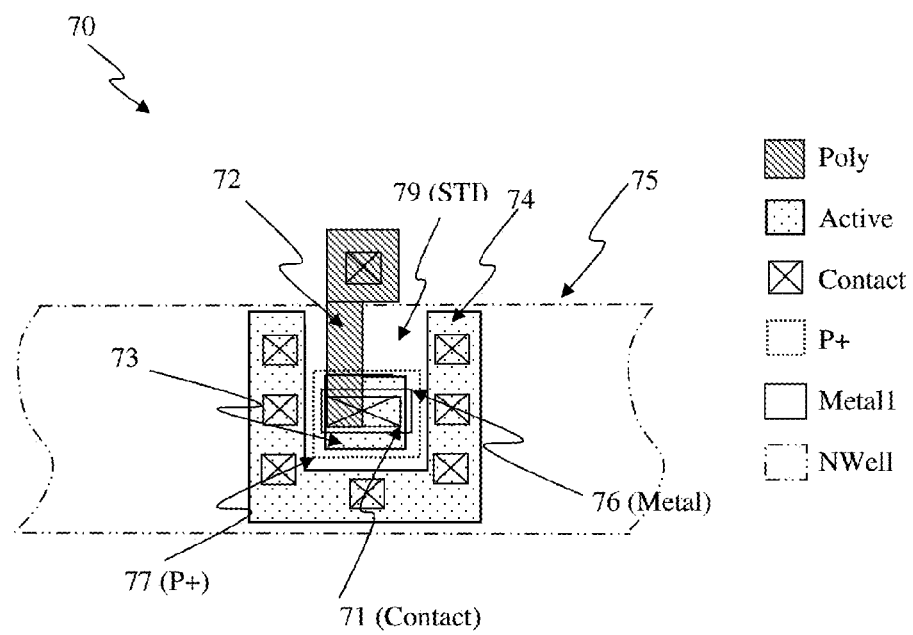

FIG. 7(f) shows a top view of another embodiment of an electrical fuse cell 70 having a P+/N well diode with an abutted contact. Active regions 73 and 74, which are isolated by an STI 79, are covered by a P+ implant 77 and an N+ implant (the complement of the P+ implant 77), respectively, to constitute the P and N terminals of the diode 70. Both of the active regions 73 and 74 reside in an N well 75, the same N well can be used to house PMOS in standard CMOS processes. A fuse element 72 is coupled to the P+ active region 73 through a metal 76 in a single contact 71. This contact 71 is quite different from the contacts in FIGS. 7(b), (c), (d), and (e) where a contact can be used to connect a fuse element with a metal and then another contact is used to connect the metal with a P+ active region. By connecting a fuse element directly to an active region through a metal in a single contact, the cell area can be reduced substantially. The abutted contact can be larger than a regular contact and, more particularly, can be a large rectangular contact that has about twice the area of a regular contact in a CMOS process. This embodiment for a fuse element can be constructed by a CMOS gate, including polysilicon, silicided polysilicon, polymetal, local interconnect, or non-aluminum metal CMOS gate, that allows an abutted contact.

Figure 7G:
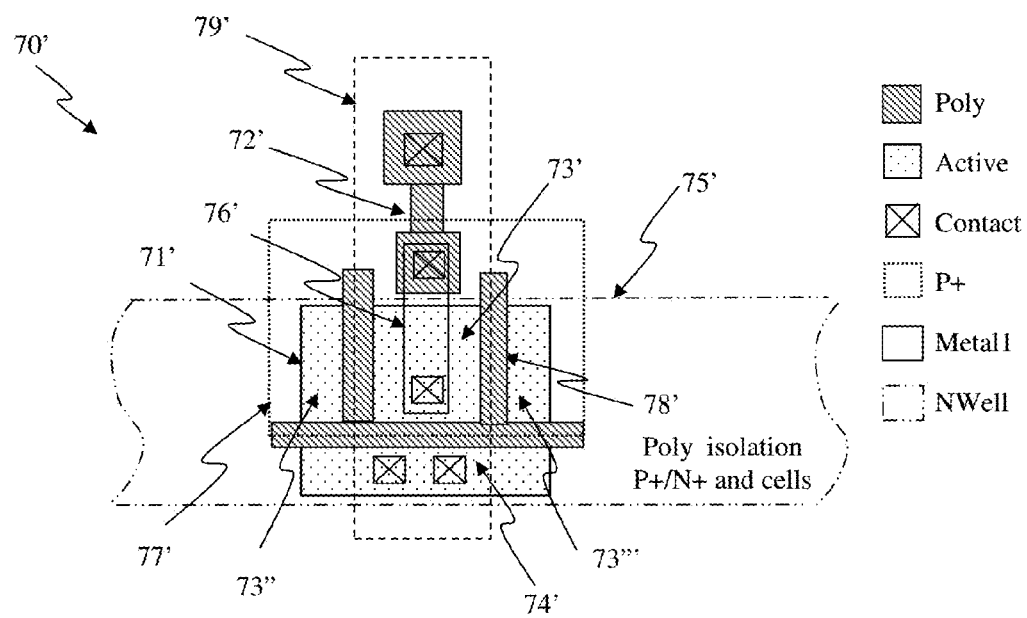

FIG. 7(g) shows a top view of yet another embodiment of fuse cells 70' with a central cell 79' and a portion of left/right cells. The central cell 79' includes an electrical fuse element 72' and a diode as program selector. An active region 71' is divided into upper active regions 73', 73", and 73'" and a lower active region 74' by a U-shape dummy MOS gate 78'. The upper active regions 73', 73", and 73'" are covered by a P+ implant 77' while the rest of lower active region 74' is covered by an N+ implant (the complement of the P+ implant 77'). The active region 73' and 74' constitute the P and N terminals of the diode in the central cell 79'. The active region 73" serves as a P terminal of a diode in the left cell, while the active region 73'" serves as a P terminal of a diode in the right cell. The polysilicon 78' isolates the P+/N+ of the diode in the central cell 79' and also isolates the P+ terminals of the left, central, and right cells by tying the polysilicon 78' to a high voltage (i.e. V+ in FIG. 5(a)). The polysilicon 78' can be a dummy MOS gate fabricated in standard CMOS processes. The active region 71' resides in an N well, the same N well that can be used to house PMOS in standard CMOS processes. A fuse element 72' is coupled to the P+ active region 73' through a metal 76' in the central cell 79'. This embodiment can offer low resistance between P and N terminals of the diode in the central cell 79' while providing isolations between the cells in the left and right.

Figure 7H:
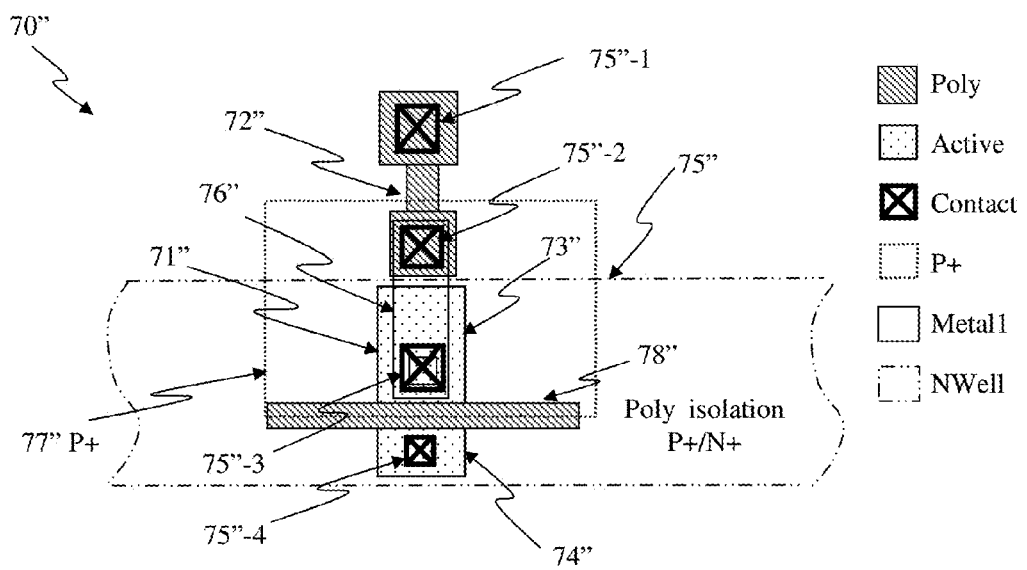
Figure 7:
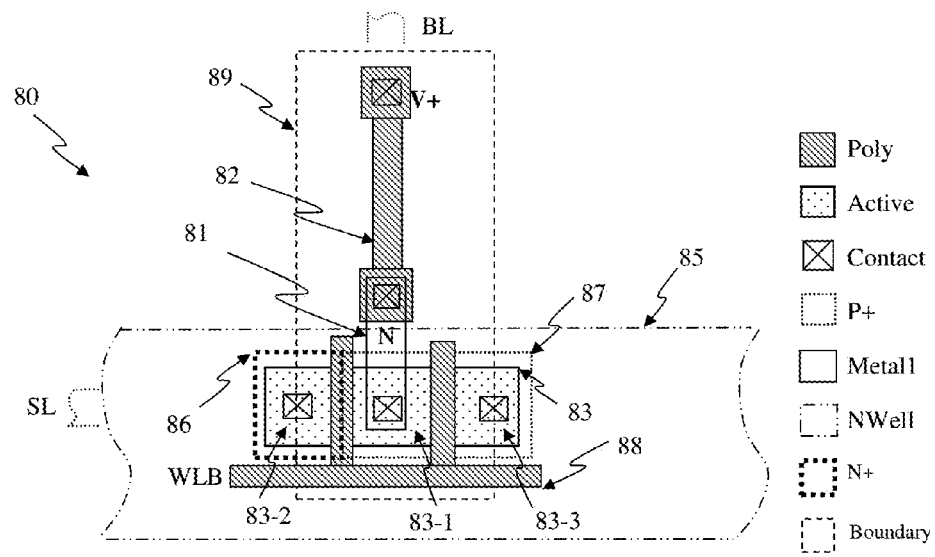
Figure 7:
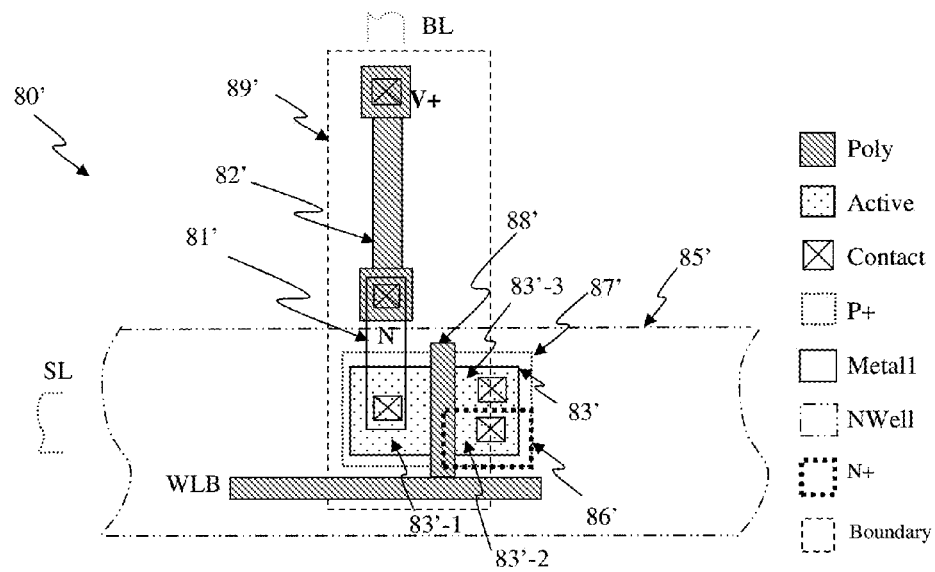
Figure 7:
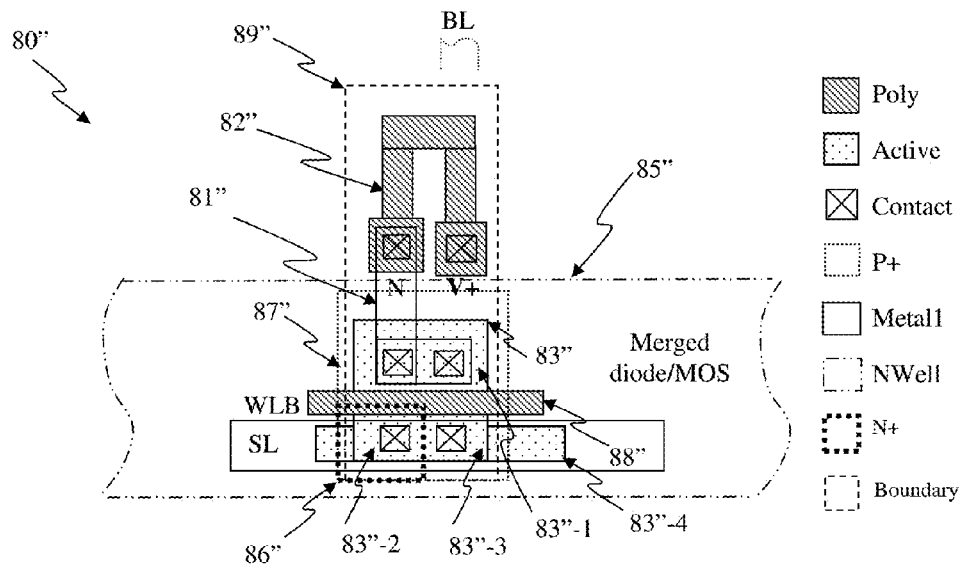
Figure 7:
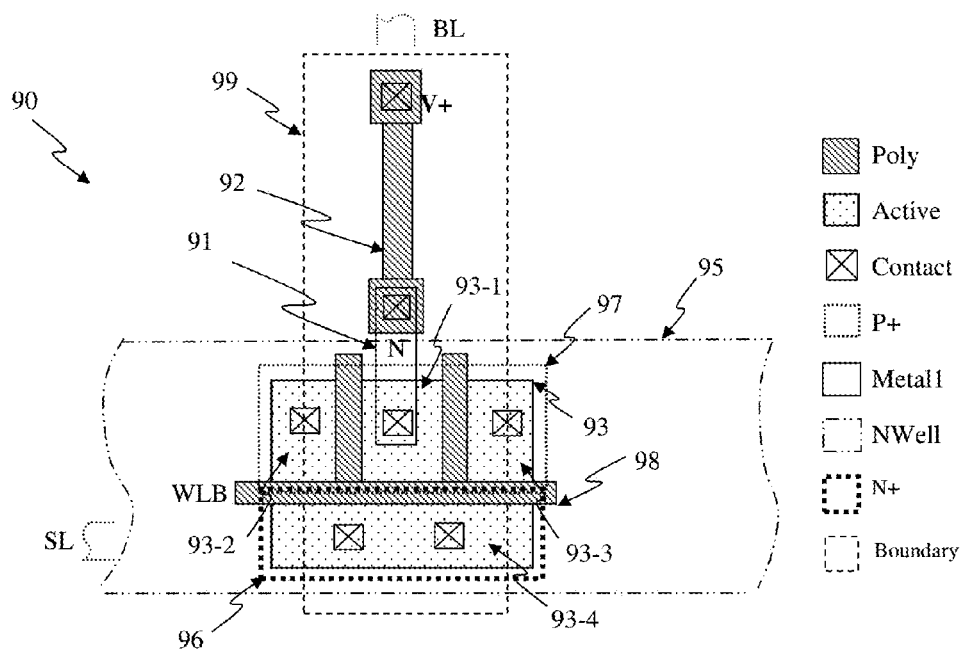
Figure 7:
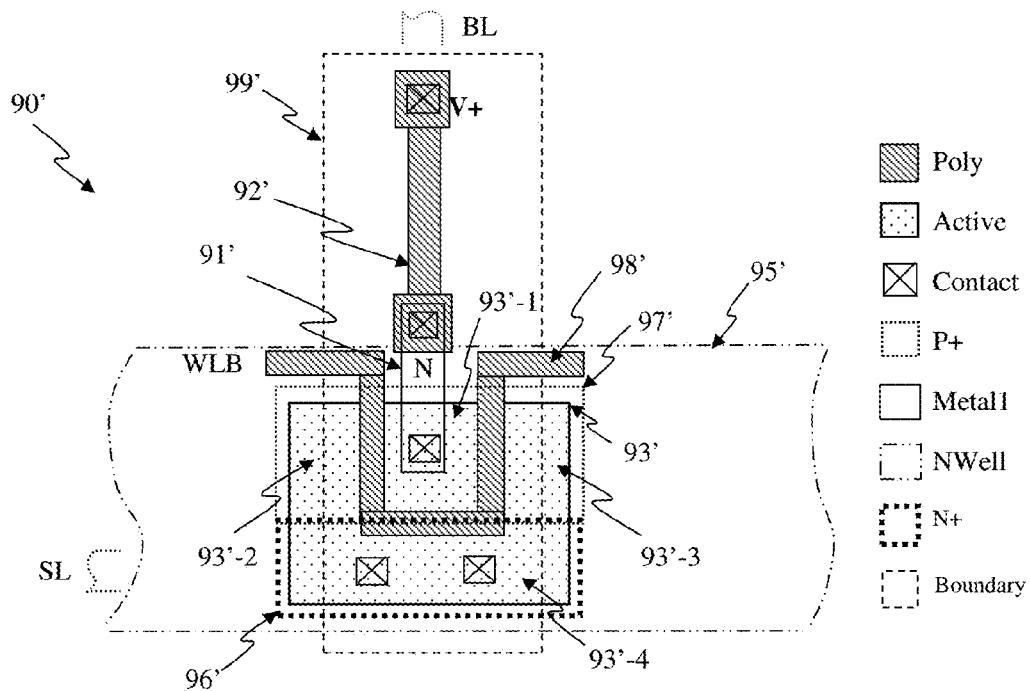
Figure 7:
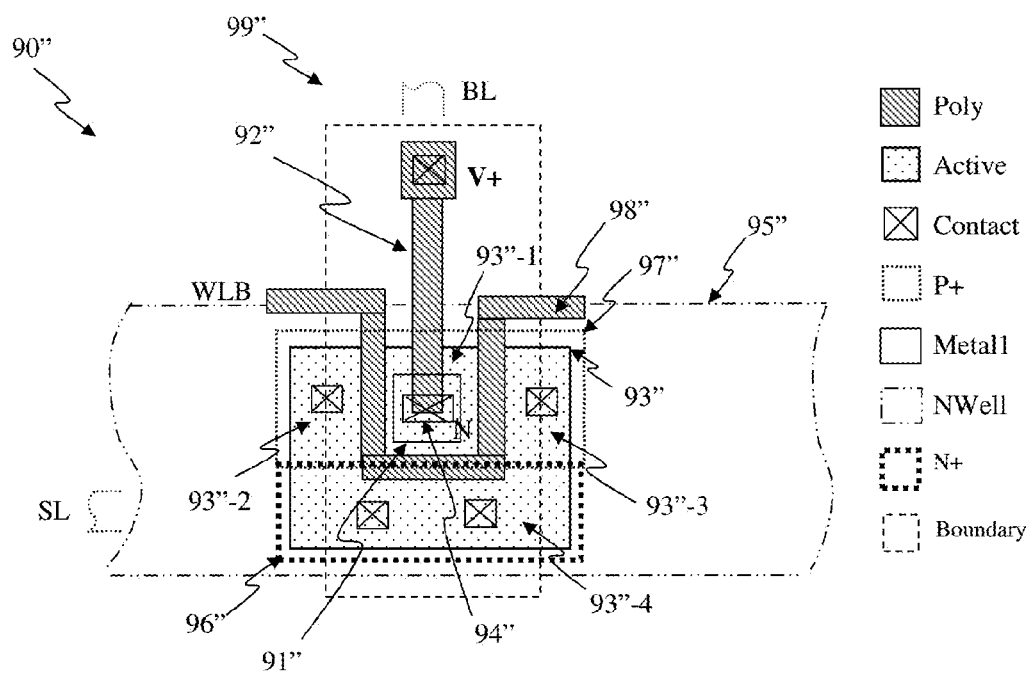
Figure 7:
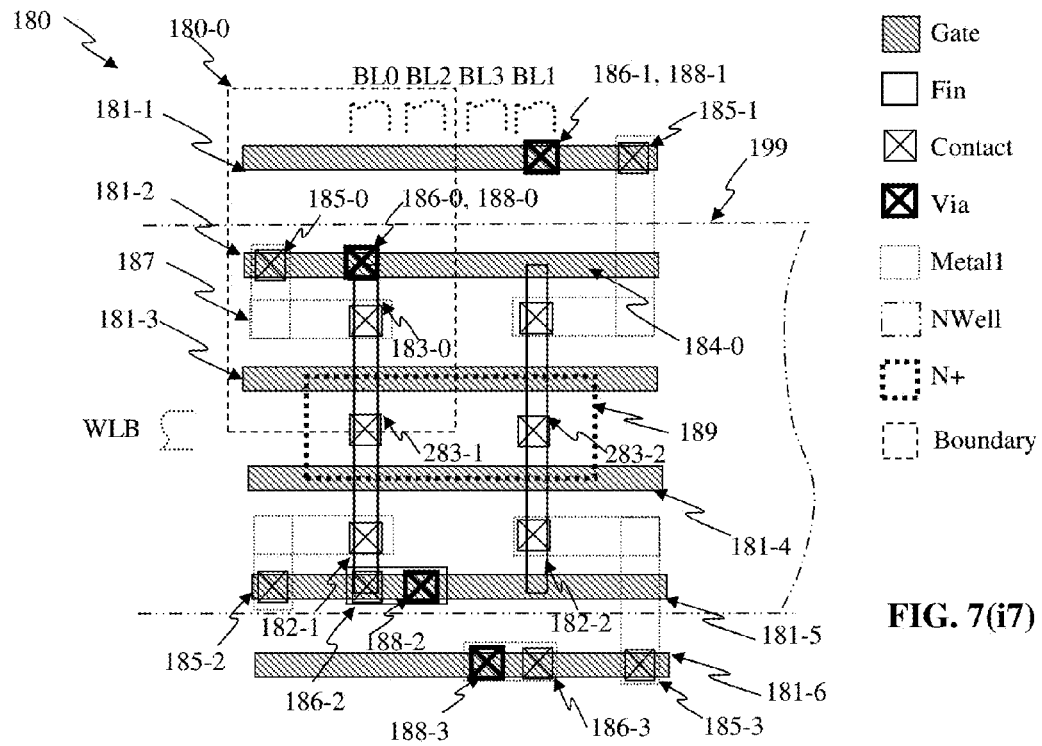
Figure 7:
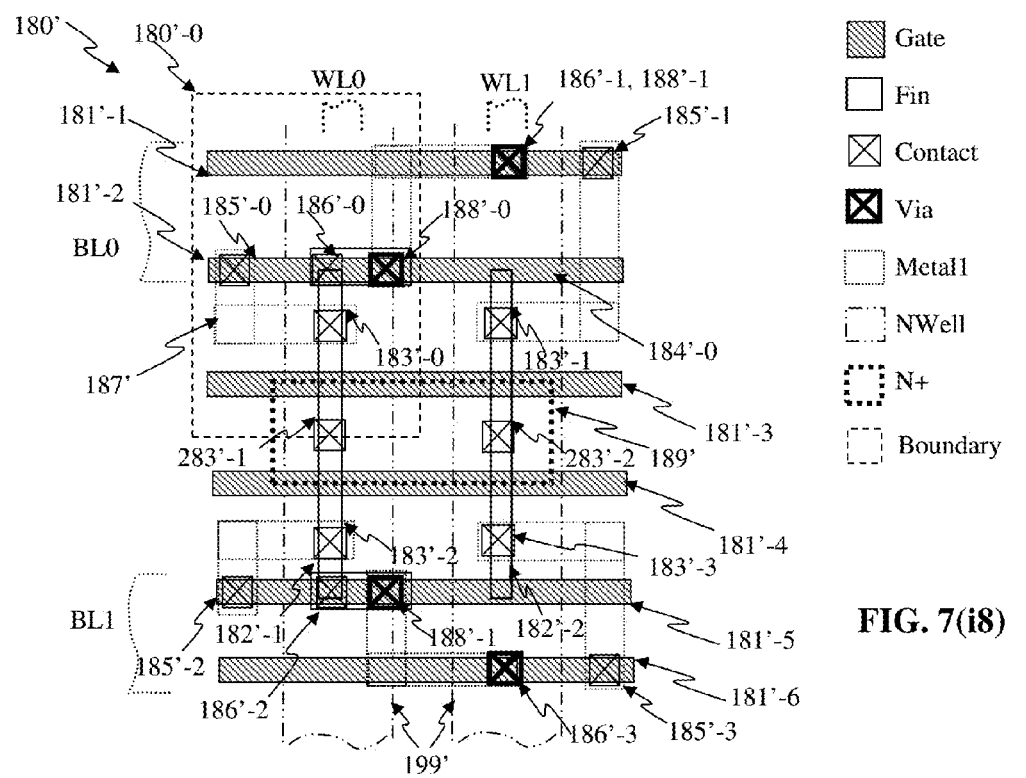
Figure 7:
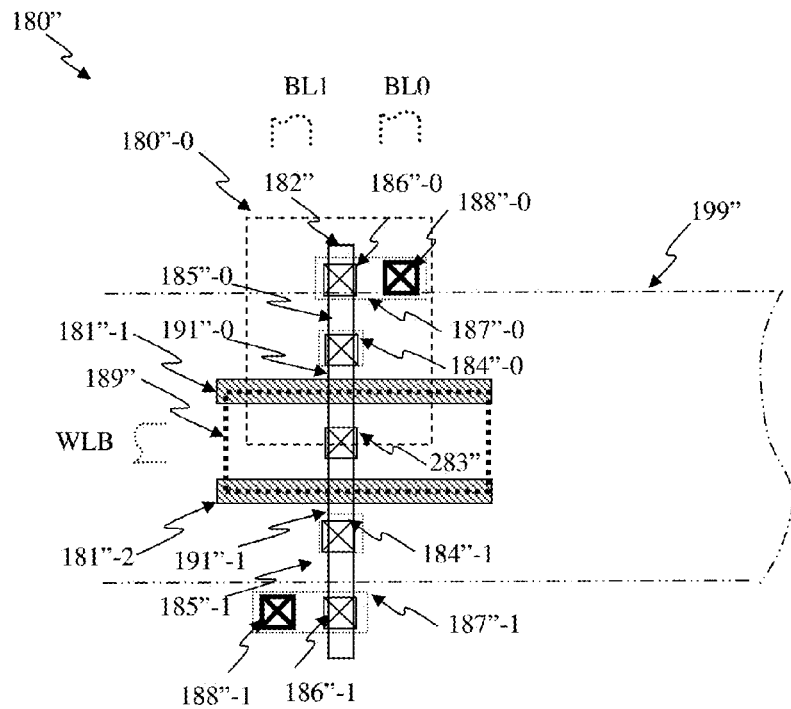
Figure 7:
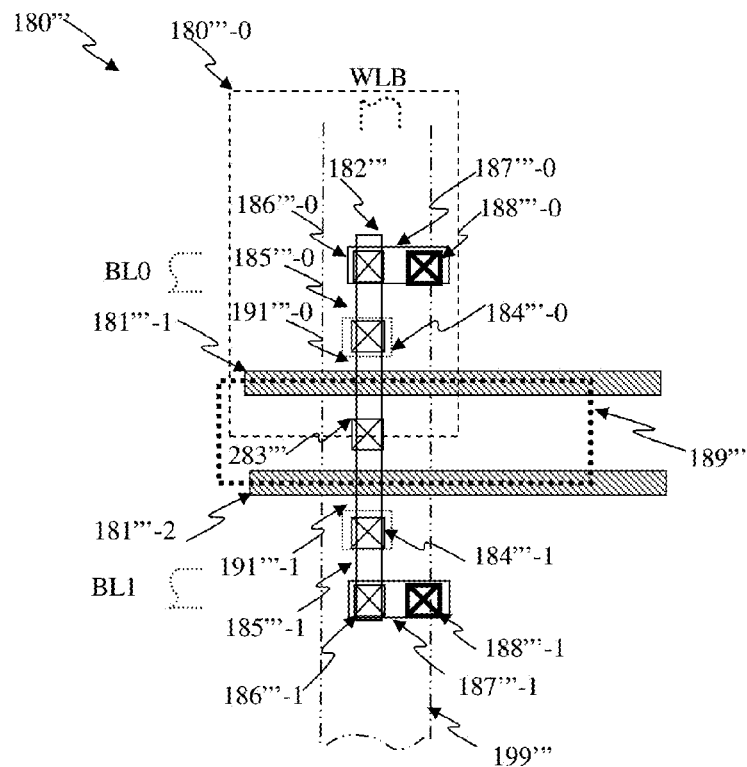

FIG. 7(h) shows a top view of yet another embodiment of a fuse cell 70" that has a dummy MOS gate 78" providing isolation between P+/N+ in N well as two terminals of a diode and an electrical fuse element 72". An active region 71" is divided into an upper active regions 73" and a lower active region 74" by a dummy MOS gate 78". The upper active region 73" can be covered by a P+ implant 77" while the lower active region 74" can be covered by an N+ implant (the complement of the P+ implant 77"). The active regions 73" and 74" constitute the P and N terminals of the diode in the cell 70". The polysilicon 78" provides isolation between the P+/N+ of the diode in the cell 70" and can be tied to a fixed bias. The MOS gate 78" is a dummy MOS gate fabricated in standard CMOS processes and can be a metal gate in advanced metal-gate CMOS processes. The width of the dummy MOS gate can be close to the minimum gate width of a CMOS technology. In one embodiment, the width of the dummy MOS gate can be less than twice the minimum gate width of a CMOS technology. The dummy MOS gate can also be created from an I/O device to sustain higher voltage. The active region 71" resides in an N well 75", the same N well that can be used to house PMOS in standard CMOS processes. A fuse element 72" can be coupled to the P+ active region 73" through a metal 76" in one end (through contacts 75"-2 and 75"-3) and to a high voltage supply line V+ in the other end (through contact 75"-1). The N+ region 74" is coupled to another voltage supply line V− through another contact 75"-4. At least one of the contacts 75"-1, 2, 3, 4 can be larger than at least one contacts outside of the memory array to reduce the contact resistance in one embodiment. When high and low voltages are applied to V+ and V−, respectively, a high current can flow through the fuse element 72" to program the fuse element 72" into a high resistance state accordingly.

FIG. 7(i1) shows a top view of a programmable resistive cell 80 that corresponds to the schematic in FIG. 6(c1), according to one embodiment. A one-piece active region 83 inside an N well 85 is divided into 83-1, 83-2, and 83-3 by a polysilicon gate 88, to serve as anode of diode, cathode of diode, and source of MOS, respectively. The active region 83-2 and a portion of MOS gate 88 is covered by an N+ implant 86, while the rest of the active region is covered by a P+ implant 87. A programmable resistive element 82 has a cathode coupled to the anode of the diode by a metal 81 and has an anode coupled to a supply voltage line V+, or Bitline (BL). The cathode of the diode 83-2 and the source of the MOS 83-3 can be coupled as Source Line (SL) by a higher level of metal running horizontally.

FIG. 7(i2) shows another top view of a programmable resistive device cell 80' that corresponds to the schematic in FIG. 6(c1), according to another embodiment. A one-piece active region 83' inside an N well 85' is divided into 83'-1, 83'-2, and 83'-3 by a MOS gate 88' and an N+ implant 86', to serve as anode of diode, cathode of diode, and source of MOS, respectively. The active region 83'-2 and a portion of MOS gate 88' is covered by an N+ implant 86', while the rest of the active region is covered by a P+ implant 87'. A programmable resistive element 82' has the cathode coupled to the anode of the diode by a metal 81', and has an anode coupled to a supply voltage line V+, or Bitline (BL). The cathode of the diode 83'-2 and the source of the MOS 83'-3 are coupled as Source Line (SL) by a higher level of metal running horizontally.

FIG. 7(i3) shows yet another top view of a programmable resistive device cell 80" that corresponds to the schematic in FIG. 6(c1), according to yet another embodiment. A one-piece active region 83" inside an N well 85" is divided into 83"-1, 83"-2, and 83"-3 by a MOS gate 88" and an N+ implant 86", to serve as anode of diode, cathode of diode, and source of MOS, respectively. The active region 83"-2 and a portion of MOS gate 88" is covered by an N+ implant 86", while the rest of the active region is covered by a P+ implant 87". A programmable resistive element 82" has the cathode coupled to the anode of the diode by a metal 81", and has an anode coupled to a supply voltage line V+, or Bitline (BL). The resistive element 82" can be bent to fit into the space more efficiently. The cathode of the diode 83"-2 and the source of the MOS 83"-3 are coupled as Source Line (SL) by an additional active region 83"-4 and a higher level of metal running horizontally.

FIG. 7(i4) shows a top view of a programmable resistive cell 90 that corresponds to the schematic in FIG. 6(c1), according to one embodiment. A one-piece active region 93 inside an N well 95 is divided into 93-1, 93-2, 93-3, and 93-4 by a MOS gate 98, to serve as anode of diode, one source of MOS, another source of MOS, and cathode of the diode, respectively. The active region 93-4 and a portion of MOS gate 98 is covered by an N+ implant 96, while the rest of the active region is covered by a P+ implant 97. A programmable resistive element 92 has a cathode coupled to the anode of the diode by a metal 91, and has an anode coupled to a supply voltage line V+, or Bitline (BL). The cathode of the diode 93-4 and the sources of the MOS 93-2 and 93-3 are coupled as Source Line (SL) by a higher level of metal running horizontally. In this embodiment, the MOS device is put on two sides of the cell that can be shared with the adjacent cells to save area. One or two MOS devices 93-2 or 93-3 can be converted into a diode by changing the P+ implant 97 into N+ implant 96 on the active region 93-2 or 93-3, respectively, to trade read for program performance in another embodiment.

FIG. 7(i5) shows a top view of a programmable resistive cell 90' that corresponds to the schematic in FIG. 6(c1), according to one embodiment. A one-piece active region 93' inside an N well 95' is divided into 93'-1, 93'-2, 93'-3, and 93'-4 by a polysilicon gate 98', to serve as anode of diode, one source of MOS, another source of MOS, and cathode of the diode, respectively. The active region 93'-4 and a portion of gate 98' is covered by an N+ implant 96', while the rest of the active region is covered by a P+ implant 97'. A programmable resistive element 92' has a cathode coupled to the anode of the diode by a metal 91', and has an anode coupled to a supply voltage line V+, or Bitline (BL). The cathode of the diode 93'-4 and the sources of the MOS 93'-2 and 93'-3 are coupled as Source Line (SL) by a higher level of metal running horizontally. In this embodiment, the MOS device is put on two sides of the cell without any contact in the source to save area. One or two MOS devices 93'-2 or 93'-3 can be converted into a diode by changing the P+ implant 97' into N+ implant 96' on the active region 93'-2 or 93'-3, respectively, to trade read for program performance in another embodiment.

FIG. 7(i6) shows another top view of a programmable resistive cell 90" that corresponds to the schematic in FIG. 6(c1), according to one embodiment. This top view is very similar to the one shown in FIG. 7(i4), except that the body of the fuse element 92" overlaps into the active region 93"-1 and is coupled to the active region 93"-1 by a single shared contact 94" with a metal 91" on top, instead of using one contact for body to metal and another contact for active to metal as shown in FIG. 7(i4). This embodiment can save spacing between the body 92" and active area 93"-1.

FIG. 7(i7) shows a top view of 1×4 programmable resistive device (PRD) cells 180 built on a FinFET technology, according to one embodiment. The cells 180 have MOS gates 181-1 through 181-6 provided in a horizontal direction in this embodiment. The gates 181-3 and 181-4 are the gates of dummy-gate diodes, while the other gates can serve as programmable resistive elements (PREs), such as fuses. In one embodiment, fins 182-1 and 182-2 are fin structures provided in the vertical direction that can be used as bodies of FinFETs. Layer 189 is an N+ implant to define the cathodes of the dummy-gate diodes for the four cells 180. For the top-left cell 180-0, contact 283-1 and 183-0 are cathode and anode contacts of a dummy-gate diode in cell 180-0, respectively. Contacts 185-0 and 186-0 are cathode and anode contacts of a PRE 181-2, respectively. A metal 187 couples the cathode contact 185-0 of the PRE to the anode contact 183-0 of the diode. 186-0 is an anode contact of the PRE 181-2 that can be coupled to a higher level of metal through a via 188-0. In one embodiment, the via 188-0 can be about the same size of the contact 186-0 and can be placed on top of the contact 186-0. Nwell layer 199 is to provide an N type well to house the devices built on fins. The portion of the gate 181-2 to the right of the contact 186-0 is an extended area 184-0 of the PRE 181-2, which is longer than required by design rules and with reduced or substantially no current flow through to accelerate programming. The same construction can be applied to the other 3 cells. The anodes of the PREs, 185-0 through 185-3 are coupled to high level metals through vias 188-0 through 188-3, which are further coupled as BL0 through BL3. The cathode contacts 283-1 and 283-2 of fins 182-1 and 182-2, respectively, can be coupled to a WLB running horizontally. The WLB and BL0-BL3 can be used to select one of 1×4 PRD cells.

The two gates 181-3 and 181-4 across two fins 182-1 and 182-2 (fin structures) to define six (6) active regions. The middle two active regions are covered by an N+ layer 189 to serve as the common cathodes of dummy-gate diodes for cells 180-0 through 180-3 that are usually coupled to a wordline bar (WLB) running horizontally. The four outer active regions in the fins are covered by a P+ layer (not shown) to serve as anodes of dummy-gate diodes with contacts 183-0 through 183-3. This constructs a 1×4 dummy-gate diode array with the dummy-gate diodes acting as selectors for the 1×4 programmable resistive cell array. Each anode of a diode is coupled to one end of PRE. The other ends of the PREs are further coupled to bitlines BL0, BL1, BL2, and BL3 through vias (188-0 to 188-3), to construct a 1×4 1R1D PRD cell array. The 4 cells in a PRE array can be selected by WLB and BLi (i=0, 1, 2, 3).

FIG. 7(i8) shows a top view of 2×2 programmable resistive device (PRD) cells 180' built on a FinFET technology, according to another embodiment. The cells 180' have MOS gates 181'-1 through 181'-6 running in the horizontal direction. The gates 181'-3 and 181'-4 are the gates of dummy-gate diodes, while the other gates can serve as programmable resistive elements (PREs), such as fuses. In this embodiment, fins 182'-1 and 182'-2 are fin structures provided in a vertical direction that can be used as bodies of FinFETs. Layer 189' is an N+ implant to define the cathodes of the dummy-gate diodes for four cells. For the top-left cell 185'-0, contact 283'-1 and 183'-0 are cathode and anode contacts of a dummy-gate diode in the cell 180'-0, respectively. Contacts 185'-0 and 186'-0 are cathode and anode contacts of a PRE 181'-2, respectively. A metal 187' couples the cathode contact 185'-0 of the PRE 181'-2 to the anode contact 183'-0 of the diode. The anode contact 186'-0 of the PRE 181'-2 can be coupled to a higher level of metal through a via 188'-0, which can be further coupled to an upper-level metal as BL0 running horizontally. Nwell layer 199' provides an N type well to house devices built on fins. The portion of the gate 181'-2 to the right of the contact 186'-0 is an extended area 184'-0 of the PRE 181'-2, which is longer than required by design rules and with reduced or substantially no current flow therethrough which can accelerate programming. The same construction can be applied to the other three (3) cells. For the bottom-left cell 180'-2, the anode contact 183'-2 of the diode can be coupled to the cathode contact 185'-2 of the PRE 181'-5. The anode contact 186'-2 of the PRE 181'-5 can be coupled to a via 188'-1, which can be further coupled to BL1 running horizontally. The top-right and bottom-right cells 180'-1 and 180'-3 can have their PREs' anode contacts 186'-1 and 186'-3 coupled to BL0 and BL1, respectively. The cathode contacts 183' and 183" of the diodes built on fins 182'-1 and 182'-2 can be coupled to WL0 and WL1, respectively, running in the vertical direction. The WL0/WL1 and BL0/BL1 can be used to select one of the 2×2 PRD cells.

FIG. 7(i8a) shows a top view of 1×2 programmable resistive device (PRD) cells 180" built on a FinFET technology using a portion of a fuse as a PRD element, according to one embodiment. The cells 180"-0 has MOS gates 181"-1 through 181"-2 provided in a horizontal direction to serve as dummy gates in this embodiment. In one embodiment, fins 182" is a fin structure provided in the vertical direction that can be used as bodies of FinFETs and PRE elements. Layer 189" is an N+ implant to define the cathodes 283" of the dummy-gate diodes for the two cells 180"-0 and 180"-1. For the top cell 180"-0, contact 283" and 184"-0 are cathode and anode contacts of a dummy-gate diode in cell 180"-0, respectively. Contacts 184"-0 and 186"-0 are cathode and anode contacts of a PRE 185"-0, respectively. Contact 184"-0 can serve as the anode contact of the diode and cathode contact of the PRE. The contact 184"-0 allows multiple dummy-gate diodes to be coupled together to create high current. The contact 184"-0 can be omitted if a single dummy-gate diode built in a fin as a selector is sufficient. A metal 187"-0 couples the anode contact 186"-0 of the PRE to a bitline BL0 through a via 188"-0. In one embodiment, the via 188"-0 can be about the same size of the contact 186"-0 and can be placed on top of the contact 186"-0. Nwell layer 199" provides an N type well to house the devices built on fins. The portion of the 182" to the top of the contact 186"-0 is an extended area of the PRE 185"-0, which is longer than required by design rules and with reduced or substantially no current flow through to accelerate programming. The same construction can be applied to the other cell. The anodes of the PREs, 185"-0 and 185"-1 are coupled to high level metals through vias 188"-0 and 188"-1, which are further coupled as BL0 and BL1, respectively. The cathode contacts 283" of fins 182" can be coupled to a WLB running horizontally. The WLB and BL0-BL1 can be used to select one of 1×2 PRD cells.

FIG. 7(*i*8*b*) shows a top view of 2×1 programmable resistive device (PRD) cells 180''' built on a FinFET technology using a portion of a fin as a PRD element, according to another embodiment. The cell 180'''-0 have MOS gates 181'''-1 through 181'''-2 provided in a horizontal direction to serve as dummy gates in this embodiment. In one embodiment, fins 182''' is a fin structure provided in the vertical direction that can be used as bodies of FinFETs and PRE elements. Layer 189''' is an N+ implant to define the cathodes 283''' of the dummy-gate diodes for the two cells 180'''-0 and 180'''-1. For the top cell 180'''-0, contact 283''' and 184'''-0 are cathode and anode contacts of a dummy-gate diode in cell 180'''-0, respectively. Contacts 184'''-0 and 186'''-0 are cathode and anode contacts of a PRE 185'''-0, respectively. Contact 184'''-0 can serve as the anode contact of the diode and cathode contact of the PRE. The contact 184'''-0 allows multiple dummy-gate diodes to be coupled together to create high current. The contact 184'''-0 can be omitted if a single dummy-gate diode built in a fin as a selector is sufficient. A metal 187'''-0 couples the anode contact 186'''-0 of the PRE to a bitline BL0 through a via 188'''-0. In one embodiment, the via 188'''-0 can be about the same size of the contact 186'''-0 and can be placed on top of the contact 186'''-0. Nwell layer 199''' provides an N type well to house the devices built on fins. The portion of the 182''' to the top of the contact 186'''-0 is an extended area of the PRE 185'''-0, which is longer than required by design rules and with reduced or substantially no current flow through to accelerate programming. The same construction can be applied to the other cell. The anodes of the PREs, 185'''-0 and 185'''-1 are coupled to high level metals through vias 188'''-0 and 188'''-1, which are further coupled as BL0 and BL1, respectively. The cathode contacts 283''' of fins 182''' can be coupled to a WLB running vertically. The WLB and BL0-BL1 can be used to select one of 2×1 PRD cells.

FIGS. 7(*i*7), 7(*i*8), 7(*i*8*a*), and 7(*i*8*b*) are used for illustrative purposes. There are many variations and equivalent embodiments that still fall within the scope of this invention. For example in FIG. 7(*i*7), the selector in a PRD cell can have any number of fins (such as 32, 16, 8, 4, etc.), through it is more desirable to have few fins for one PRD cell (such as 1 or ½ fin per cell) in other embodiments. The N+ layer 189 as shown in FIG. 7(*i*7) falls on the gates to construct four (4) dummy-gate diodes in one embodiment. The width of the N+ layer 189 can be narrower such that it does not overlap into the gates 181-3 and 181-4, which constructs four (4) MOS devices as selectors in another embodiment. The MOS can be turned on by pulling the voltage low in the contact 183 area to turn on the source/drain junction diode of the MOS as described in FIGS. 6(*c*4)-6(*c*7). The devices built on fins 182-1 and/or 182-2 can be core logic or I/O devices.

The gates 181-1 through 181-6 can be gates of dummy-gate diodes or MOS devices, or PREs. A segment or a plurality of segments can be used as PREs. The PREs can be rectangle structures and can have at least one extended area in one or two ends to accelerate programming. The extended area is a portion of PRE that is formed such that it is longer than required by design rules and such that reduced or substantially no current flows therethrough.

The extend area can also have contacts built upon it. The length to width ratio of the extended area can be from 2 to 10 in one embodiment. The gates can be running in the same direction and have equal width and/or space between them in one embodiment. The gates can also have different width or space combinations in another embodiment. The length to width ratio between two closest anode and cathode contracts in a PRE can be from 1 to 8 for metal gate configurations, in one embodiment. The PREs can be gates for NMOS, PMOS, or combination of NMOS or PMOS gates. The gates 181-2 or 181-5 are dummy-gates of the fin structures 182-1 and 182-2. The dummy gates of the fin structures 181-2 or 181-5 can also be used as PREs as shown in FIG. 7(*i*7), according to one embodiment. In another embodiment, the dummy gates of the fun structures are not used as PREs so that one additional row of gate per side would be provided for PRE in another embodiment.

In FIG. 7(*i*7), contacts, 183-0 through 183-3, 185-0 through 185-3, and 186-0 through 186-3, are used to interconnect nodes through high-level metals. The contacts can be borderless contacts that are wider than the width of the gates. The contacts can be squares or rectangles and/or can be made larger to reduce contact resistance that at least one contact outside of the OTP cell array in one embodiment. There can be a plurality of contacts for one selector or PRE. It is typically more desirable to have less contacts, such as four (4), to save space. For example, the PREs can have one or two contacts in each end in one embodiment, or can have a different number of contacts at the two ends, i.e. one contact in one end and 2-4 contacts in the other end.

There can be many different conduction modes in a FinFET technology to construct selectors, namely dummy-gate mode, MOS/diode mode, MOS mode, and Schottky diode modes, with different implant schemes, according to different embodiments of the invention. The selectors shown FIGS. 7(*i*7), 7(*i*8), 7(*i*8*a*), and 7(*i*8*b*) are dummy-gate diodes by using MOS gates to divide fins into at least two active regions, where each active region receives N+ and P+ implants, respectively. For the cell 180-0 in FIG. 7(*i*7), if the N+ implant layer 189 only covers contact area 183 but does not overlap into the MOS gate 181-3, this selector is a MOS device with a contact 183-0, gate 181-3, and drain/Nwell tap contact 183. However, the selector can also have another diode operation by pulling the Nwell tap contact 183 node low to turn on the source junction 183-0 as described in FIG. 6(*c*3)-6(*c*7). This is a very unique operation because the Nwell tap is normally tied to a high voltage in normal MOS operation. This mode can be called MOS/diode mode. If the two active regions in the fin with contacts areas 183-0 and

183 are both covered by P+ implant (i.e. no N+ implant 189 in the cell), this selector is a MOS without Nwell tap, called MOS mode. If the contact area 183-0 has no N+ implant 189 and no P+ implant, the contact area 183-0 forms a Schottky barrier between silicide and N type silicon, called Schottky diode mode. The four operation modes are summarized in FIG. 7(*i*9). The four operation modes can also be applied to any CMOS other than FinFET technologies in other embodiments.

In general, a polysilicon or silicide polysilicon fuse is more commonly used as an electrical fuse because of its lower program current than metal or contact/via fuses. However, a metal fuse has some advantages such as smaller size and wide resistance ratio after being programmed. Metal as a fuse element allows making contacts directly to a P+ active region thus eliminating one additional contact as compared to using a polysilicon fuse. In advanced CMOS technologies with feature size less than 40 nm, the program voltage for metal fuses can be lower than 3.3V, which makes metal fuse a viable solution.

Figure 8C:
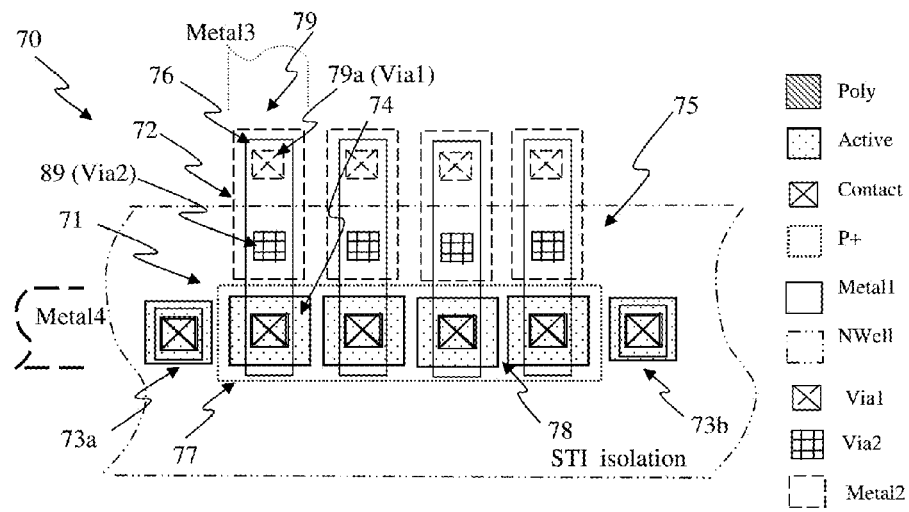
FIG. 8(*a*) shows a top view of a metal fuse coupled to a junction diode with dummy CMOS gate isolation according to one embodiment.
Figure 8D:
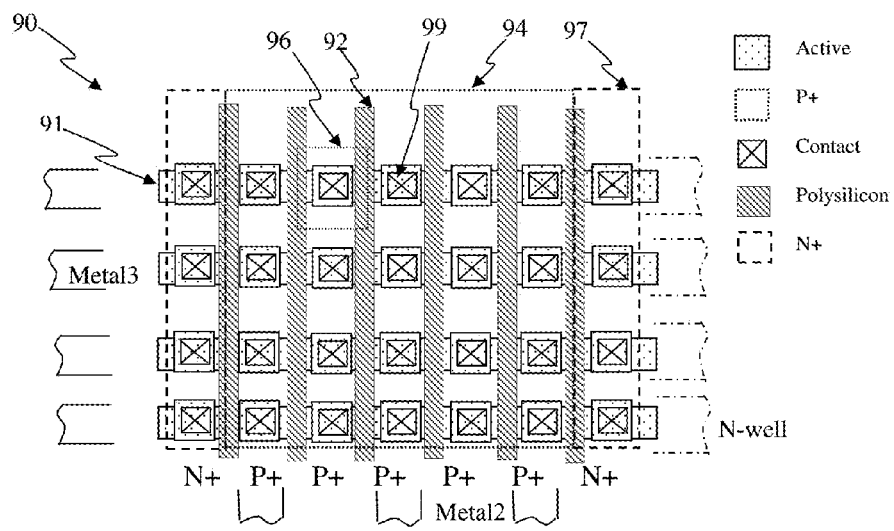
Figure 8:
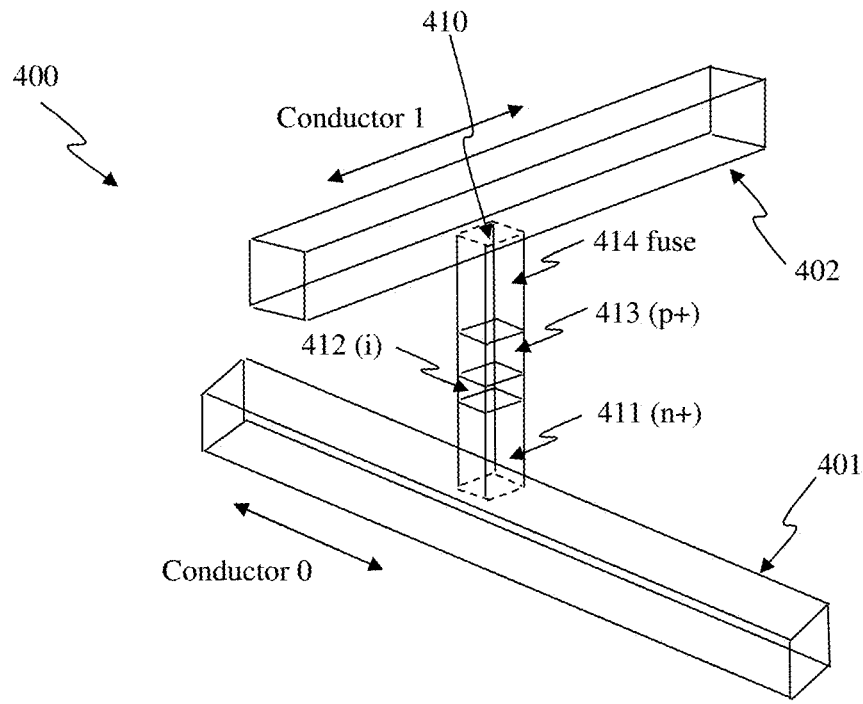
Figure 8:
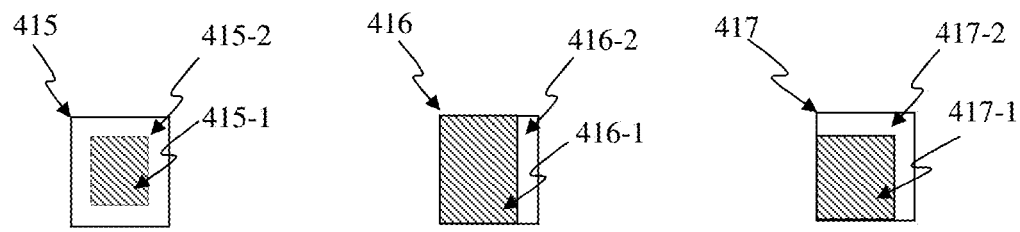

FIG. 8(*a*) shows a top view of a metal1 fuse cell 60" including a P+/N well diode 60" with dummy CMOS gate isolation. An active region 61 is divided into a center active region 63 and a peripheral active region 64 by a ring-shape MOS gate 68. The center active region 63 is covered by a P+ implant 67 and the peripheral active region 64 is covered by an N+ implant (the complement of the P+ implant 67), respectively, to constitute the P and N terminals of a diode. The active region 61 resides in an N well 65, the same N well can be used to house PMOS in standard CMOS processes. A metal1 fuse element 62" is coupled to the P+ region 63 directly. The ring-shape MOS gate 68, which provides dummy CMOS gate isolation, can be biased at a fixed voltage, and can provide isolation between P+ active 63 and N+ active 64 regions in four sides. In one embodiment, the length to width ratio of a metal fuse can be about or larger than 10 to 1 to lower the electromigration threshold.

The size of the metal fuse cell in FIG. 8(*a*) can be further reduced, if the turn-on resistance of the diode is not crucial. FIG. 8(*b*) shows a top view of a row of metal fuse cells 60''' having four metal fuse cells that share one N well contact in each side in accordance with one embodiment. Metal1 fuse 69 has an anode 62', a metal1 body 66', and a cathode coupled to an active region 64' covered by a P+ implant 67' that acts as the P terminal of a diode. The active region 61' resides in an N well 65'. Another active region 63' covered by an N+ implant (complement of P+ implant 67') acts as N terminal of the diode. Four diodes are isolated by STI 68' and share one N+ active region 63' each side. The N+ active regions 63' are connected by a metal2 running horizontally, and the anode of the diode is connected by a metal3 running vertically. If metal1 is intended to be programmed, other types of metals in the conduction path should be wider. Similarly, more contacts and vias should be put in the conduction path to resist undesirable programming. Using metal1 as a metal fuse in FIG. 8(*b*) is for illustrative purposes, those skilled in the art understand that the above description can be applied to any metals, such as metal0, metal2, metal3, or metal4 in other embodiments. Similarly, those skilled in the art understand that the isolation, metal scheme, and the number of cells sharing one N+ active may vary in other embodiments.

Contact or via fuses may become more viable for advanced CMOS technologies with feature size less than 65 nm, because small contact/via size makes program current rather low. FIG. 8(*c*) shows a top view of a row of four via1 fuse cells 70 sharing N type well contacts 73*a* and 73*b* in accordance with one embodiment. Vial fuse cell 79 has a via1 79*a* coupled to a metal1 76 and a metal2 72. Metal2 72 is coupled to a metal3 through via2 89 running vertically as a bitline. Metal1 76 is coupled to an active region 74 covered by a P+ implant 77 that acts as the P terminal of a diode 71. Active regions 73*a* and 73*b* covered by an N+ implant (complement of P+ implant 77) serves as the N terminal of the diode 71 in via1 fuse cell 79. Moreover, the active regions 73*a* and 73*b* serve as the common N terminal of the diodes in the four-fuse cell 70. They are further coupled to a metal4 running horizontally as a wordline. The active regions 74, 73*a*, and 73*b* reside in the same N well 75. Four diodes in via1 fuse cells 70 have STI 78 isolation between each other. If via1 is intended to be programmed, more contacts and more other kinds of vias should be put in the conduction path. And metals in the conduction path should be wider and contain large contact/via enclosures to resist undesirable programming. Vial as a via fuse in FIG. 8(*c*) is for illustrative purpose, those skilled in the art understand that the above description can be applied to any kinds of contacts or vias, such as via2, via3, or via4, etc. Similarly, those skilled in the art understand that the isolation, metal scheme, and the number of cells sharing one N+ active may vary in other embodiments.

FIG. 8(*d*) shows a top view of an array of 4×5 via1 fuses 90 with dummy CMOS gate isolation in accordance with one embodiment. The one-row via fuse shown in FIG. 8(*c*) can be extended into a two-dimensional array 90 as shown in FIG. 8(*d*). The array 90 has four rows of active regions 91, each residing in a separate N well, and five columns of via fuse cells 96, isolated by dummy CMOS gates 92 between active regions. Each via fuse cell 96 has one contact 99 on an active region covered by a P+ implant 94 that acts as the P terminal of a diode, which is further coupled to a metal2 bitline running vertically. Active regions in two sides of the array 90 are covered by N+ implant 97 to serve as the N terminals of the diodes in the same row, which is further coupled to metal3 as wordlines running horizontally. To program a via fuse, select and apply voltages to the desired wordline and bitline to conduct a current from metal2 bitline, via1, metal1, contact, P+ active, N+ active, to metal3 wordline. To ensure only via1 is programmed, metals can be made wider and the numbers of other types of vias or contact can be more than one. To simplify the drawing, metal1 -via1 -metal2 connection can be referred to FIG. 8(*c*) and, therefore, is not shown in each cell in FIG. 8(*d*). Those skilled in the art understand that various types of contact or vias can be used as resistive elements and the metal schemes may change in other embodiments. Similarly, the number of cells in rows and columns, the numbers of rows or columns in an array, and the numbers of cells between N+ active may vary in other embodiments.

The contact or via structures showed in FIGS. 8(*c*)-8(*d*) can be applied to reversible programmable resistive devices too. The contact or via can be filled with metal oxide between electrodes, such as TiN/Ti/HfO2/TiN, W/TiN/TiON/SiO2/Si, or W/TiOxNy/SiO2/Si, to build a Resistive RAM (RRAM) inside the contact or via hole. The RRAM element can be built into the contact hole in the anode of the diode to reduce area. This type of RRAM element can be built into the anode or cathode contact hole of all diode structures, such as the diodes in FIGS. 5(*b*)-5(*d*), 6(*a*), 6(*a*1-*a*4), and 6(*b*). The cathodes of a plurality of diodes in a row can be shared, if the program current is not degraded much by the parasitic resistance. Moreover, a shallow Nwell can be built to house the diodes as program selectors, instead of using Nwell in standard CMOS, to further reduce the area.

By applying different magnitude, duration, or bipolar voltage or current pulses, the RRAM element built inside a contact or via hole can be programmable repetitively and reversibly into another logic states Conventional contact can be filled by a buffer layer (i.e. TiN, TaN), a tungsten plug, and then by a layer of metal such as Al or Cu. Conventional via can be filled by the same metal layer in the dual damascene metallization processes. Contact or via constructed in this way can be very difficult to program. FIG. 8(e1) shows a 3D perspective view of a contact/via fuse cell 400 according to one embodiment. A pair of conductors 401 and 402 run in the same or different directions. At the cross-over of the conductors, builds a contact/via fuse 410. The contact/via 410 has an N+ silicon 411, intrinsic silicon 412, P+ silicon 413, and fuse element 414 to construct a fuse cell 410. The cell has a fuse element 414 and a diode as program selector consisting of 411, 412, and 413. The intrinsic layer 412 only means the layer is not intentionally doped or can be slightly N or P doped to increase the diode's breakdown voltage in other embodiments. The fuse cell can be programmed by applying a high voltage between the conductor 1 and conductor 0 to turn on the diode as program selector and to conduct a high current flowing through the fuse element 414. The conductors can be one of the N+ buried layer, active region, polysilicon, metal1, metal2, etc. The contact/via structure in FIG. 8(e1) can be applied to any contact/via fuses discussed in this invention. The fuse element 414 can be other kinds of materials to construct other kinds of programmable resistive element.

FIG. 8(e2) shows three cross sections 415, 416, and 417 of the fuse elements 414, corresponding to the fuse cell in FIG. 8(e1), according to other embodiments. The fuse elements can have a polysilicon layer 415-1, 416-1, and 417-1 and a silicide layer 415-2, 416-2, and 417-2 surrounding the polysilicon layer in the cross sections 415, 416, and 417, respectively. The silicide can be coated to the polysilicon surfaces in 4, 1, or 2 side(s) as shown in 415, 416, and 417, respectively. Alternatively, the silicide can be coated partly or fully of any side, or none of the polysilicon surface in other embodiments. The polysilicon layers in 415-1, 416-1, and 417-1 can be N+, P+, or part N and part P doped for different embodiments. The polysilicon inside the contact/via hole for building fuse or diode can be any kinds of semiconductor materials, such as silicon, crystalline silicon, selective epitaxial silicon (SEQ), or SiGe. The fuse can be partially silicided or fully silicided through the length of the fuse element. The contact/via hole openings may not have the same size in both ends, or may not have the same as those contact/via outside of the memory arrays. The shape of the contact/via may be round square or rectangle or even circle due to lithography and etch. There can be buffer or barrier layers, such as TiN or TaN, between the polysilicon and the conductors. Those skilled in the art understand that there are many variations and equivalent embodiments and that are still within the scope of this invention.

Figure 9A:
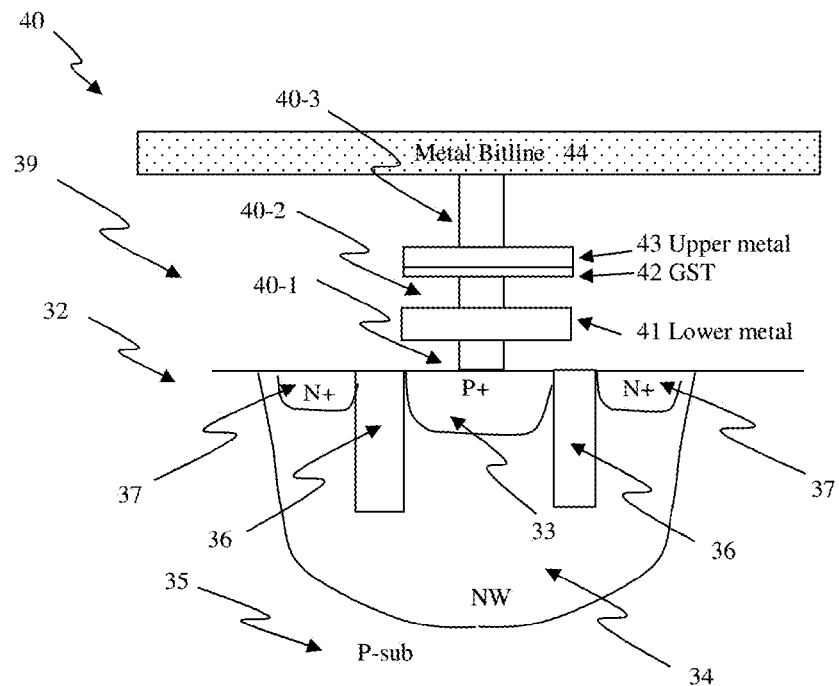
FIG. 9(*a*) shows a cross section of a programmable resistive device cell using phase-change material as a resistive element, with buffer metals and a P+/N well junction diode, according to one embodiment.

FIG. 9(a) shows a cross section of a programmable resistive device cell 40 using phase-change material as a resistive element 42, with buffer metals 41 and 43, and a P+/N well diode 32, according to one embodiment. The P+/N well diode 32 has a P+ active region 33 and N+ active region 37 on an N well 34 as P and N terminals. The isolation between the P+ active region 33 and N+ active region 37 is an STI 36. The P+ active region 33 of the diode 32 is coupled to a lower metal 41 as a buffer layer through a contact plug 40-1. The lower metal 41 is then coupled to a thin film of phase change material 42 (e.g., GST film such as Ge2Sb2Te5 or AgInSbTe, etc.) through a contact plug 40-2. An upper metal 43 also couples to the thin film of the phase-change material 42. The upper metal 43 is coupled to another metal 44 to act as a bitline (BL) through a plug 40-3. The phase-change film 42 can have a chemical composition of Germanium (Ge), Antimony (Sb), and Tellurium (Te), such as $Ge_xSb_yTe_z$ (x, y and z are any arbitrary numbers), or as one example $Ge_2Sb_2Te_5$ (GST-225). The GST film can be doped with at least one or more of Indium (In), Tin (Sn), or Selenium (Se) to enhance performance. The phase-change cell structure can be substantially planar, which means the phase-change film 42 has an area that is larger than the film contact area coupled to the program selector, or the height from the surface of the silicon substrate to the phase-change film 42 is much smaller than the dimensions of the film parallel to silicon substrate. In this embodiment, the active area of phase-change film 42 is much larger than the contact area so that the programming characteristics can be more uniform and reproducible. The phase-change film 42 is not a vertical structure and does not sit on top of a tall contact, which can be more suitable for embedded phase-change memory applications, especially when the diode 32 (i.e., junction diode) is used as program selector to make the cell size very small. For those skilled in the art understand that the structure and fabrication processes may vary and that the structures of phase-change film (e.g., GST film) and buffer metals described above are for illustrative purpose.

Figure 9B:
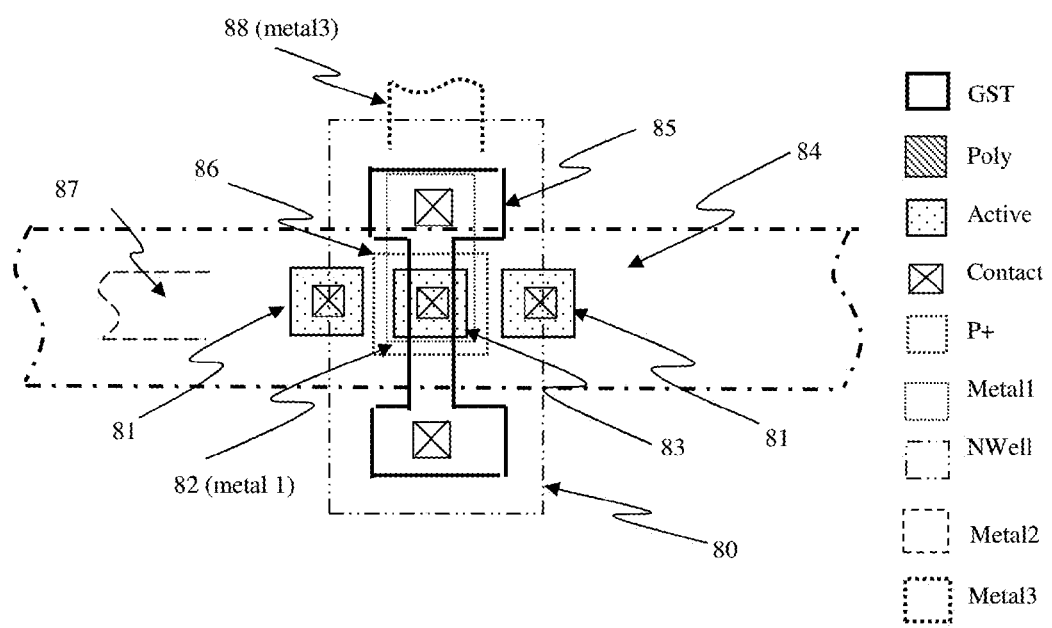

FIG. 9(b) shows a top view of a PCM cell using a junction diode as program selector having a cell boundary 80 in accordance with one embodiment. The PCM cell has a P+/N well diode and a phase-change material 85, which can be a GST film. The P+/N well diode has active regions 83 and 81 covered by a P+ implant 86 and an N+ implant (complement of P+ implant 86), respectively, to serve as the anode and cathode. Both active regions 81 and 83 reside on an N well 84, the same N well can be used to house PMOS in standard CMOS processes. The anode is coupled to the phase-change material 85 through a metal1 82. The phase-change material 85 is further coupled to a metal3 bitline (BL) 88 running vertically. The cathode of the P+/N well diode (i.e., active region 81) is connected by a metal2 wordline (WL) 87 running horizontally. By applying a proper voltage between the bitline 88 and the wordline 87 for a suitable duration, the phase-change material 85 can be programmed into a 0 or 1 state accordingly. Since programming the PCM cell is based on raising the temperature rather than electro-migration as with an electrical fuse, the phase-change film (e.g., GST film) can be symmetrical in area for both anode and cathode. Those skilled in the art understand that the phase-change film, structure, layout style, and metal schemes may vary in other embodiments.

Programming a phase-change memory (PCM), such as a phase-change film, depends on the physical properties of the phase-change film, such as glass transition and melting temperatures. To reset, the phase-change film needs to be heated up beyond the melting temperature and then quenched. To set, the phase-change film needs to be heated up between melting and glass transition temperatures and then annealed. A typical PCM film has glass transition temperature of about 200° C. and melting temperature of about 600° C. These temperatures determine the operation temperature of a PCM memory because the resistance state may change after staying in a particular temperature for a long time. However, most applications require retaining data for 10 years for the operation temperature from 0 to 85° C. or even from −40 to 125° C. To maintain cell stability over the device's lifetime and over such a wide temperature range, periodic reading and then writing back data into the same cells can be performed. The refresh period can be quite long, such as longer than a second (e.g., minutes, hours, days, weeks, or even months). The refresh mechanism can be generated inside the memory or triggered from outside the memory. The long refresh period to maintain cell stability can also be applied to other emerging memories such as RRAM, CBRAM, and MRAM, etc.

Figure 10:
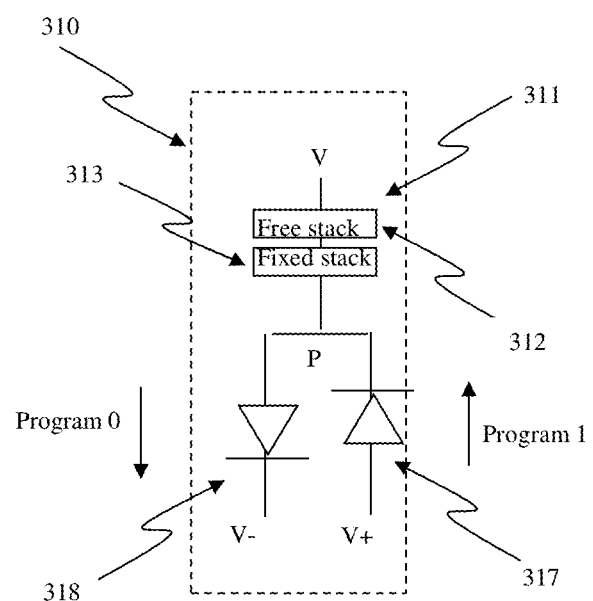
FIG. 10 shows one embodiment of an MRAM cell using diodes as program selectors in accordance with one embodiment.

FIG. 10 shows one embodiment of an MRAM cell 310 using diodes 317 and 318 as program selectors in accordance with one embodiment. The MRAM cell 310 in FIG. 10 is a three-terminal MRAM cell. The MRAM cell 310 has an MTJ 311, including a free layer stack 312, a fixed layer stack 313, and a dielectric film in between, and the two diodes 317 and 318. The free layer stack 312 is coupled to a supply voltage V, and coupled to the fixed layer stack 313 through a metal oxide such as $Al_2O_3$ or MgO. The diode 317 has the N terminal coupled to the fixed layer stack 313 and the P terminal coupled to V+ for programming a 1. The diode 318 has the P terminal coupled to the fixed layer stack 313 and the N terminal coupled to V− for programming a 0. If V+ voltage is higher than V, a current flows from V+ to V to program the MTJ 311 into state 1. Similarly, if V− voltage is lower than V, a current flows from V to V− to program the MTJ 311 into state 0. During programming, the other diode is supposedly cutoff. For reading, V+ and V− can be both set to 0V and the resistance between node V and V+/V− can be sensed to determine whether the MTJ 311 is in state 0 or 1.

Figure 11A:
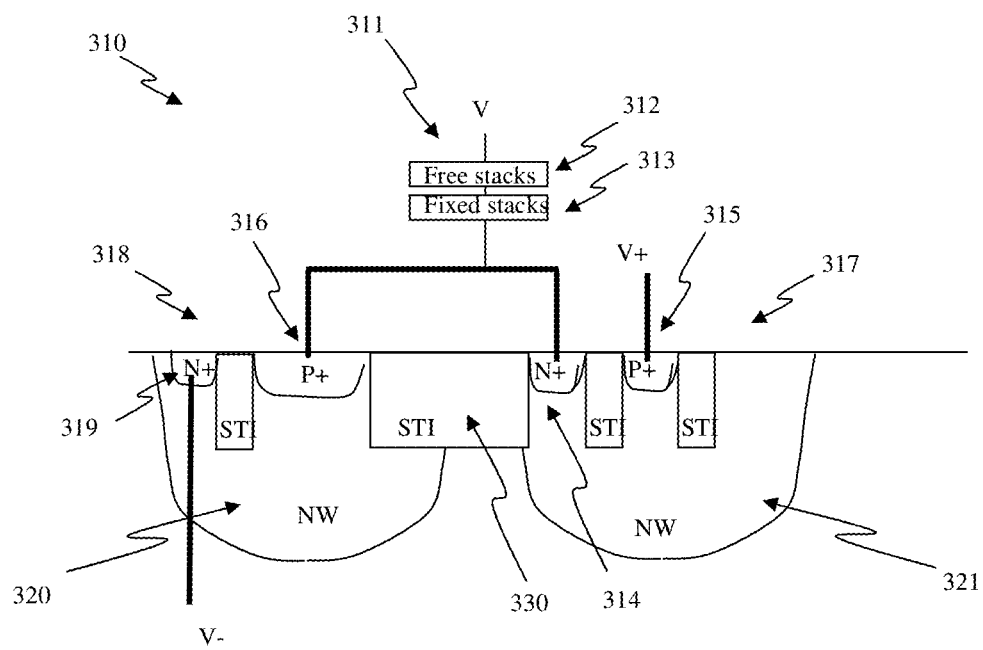
FIG. 11(*a*) shows a top view of an MRAM cell with an MTJ as a resistive element and with P+/N well diodes as program selectors in standard CMOS processes in accordance with one embodiment.

FIG. 11(a) shows a cross section of one embodiment of an MRAM cell 310 with MTJ 311 and junction diodes 317 and 318 as program selectors in accordance with one embodiment. MTJ 311 has a free layer stack 312 on top and a fixed layer stack 313 underneath with a dielectric in between to constitute a magnetic tunneling junction. Diode 317 is used to program 1 and diode 318 is used to program 0. Diodes 317 and 318 have P+ and N+ active regions on N wells 321 and 320, respectively, the same N wells to house PMOS in standard CMOS processes. Diode 317 has a P+ active region 315 and N+ active region 314 to constitute the P and N terminals of the program-1 diode 317. Similarly, diode 318 has a P+ active 316 and N+ active 319 to constitute the P and N terminals of the program-0 diode 318. FIG. 11(a) shows STI 330 isolation for the P and N terminals of the diodes 317 and 318. For those skilled in the art understand that different isolation schemes, such as dummy MOS gate or SBL, can alternatively be applied.

The free stacks 312 of the MTJ 311 can be coupled to a supply voltage V, while the N terminal of the diode 318 can be coupled to a supply voltage V− and the P terminal of the diode 317 can be coupled to another supply voltage V+. Programming a 1 in FIG. 11(a) can be achieved by applying a high voltage, i.e., 2V to V+ and V−, while keeping V at ground, or 0V. To program a 1, a current flows from diode 317 through the MTJ 311 while the diode 318 is cutoff. Similarly, programming a 0 can be achieved by applying a high voltage to V, i.e., 2V, and keeping V+ and V− at ground. In this case. a current flows from MTJ 311 through diode 318 while the diode 317 is cutoff.

Figure 11B:
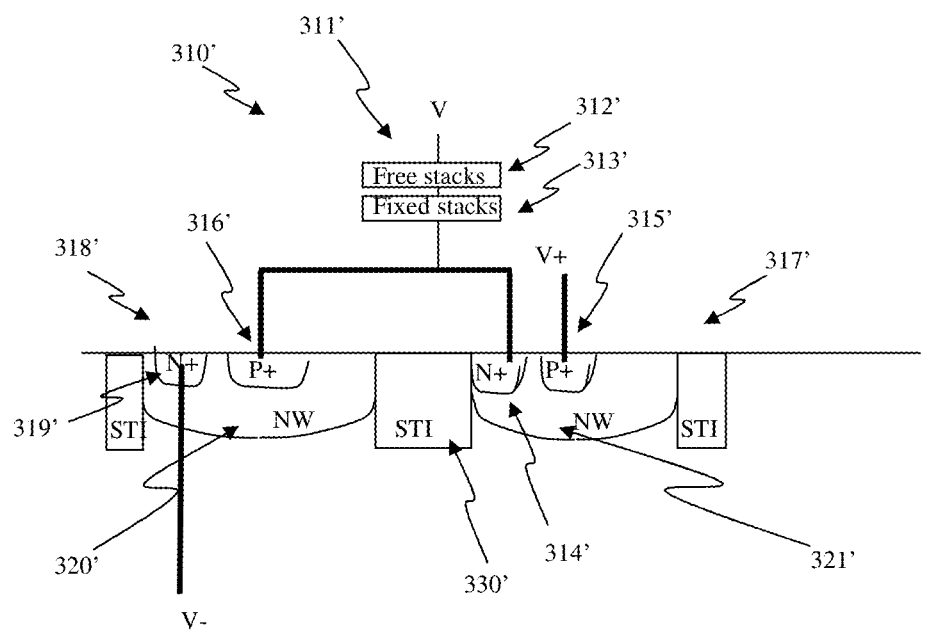

FIG. 11(b) shows a cross section of another embodiment of an MRAM cell 310' with MTJ 311' and junction diodes 317' and 318' as program selectors in accordance with one embodiment. MTJ 311' has a free layer stack 312' on top and a fixed layer stack 313' underneath with a dielectric in between to constitute a magnetic tunneling junction. Diode 317' is used to program 1 and diode 318' is used to program 0. Diodes 317' and 318' have P+ and N+ active regions on N wells 321' and 320', respectively, which are fabricated by shallow N wells with additional process steps. Though more process steps are needed, the cell size can be smaller. Diode 317' has P+ active region 315' and N+ active region 314' to constitute the P and N terminals of the program-1 diode 317'. Similarly, diode 318' has P+ active 316' and N+ active 319' to constitute the P and N terminals of the program-0 diode 318'. STI 330' isolates different active regions.

The free stacks 312' of the MTJ 311' can be coupled to a supply voltage V, while the N terminal of the diode 318' can be coupled to a supply voltage V− and the P terminal of the diode 317' is coupled to another supply voltage V+. Programming a 1 in FIG. 11(b) can be achieved by applying a high voltage, i.e., 2V to V+ and V−, while keeping V at ground, or 0V. To program a 1, a current will flow from diode 317' through the MTJ 311' while the diode 318' is cutoff. Similarly, programming 0 can be achieved by applying a high voltage to V, i.e., 2V, and keeping V+ and V− at ground. In this case, a current will flow from MTJ 311' through diode 318' while the diode 317' is cutoff.

Figures 12A, 12B:
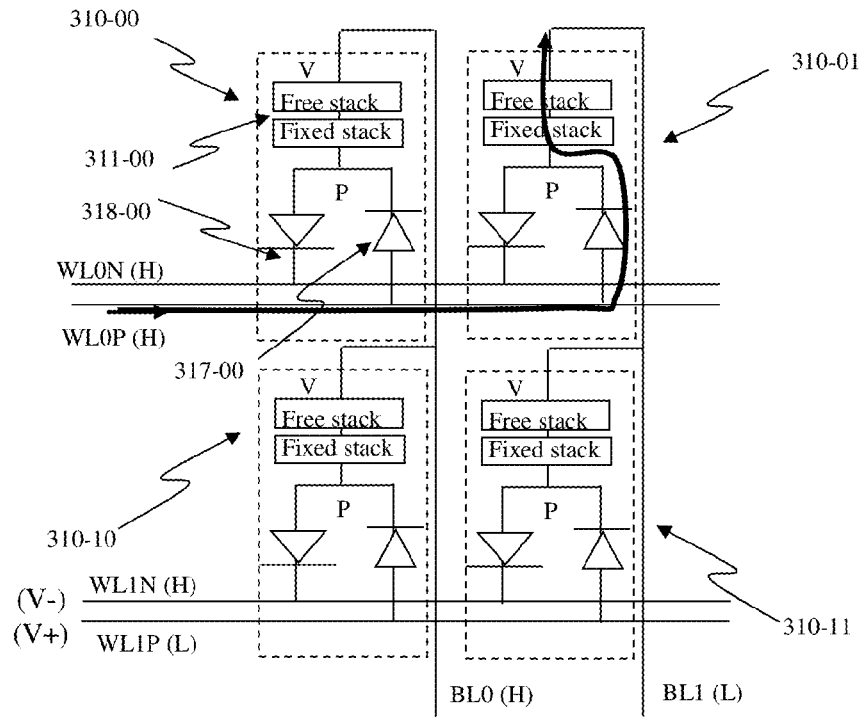
FIG. 12(*a*) shows one embodiment of a three-terminal 2×2 MRAM cell array using junction diodes as program selectors and the condition to program the upper-right cell into 1 in accordance with one embodiment.

FIG. 12(a) shows one embodiment of a three-terminal 2×2 MRAM cell array using junction diodes 317 and 318 as program selectors and the condition to program 1 in a cell in accordance with one embodiment. Cells 310-00, 310-01, 310-10, and 310-11 are organized as a two-dimensional array. The cell 310-00 has a MTJ 311-00, a program-1 diode 317-00, and a program-0 diode 318-00. The MTJ 311-00 is coupled to a supply voltage V at one end, to the N terminal of the program-1 diode 317-00 and to the P terminal of the program-0 diode 318-00 at the other end. The P terminal of the program-1 diode 317-00 is coupled to a supply voltage V+. The N terminal of the program-0 diode 318-00 is coupled to another supply voltage V−. The other cells 310-01, 310-10, and 310-11 are similarly coupled. The voltage Vs of the cells 310-00 and 310-10 in the same columns are connected to BL0. The voltage Vs of the cells 310-01 and 310-11 in the same column are connected to BL1. The voltages V+ and V− of the cells 310-00 and 310-01 in the same row are connected to WL0P and WL0N, respectively. The voltages V+ and V− of the cells 310-10 and 310-11 in the same row are connected to WL1P and WL1N, respectively. To program a 1 into the cell 310-01, WL0P is set high and BL1 is set low, while setting the other BL and WLs at proper voltages as shown in FIG. 12(a) to disable the other program-1 and program-0 diodes. The bold line in FIG. 12(a) shows the direction of current flow.

FIG. 12(b) shows alternative program-1 conditions for the cell 310-01 in a 2×2 MRAM array in accordance with one embodiment. For example, to program a 1 into cell 310-01, set BL1 and WL0P to low and high, respectively. If BL0 is set to high in condition 1, the WL0N and WL1N can be either high or floating, and WL1P can be either low or floating. The high and low voltages of an MRAM in today's technologies are about 2-3V for high voltage and 0 for low voltage, respectively. If BL0 is floating in condition 2, WL0N and WL1N can be high, low, or floating, and WL1P can be either low or floating. In a practical implementation, the floating nodes are usually coupled to very weak devices to a fixed voltage to prevent leakage. One embodiment of the program-1 condition is shown in FIG. 12(a) without any nodes floating.

Figures 13A, 13B:
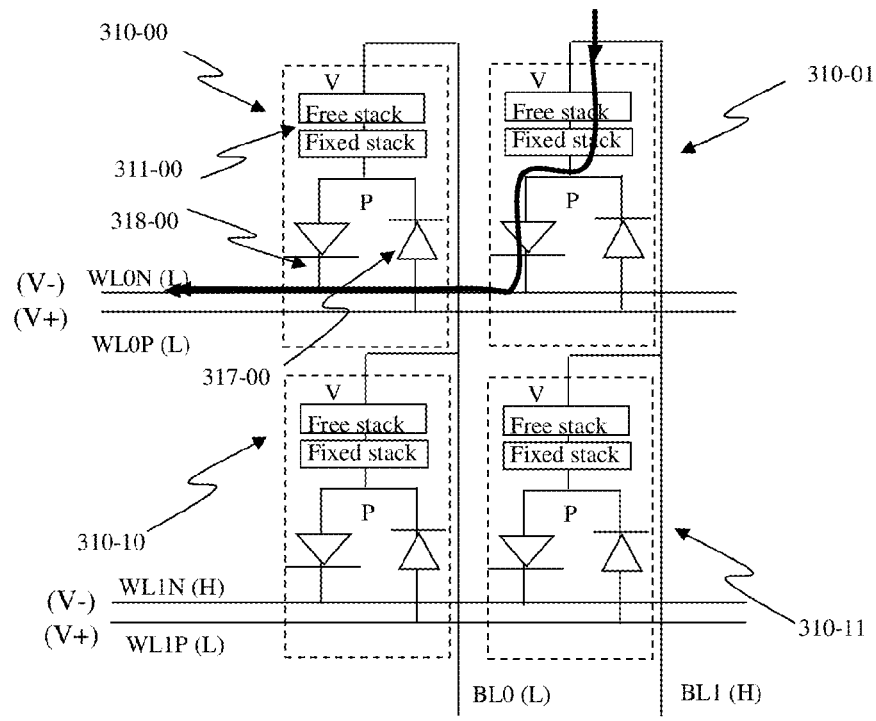
FIG. 13(b) shows alternative conditions to program the upper-right cell into 0 in a 2×2 MRAM array in accordance with one embodiment.

FIG. 13(a) shows one embodiment of a three-terminal 2×2 MRAM cell array with MTJ 311 and junction diodes 317 and 318 as program selectors and the condition to program 0 in a cell in accordance with one embodiment. The cells 310-00, 310-01, 310-10, and 310-11 are organized as a two-dimensional array. The cell 310-00 has a MTJ 311-00, a program-1 diode 317-00, and a program-0 diode 318-00. The MTJ 311-00 is coupled to a supply voltage V at one end, to the N terminal of program-1 diode 317-00 and to the P terminal of program-0 diode 318-00 at the other end. The P terminal of the program-1 diode 317-00 is coupled to a supply voltage V+. The N terminal of the program-0 diode 318-00 is coupled to another supply voltage V−. The other cells 310-01, 310-10, and 310-11 are similarly coupled. The voltage Vs of the cells 310-00 and 310-10 in the same columns are connected to BL0. The voltage Vs of the cells 310-01 and 310-11 in the same column are connected to BL1. The voltages V+ and V− of the cells 310-00 and 310-01 in the same row are connected to WL0P and WL0N, respectively. The voltages V+ and V− of the cells 310-10 and 310-11 in the same row are connected to WL1P and WL1N, respectively. To program a 0 into the cell 310-01, WL0N is set low and BL1 is set high, while setting the other BL and WLs at proper voltages as shown in FIG. 13(*a*) to disable the other program-1 and program-0 diodes. The bold line in FIG. 13(*a*) shows the direction of current flow.

FIG. 13(*b*) shows alternative program-0 conditions for the cell 310-01 in a 2×2 MRAM array in accordance with one embodiment. For example, to program a 0 into cell 310-01, set BL1 and WL0N to high and low, respectively. If BL0 is set to low in condition 1, the WL0P and WL1P can be either low or floating, and WL1N can be either high or floating. The high and low voltages of an MRAM in today's technologies are about 2-3V for high voltage and 0 for low voltage, respectively. If BL0 is floating in condition 2, WL0P and WL1P can be high, low, or floating, and WL1N can be either high or floating. In a practical implementation, the floating nodes are usually coupled to very weak devices to a fixed voltage to prevent leakage. One embodiment of the program-0 condition is as shown in FIG. 13(*a*) without any nodes floating.

Figure 14A:
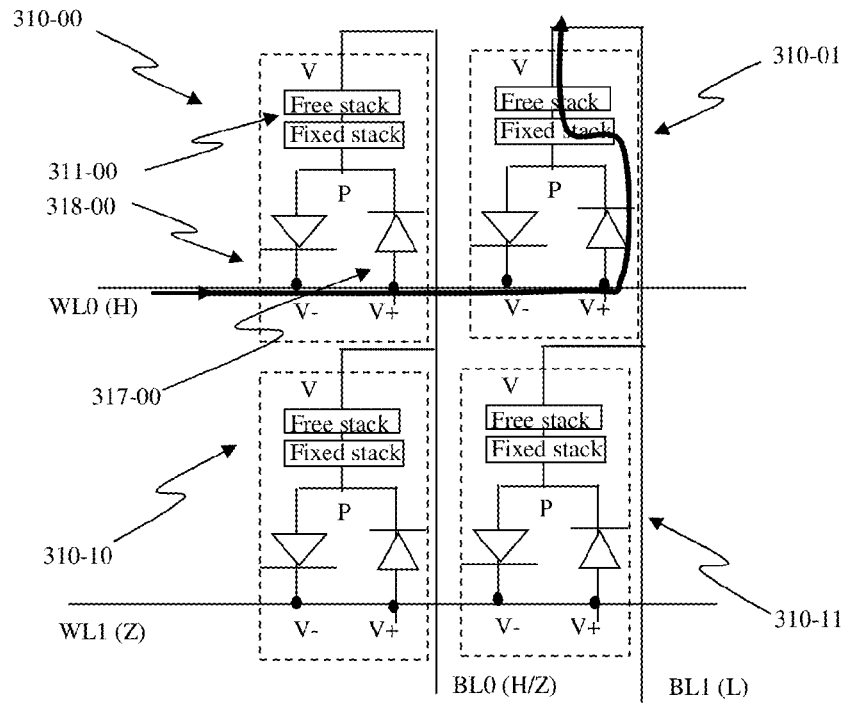
FIGS. 14(a) and 14(b) show one embodiment of programming 1 and 0 into the upper-right cell, respectively, in a two-terminal 2×2 MRAM cell array in accordance with one embodiment.
Figure 14B:
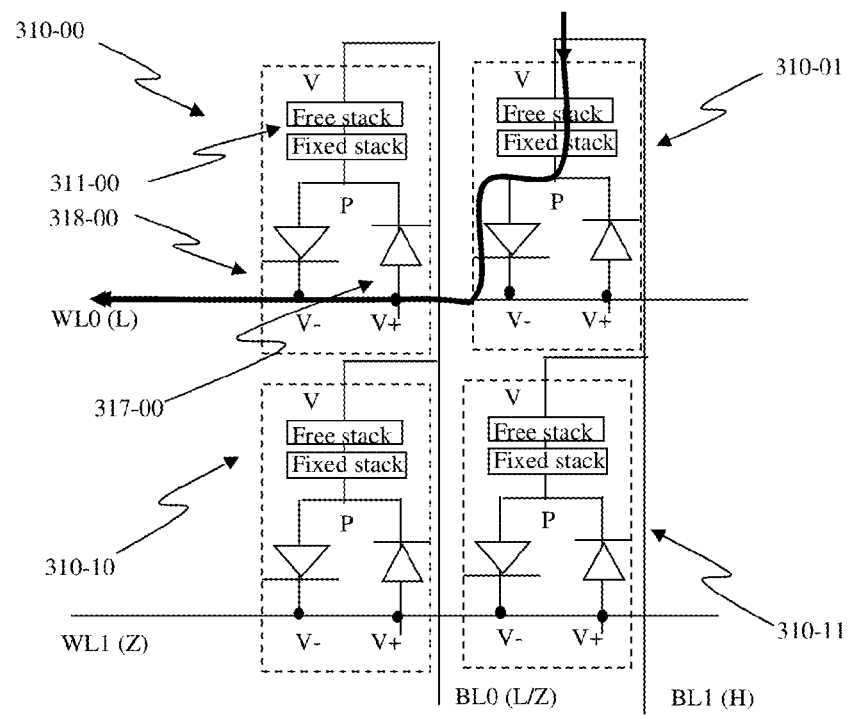

The cells in 2×2 MRAM arrays in FIGS. 12(*a*), 12(*b*), 13(*a*) and 13(*b*) are three-terminal cells, namely, cells with V, V+, and V− nodes. However, if the program voltage VDDP is less than twice a diode's threshold voltage Vd, i.e. VDDP<2*Vd, the V+ and V− nodes of the same cell can be connected together as a two-terminal cell. Since Vd is about 0.6-0.7V at room temperature, this two-terminal cell works if the program high voltage is less than 1.2V and low voltage is 0V. This is a common voltage configuration of MRAM arrays for advanced CMOS technologies that has supply voltage of about 1.0V. FIGS. 14(*a*) and 14(*b*) show schematics for programming a 1 and 0, respectively, in a two-terminal 2×2 MRAM array.

FIGS. 14(*a*) and 14(*b*) show one embodiment of programming 1 and 0, respectively, in a two-terminal 2×2 MRAM cell array in accordance with one embodiment. The cells 310-00, 310-01, 310-10, and 310-11 are organized in a two-dimensional array. The cell 310-00 has the MTJ 311-00, the program-1 diode 317-00, and the program-0 diode 318-00. The MTJ 311-00 is coupled to a supply voltage V at one end, to the N terminal of program-1 diode 317-00 and the P terminal of program-0 diode 318-00 at the other end. The P terminal of the program-1 diode 317-00 is coupled to a supply voltage V+. The N terminal of the program-0 diode 318-00 is coupled to another supply voltage V−. The voltages V+ and V− are connected together in the cell level if VDDP<2*Vd can be met. The other cells 310-01, 310-10 and 310-11 are similarly coupled. The voltages Vs of the cells 310-00 and 310-10 in the same columns are connected to BL0. The voltage Vs of the cells 310-01 and 310-11 in the same column are connected to BL1. The voltages V+ and V− of the cells 310-00 and 310-01 in the same row are connected to WL0. The voltages V+ and V− of the cells 310-10 and 310-11 in the same row are connected to WL1.

To program a 1 into the cell 310-01, WL0 is set high and BL1 is set low, while setting the other BL and WLs at proper voltages as shown in FIG. 14(*a*) to disable other program-1 and program-0 diodes. The bold line in FIG. 14(*a*) shows the direction of current flow. To program a 0 into the cell 310-01, WL0 is set low and BL1 is set high, while setting the other BL and WLs at proper voltages as shown in FIG. 14(*b*) to disable the other program-1 and program-0 diodes. The bold line in FIG. 14(*b*) shows the direction of current flow.

The embodiments of constructing MRAM cells in a 2×2 array as shown in FIGS. 12(*a*)-14(*b*) are for illustrative purposes. Those skilled in the art understand that the number of cells, rows, or columns in a memory can be constructed arbitrarily and rows and columns are interchangeable.

Figure 15A:
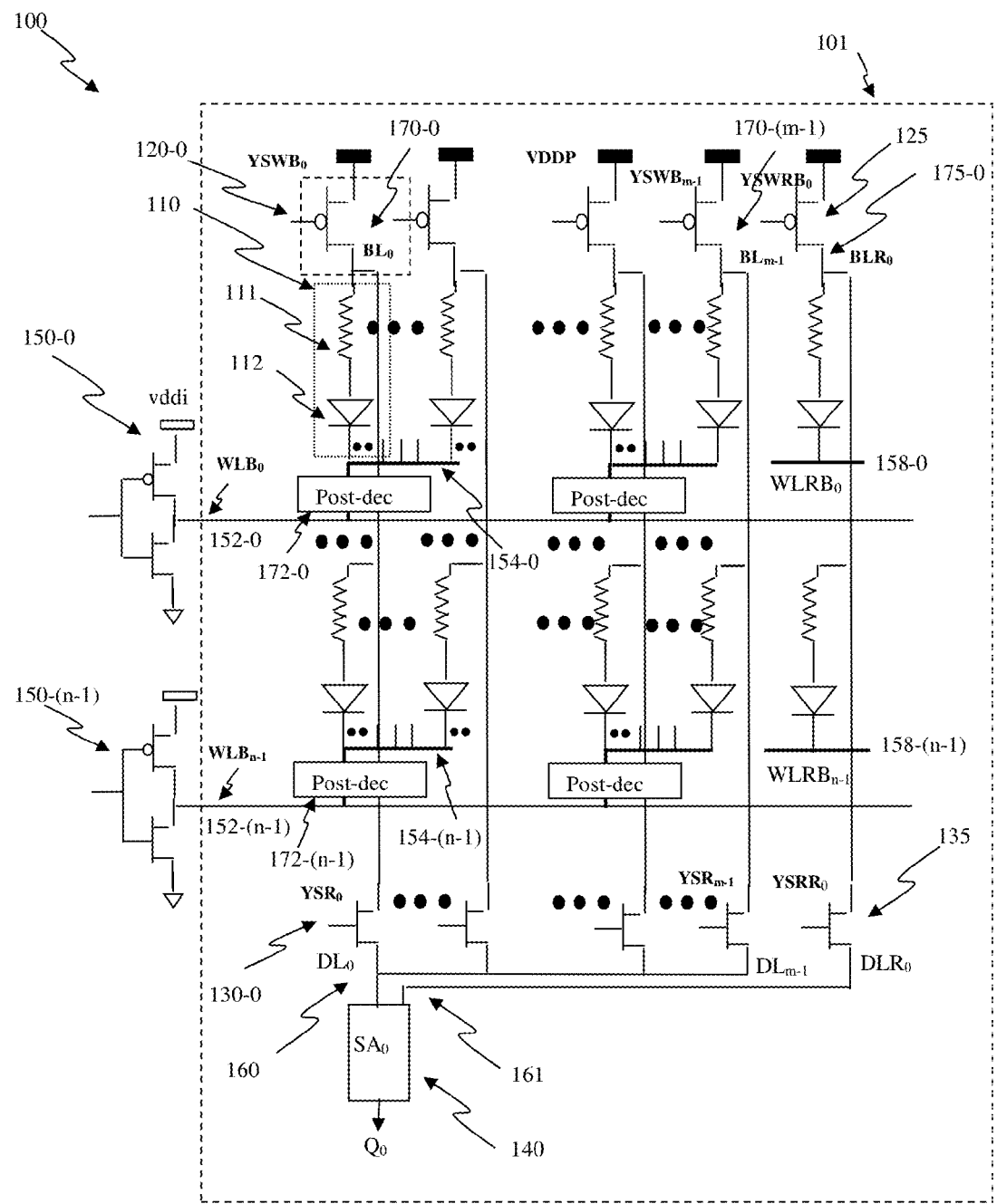
FIG. 15(a) shows a portion of a programmable resistive memory constructed by an array of n-row by (m+1)-column single-diode-as-program-selector cells and n wordline drivers in accordance with one embodiment.
Figure 15B:
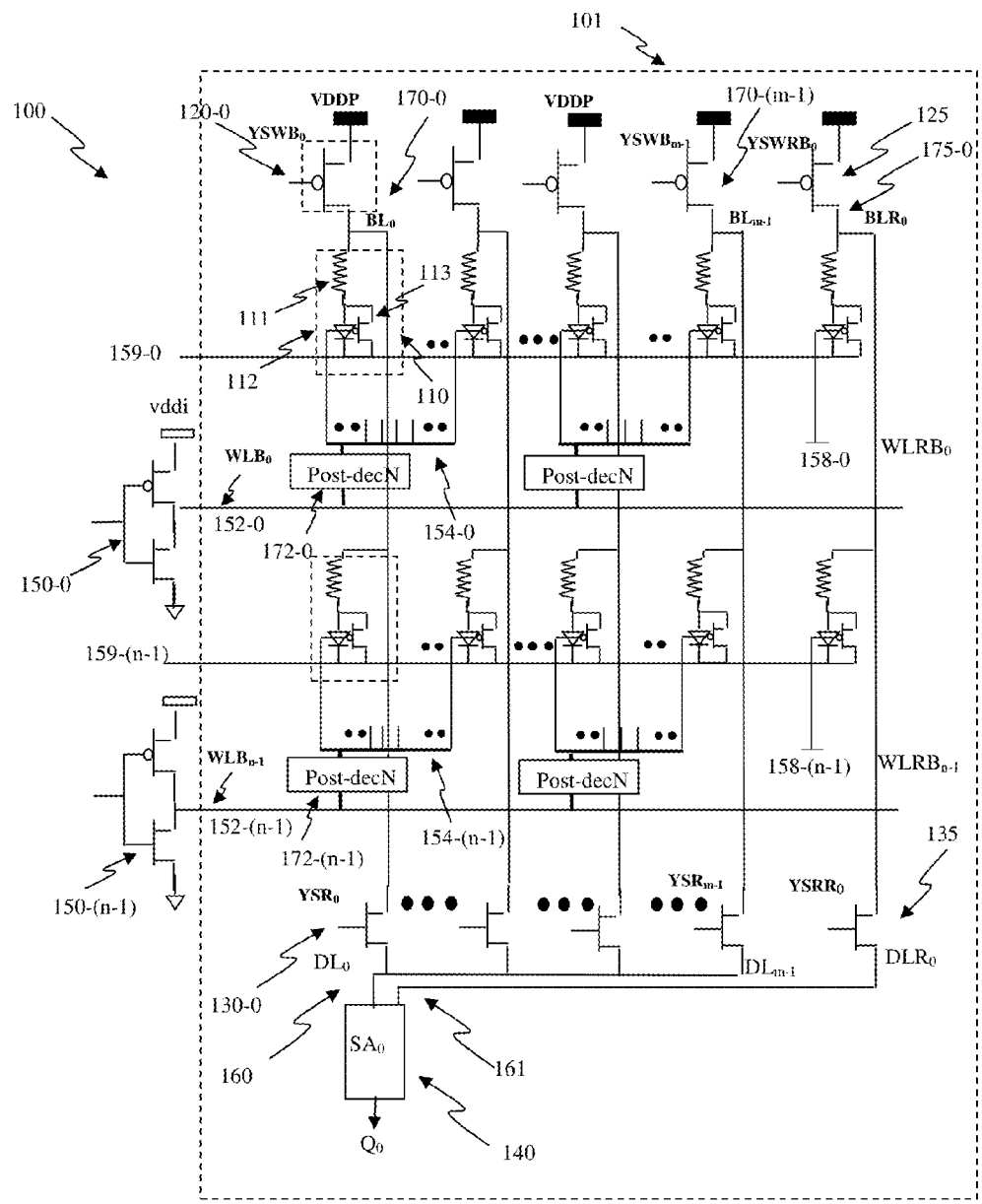
FIG. 15(b) shows a block diagram of a portion of a low-power programmable resistive memory array according to one embodiment.
Figure 15:
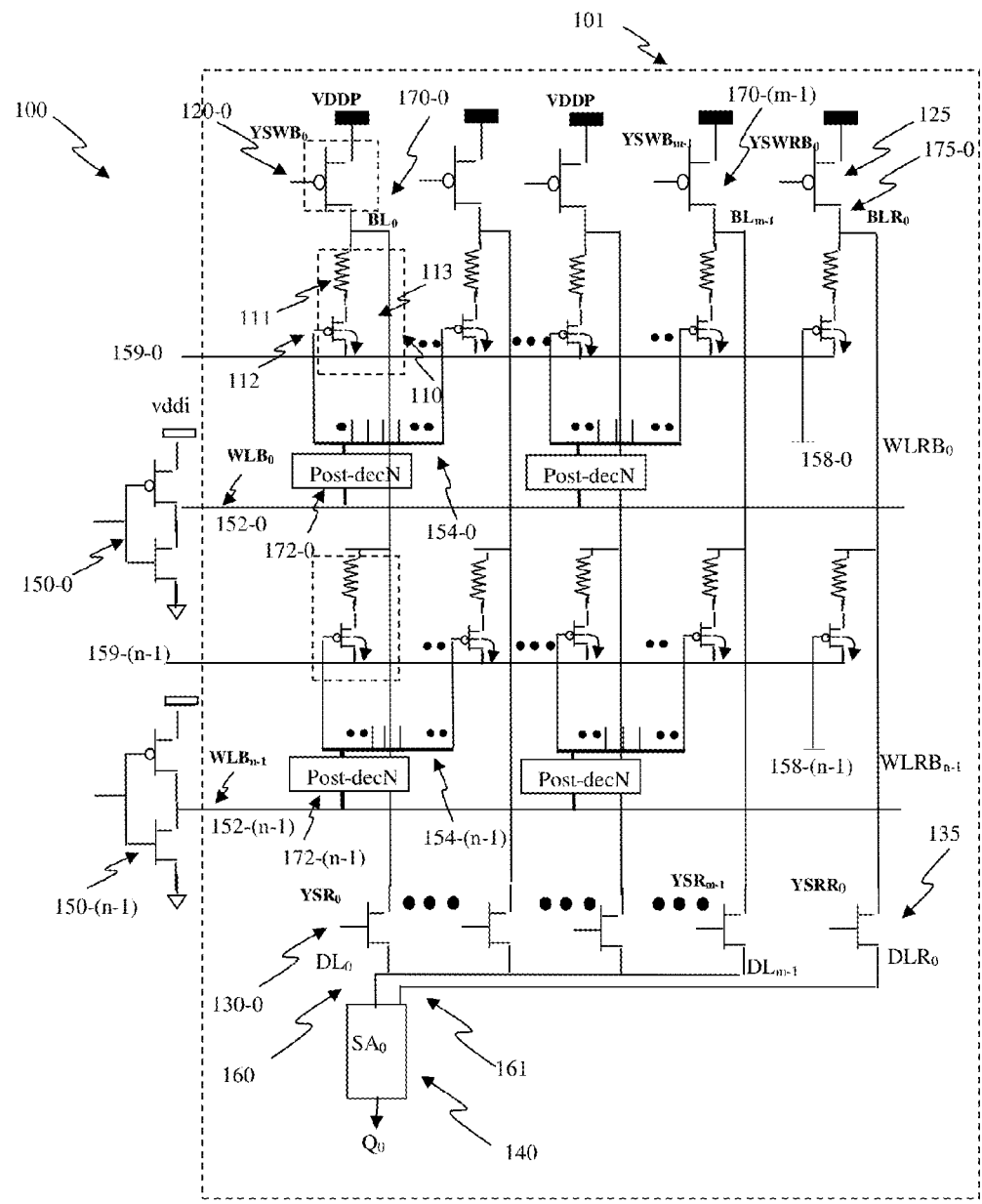
FIG. 15(b1) shows a block diagram of a portion of a programmable resistive memory array with MOS/junction diode for programming and MOS in triode region for reading according to one embodiment.

The programmable resistive devices can be used to construct a memory in accordance with one embodiment. FIG. 15(*a*) shows a portion of a programmable resistive memory 100 constructed by an array 101 of n-row by (m+1)-column single-diode-as-program-selector cells 110 and n wordline drivers 150-*i*, where i=0, 1, . . . , n−1, in accordance with one embodiment. The memory array 101 has m normal columns and one reference column for one shared sense amplifier 140 for differential sensing. Each of the memory cells 110 has a resistive element 111 coupled to the P terminal of a diode 112 as program selector and to a bitline BLj 170-*j* (j=0, 1, . . . m−1) or reference bitline BLR0 175-0 for those of the memory cells 110 in the same column. The N terminal of the diode 112 is coupled to a wordline WLBi 152-*i* through a local wordline LWLBi 154-*i*, where i=0, 1, . . . , n−1, for those of the memory cells 110 in the same row. Each wordline WLBi is coupled to at least one local wordline LWLBi, where i=0, 1, . . . , n−1. The LWLBi 154-*i* is generally constructed by a high resistivity material, such as N well, polysilicon, local interconnect, polymetal, active region, or metal gate to connect cells, and then coupled to the WLBi (e.g., a low-resistivity metal WLBi) through conductive contacts or vias, buffers, or post-decoders 172-*i*, where i=0, 1, . . . , n−1. Buffers or post-decoders 172-*i* may be needed when using diodes as program selectors because there are currents flowing through the WLBi, especially when one WLBi drives multiple cells for program or read simultaneously in other embodiments. The wordline WLBi is driven by the wordline driver 150-*i* with a supply voltage vddi that can be switched between different voltages for program and read. Each BLj 170-*j* or BLR0 175-0 is coupled to a supply voltage VDDP through a Y-write pass gate 120-*j* or 125 for programming, where each BLj 170-*j* or BLR0 175-0 is selected by YSWBj (j=0, 1, . . . , m−1) or YSWRB0, respectively. The Y-write pass gate 120-*j* (j=0, 1, . . . , m−1) or 125 can be built by PMOS, though NMOS, diode, or bipolar devices can be employed in some embodiments. Each BLj or BLR0 is coupled to a dataline DLj or DLR0 through a Y-read pass gate 130-*j* or 135 selected by YSRj (j=0, 1, . . . , m−1) or YSRR0, respectively. In this portion of memory array 101, m normal datalines DLj (j=0, 1, . . . , m−1) are connected to an input 160 of a sense amplifier 140. The reference dataline DLR0 provides another input 161 for the sense amplifier 140 (no multiplex is generally needed in the reference branch). The output of the sense amplifiers 140 is Q0.

To program a cell, the specific WLBi and YSWBj are turned on and a high voltage is supplied to VDDP, where i=0, 1, . . . n−1 and j=0, 1, . . . , m−1. In some embodiments, the reference cells can be programmed to 0 or 1 by turning on WLRBi, and YSWRB0, where i=0, 1, . . . , n−1. To read a cell, a data column 160 can be selected by turning on the specific WLBi and YSRj, where i=0, 1, . . . , n−1, and j=0, 1, . . . , m−1, and a reference cell coupled to the reference dataline DLR0 161 can be selected for the sense amplifier 140 to sense and compare the resistance difference between normal/reference BLs and ground, while disabling all YSWBj and YSWRB0 where j=0, 1, . . . , m−1.

The programmable resistive devices can be used to construct a memory in accordance with one embodiment. FIG. 15(b) shows a portion of a programmable resistive memory 100 constructed by an array 101 of n-row by (m+1)-column cells 110, as shown in FIG. 6(c1) and n wordline drivers 150-i, where i=0, 1, . . . , n−1, in accordance with one embodiment. The memory array 101 has m normal columns and one reference column for one shared sense amplifier 140 for differential sensing. Each of the memory cells 110 has a resistive element 111 coupled to the P terminal of a diode 112 as program selector, a MOS 113 as read program selector, and to a bitline BLj 170-j (j=0, 1, . . . m−1) or reference bitline BLR0 175-0 for those memory cells 110 in the same column. The gate of the MOS 113 is coupled to a wordline WLBi 152-i through a local wordline LWLBi 154-i, where i=0, 1, . . . , n−1, for those of the memory cells 110 in the same row. Each wordline WLBi is coupled to at least one local wordline LWLBi, where i=0, 1, . . . , n−1. The LWLBi 154-i is generally constructed by a high resistivity material, such as N well, polysilicon, polycide, polymetal, local interconnect, active region, or metal gate to connect cells, and then coupled to the WLBi (e.g., a low-resistivity metal WLBi) through conductive contacts or vias, buffers, or post-decoders 172-i, where i=0, 1, . . . , n−1. Buffers or post-decoders 172-i may be needed when using diodes as program selectors or MOS as read selectors to increase performances in other embodiments. The select lines (SLs), 159-0 through 159-(n−1), can be embodied similar to WLBs, that have local SLs, buffers, post-decoders, with low or high resistivity interconnect, etc. Each BLj 170-j or BLR0 175-0 is coupled to a supply voltage VDDP through a Y-write pass gate 1201 or 125 for programming, where each BLj 1701 or BLR0 175-0 is selected by YSWBj (j=0, 1, . . . , m−1) or YSWRB0, respectively. The Y-write pass gate 120-j (j=0, 1, . . . , m−1) or 125 can be built by PMOS, though NMOS, diode, or bipolar devices can be employed in some embodiments. Each BLj or BLR0 is coupled to a dataline DLj or DLR0 through a Y-read pass gate 1301 or 135 selected by YSRj (j=0, 1, . . . , m−1) or YSRR0, respectively. In this portion of memory array 101, m normal datalines DLj (j=0, 1, . . . , m−1) are connected to an input 160 of a sense amplifier 140. The reference dataline DLR0 provides another input 161 for the sense amplifier 140 (no multiplex is generally needed in the reference branch). The output of the sense amplifiers 140 is Q0.

To program a cell, the specific WLBi and YSWBj are turned on and a high voltage is supplied to VDDP, where i=0, 1, . . . n−1 and j=0, 1, . . . , m−1. In some embodiments, the reference cells can be programmed to 0 or 1 by turning on WLRBi, and YSWRB0, where i=0, 1, . . . , n−1. To read a cell, all SLs can be set to low and a dataline 160 can be selected by turning on the specific WLBi (read selector) and YSRj (Y read pass gate), where i=0, 1, . . . , n−1, and j=0, 1, . . . , m−1, and a reference cell coupled to the reference dataline DLR0 161 can be selected for the sense amplifier 140 to sense and compare the resistance difference between normal and reference BLs to ground, while disabling all column write pass gates YSWBj and YSWRB0 where j=0, 1, . . . , m−1.

The programmable resistive devices can be used to construct a memory in accordance with yet another embodiment. FIG. 15(b1) shows an array architecture that is built on cells shown in FIG. 6(c4). Programming a programmable resistive cell is by turning on the channel and the drain junction of a PMOS by pulling the WL and SL low. Reading a programmable resistive cell is by turning on the channel of the PMOS with drain coupled to VDD. In this configuration, program current is high because of the combination of MOS channel and drain junction diode current. Read voltage can be low because the PMOS is operated in triode region that has very low voltage drop.

FIG. 15(b1) shows a portion of a programmable resistive memory 100 constructed by an array 101 of n-row by (m+1)-column cells 110, as shown in FIG. 6(c4) and n wordline drivers 150-i, where i=0, 1, . . . , n−1, in accordance with one embodiment. The memory array 101 has m normal columns and one reference column for one shared sense amplifier 140 for differential sensing. Each memory cell 110 has a resistive element 111 coupled to the source of a PMOS 112 as program selector and to a bitline BLj 170-j (j=0, 1, . . . m−1) or reference bitline BLR0 175-0 for those memory cells 110 in the same column. The gate of the PMOS 112 is coupled to a wordline WLBi 152-i through a local wordline LWLBi 154-i, where i=0, 1, . . . , n−1, for those memory cells 110 in the same row. Each wordline WLBi is coupled to at least one local wordline LWLBi, where i=0, 1, . . . , n−1. The LWLBi 154-i is generally constructed by a high resistivity material, such as N well, polysilicon, polycide, polymetal, local interconnect, active region, or metal gate to connect cells, and then coupled to the WLBi (e.g., a low-resistivity metal WLBi) through conductive contacts or vias, buffers, or post-decoders 172-i, where i=0, 1, . . . , n−1. Buffers or post-decoders 172-i may be needed when using PMOS and/or drain junction diode as program selectors and PMOS as read selectors to increase performances in other embodiments. The select lines (SLs), 159-0 through 159-(n−1), can be embodied similar to WLBs, that have local SLs, buffers, post-decoders, with low or high resistivity interconnect, etc. Each BLj 170-j or BLR0 175-0 is coupled to a supply voltage VDDP through a Y-write pass gate 120-j or 125 for programming, where each BLj 170-j or BLR0 175-0 is selected by YSWBj (j=0, 1, . . . , m−1) or YSWRB0 for programming, respectively. The Y-write pass gate 120-j (j=0, 1, . . . , m−1) or 125 can be built by PMOS, though NMOS, diode, or bipolar devices can be employed in some embodiments. Each BLj or BLR0 is coupled to a dataline DLj or DLR0 through a Y-read pass gate 130-j or 135 selected by YSRj (j=0, 1, . . . , m−1) or YSRR0, respectively, for read. In this portion of memory array 101, m normal datalines DLj (j=0, 1, . . . , m−1) are connected to an input 160 of a sense amplifier 140. The reference dataline DLR0 provides another input 161 for the sense amplifier 140 (no multiplex is generally needed in the reference branch except for providing different reference resistors). The output of the sense amplifiers 140 is Q0.

To program a cell, the specific WLBi for WLB/SL and YSWBj are turned on and a high voltage is supplied to VDDP, where i=0, 1, . . . n−1 and j=0, 1, . . . , m−1. The drain of the PMOS in the selected cell can be pulled low so that the drain junction diode will be turned on to conduct current flowing through the PRD 111. The PMOS gate can be also turned on to provide more MOS channel current in additional to the diode current to program the PRD 111. To read a cell, all SLs (159-0 through 159-(n−1)) can be set to VDD while pulling the WLBi low and turn on YSRj (Y read pass gate), where i=0, 1, . . . , n−1, and j=0, 1, . . . , m−1, to select a cell for sensing. A reference cell coupled to a reference dataline DLR0 161 can also be selected for sensing. In some embodiments, the reference cells can be programmed to 0 or 1 by turning on WLRBi, and YSWRB0, where i=0, 1, . . . , n−1. A sense amplifier 140 can compare the currents flowing through the cell and the reference branches to determine the cell resistance into logic 0 or 1. During reading, all column write pass gates YSWBj and YSWRB0 where j=0, 1, . . . , m−1, are normally disabled, except for low-voltage concurrent programming to test program circuits. In other embodiment, the WL and SL of each cell can be coupled together for programming or reading so that needs no duplicated local WL/SL and post-decoders.

Figure 15C:
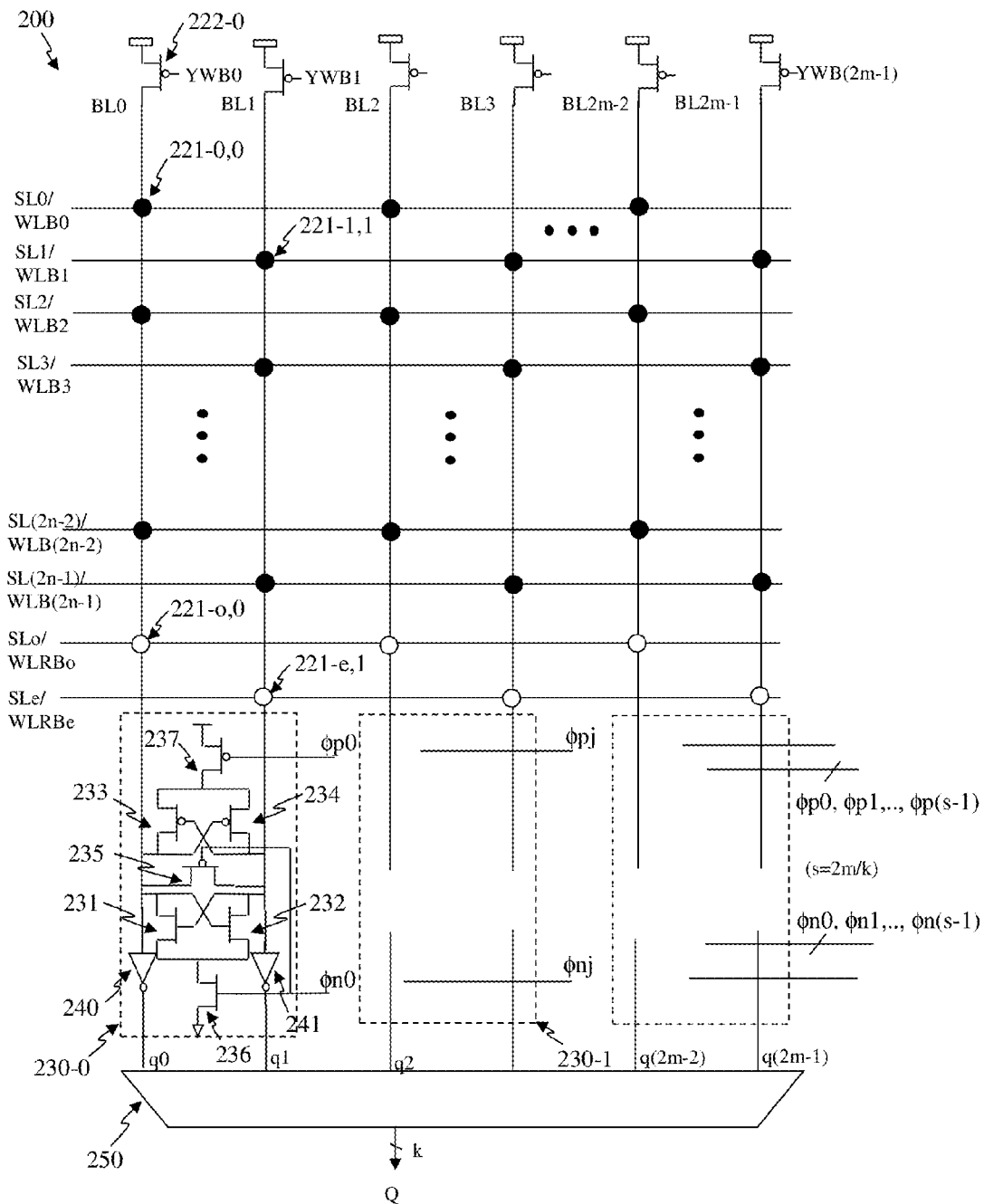
FIG. 15(c) shows a block diagram of a portion of a low-power programmable resistive memory array with differential sensing according to one embodiment.

FIG. 15(c) shows a schematic of a portion of an OTP array 200, according to another embodiment. The OTP array 200 as 2n rows and 2m columns organized in a half-populated two dimensional array for a total of 2 nm cells, i.e. the cells at even rows are only coupled to even columns, and the cells at odd rows are only coupled to the odd columns. The bitlines (BLj, j=0, 1, 2, . . . , 2m−1) run in the column direction and the source lines/wordline bar (SLi/WLBi, i=0, 1, 2, . . . , 2n−1) run in the row direction. At each intersection of even-row/even-column and odd-row/odd-column is an OTP cell corresponding to the cell shown in FIG. 6(c1). For example, a cell 221-0,0 is located at (row, column)=(0,0), another cell 221-1,1 is located at (1,1), and so on. Another two reference rows SLe/WLRBe and SLo/WLRBo are provided for differential sensing. The reference cells are similar to the normal cells except that the fuse resistance is set about half-way between state 0 and state 1 resistance. This can be achieved by adjusting the ratio of fuse width and length in the reference cells, or blocking a portion of silicide on the fuse or put an additional reference resistor in serial with the reference cells outside of the OTP array. The reference cells on the even row of the reference row are coupled to odd columns, such as 221-e,1, 221-e,3, etc. And the reference cells on the odd row of the reference row are coupled to even columns, such as 221-o,0, 221-o,2, etc. During read, when a cell in an even column is turned on, another reference cell in the adjacent odd column is also turned on too so that BLs in the same column pair can be used for differential sensing. Each BLj has a PMOS pullup 222-j coupled to a program voltage supply VDDP with the gates coupled to YWBj, where j=0, 1, 2, . . . , 2m−1. During program, a cell can be selected by turning on a SLi (i=0, 1, 2, . . . , 2n−1) and YWBj (j=0, 1, 2, . . . , 2m−1) to conduct a current flowing through a diode in the selected cell and thus program the cell into a different resistance state. There can be more than one pair of reference SL/WLR with different reference resistances upon select to suit different ranges of post-program resistances.

In FIG. 15(c), there are m sense amplifiers 230-j, j=0, 1, 2, . . . , m−1 to sense data between two adjacent BLs. In the sense amplifier 230-0, for example, a pair of NMOS 231 and 232 have their drains and gates cross-coupled and their sources coupled to a drain of a NMOS pulldown device 236. Similarly, a pair of PMOS 233 and 234 have their drains and gates cross-coupled and their sources coupled to a drain of a PMOS pullup 237. The drains of the NMOS 231 and PMOS 233 are coupled to BL0 and the drains of the PMOS 232 and PMOS 234 are coupled to BL1. Two inverters 240 and 241 are coupled to the BL0 and BL1 for local output q0 and q1, respectively. The gates of the NMOS 236 and PMOS 237 are coupled to φn and φp, respectively. A PMOS equalizer 235 has a gate coupled to φn to equalize the BL0 and BL1 voltages before sensing. The PMOS equalizer 235 can be an NMOS with gate coupled to φp in other embodiment. The equalizer 235 can be replaced by a pair of BL0 and BL1 pullups or pulldowns to VDD or ground with gates coupled to φn or φp, respectively, in another embodiment. The equalizer or pullups/pulldowns can be coupled to a different control signal in yet another embodiment. If the OTP array have k outputs Q0, Q1, . . . , Q(k−1), there can be s=2m/k pairs of φn and φp to select and activate k sense amplifiers. The 2m local outputs, q0, q1, . . . , q(2m−1) can be multiplexed in a multiplexer 205 to generate k outputs Q0, Q1, . . . , Q(k−1) accordingly. The sensing scheme can be applied to the cells using diode or MOS as read selector.

Figure 15D:
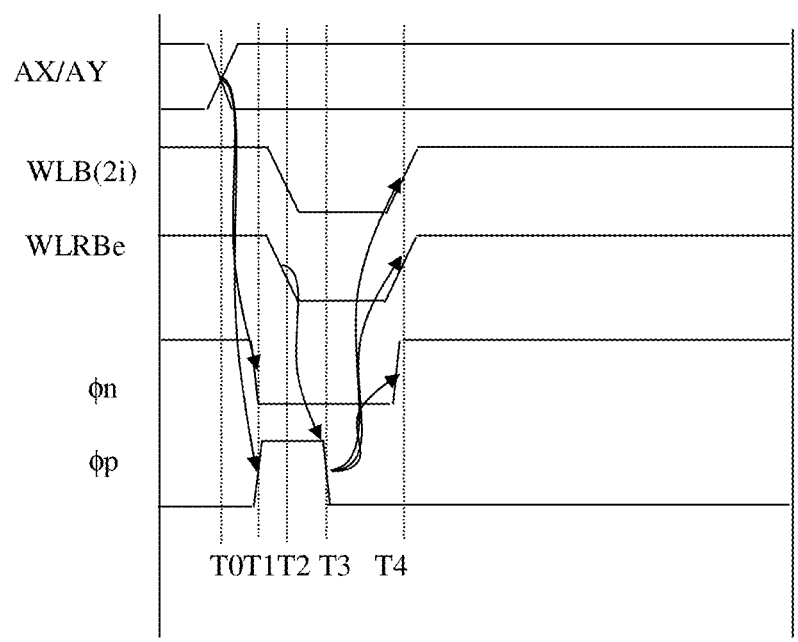
FIG. 15(d) shows a portion of timing diagram of a low-power OTP memory array according to one embodiment.

FIG. 15(d) shows a portion of timing diagram to illustrate how a sense amplifier operates, corresponding to the sense amplifiers 230-j (j=0, 1, 2, . . . , m−1) in FIG. 15(c). The sensing procedure is to turn on the PMOS half-latch first and then turn on the NMOS half-latch while disabling the selected WLB and RWLB. The BL of the memory cell has a programmable resistive element in serial with a diode or MOS as read selector to SL. All normal and reference source lines are set to high in the read mode. At time T0, X- and Y-addresses are selected for a new read operation. At T1, φn is set low and φp is set high to disable the cross-coupled latch consists of MOS 231, 232, 233, and 234 and equalize the BL0 and BL1 so that the data from the previous sensing can be reset. At T2, an even/odd WLB and a corresponding odd/even WLRB are turned on so that a normal and a reference cells in the same BL pair can be selected for sensing. At T3, φp is set low to turn on the half latch of PMOS 233 and 234. The BL0 and BL1 differential voltages can be sensed and latched in a PMOS latch consisting of PMOS 233 and 234. At T4, the WLB and WLRB are turned off and the NMOS pulldown is activated by setting φn high to enable the NMOS half latch consisting of NMOS 231 and 232. Full-swing local outputs q0 and q1 will be ready at the outputs of the inverters 240 and 241, respectively. The local outputs q0 through q(2m−1) can be further selected by a multiplexer 250 to generate Q0, Q1, . . . , Q(k−1). The timing sequences of turning off WLB/WLRB and turning on φn are not critical.

Figure 16A:
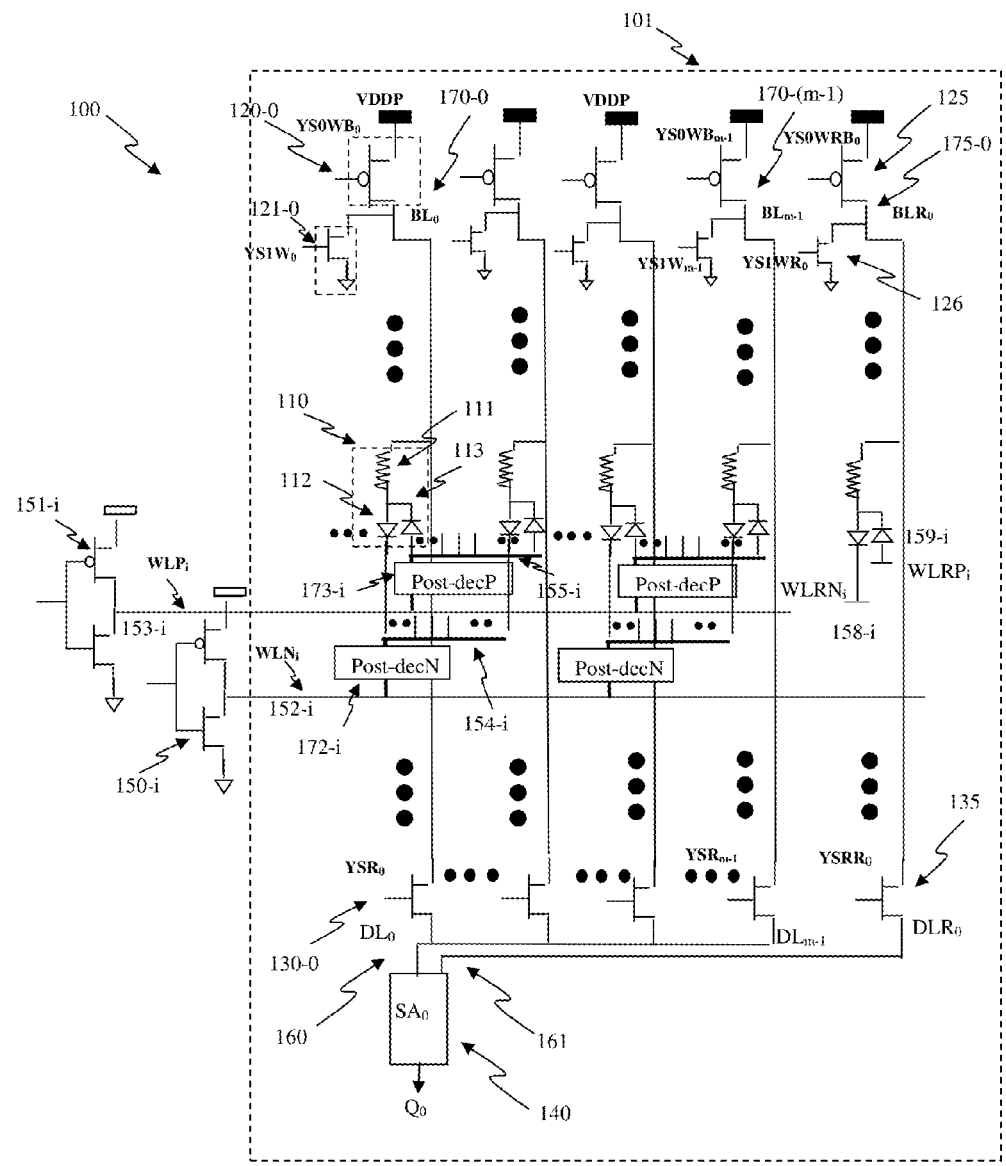
FIG. 16(a) shows a portion of a programmable resistive memory constructed by an array of 3-terminal MRAM cells according to one embodiment.

The programmable resistive devices can be used to construct a memory in accordance with one embodiment. FIG. 16(a) shows a portion of a programmable resistive memory 100 constructed by an array 101 of 3-terminal MRAM cells 110 in n rows and m+1 columns and n pairs of wordline drivers 150-i and 151-i, where i=0, 1, . . . , n−1, according to one embodiment. The memory array 101 has m normal columns and one reference column for one shared sense amplifier 140 for differential sensing. Each of the memory cells 110 has a resistive element 111 coupled to the P terminal of a program-0 diode 112 and N terminal of a program-1 diode 113. The program-0 diode 112 and the program-1 diode 113 serve as program selectors. Each resistive element 111 is also coupled to a bitline BLj 1701 (j=0, 1, . . . m−1) or reference bitline BLR0 175-0 for those of the memory cells 110 in the same column. The N terminal of the diode 112 is coupled to a wordline WLNi 152-i through a local wordline LWLNi 154-i, where i=0, 1, . . . , n−1, for those of the memory cells 110 in the same row. The P terminal of the diode 113 is coupled to a wordline WLPi 153-i through a local wordline LWLPi 155-i, where i=0, 1, . . . , n−1, for those cells in the same row. Each wordline WLNi or WLPi is coupled to at least one local wordline LWLNi or LWLPi, respectively, where i=0, 1, . . . , n−1. The LWLNi 154-i and LWLPi 155-i are generally constructed by a high resistivity material, such as N well, polysilicon, local interconnect, polymetal, active region, or metal gate to connect cells, and then coupled to the WLNi or WLPi (e.g., low-resistivity metal WLNi or WLPi) through conductive contacts or vias, buffers, or post-decoders 172-*i* or 173-*i* respectively, where i=0, 1, . . . , n−1. Buffers or post-decoders 172-*i* or 173-*i* may be needed when using diodes as program selectors because there are currents flowing through WLNi or WLPi, especially when one WLNi or WLPi drivers multiple cells for program or read simultaneously in some embodiments. The wordlines WLNi and WLPi are driven by wordline drivers 150-*i* and 151-*i*, respectively, with a supply voltage vddi that can be switched between different voltages for program and read. Each BLj 170-*j* or BLR0 175-0 is coupled to a supply voltage VDDP through a Y-write-0 pass gate 120-*j* or 125 to program 0, where each BLj 1701 or BLR0 175-0 is selected by YS0WBj (j=0, 1, . . . , m−1) or YS0WRB0, respectively. Y-write-0 pass gate 120-*j* or 125 can be built by PMOS, though NMOS, diode, or bipolar devices can be employed in other embodiments. Similarly, each BLj 170-*j* or BLR0 175-0 is coupled to a supply voltage 0V through a Y-write-1 pass gate 121-*j* or 126 to program 1, where each BLj 170-*j* or BLR0 175-0 is selected by YS1Wj (j=0, 1, . . . , m−1) or YS1WR0, respectively. Y-write-1 pass gate 121-*j* or 126 is can be built by NMOS, though PMOS, diode, or bipolar devices can be employed in other embodiments. Each BLj or BLR0 is coupled to a dataline DLj or DLR0 through a Y-read pass gate 130-*j* or 135 selected by YSRj (j=0, 1, . . . , m−1) or YSRR0, respectively. In this portion of memory array 101, m normal datalines DLj (j=0, 1, . . . , m−1) are connected to an input 160 of a sense amplifier 140. Reference dataline DLR0 provides another input 161 for the sense amplifier 140, except that no multiplex is generally needed in a reference branch. The output of the sense amplifier 140 is Q0.

To program a 0 into a cell, the specific WLNi, WLPi and BLj are selected as shown in FIG. 13(*a*) or 13(*b*) by wordline drivers 150-*i*, 151-*i*, and Y-pass gate 1201 by YS0WBj, respectively, where i=0, 1, . . . n−1 and j=0, 1, . . . , m−1, while the other wordlines and bitlines are also properly set. A high voltage is applied to VDDP. In some embodiments, the reference cells can be programmed into 0 by setting proper voltages to WLRNi 158-*i*, WLRPi 159-*i* and YS0WRB0, where i=0, 1, . . . , n−1. To program a 1 to a cell, the specific WLNi, WLPi and BLj are selected as shown in FIG. 12(*a*) or 12(*b*) by wordline driver 150-*i*, 151-*i*, and Y-pass gate 121-*j* by YS1Wj, respectively, where i=0, 1, . . . n−1 and j=0, 1, . . . , m−1, while the other wordlines and bitlines are also properly set. In some embodiments, the reference cells can be programmed to 1 by setting proper voltages to WLRNi 158-*i*, WLRPi 159-*i* and YS1WR0, where i=0, 1, . . . , n−1. To read a cell, a data column 160 can be selected by turning on the specific WLNi, WLPi and YSRj, where i=0, 1, . . . , n−1, and j=0, 1, . . . , m−1, and a reference cell coupled to the reference dataline DLR 161 for the sense amplifier 140 to sense and compare the resistance difference between normal/reference BLs and ground, while disabling all YS0WBj, YS0WRB0, YS1Wj and YS1WR0, where j=0, 1, . . . , m−1.

Figure 16B:
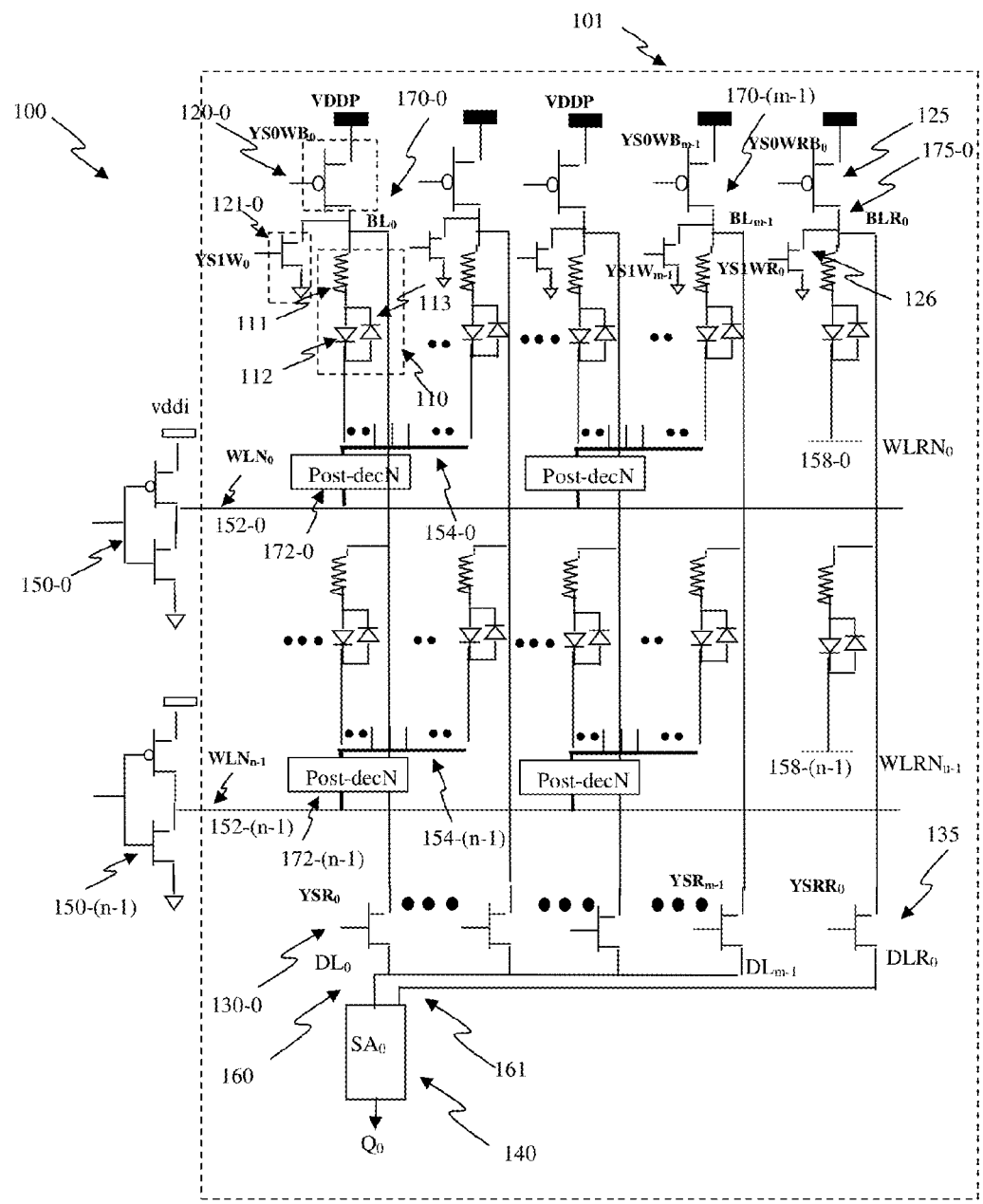
FIG. 16(b) shows another embodiment of constructing a portion of MRAM memory with 2-terminal MRAM cells.

Another embodiment of constructing an MRAM memory with 2-terminal MRAM cells is shown in FIG. 16(*b*), provided the voltage difference VDDP, between high and low states, is less than twice of the diode's threshold voltage Vd, i.e., VDDP<2*Vd. As shown in FIG. 16(*b*), two wordlines per row WLNi 152-*i* and WLPi 153-*i* in FIG. 16(*a*) can be merged into one wordline driver WLNi 152-*i*, where i=0, 1, . . . , n−1. Also, the local wordlines LWLNi 154-*i* and LWLP 155-*i* per row in FIG. 16(*a*) can be merged into one local wordline LWLNi 154-*i*, where i=0, 1, . . . , n−1, as shown in FIG. 16(*b*). Still further, two wordline drivers 150-*i* and 151-*i* in FIG. 16(*a*) can be merged into one, i.e., wordline driver 150-*i*. The BLs and WLNs of the unselected cells are applied with proper program 1 and 0 conditions as shown in FIGS. 14(*a*) and 14(*b*), respectively. Since half of wordlines, local wordlines, and wordline drivers can be eliminated in this embodiment, cell and macro areas can be reduced substantially.

Figure 17A:
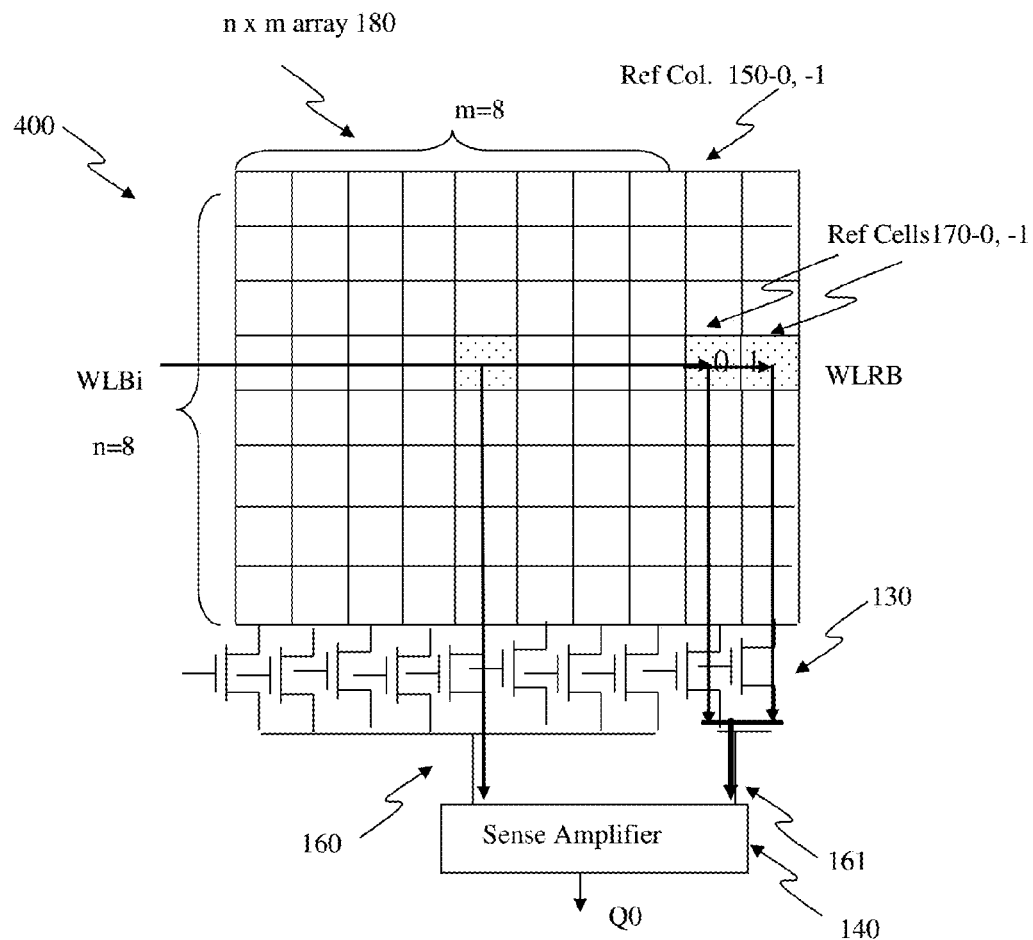
FIGS. 17(a), 17(b), and 17(c) show three other embodiments of constructing reference cells for differential sensing.

Differential sensing is a common for programmable resistive memory, though single-end sensing can be used in other embodiments. FIGS. 17(*a*), 17(*b*), and 17(*c*) show three other embodiments of constructing reference cells for differential sensing. In FIG. 17(*a*), a portion of memory 400 has a normal array 180 of n×m cells, two reference columns 150-0 and 150-1 of n×1 cells each storing all data 0 and 1 respectively, m+1 Y-read pass gates 130, and a sense amplifier 140. As an example, n=8 and m=8 are used to illustrate the concept. There are n wordlines WLBi and n reference wordlines WLRBi for each column, where i=0, 1, . . . , n−1. When a wordline WLBi is turned on to access a row, a corresponding reference wordline WLRBi (i=0, 1, . . . , n−1) is also turned on to activate two reference cells 170-0 and 170-1 in the same row to provide mid-level resistance after proper scaling in the sense amplifier. The selected dataline 160 along with the reference dataline 161 are input to a sense amplifier 140 to generate an output Q0. In this embodiment, each WLRBi and WLBi (i=0, 1, . . . , n−1) are hardwired together and every cells in the reference columns need to be pre-programmed before read.

FIG. 17(*b*) shows another embodiment of using a reference cell external to a reference column. In FIG. 17(*b*), a portion of memory 400 has a normal array 180 of n×m cells, a reference column 150 of n×1 cells, m+1 Y-read pass gates 130, and a sense amplifier 140. When a wordline WLBi (i=0, 1, . . . , n−1) is turned on, none of the cells in the reference column 150 are turned on. An external reference cell 170 with a pre-determined resistance is turned on instead by an external reference wordline WLRB. The selected dataline 160 and the reference dataline 161 are input to a sense amplifier 140 to generate an output Q0. In this embodiment, all internal reference wordlines WLRBi (i=0, 1, . . . , n−1) in each row are disabled. The reference column 150 provides a loading to match with that of the normal columns. The reference cells or the reference column 150 can be omitted in other embodiments.

FIG. 17(*c*) shows another embodiment of constructing reference cells for differential sensing. In FIG. 17(*c*), a portion of memory 400 has a normal array 180 of n×m cells, one reference column 150 of n×1, two reference rows 175-0 and 175-1 of 1×m cells, m+1 Y-read pass gates 130, and a sense amplifier 140. As an example, n=8 and m=8 are used to illustrate the approach. There are n wordlines WLBi and 2 reference wordlines WLRB0 175-0 and WLRB1 175-1 on top and bottom of the array, where i=0, 1, . . . , n−1. When a wordline WLBi (i=0, 1, . . . , n−1) is turned on to access a row, the reference wordline WLRB0 and WLRB1 are also turned on to activate two reference cells 170-0 and 170-1 in the upper and lower right corners of the array 180, which store data 0 and 1 respectively. The selected dataline 160 along with the reference dataline 161 are input to a sense amplifier 140 to generate an output Q0. In this embodiment, all cells in the reference column 150 are disabled except that the cells 170-0 and 170-1 on top and bottom of the reference column 150. Only two reference cells are used for the entire n×m array that needs to be pre-programmed before read.

Figure 17B:
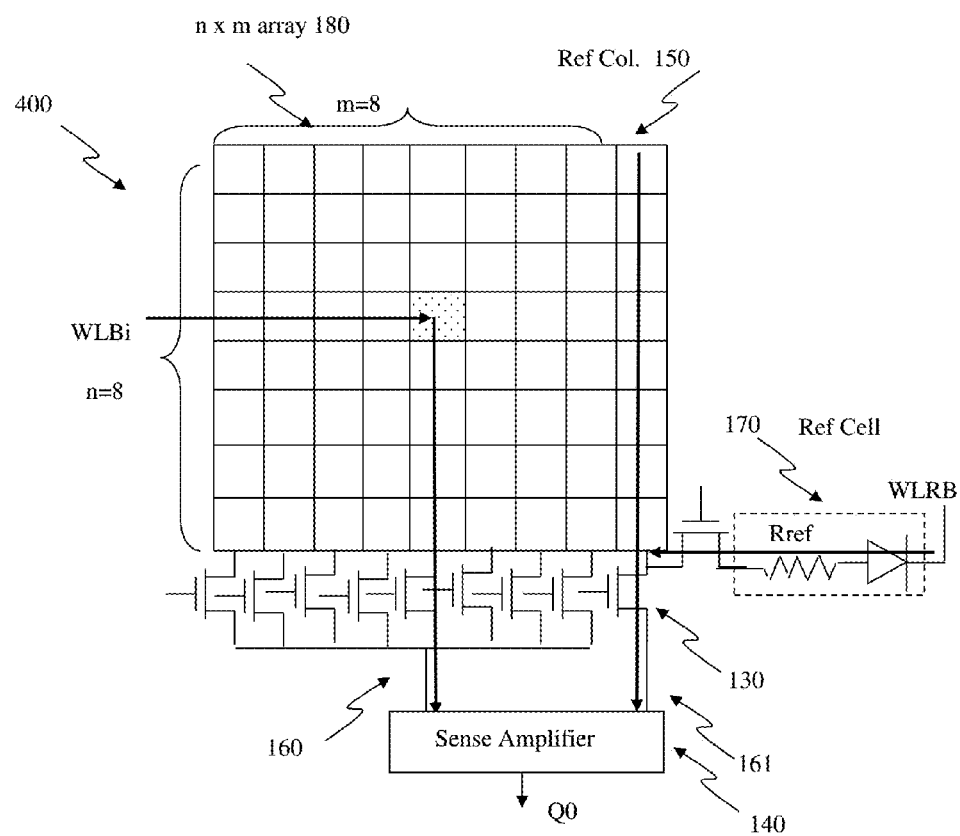
Figure 17C:
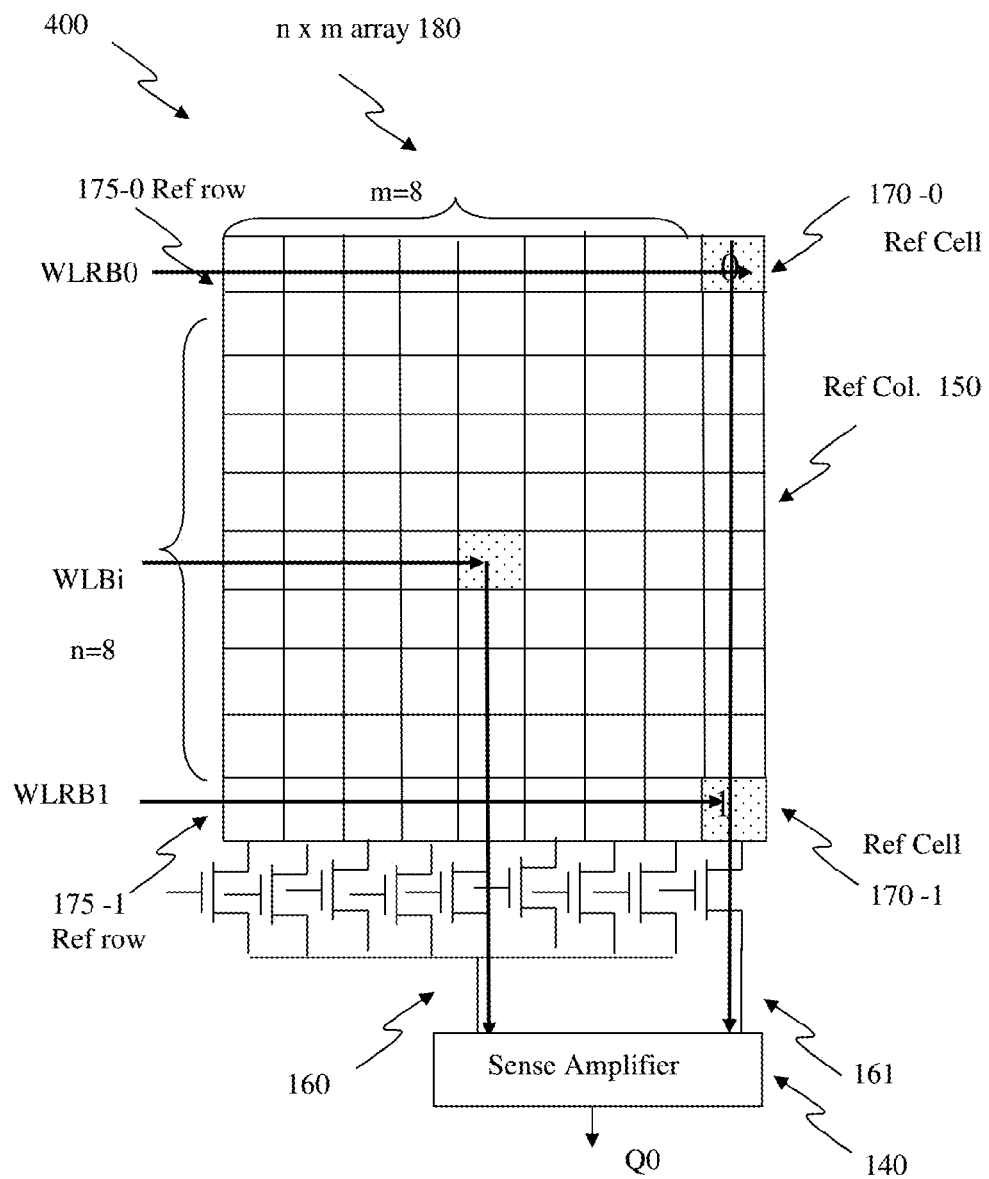

For those programmable resistive devices that have a very small resistance ratio between states 1 and 0, such as 2:1 ratio in MRAM, FIGS. 17(*a*) and 17(*c*) are desirable embodiments, depending on how many cells are suitable for one pair of reference cells. Otherwise, FIG. 17(b) is a desirable embodiment for electrical fuse or PCM that has resistance ratio of more than about 10.

FIGS. 15, 16(a), 16(b), 17(a), 17(b), and 17(c) show only a few embodiments of a portion of programmable resistive memory in a simplified manner. The memory array 101 in FIGS. 15, 16(a), and 16(b) can be replicated s times to read or program s-cells at the same time. In the case of differential sensing, the number of reference columns to normal columns may vary and the physical location can also vary relative to the normal data columns. Rows and columns are interchangeable. The numbers of rows, columns, or cells likewise may vary. For those skilled in the art understand that the above descriptions are for illustrative purpose. Various embodiments of array structures, configurations, and circuits are possible and are still within the scope of this invention.

The portions of programmable resistive memories shown in FIGS. 15, 16(a), 16(b), 17(a), 17(b) and 17(c) can include different types of resistive elements. The resistive element can be an electrical fuse including a fuse fabricated from an interconnect, contact/via fuse, contact/via anti-fuse, or gate oxide breakdown anti-fuse. The interconnect fuse can be formed from silicide, polysilicon, silicided polysilicon, metal, metal alloy, local interconnect, thermally isolated active region, or some combination thereof, or can be constructed from a CMOS gate. The resistive element can also be fabricated from phase-change material in PCRAM, resistive film in RRAM/CBRAM, or MTJ in MRAM, etc. For the electrical fuse fabricated from an interconnect, contact, or via fuse, programming requirement is to provide a sufficiently high current, about 4-20 mA range, for a few microseconds to blow the fuse by electro-migration, heat, ion diffusion, or some combination thereof. For anti-fuse, programming requirement is to provide a sufficiently high voltage to breakdown the dielectrics between two ends of a contact, via or CMOS gate/body. The required voltage is about 6-7V for a few millisecond to consume about 100 uA of current in today's technologies. Programming Phase-Change Memory (PCM) requires different voltages and durations for 0 and 1. Programming to a 1 (or to reset) requires a high and short voltage pulse applied to the phase-change film. Alternatively, programming to a 0 (or to set) requires a low and long voltage pulse applied to the phase change film. The reset needs about 3V for 50 ns and consumes about 300 uA, while set needs about 2V for 300 ns and consumes about 100 uA. For MRAM, the high and low program voltages are about 2-3V and 0V, respectively, and the current is about +/−100-200 uA.

Most programmable resistive devices have a higher voltage VDDP (~2-3V) for programming than the core logic supply voltage VDD (~1.0V) for reading. FIG. 18(a) shows a schematic of a wordline driver circuit 60 according to one embodiment. The wordline driver includes devices 62 and 61, as shown as the wordline driver 150 in FIGS. 15, 16(a) and 16(b). The supply voltage vddi is further coupled to either VDDP or VDD through power selectors 63 and 64 (e.g., PMOS power selectors) respectively. The input of the wordline driver Vin is from an output of an X-decoder. In some embodiments, the power selectors 63 and 64 are implemented as thick oxide I/O devices to sustain high voltage. The bodies of power selector 63 and 64 can be tied to vddi to prevent latchup.

Similarly, bitlines tend to have a higher voltage VDDP (~2-3V) for programming than the core logic supply voltage VDD (~1.0V) for reading. FIG. 18(b) shows a schematic of a bitline circuit 70 according to one embodiment. The bitline circuit 70 includes a bitline (BL) coupled to VDDP and VDD through power selectors 73 and 74 (e.g., PMOS power selectors), respectively. If the bitline needs to sink a current such as in an MRAM, an NMOS pulldown device 71 can be provided. In some embodiments, the power selectors 73 and 74 as well as the pulldown device 71 can be implemented as thick-oxide I/O devices to sustain high voltage. The bodies of power selector 73 and 74 can be tied to vddi to prevent latchup.

Figure 18C:
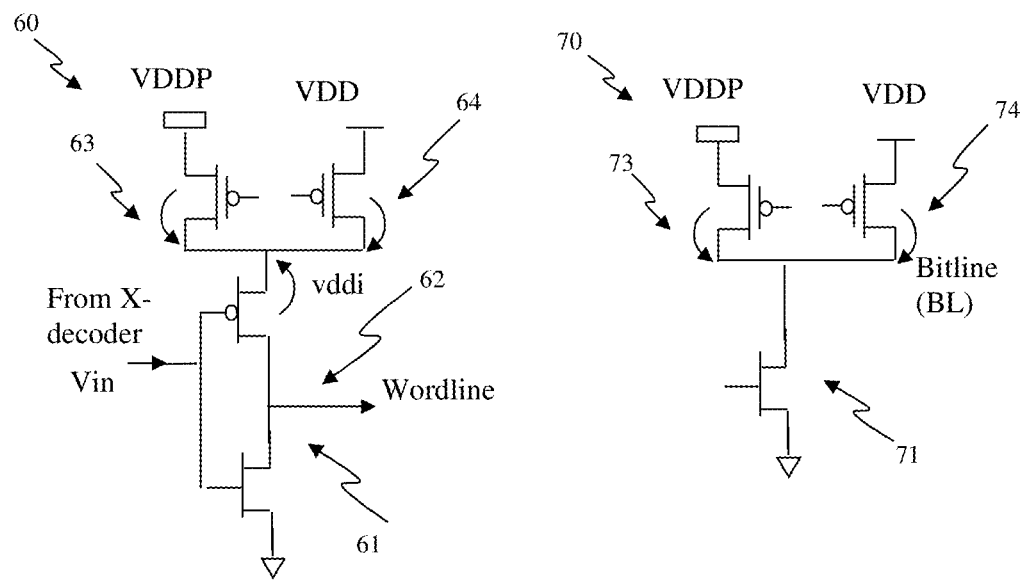
FIG. 18(c) shows a portion of memory with an internal power supply VDDP coupled to an external supply VDDPP and a core logic supply VDD through power selectors.
Figure 18C:
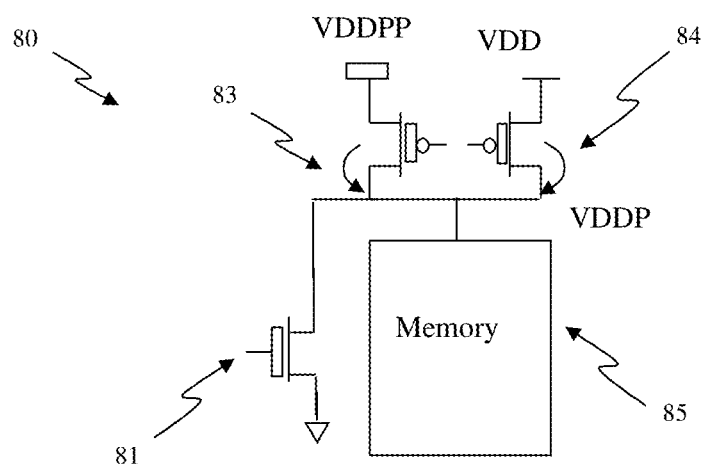

Using junction diodes as program selectors may have high leakage current if a memory size is very large. Power selectors for a memory can help reducing leakage current by switching to a lower supply voltage or even turning off when a portion of memory is not in use. FIG. 18(c) shows a portion of memory 85 with an internal power supply VDDP coupled to an external supply VDDPP and a core logic supply VDD through power selectors 83 and 84. VDDP can even be coupled to ground by an NMOS pulldown device 81 to disable this portion of memory 85, if this portion of memory is temporarily not in use.

Figure 19A:
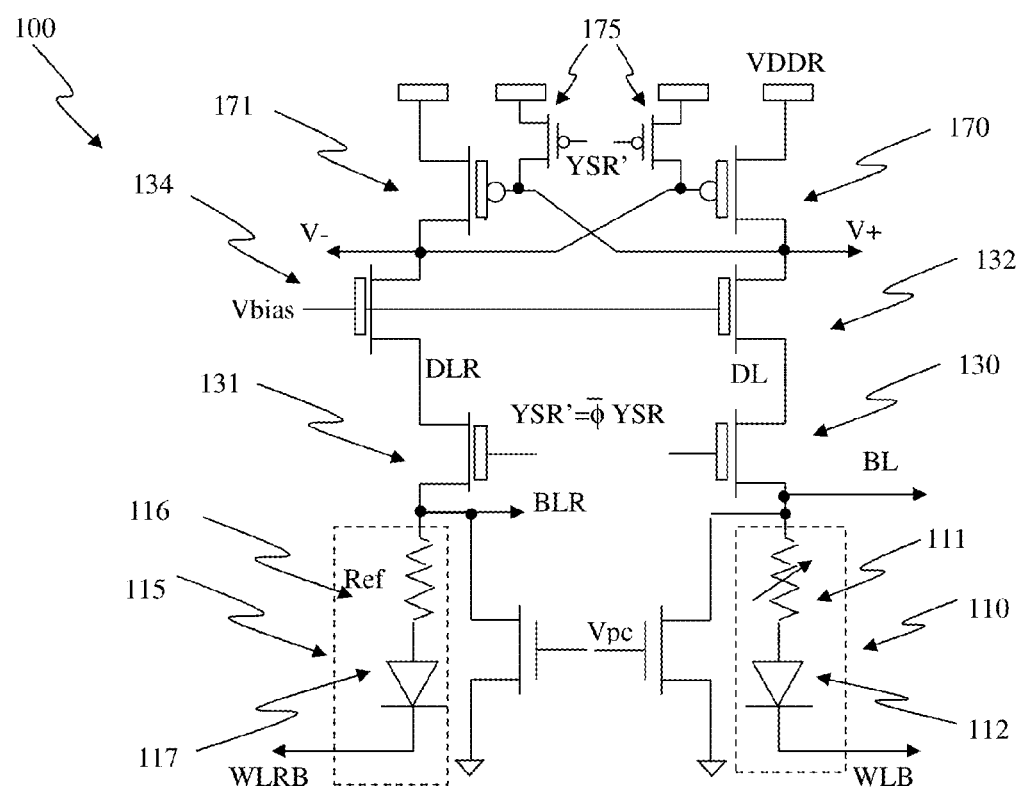
FIG. 19(a) shows one embodiment of a schematic of a pre-amplifier according to one embodiment.

FIG. 19(a) shows one embodiment of a schematic of a pre-amplifier 100 according to one embodiment. The pre-amplifier 100 needs special considerations because the supply voltage VDD for core logic devices is about 1.0V that does not have enough head room to turn on a diode to make sense amplifiers functional, considering a diode's threshold is about 0.7V. One embodiment is to use another supply VDDR, higher than VDD, to power at least the first stage of sense amplifiers. The programmable resistive cell 110 shown in FIG. 19(a) has a resistive element 111 and a diode 112 as program selector, and can be selected for read by asserting YSR' to turn on a gate of a MOS 130 and wordline bar WLB. The MOS 130 is a Y-select pass gate to select a signal from one of the at least one bitline(s) (BL) coupled to cells to a dataline (DL) for sensing. The pre-amplifier 100 also has a reference cell 115 including a reference resistive element 116 and a reference diode 117. The reference cell 115 can be selected for differential sensing by asserting YSRR' to turn on a gate of a MOS 131 and reference wordline WLRB. The MOS 131 is a reference pass gate to pass a signal from a reference bitline (BLR) to a reference dataline (DLR) for sensing. YSRR' is similar to YSR' to turn on a reference cell rather than a selected cell, except that the reference branch typically has only one reference bitline (BLR). The resistance Ref of the reference resistive element 116 can be set at a resistance approximately half-way between the minimum of state 1 and maximum of state 0 resistance. MOS 151 is for pre-charging DL and DLR to the same voltage before sensing by a pre-charge signal Vpc. Alternatively, the DL or DLR can be pre-charged to each other or to a diode voltage above ground in other embodiments. The reference resistor element 116 can be a plurality of resistors for selection to suit different cell resistance ranges in another embodiment.

The drains of MOS 130 and 131 are coupled to sources of NMOS 132 and 134, respectively. The gates of 132 and 134 are biased at a fixed voltage Vbias. The channel width to length ratios of NMOS 132 and 134 can be relatively large to clamp the voltage swings of dataline DL and reference dataline DLR, respectively. The drain of NMOS 132 and 134 are coupled to drains of PMOS 170 and 171, respectively. The drain of PMOS 170 is coupled to the gate of PMOS 171 and the drain of PMOS 171 is coupled to the gate of PMOS 170. The outputs V+ and V− of the pre-amplifier 100 are the drains of PMOS 170 and PMOS 171 respectively. The sources of PMOS 170 and PMOS 171 are coupled to a read supply voltage VDDR. The outputs V+ and V− are pulled up by a pair of PMOS 175 to VDDR when the pre-amplifier 100 is disabled. VDDR is about 2-3V (which is higher than about 1.0V VDD of core logic devices) to turn on the diode selectors 112 and 117 in the programmable resistive cell 110 and the reference cell 115, respectively. The CMOS 130, 131, 132, 134, 170, 171, and 175 can be embodied as thick-oxide I/O devices to sustain high voltage VDDR. The NMOS 132 and 134 can be native NMOS (i.e. the threshold voltage is ~0V) to allow operating at a lower VDDR. In another embodiment, the read selectors 130 and 131 can be PMOS devices. In another embodiment, the sources of PMOS 170 and 171 can be coupled to the drain of a PMOS pullup (an activation device not shown in FIG. 19(a)), whose source is then coupled to VDDR. This sense amplifier can be activated by setting the gate of the PMOS pullup low after turning on the reference and Y-select pass gates.

Figure 19B:
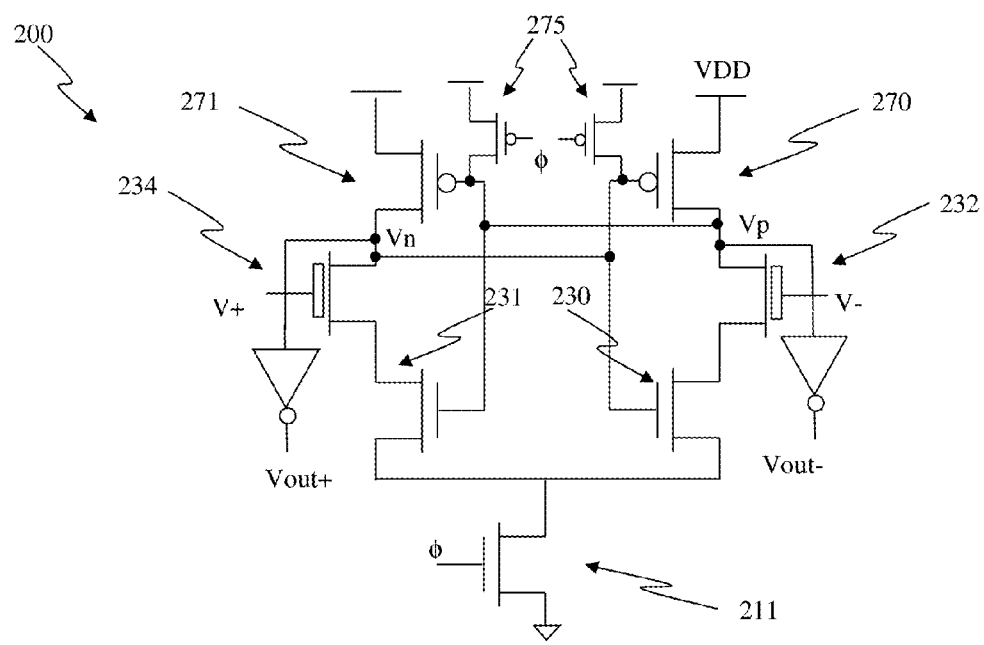

FIG. 19(b) shows one embodiment of a schematic of an amplifier 200 according to one embodiment. In another embodiment, the outputs V+ and V− of the pre-amplifier 100 in FIG. 19(a) can be coupled to gates of NMOS 234 and 232, respectively, of the amplifier 200. The NMOS 234 and 232 can be relatively thick oxide I/O devices to sustain the high input voltage V+ and V− from a pre-amplifier. The sources of NMOS 234 and 232 are coupled to drains of NMOS 231 and 230, respectively. The sources of NMOS 231 and 230 are coupled to a drain of an NMOS 211. The gate of NMOS 211 is coupled to a clock ϕ to turn on the amplifier 200, while the source of NMOS 211 is coupled to ground. The drains of NMOS 234 and 232 are coupled to drains of PMOS 271 and 270, respectively. The sources of PMOS 271 and 270 are coupled to a core logic supply VDD. The gates of PMOS 271 and NMOS 231 are connected and coupled to the drain of PMOS 270, as a node Vp. Similarly, the gates of PMOS 270 and NMOS 230 are connected and coupled to the drain of PMOS 271, as a node Vn. The nodes Vp and Vn are pulled up by a pair of PMOS 275 to VDD when the amplifier 200 is disabled when ϕ goes low. The output nodes Vout+ and Vout− are coupled to nodes Vn and Vp through a pair of inverters as buffers.

Figure 19C:
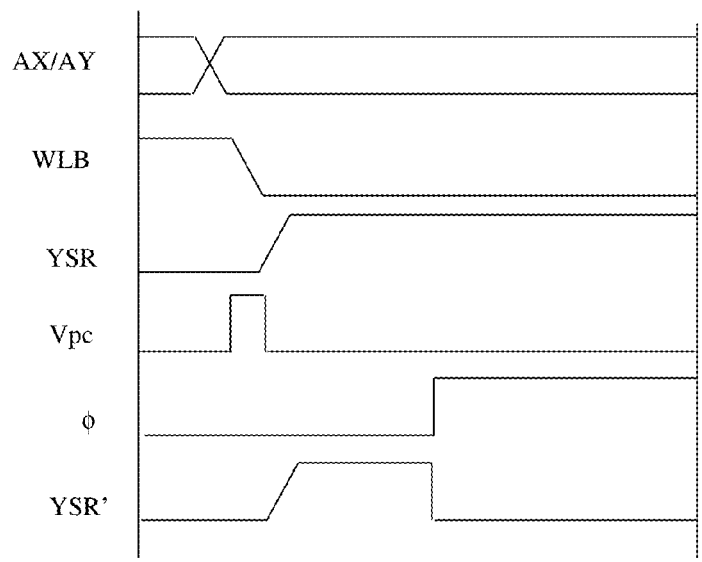

FIG. 19(c) shows a timing diagram of the pre-amplifier 100 and the amplifier 200 in FIGS. 19(a) and 19(b), respectively. The X- and Y-addresses AX/AY are selected to read a cell. After some propagation delays, a cell is selected for read by turning WLB low and YSR high to thereby select a row and a column, respectively. Before activating the pre-amplifier 100, a pulse Vpc can be generated to precharge DL and DLR to ground, to a diode voltage above ground, or to each other. The pre-amplifier 100 would be very slow if the DL and DLR voltages are high enough to turn off the cascode devices (e.g., NMOS 132 and 134). After the pre-amplifier outputs V+ and V− are stabilized, the clock ϕ is set high to turn on the amplifier 200 and to amplify the final output Vout+ and Vout− into full logic levels. The precharge scheme can be omitted in other embodiments.

Figure 20A:
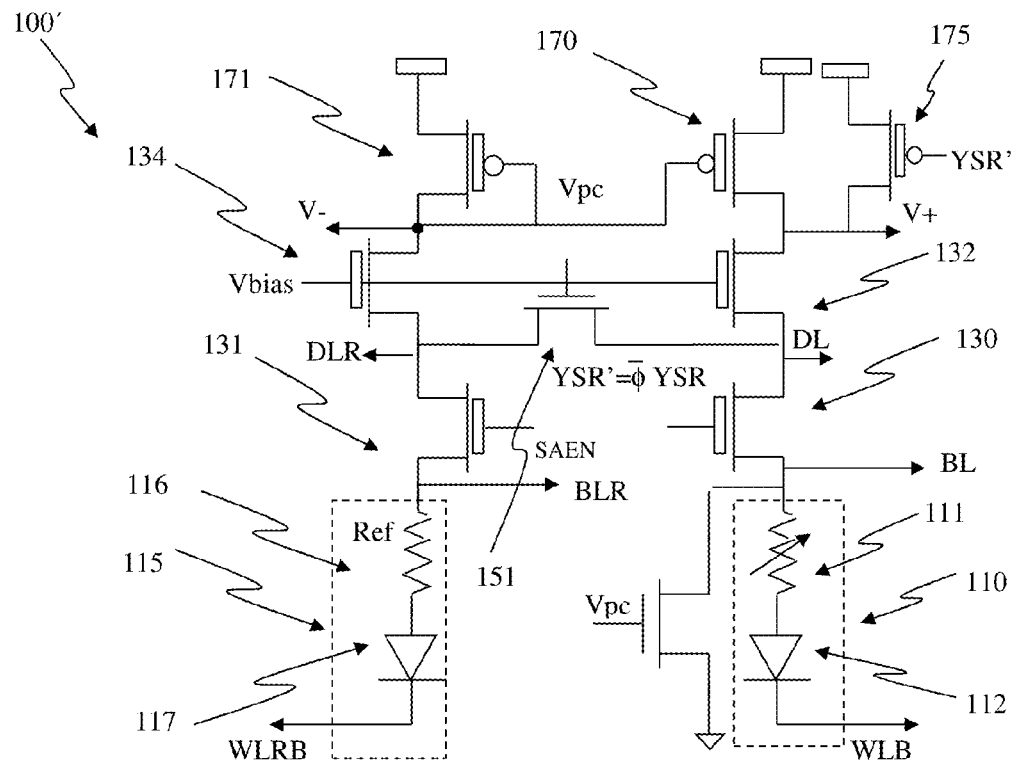

FIG. 20(a) shows another embodiment of a pre-amplifier 100′, similar to the pre-amplifier 100 in FIG. 19(a), with PMOS pull-ups 171 and 170 configured as current mirror loads. The reference branch can be turned on by a level signal, Sense Amplifier Enable (SAEN), to enable the pre-amplifier, or by a cycle-by-cycle signal YSRR′ as in FIG. 19(a). MOS 151 is for pre-charging DL and DLR to the same voltage before sensing by a pre-charge signal Vpc. Alternatively, the DL or DLR can be pre-charged to ground or to a diode voltage above ground in other embodiments. In this embodiment, the number of the reference branches can be shared between different pre-amplifiers at the expense of increasing power consumption. The reference resistor 116 can be a plurality of resistors for selection to suit different cell resistance ranges in another embodiment.

Figure 20B:
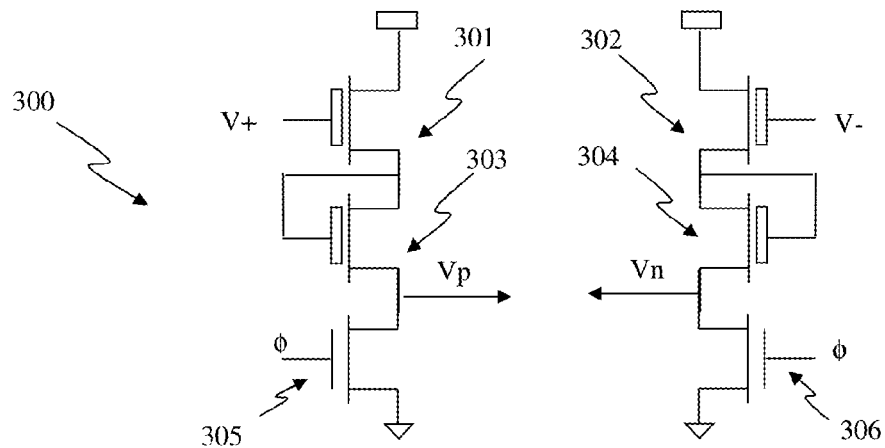

FIG. 20(b) shows level shifters 300 according to one embodiment. The V+ and V− from the pre-amplifier 100, 100′ outputs in FIG. 19(a) or FIG. 20(a) are coupled to gates of NMOS 301 and 302, respectively. The drains of NMOS 301 and 302 are coupled to a supply voltage VDDR. The sources of NMOS 301 and 302 are coupled to drains of NMOS 303 and 304, respectively, which have gates and drains connected as diodes to shift the voltage level down by one Vtn, the threshold voltage of an NMOS. The sources of NMOS 303 and 304 are coupled to the drains of pulldown devices NMOS 305 and 306, respectively. The gates of NMOS 305 and 306 can be turned on by a clock 0. The NMOS 301, 302, 303 and 304 can be thick-oxide I/O devices to sustain high voltage VDDR. The NMOS 303 and 304 can be cascaded more than once to shift V+ and V− further to proper voltage levels Vp and Vn. In another embodiment, the level shifting devices 303 and 304 can be built using PMOS devices.

Figure 20C:
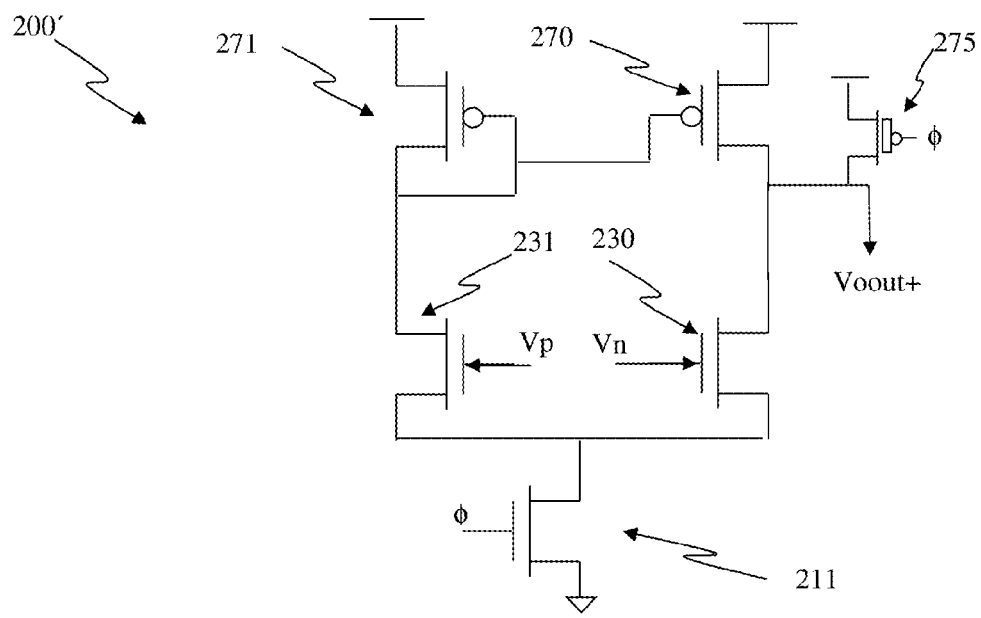

FIG. 20(c) shows another embodiment of an amplifier 200′ with current-mirror loads having PMOS 270 and 271 as loads. The inputs Vp and Vn of the amplifier 200′ are from the outputs Vp and Vn of the level shifter 300 in FIG. 20(b) that can be coupled to gates of NMOS 231 and 230, respectively. The drains of NMOS 231 and 230 are coupled to drains of PMOS 271 and 270 which provide current-mirror loads. The drain and gate of PMOS 271 are connected and coupled to the gate of PMOS 270. The sources of NMOS 231 and 230 are coupled to the drain of an NMOS 211, which has the gate coupled to a clock signal ϕ and the source to ground. The clock signal ϕ enables the amplifier 200′. The drain of PMOS 270 provides an output Vout+. The PMOS pullup 275 keeps the output Vout+ at logic high level when the amplifier 200′ is disabled.

Figure 20D:
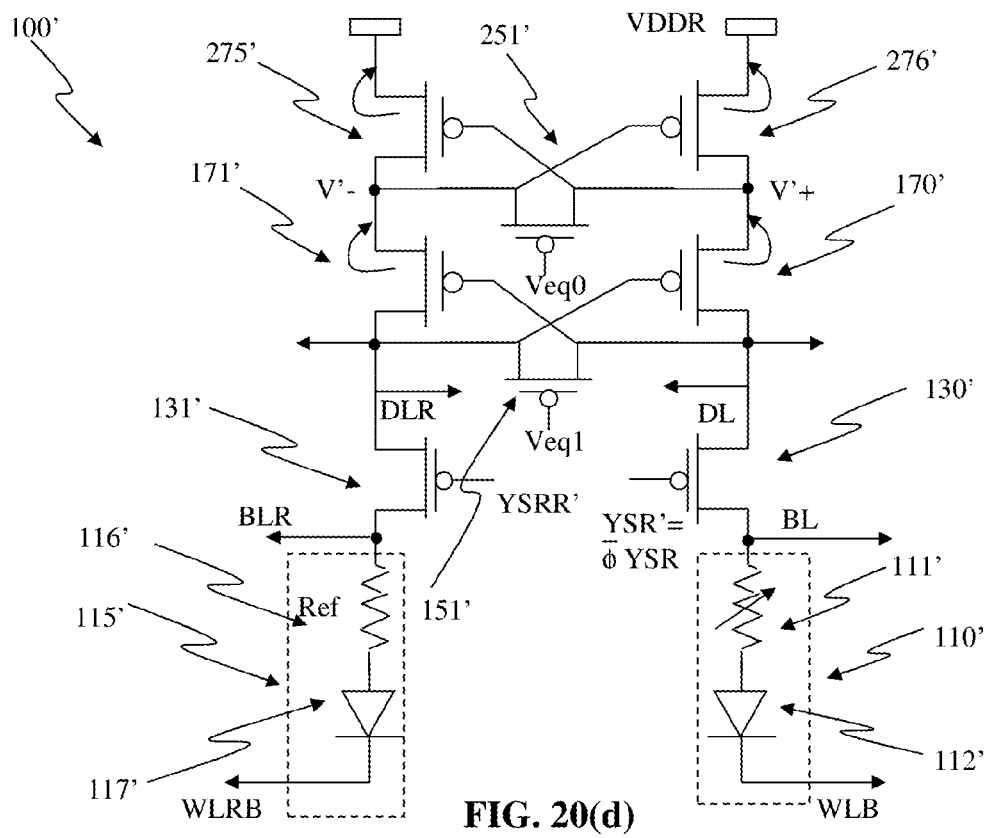
Figure 20E:
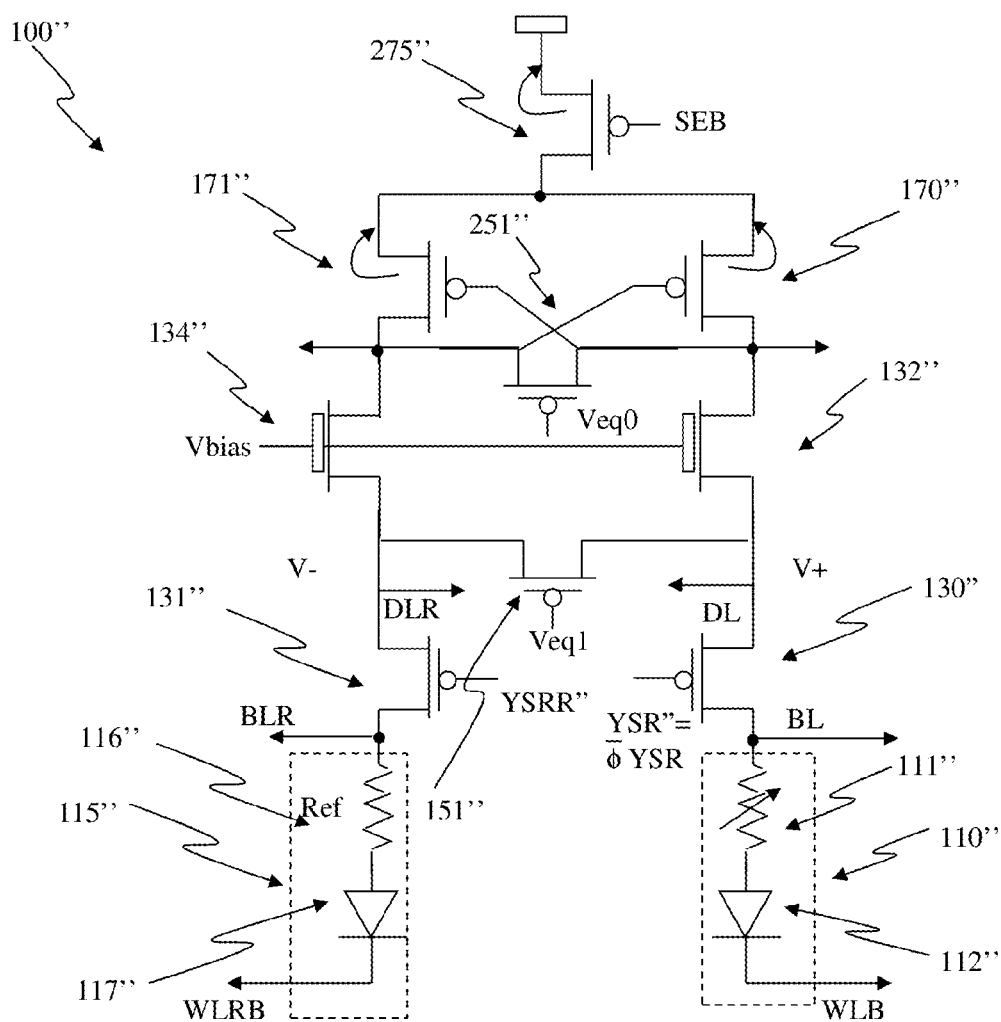

FIG. 20(d) shows one embodiment of a pre-amplifier 100′ based on all core devices according to one embodiment. The programmable resistive cell 110′ has a resistive element 111′ and a diode 112′ as program selector that can be selected for read by asserting YSR′ to turn on a gate of a MOS 130′ and wordline bar WLB. The MOS 130′ is a Y-select pass gate to select a signal from one of the at least one bitline(s) (BL) coupled to cells to a dataline (DL) for sensing. The pre-amplifier 100′ also has a reference cell 115′ including a reference resistive element 116′ and a reference diode 117′. The reference resistor 116′ can be a plurality of resistors for selection to suit different cell resistance ranges in another embodiment. The reference cell 115′ can be selected for differential sensing by asserting YSRR′ to turn on a gate of a MOS 131′ and reference wordline WLRB. The MOS 131′ is a reference pass gate to pass a signal from a reference bitline (BLR) to a reference dataline (DLR) for sensing. YSRR′ is similar to YSR′ to turn on a reference cell rather than a selected cell, except that the reference branch typically has only one reference bitline (BLR). The drains of MOS 130′ and 131′ are coupled to drains of PMOS 170′ and 171′, respectively. The gate of 170′ is coupled to the drain of 171′ and the gate of 171′ is coupled to the drain of 170′. The sources of MOS 170′ and 171′ are coupled to the drains of MOS 276′ and 275′, respectively. The gate of 275′ is coupled to the drain of 276′ and the gate of 276′ is coupled to the drain of 275′. The drains of 170′ and 171′ are coupled by a MOS equalizer 151′ with a gate controlled by an equalizer signal Veq1. The drains of 276′ and 275′ are coupled by a MOS equalizer 251′ with a gate controlled by an equalizer signal Veq0. The equalizer signals Veq0 and Veq1 can be dc or ac signals to reduce the voltage swing in the drains of 170', 171' and 275', 276', respectively. By reducing the voltage swings of the PMOS devices in the pullup and by stacking more than one level of cross-coupled PMOS, the voltage swings of the 170', 171', 275', and 276' can be reduced to VDD range so that core logic devices can be used. For example, the supply voltage of the sense amplifier VDDR is about 2.5V, while the VDD for core logic devices is about 1.0V. The DL and DLR are about 1V, based on diode voltage of about 0.7V with a few hundred millivolts drop for resistors and pass gates. If the cross-coupled PMOS are in two-level stacks, each PMOS only endures voltage stress of (2.5-1.0)/2=0.75V. Alternatively, merging MOS 275' and 276' into a single MOS or using a junction diode in the pullup is another embodiment. Inserting low-Vt NMOS as cascode devices between 170' and 130'; 171' and 131' is another embodiment. The output nodes from the drains of 170' and 171' are about 1.0-1.2V so that the sense amplifier as shown in FIG. 19(*b*) can be used with all core logic devices.

FIG. 20(*e*) shows another embodiment of a pre-amplifier 100" with an activation device 275" according to one embodiment. The programmable resistive cell 110" has a resistive element 111" and a diode 112" as program selector that can be selected for read by asserting YSR" to turn on a gate of a MOS 130" and wordline bar WLB. The MOS 130" is a Y-select pass gate to select a signal from one of the at least one bitline(s) (BL) coupled to cells to a dataline (DL) for sensing. The pre-amplifier 100" also has a reference cell 115" including a reference resistive element 116" and a reference diode 117". The reference resistor 116 can be a plurality of resistors to suit different cell resistance ranges in another embodiment. The reference cell 115" can be selected for differential sensing by asserting YSRR" to turn on a gate of a MOS 131" and reference wordline WLRB. The MOS 131" is a reference pass gate to pass a signal from a reference bitline (BLR) to a reference dataline (DLR) for sensing. YSRR" is similar to YSR" to turn on a reference cell rather than a selected cell, except that the reference branch typically has only one reference bitline (BLR). The drains of MOS 130" and 131" are coupled to the sources of MOS 132" and 134", respectively. The drains of MOS 132" and 134" are coupled to the drains of PMOS 170" and 171", respectively. The gate of 170" is coupled to the drain of 171" and the gate of 171" is coupled to the drain of 170". The sources of MOS 170" and 171" are coupled to the drain of MOS 275" whose source is coupled to a supply voltage and gate coupled to a Sensing Enable Bar (SEB). The drains of 170" and 171" are coupled by a MOS equalizer 251" with a gate controlled by an equalizer signal Veq0. The sources of 132" and 134" are coupled by a MOS equalizer 151" with a gate controlled by an equalizer signal Veq1. The equalizer signals Veq0 and Veq1 can be dc or ac signals to reduce the voltage swings in the sources of 170", 171" and 132", 134", respectively.

FIGS. 19(*a*), 20(*a*), 20(*d*) and 20(*e*) only show four of many pre-amplifier embodiments. Similarly, FIGS. 19(*b*), 20(*c*) and 20(*b*) only show several of many amplifier and level shifter embodiments. Various combinations of pre-amplifiers, level shifters, and amplifiers in NMOS or PMOS, in core logic or I/O devices, with devices stacked or with an activation device, operated under high voltage VDDR or core supply VDD can be constructed differently, separately, or mixed. The equalizer devices can be embodied as PMOS or NMOS, and can be activated by a dc or ac signal. In some embodiments, the precharge or equalizer technique can be omitted.

FIGS. 21(*a*), 21(*b*), and 21(*c*) show a flow chart depicting embodiments of a program method 700, a read method 800 and 800', respectively, for a programmable resistive memory in accordance with certain embodiments. The methods 700 and 800 are described in the context of a programmable resistive memory, such as the programmable resistive memory 100 in FIGS. 15(*a*), 16(*a*), and 16(*b*). The method 800' is described in the context of a programmable resistive memory, such as the programmable resistive memory 100 in FIGS. 15(*b*) and 15(*c*). In addition, although described as a flow of steps, one of ordinary skilled in the art will recognize that at least some of the steps may be performed in a different order, including simultaneously, or skipped.

FIG. 21(*a*) depicts a method 700 of programming a programmable resistive memory in a flow chart according to one embodiment. In the first step 710, proper power selectors can be selected so that high voltages can be applied to the power supplies of wordline drivers and bitlines. In the second step 720, the data to be programmed in a control logic (not shown in FIGS. 15(*a*), 15(*b*), 15(*c*), 16(*a*), and 16(*b*)) can be analyzed, depending on what types of programmable resistive devices. For electrical fuse, this is a One-Time-Programmable (OTP) device such that programming always means blowing fuses into a non-virgin state and is irreversible. Program voltage and duration tend to be determined by external control signals, rather than generated internally from the memory. To more easily program OTP, programming pulses can be applied more than one shot consecutively when programming each cell in one embodiment. A shot pulse can also be applied to all cells in a single pass and then selectively applied more shots for those cells that are hard to program in another pass to reduce the overall programming time in another embodiment. For PCM, programming into a 1 (to reset) and programming into a 0 (to set) require different voltages and durations such that a control logic determines the input data and select proper power selectors and assert control signals with proper timings. For MRAM, the directions of current flowing through MTJs are more important than time duration. A control logic determines proper power selectors for wordlines and bitlines and assert control signals to ensure a current flowing in the desired direction for desired time. In the third step 730, a cell in a row can be selected and the corresponding local wordline can be turned on. In the fourth step 740, sense amplifiers can be disabled to save power and prevent interference with the program operations. In the fifth step 750, a cell in a column can be selected and the corresponding Y-write pass gate can be turned on to couple the selected bitline to a supply voltage. In the step 760, a desired current can be driven for a desired time in an established conduction path. In the step 770, the data are written into the selected cells. For most programmable resistive memories, this conduction path is from a high voltage supply through a bitline select, resistive element, diode as program selector, and an NMOS pulldown of a local wordline driver to ground. Particularly, for programming a 1 to an MRAM, the conduction path is from a high voltage supply through a PMOS pullup of a local wordline driver, diode as program selector, resistive element, and bitline select to ground.

FIG. 21(*b*) depicts a method 800 of reading a programmable resistive memory in a flow chart according to one embodiment. In the first step 810, proper power selectors can be selected to provide supply voltages for local wordline drivers, sense amplifiers, and other circuits. In the second step 820, all Y-write pass gates, i.e. bitline program selectors, can be disabled. In the third step 830, desired local wordline(s) can be selected so that the diode(s) as program selector(s) have a conduction path to ground. In the fourth step 840, sense amplifiers can be enabled and prepared for sensing incoming signals. In the fifth step 850, the dataline and the reference dataline can be pre-charged to the V− voltage of the programmable resistive device cell. In the sixth step 860, the desired Y-read pass gate can be selected so that the desired bitline is coupled to an input of the sense amplifier. A conduction path is thus established from the bitline to the resistive element in the desired cell, diode(s) as program selector(s), and the pulldown of the local wordline driver(s) to ground. The same applies for the reference branch. In the step 870, the sense amplifiers can compare the read current with the reference current to determine a logic output of 0 or 1 to complete the read operations and output the read data in the step 880.

Figure 21A:
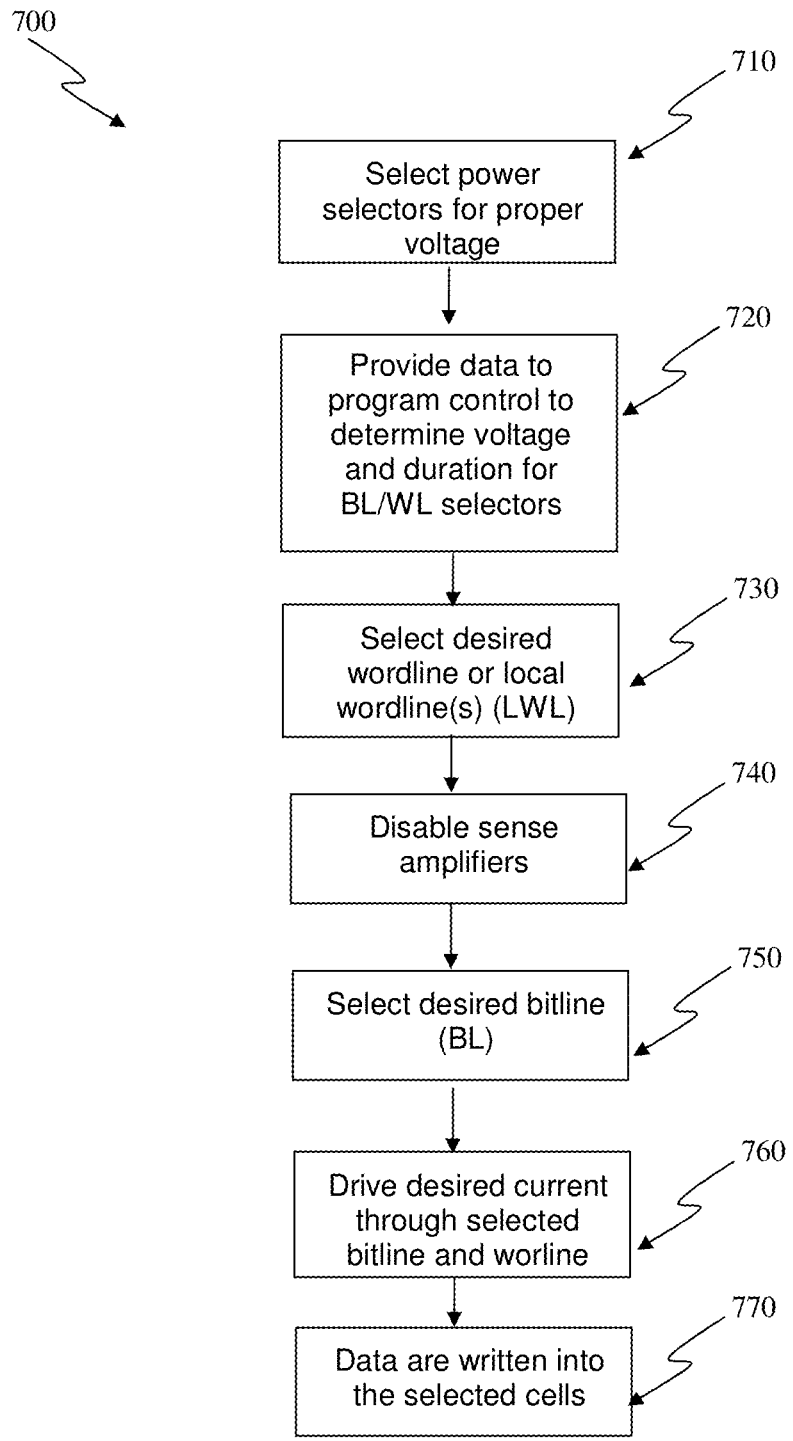
Figure 21B:
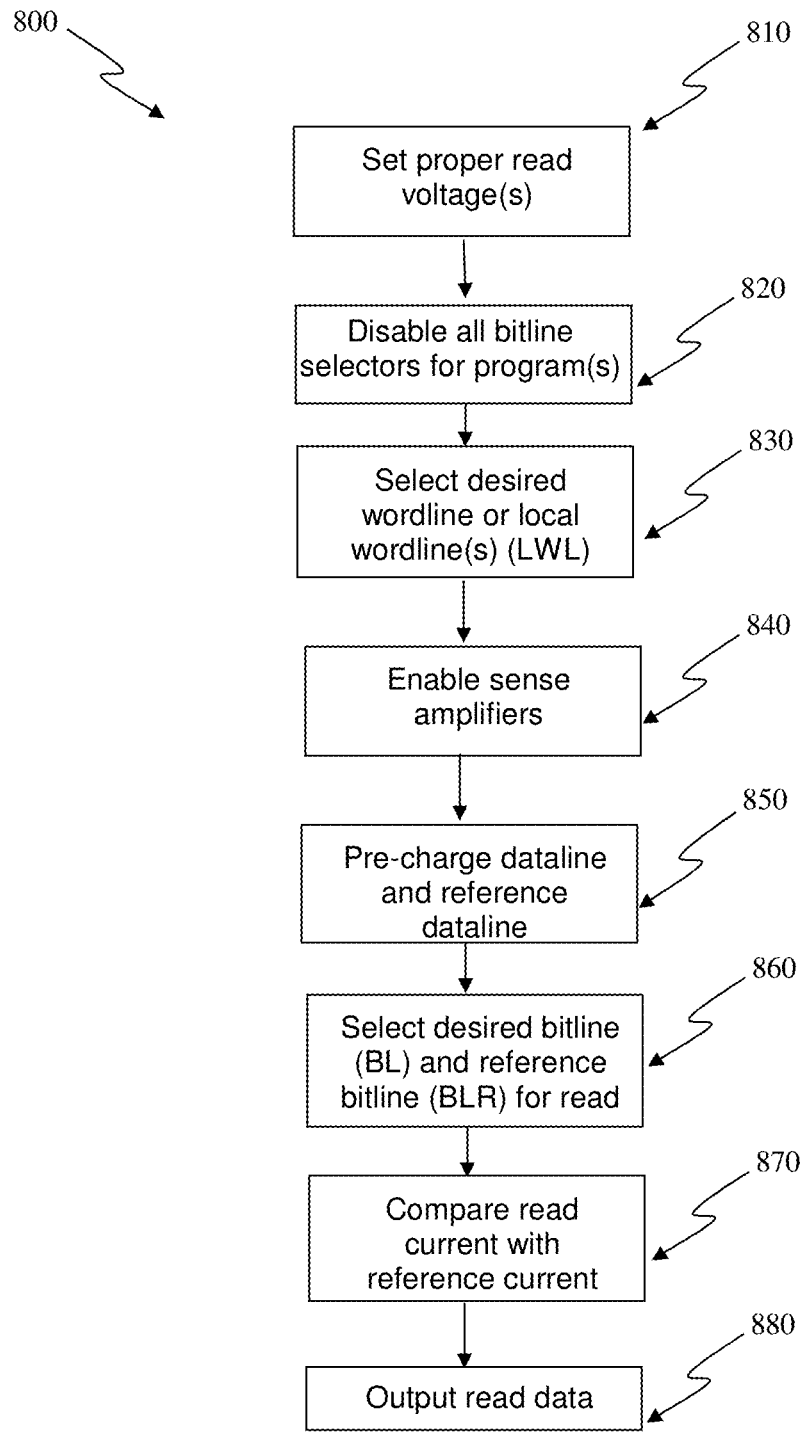
Figure 21C:
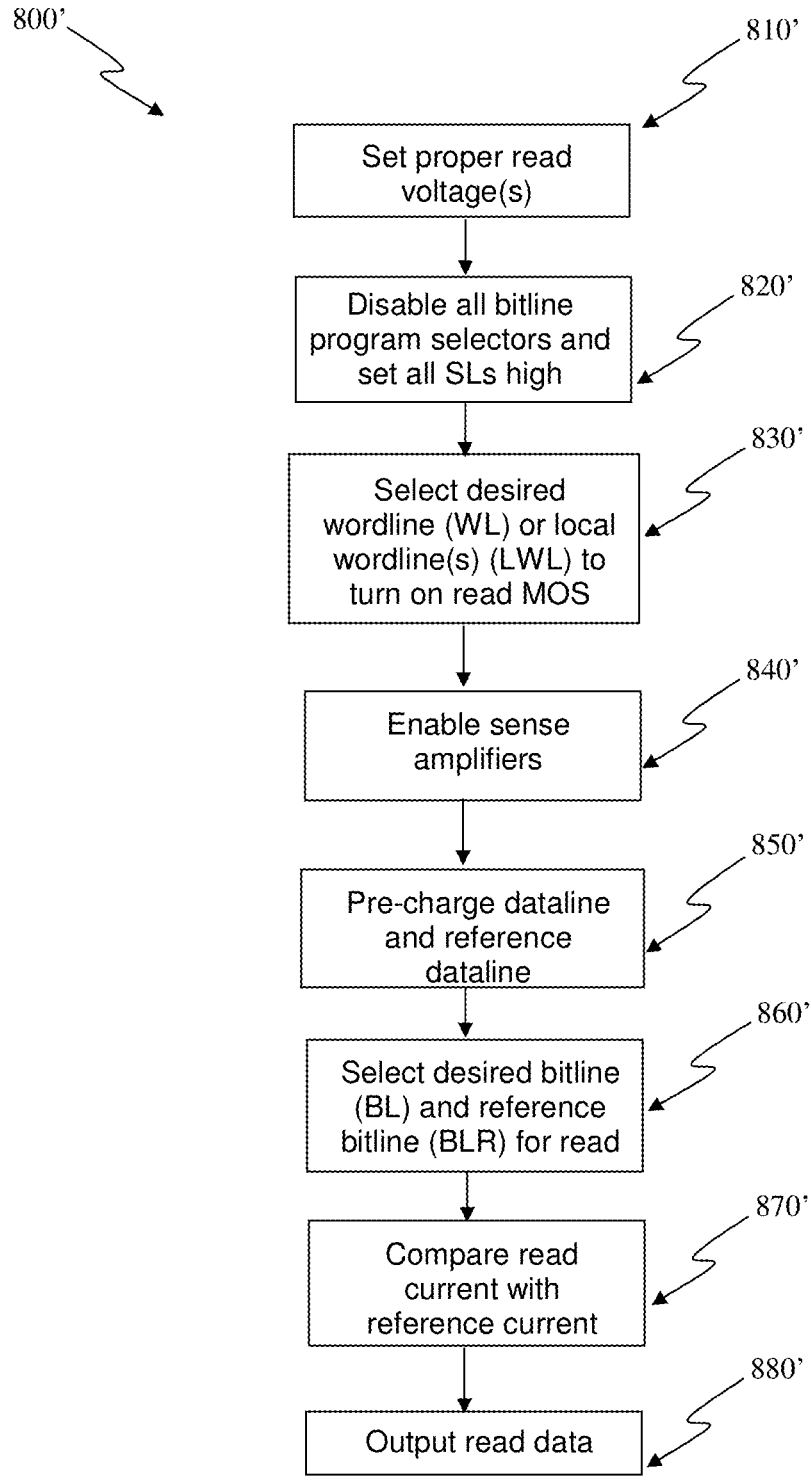

FIG. 21(c) depicts a method 800' of reading a programmable resistive memory, in a flow chart according to another embodiment. In the first step 810', proper power selectors can be selected to provide supply voltages for local wordline drivers, sense amplifiers, and other circuits. In the second step 820', all Y-write pass gates, i.e. bitline program selectors, can be disabled and all SLs are set to high. In the third step 830", desired wordline bar or local wordline bar can be selected so that the MOS devices as read selectors can be turned on. In the fourth step 840', sense amplifiers can be enabled and prepared for sensing incoming signals. In the fifth step 850', the dataline and the reference dataline can be pre-charged for proper functionality or performance of the sense amplifiers. In the sixth step 860', the desired Y-read pass gate can be selected so that the desired bitline can be coupled to an input of the sense amplifier. A conduction path is thus established from the bitline to the resistive element in the desired cell, MOS as read selector(s), and the source line (SL). The same applies for the reference branch. In the step 870', the sense amplifiers can compare the read current with the reference current to determine a logic output of 0 or 1 to complete the read operations and output the read data in the step 880'.

Figure 21D:
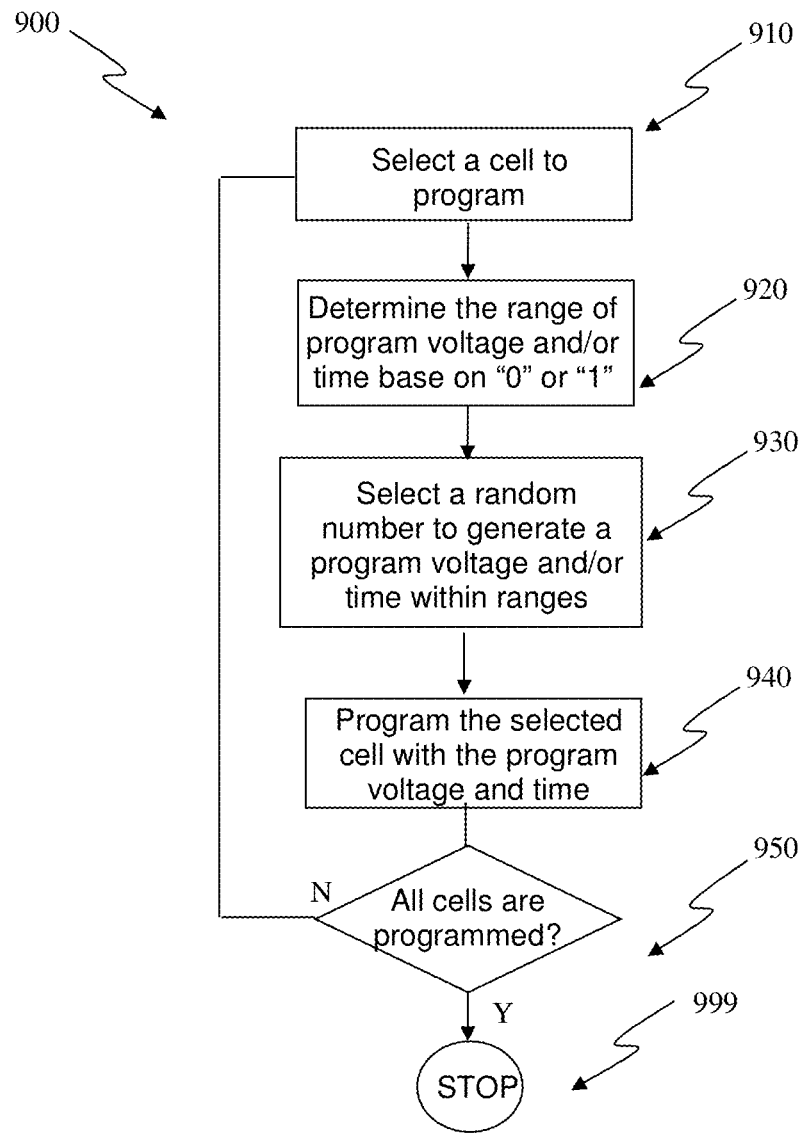

FIG. 21(d) depicts a flow chart of a programming method 900 to randomizing OTP resistance according to one embodiment. In a first step 910, select a cell to program. In a second step 920, determine a range of the program voltage and/or program time based on data to reach "0" or "1" In a third step 930, select a random number to generate a program voltage and/or program time within the selected ranges. In a fourth step 940, program the selected cell accordingly with the determined program voltage and program time. In a fifth step 950, check if all cells are programmed. If no, go to step 910 to select another cell to program. If yes, stop the procedure in step 999.

Figure 21E:
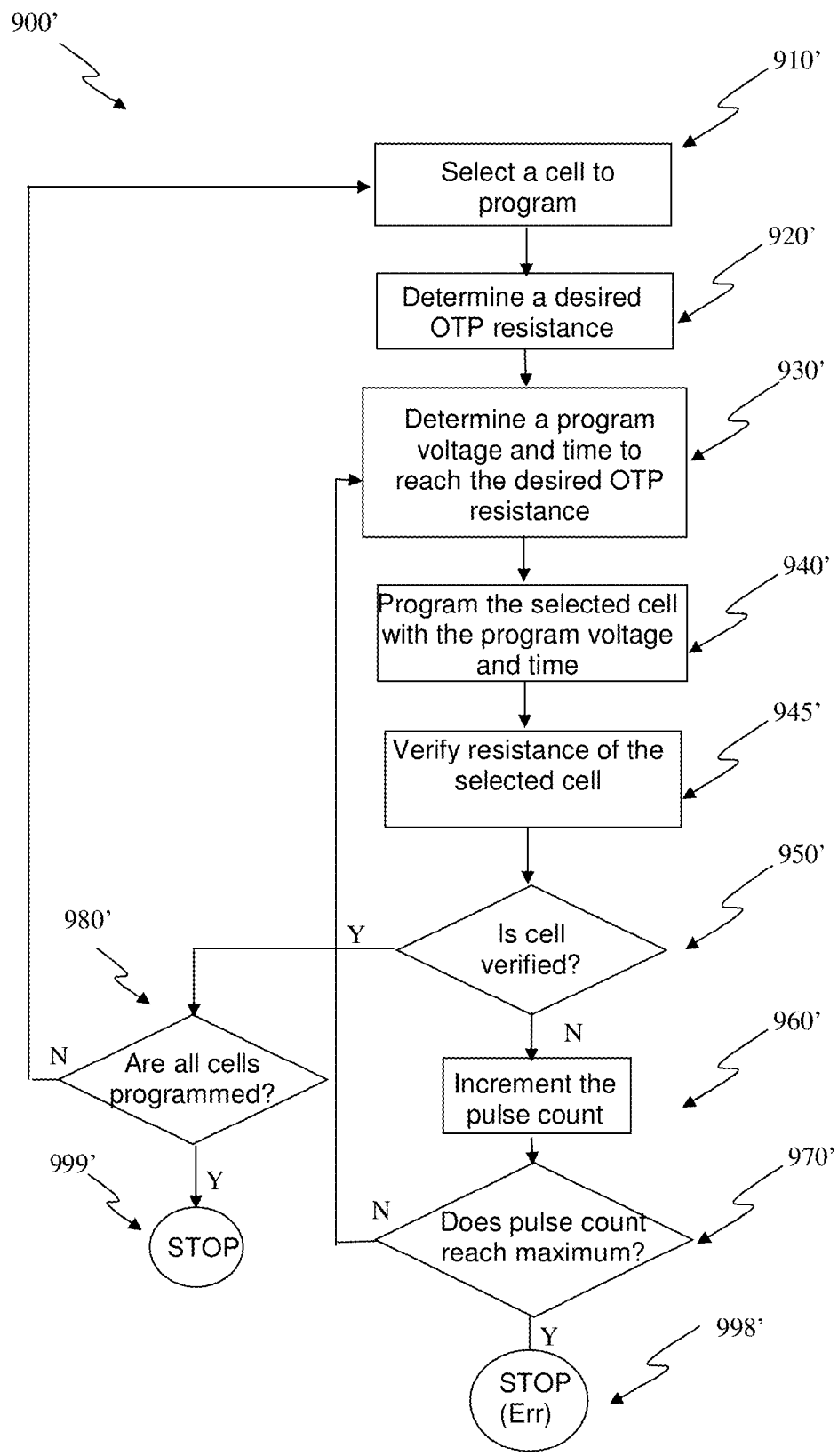

FIG. 21(e) depicts a flow chart of a programming method 900' to reach a desirable OTP resistance according to one embodiment. In a first step 910', select a cell to program. In a second step 920', determine a desired OTP resistance to be reach. In a third step 930', determine a program voltage and program time to reach a desired OTP resistance. In a fourth step 940', program the selected cell with the program voltage and program time using at least one pulse. In a step 945', verify the cell resistance by measuring cell current or logic state. In step 950', check if the cell has been verified. If not verified, increment the pulse count in step 960' and then and go to 970'. If verified, check if all cells are programmed in step 980'. If all cells have been programmed in step 980', then the programming method 900' can stop in step 999' with a success. If all cells are programmed have not been programmed, go to step 910' to select another cell to program. Following step 960', in step 970', check if the pulse count reaches the maximum. If yes, stop in step 998' with an error. If no, go to step 930' to start another pulse to program.

FIG. 22 shows a processor system 700 according to one embodiment. The processor system 700 can include a programmable resistive device 744, such as in a cell array 742, in memory 740, according to one embodiment. The processor system 700 can, for example, pertain to a computer system. The computer system can include a Central Process Unit (CPU) 710, which communicate through a common bus 715 to various memory and peripheral devices such as I/O 720, hard disk drive 730, CDROM 750, memory 740, and other memory 760. Other memory 760 is a conventional memory such as SRAM, DRAM, or flash, typically interfaces to CPU 710 through a memory controller. CPU 710 generally is a microprocessor, a digital signal processor, or other programmable digital logic devices. Memory 740 is preferably constructed as an integrated circuit, which includes the memory array 742 having at least one programmable resistive device 744. The memory 740 typically interfaces to CPU 710 through a memory controller. If desired, the memory 740 may be combined with the processor, for example CPU 710, in a single integrated circuit.

The invention can be implemented in a part or all of an integrated circuit in a Printed Circuit Board (PCB), or in a system. The programmable resistive device can be fuse, anti-fuse, or emerging nonvolatile memory. The fuse can be silicided or non-silicided polysilicon fuse, thermally isolated active-region fuse, local interconnect fuse, metal fuse, contact fuse, via fuse, or fuse constructed from CMOS gates. The anti-fuse can be a gate-oxide breakdown anti-fuse, contact or via anti-fuse with dielectrics in-between. The emerging nonvolatile memory can be Magnetic RAM (MRAM), Phase Change Memory (PCM), Conductive Bridge RAM (CBRAM), or Resistive RAM (RRAM). Though the program mechanisms are different, their logic states can be distinguished by different resistance values.

The above description and drawings are only to be considered illustrative of exemplary embodiments, which achieve the features and advantages of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An OTP memory, comprising:
   a plurality of OTP cells, at least one of the OTP cells including at least:
      an OTP element including at least one electrical fuse as an OTP element having a first terminal coupled to a first supply voltage line, the at least one OTP element having a resistance; and
      a selector coupled to the OTP element with at least one enable signal coupled to a second and/or a third supply voltage line; and
   program logic configured to provide programming the at least one of the OTP cells into a different logic state by applying at least one voltage or current pulses to the at least one of the OTP cells via the first, the second, and/or the third supply voltage lines to turn on the selector and to thereby progressively change the resistance of the at least one of the OTP cells, wherein the at least one of the OTP cells in a virgin state is lightly programmed but is still converted into a logic virgin state.

2. An OTP memory as recited in claim 1, wherein the resistance of the at least one of the OTP cells in the virgin state is lightly programmed to less than 300 ohm but is still converted into a logic virgin state.

3. An OTP memory as recited in claim 1, wherein resistance of the at least one of the OTP cells in the virgin state is lightly programmed to a lightly programmed from an unprogrammed virgin resistance to a lightly programmed resistance that is less than 2-3 times the unprogrammed virgin resistance.

4. An OTP memory as recited in claim 1, wherein the at least one of the OTP cells is programmed to a resistance that depends on the magnitude of the supply voltages applied and/or the duration or number of the programming pulses.

5. An OTP memory as recited in claim 4, wherein the resistance of the at least one of the OTP cells in the programmed state is greater than 2K ohm.

6. An OTP memory as recited in claim 4, wherein the resistance of the at least one of the OTP cells in the programmed state is greater than 1K ohm to enhance data security.

7. An OTP memory as recited in claim 1, wherein the programming of the at least one of the OTP cells to a logic programmed state randomly programs with different voltages, duration, and/or number of pulses, but regardless of being randomly programmed is still converted into the logic programmed state.

8. An OTP memory as recited in claim 1, wherein the programming of the at least one of the OTP cells from a virgin state to a lightly programmed state randomly programs with different voltages, duration, and/or number of pulses, but regardless of being randomly lightly programmed is still converted into the logic unprogrammed state.

9. An OTP memory, comprising:
a plurality of OTP cells, at least one of the OTP cells including at least:
an OTP element including at least one electrical fuse as an OTP element having a first terminal coupled to a first supply voltage line, the at least one OTP element having a resistance; and
a selector coupled to the OTP element with at least one enable signal coupled to a second and/or a third supply voltage line; and
program logic configured to provide programming the at least one of the OTP cells into a different logic state by applying at least one voltage or current pulses to the at least one of the OTP cells via the first, the second, and/or the third supply voltage lines to turn on the selector and to thereby progressively change the resistance of the at least one of the OTP cells; and
data security logic to introduce variance in the resistance of the OTP cells,
wherein the data security logic impedes cell current from being measured accurately in logic level determinations by varying currents flowing through the first supply voltage line to scramble the cell current.

10. An electronic system, comprising:
a processor; and
an One-Time Programmable (OTP) memory operatively connected to the processor, the OTP memory including a plurality of OTP cells, at least one of the OTP cells comprising:
an OTP element including at least one electrical fuse as an OTP element having a first terminal coupled to a first supply voltage line, the at least one OTP element having a resistance; and
a selector coupled to the OTP element with at least one enable signal coupled to a second and/or a third supply voltage line; and
program logic configured to provide programming the at least one of the OTP cells into a different logic state by applying at least one voltage or current pulses to the at least one of the OTP cell via the first, the second, and/or the third supply voltage lines to turn on the selector and to thereby progressively change the resistance of the at least one of the OTP cells,
wherein the at least one of the OTP cells in a virgin state is lightly programmed but is still converted into a logic virgin state.

11. An electronic system as recited in claim 10, wherein the electronic system comprises:
a sensing circuit coupled to the OTP memory and configured to sense the resistance of the at least one of the OTP cells and convert to an associated logic state.

12. An electronic system as recited in claim 10, wherein the resistance of the at least one of the OTP cells in the virgin state is less than 300 ohm.

13. An electronic system as recited in claim 10, wherein the at least one of the OTP cells is programmed dependent on magnitude of program voltage applied and/or the duration or number of programming pulses applied.

14. An electronic system as recited in claim 10, wherein the resistance of the at least one of the OTP cells in the programmed state is greater than 2K ohm.

15. An electronic system as recited in claim 10, wherein the resistance of the at least one of the OTP cells in the programmed state is greater than 1K ohm to enhance data security.

16. An electronic system as recited in claim 10, wherein the at least one of the OTP cells in a virgin state is lightly programmed to be less than three (3) times its original resistance, but is still converted into the logic virgin state.

17. An electronic system as recited in claim 10, wherein the at least one of the OTP cells in a virgin state is at first address where a start of instructions for the processor start and is lightly programmed but is still converted into the logic virgin state.

18. A method of programming OTP memory with high data security, comprising:
providing a plurality of OTP cells, at least one of the OTP cells including at least:
an OTP element including at least one electrical fuse as OTP element having a first terminal coupled to a first supply voltage line; and
a selector coupled to the OTP element with at least one enable signal coupled to a second and/or a third supply voltage line, and
programming the at least one OTP cell into a different logic state by applying at least one voltage or current pulses to the at least one OTP cell via the first, the second, and/or the third supply voltage lines to turn on the selector and to thereby change the OTP cell resistance progressively, wherein program voltage, program time, and/or program pulses are randomized within suitable respective ranges to program at least one of the selected OTP cells.

19. A method of programming an OTP memory as recited in claim 18, wherein at least one of the selected OTP cells is a virgin OTP cell, and wherein the virgin OTP cell is programmed but is still verified as a virgin fuse state.

20. A method of programming an OTP memory as recited in claim 18, wherein the resistance of the at least one OTP elements can be programmed into a desirable resistance by at least:
  (i) determining the program voltage and program time to a selected OTP cell;
  (ii) applying a pulse with the program voltage and time to the selected cell;
  (iii) verifying the resistance of the OTP element by measuring the cell current or logic state;
  (iv) applying one more shot to program if the resistance of the OTP element does not reach the desirable level.

21. A One-Time Programmable (OTP) memory, comprising:
  an OTP memory block including at least a plurality of OTP cells, at least one of the OTP cells including at least:
    an electrical fuse having a first terminal coupled to a first supply voltage line; and
    a selector coupled to the electrical fuse and having at least one enable signal coupled to a second and/or a third supply voltage line; and
  at least one regulator to regulate an input current provided to the OTP memory block,
  wherein the least one of the OTP cells is configured to be programmable by applying voltages to the first, second, and/or the third supply voltage lines to turn on the selector and to thereby change the electrical fuse resistance,
  wherein program voltage, program time, and/or program pulses are varied within suitable respective ranges to program at least one of the selected OTP cells.

* * * * *